US008598650B2

(12) United States Patent
Masuoka et al.

(10) Patent No.: US 8,598,650 B2
(45) Date of Patent: Dec. 3, 2013

(54) SEMICONDUCTOR DEVICE AND PRODUCTION METHOD THEREFOR

(75) Inventors: Fujio Masuoka, Tokyo (JP); Shintaro Arai, Tokyo (JP)

(73) Assignee: Unisantis Electronics Singapore PTE Ltd., Singapore (SG)

( * ) Notice: Subject to any disclaimer, the term of this patent is extended or adjusted under 35 U.S.C. 154(b) by 243 days.

(21) Appl. No.: 12/704,935

(22) Filed: Feb. 12, 2010

(65) Prior Publication Data

US 2010/0207201 A1 Aug. 19, 2010

Related U.S. Application Data

(63) Continuation of application No. PCT/JP2009/051459, filed on Jan. 29, 2009.

(60) Provisional application No. 61/207,567, filed on Feb. 13, 2009.

(30) Foreign Application Priority Data

Jan. 29, 2008 (WO) .................. PCT/JP2008/051300

(51) Int. Cl.
*H01L 25/04* (2006.01)

(52) U.S. Cl.
USPC .............. 257/329; 257/E29.262; 257/E21.41; 438/268

(58) Field of Classification Search
USPC .............. 257/329, E29.262, E21.41; 438/268
See application file for complete search history.

(56) References Cited

U.S. PATENT DOCUMENTS

| | | | | |
|---|---|---|---|---|
| 5,017,977 | A | 5/1991 | Richardson | |
| 5,208,172 | A | 5/1993 | Fitch et al. | |
| 5,244,824 | A | 9/1993 | Sivan | |
| 5,258,635 | A | 11/1993 | Nitayama et al. | |
| 5,308,782 | A | 5/1994 | Mazure et al. | |
| 5,312,767 | A | 5/1994 | Shimizu et al. | |
| 5,382,816 | A | 1/1995 | Mitsui | |
| 5,416,350 | A * | 5/1995 | Watanabe | 257/330 |
| 5,480,838 | A | 1/1996 | Mitsui | |
| 5,627,390 | A | 5/1997 | Maeda et al. | |
| 5,656,842 | A | 8/1997 | Iwamatsu et al. | |
| 5,703,386 | A | 12/1997 | Yasuda et al. | |

(Continued)

FOREIGN PATENT DOCUMENTS

| | | |
|---|---|---|
| CN | 1507035 | 6/2004 |
| CN | 1610126 A | 4/2005 |

(Continued)

OTHER PUBLICATIONS

International Search Report for International Application No. PCT/JP2008/051300, dated May 13, 2008, 4 pages.

(Continued)

*Primary Examiner* — Allan R Wilson
(74) *Attorney, Agent, or Firm* — Brinks Hofer Gilson & Lione

(57) ABSTRACT

It is intended to provide a semiconductor device comprising a circuit which has a connection between a drain region or a source region of a first MOS transistor and a drain region or a source region of a second MOS transistor. Each surround gate transistor (SGT) has a gate electrode that surrounds a sidewall of a pillar-shaped semiconductor layer.

9 Claims, 118 Drawing Sheets

(56) References Cited

U.S. PATENT DOCUMENTS

| | | | | |
|---|---|---|---|---|
| 5,707,885 | A | 1/1998 | Lim | |
| 5,710,447 | A | 1/1998 | Tohyama | |
| 5,767,549 | A | 6/1998 | Chen et al. | |
| 5,780,888 | A | 7/1998 | Maeda et al. | |
| 5,811,336 | A | 9/1998 | Kasai | |
| 5,872,037 | A | 2/1999 | Iwamatsu et al. | |
| 5,905,283 | A | 5/1999 | Kasai | |
| 5,994,735 | A | 11/1999 | Maeda et al. | |
| 6,121,086 | A | 9/2000 | Kuroda et al. | |
| 6,127,209 | A | 10/2000 | Maeda et al. | |
| 6,175,138 | B1 | 1/2001 | Noda | |
| 6,294,418 | B1 | 9/2001 | Noble | |
| 6,303,425 | B1 | 10/2001 | Maeda et al. | |
| 6,373,099 | B1 | 4/2002 | Kikuchi et al. | |
| 6,392,271 | B1 | 5/2002 | Alavi et al. | |
| 6,406,962 | B1 * | 6/2002 | Agnello et al. | 438/268 |
| 6,420,751 | B1 | 7/2002 | Maeda et al. | |
| 6,461,900 | B1 | 10/2002 | Sundaresan et al. | |
| 6,483,171 | B1 | 11/2002 | Forbes et al. | |
| 6,624,459 | B1 | 9/2003 | Dachtera et al. | |
| 6,658,259 | B2 | 12/2003 | McIntosh | |
| 6,740,937 | B1 | 5/2004 | Sushihara | |
| 6,747,314 | B2 * | 6/2004 | Sundaresan et al. | 257/330 |
| 6,815,277 | B2 | 11/2004 | Fried et al. | |
| 6,849,903 | B2 | 2/2005 | Sushihara | |
| 6,861,684 | B2 | 3/2005 | Skotnicki et al. | |
| 6,878,991 | B1 | 4/2005 | Forbes | |
| 6,891,225 | B2 | 5/2005 | Horiguchi et al. | |
| 6,943,407 | B2 | 9/2005 | Ouyang et al. | |
| 7,052,941 | B2 | 5/2006 | Lee | |
| 7,193,278 | B2 | 3/2007 | Song | |
| 7,198,976 | B2 | 4/2007 | Hirata | |
| 7,233,033 | B2 | 6/2007 | Koyama et al. | |
| 7,241,655 | B2 * | 7/2007 | Tang et al. | 438/212 |
| 7,271,052 | B1 | 9/2007 | Forbes | |
| 7,368,334 | B2 | 5/2008 | Yeo et al. | |
| 7,374,990 | B2 * | 5/2008 | Tang et al. | 438/212 |
| 7,413,480 | B2 | 8/2008 | Thomas | |
| 7,579,214 | B2 | 8/2009 | Yamazaki et al. | |
| 7,619,675 | B2 | 11/2009 | Horii | |
| 7,829,952 | B2 | 11/2010 | Moniwa et al. | |
| 7,872,287 | B2 | 1/2011 | Masuoka et al. | |
| 7,977,736 | B2 | 7/2011 | Kim et al. | |
| 7,977,738 | B2 | 7/2011 | Minami et al. | |
| 7,981,738 | B2 | 7/2011 | Moniwa et al. | |
| 8,039,893 | B2 | 10/2011 | Masuoka et al. | |
| 8,058,683 | B2 | 11/2011 | Yoon et al. | |
| 8,067,800 | B2 | 11/2011 | Hsieh | |
| 8,110,869 | B2 | 2/2012 | Bhalla | |
| 8,154,076 | B2 | 4/2012 | Takaishi | |
| 8,188,537 | B2 | 5/2012 | Masuoka et al. | |
| 8,227,305 | B2 | 7/2012 | Forbes | |
| 8,482,047 | B2 | 7/2013 | Abbott et al. | |
| 2001/0052614 | A1 | 12/2001 | Ishibashi | |
| 2002/0000624 | A1 | 1/2002 | Takemura et al. | |
| 2002/0034853 | A1 | 3/2002 | Alavi et al. | |
| 2002/0110039 | A1 | 8/2002 | Forbes et al. | |
| 2002/0195652 | A1 | 12/2002 | Maeda et al. | |
| 2003/0002093 | A1 | 1/2003 | Hynecek | |
| 2003/0075758 | A1 | 4/2003 | Sundaresan et al. | |
| 2004/0005755 | A1 | 1/2004 | Moniwa et al. | |
| 2004/0113207 | A1 | 6/2004 | Hsu et al. | |
| 2004/0135215 | A1 | 7/2004 | Song | |
| 2004/0169293 | A1 | 9/2004 | Sushihara | |
| 2004/0256639 | A1 | 12/2004 | Ouyang et al. | |
| 2004/0262681 | A1 | 12/2004 | Masuoka et al. | |
| 2005/0127404 | A1 | 6/2005 | Sushihara | |
| 2005/0145911 | A1 | 7/2005 | Forbes et al. | |
| 2005/0164454 | A1 | 7/2005 | Leslie | |
| 2005/0263821 | A1 | 12/2005 | Cho et al. | |
| 2005/0281119 | A1 | 12/2005 | Shibata et al. | |
| 2006/0006444 | A1 | 1/2006 | Leslie | |
| 2006/0007333 | A1 | 1/2006 | Horii | |
| 2006/0033524 | A1 | 2/2006 | Sushihara | |
| 2006/0043520 | A1 | 3/2006 | Jerdev et al. | |
| 2006/0046391 | A1 | 3/2006 | Tang et al. | |
| 2006/0261406 | A1 | 11/2006 | Chen | |
| 2007/0007601 | A1 | 1/2007 | Hsu et al. | |
| 2007/0075359 | A1 | 4/2007 | Yoon et al. | |
| 2007/0117324 | A1 | 5/2007 | Previtali | |
| 2007/0138557 | A1 | 6/2007 | Ipposhi | |
| 2007/0173006 | A1 | 7/2007 | Moniwa et al. | |
| 2008/0048245 | A1 * | 2/2008 | Kito et al. | 257/321 |
| 2008/0173936 | A1 | 7/2008 | Yoon et al. | |
| 2008/0210985 | A1 | 9/2008 | Ogawa et al. | |
| 2008/0227241 | A1 | 9/2008 | Nakabayashi et al. | |
| 2009/0032955 | A1 | 2/2009 | Tanaka et al. | |
| 2009/0057722 | A1 | 3/2009 | Masuoka et al. | |
| 2009/0065832 | A1 | 3/2009 | Masuoka et al. | |
| 2009/0085088 | A1 | 4/2009 | Takaishi | |
| 2009/0114989 | A1 | 5/2009 | Hamamoto | |
| 2009/0159964 | A1 | 6/2009 | Lee | |
| 2009/0174024 | A1 | 7/2009 | Kim | |
| 2009/0197379 | A1 * | 8/2009 | Leslie | 438/253 |
| 2009/0290082 | A1 | 11/2009 | Yamazaki et al. | |
| 2009/0291551 | A1 | 11/2009 | Cho | |
| 2010/0052029 | A1 | 3/2010 | Huang | |
| 2010/0200731 | A1 | 8/2010 | Masuoka et al. | |
| 2010/0200913 | A1 | 8/2010 | Masuoka et al. | |
| 2010/0207172 | A1 | 8/2010 | Masuoka et al. | |
| 2010/0207213 | A1 | 8/2010 | Tan et al. | |
| 2010/0213525 | A1 | 8/2010 | Masuoka et al. | |
| 2010/0213539 | A1 | 8/2010 | Masuoka et al. | |
| 2010/0219457 | A1 | 9/2010 | Masuoka et al. | |
| 2010/0219483 | A1 * | 9/2010 | Masuoka et al. | 257/369 |
| 2010/0270611 | A1 | 10/2010 | Masuoka et al. | |
| 2010/0276750 | A1 | 11/2010 | Tu | |
| 2010/0295123 | A1 | 11/2010 | Lung et al. | |
| 2011/0073925 | A1 | 3/2011 | Park et al. | |
| 2011/0215381 | A1 | 9/2011 | Masuoka et al. | |
| 2011/0254067 | A1 | 10/2011 | Abbott et al. | |
| 2011/0275207 | A1 | 11/2011 | Moniwa et al. | |
| 2011/0303973 | A1 | 12/2011 | Masuoka et al. | |
| 2011/0303985 | A1 | 12/2011 | Masuoka et al. | |
| 2012/0086051 | A1 | 4/2012 | Wang et al. | |
| 2012/0196415 | A1 | 8/2012 | Masuoka et al. | |

FOREIGN PATENT DOCUMENTS

| | | | |
|---|---|---|---|
| CN | 1983601 | A | 6/2007 |
| CN | 101542733 | A | 9/2009 |
| DE | 4443968 | | 11/1995 |
| EP | 1770769 | A1 | 4/2007 |
| EP | 2197032 | A1 | 6/2010 |
| EP | 2239770 | A1 | 10/2010 |
| EP | 2239771 | A1 | 10/2010 |
| EP | 2244305 | A1 | 10/2010 |
| EP | 2246895 | A1 | 11/2010 |
| JP | 60-070757 | A | 4/1985 |
| JP | 61-013661 | | 1/1986 |
| JP | 62-045058 | A | 2/1987 |
| JP | 62-190751 | A | 8/1987 |
| JP | 63-037633 | A | 2/1988 |
| JP | 63-158866 | A | 7/1988 |
| JP | 64-089560 | A | 4/1989 |
| JP | 01-175775 | A | 7/1989 |
| JP | 02-066969 | A | 3/1990 |
| JP | 02-071556 | A | 3/1990 |
| JP | 02-089368 | A | 3/1990 |
| JP | 02-188966 | A | 7/1990 |
| JP | 03-114233 | A | 5/1991 |
| JP | 03-145761 | | 6/1991 |
| JP | 03-225873 | A | 10/1991 |
| JP | 04-234166 | A | 8/1992 |
| JP | 05-276442 | A | 10/1993 |
| JP | 06-021467 | A | 1/1994 |
| JP | 06-069441 | | 3/1994 |
| JP | 06-237003 | A | 8/1994 |
| JP | H06-334146 | | 12/1994 |
| JP | 07-99311 | A | 4/1995 |
| JP | 07-099311 | A | 4/1995 |
| JP | 07-321228 | | 12/1995 |
| JP | 08-078533 | A | 3/1996 |
| JP | 09-008295 | | 1/1997 |

(56) References Cited

FOREIGN PATENT DOCUMENTS

| | | | |
|---|---|---|---|
| JP | 10-079482 | A | 3/1998 |
| JP | 10-223777 | A | 8/1998 |
| JP | 11-087649 | | 3/1999 |
| JP | 2000-012705 | A | 1/2000 |
| JP | 2000-068516 | A | 3/2000 |
| JP | 2000-208434 | | 7/2000 |
| JP | 2000-243085 | | 9/2000 |
| JP | 2000-244818 | A | 9/2000 |
| JP | 2000-357736 | | 12/2000 |
| JP | 2001-028399 | | 8/2001 |
| JP | 2001-237421 | A | 8/2001 |
| JP | 2001-339057 | A | 12/2001 |
| JP | 2001-352047 | A | 12/2001 |
| JP | 2002-009257 | | 1/2002 |
| JP | 2002-033399 | A | 1/2002 |
| JP | 2002-231951 | A | 8/2002 |
| JP | 2002-246580 | A | 8/2002 |
| JP | 2002-246581 | A | 8/2002 |
| JP | 2003-068883 | A | 3/2003 |
| JP | 2003-142684 | | 5/2003 |
| JP | 2003-179160 | A | 6/2003 |
| JP | 2003-224211 | A | 8/2003 |
| JP | 2004-079694 | | 3/2004 |
| JP | 2004-096065 | A | 3/2004 |
| JP | 2004-153246 | | 5/2004 |
| JP | 2004-193588 | A | 7/2004 |
| JP | 2004-259733 | A | 9/2004 |
| JP | 2004-319808 | A | 11/2004 |
| JP | 2005-012213 | A | 1/2005 |
| JP | 2005-135451 | | 5/2005 |
| JP | 2006-024799 | A | 1/2006 |
| JP | 2006-514392 | | 4/2006 |
| JP | 2006-294995 | A | 10/2006 |
| JP | 2007-0250652 | A | 9/2007 |
| JP | 2008-177565 | | 7/2008 |
| JP | 2008-205168 | A | 9/2008 |
| JP | 2008-300558 | A | 12/2008 |
| JP | 2009-110049 | A | 5/2009 |
| JP | 2009-182316 | A | 8/2009 |
| JP | 2009-182317 | A | 8/2009 |
| JP | 2010-171055 | | 8/2010 |
| JP | 2010-0213539 | A | 9/2010 |
| JP | 2010-258345 | | 11/2010 |
| JP | 2011-066105 | | 3/2011 |
| JP | 2011-071235 | | 4/2011 |
| JP | 2011-077437 | | 4/2011 |
| JP | 2011-211161 | A | 10/2011 |
| KR | 10-0132560 | | 12/1997 |
| KR | 10-0200222 | | 6/1999 |
| KR | 10-0327875 | B1 | 9/2002 |
| KR | 2004-0063348 | A | 7/2004 |
| WO | WO 94/14198 | A1 | 6/1994 |
| WO | WO 01/22494 | A1 | 3/2001 |
| WO | WO 2005/036651 | | 4/2005 |
| WO | WO 2006/127586 | | 11/2006 |
| WO | WO 2009/034623 | A1 | 3/2009 |
| WO | WO 2009/034731 | A1 | 3/2009 |
| WO | WO 2009/057194 | A1 | 5/2009 |
| WO | WO 2009/095997 | A1 | 8/2009 |
| WO | WO 2009/096001 | A1 | 8/2009 |
| WO | WO 2009/096464 | A1 | 8/2009 |
| WO | WO 2009/096465 | A1 | 8/2009 |
| WO | WO 2009/096466 | A1 | 8/2009 |
| WO | WO 2009/096470 | A1 | 8/2009 |
| WO | WO 2009/102059 | A1 | 8/2009 |
| WO | WO 2009/133957 | A1 | 11/2009 |
| WO | WO 2011/111662 | A1 | 9/2011 |

OTHER PUBLICATIONS

International Search Report for International Application No. PCT/JP2009/051459, dated Apr. 14, 2009, 4 pages.

Maeda, Shigenobu et al., "Impact of a Vertical ϕ-Shape Transistor (VϕT) Cell for 1 Gbit DRAM and Beyond," IEEE Transactions on Electron Devices, vol. 42, No. 12, Dec. 1995, pp. 2117-2124.

Choi, Yang-Kyu et al., "FinFET Process Refinements for Improved Mobility and Gate Work Function Engineering," IEEE, 2002, 4 pages.

Notice of Allowance from co-pending U.S. Appl. No. 12/704,955, dated Mar. 15, 2012, 8 pages.

Notice of Allowance for U.S. Appl. No. 13/043,081, dated Mar. 18, 2013, 6 pages.

Notice of Allowance for U.S. Appl. No. 13/113,482, dated Apr. 4, 2013, 10 pages.

Notice of Allowance for U.S. Appl. No. 12/768,290, dated Apr. 18, 2013, 9 pages.

Extended European Search Report for European Application No. 10004492.4, dated Jun. 21, 2012, 10 pages.

Agranov, G. et al., "Pixel Size Reduction of CMOS Image Sensors and Comparison of Characteristics", *The Institute of Image Formation and Television Engineers* (*ITE*) *Technical Report*, vol. 33, No. 38, pp. 9-12, Sep. 2009.

Examination Report for European Application No. 08722595.9, dated Jul. 11, 2012, 4 pages.

Examination Report in corresponding European Application No. 07 807 139.6, dated Jun. 11, 2012, 4 pages.

Extended European Search Report for European Application No. 07807139.6, dated Jun. 24, 2011, 10 pages.

Extended European Search Report for European Application No. 12001395.8, dated Apr. 26, 2012, 7 pages.

International Preliminary Report on Patentability for International Application No. PCT/JP2011/055264, dated Oct. 11, 2012, 7 pages.

International Search Report for International Application No. PCT/JP2007/067732, dated Dec. 11, 2007, 2 pages.

International Search Report for International Application No. PCT/JP2008/051304, dated Apr. 15, 2008, 2 pages.

International Search Report for International Application No. PCT/JP2008/058412, dated Jun. 10, 2008, 2 pages.

International Search Report for International Application No. PCT/JP2009/051463, dated Feb. 24, 2009, 2 pages.

International Search Report for International Application No. PCT/JP2009/058629, dated Jun. 2, 2009, 2 pages.

Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.

Nakamura, Jun-ichi et al., "Nondestructive Readout Mode Static Induction Transistor (SIT) Photo Sensors," IEEE Transactions on Electron Devices, 1993, vol. 40, pp. 334-341, Feb.

Non-Certified Partial Translation of Office Action from counterpart Korean Application No. 10-2010-7018204, dated Mar. 29, 2012, 1 page.

Notice of Allowance for U.S. Appl. No. 12/700,294, dated Oct. 5, 2012, 7 pages.

Notice of Allowance for U.S. Appl. No. 13/447,721, dated Nov. 2, 2012, 9 pages.

Office Action from co-pending U.S. Appl. No. 12/704,935, dated Nov. 18, 2011, 9 pages.

Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.

Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.

Written Opinion of the International Searching Authority for International Application No. PCT/JP2007/067732, dated Dec. 11, 2007, 4 pages.

Written Opinion of the International Searching Authority for International Application No. PCT/JP2008/058412, dated Jun. 10, 2008, 4 pages.

Written Opinion of the International Searching Authority for International Application No. PCT/JP2009/058629, dated Jun. 2, 2009, 4 pages.

(56) References Cited

OTHER PUBLICATIONS

Wuu, S.G. et al., "A Leading-Edge 0.9 μm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuites Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Chen, Yijian et al., "Vertical integrated-gate CMOS for ultra-dense IC", *Microelectronic Engineering*, vol. 83, 2006, pp. 1745-1748.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Extended European Search Report for European Application No. 10009574.4, dated May 15, 2012, 6 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Search Report for International Application No. PCT/JP2007/071052, dated Jan. 29, 2008, 6 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Written Opinion of the International Searching Authority for International Application No. PCT/JP2007/071052, dated Jan. 29, 2008, 9 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21,2009, 6 pages.
Wu et al., "High Performance 22/20nm FinFET CMOS Devices with Advanced High-K/Metal Gate Scheme", IEEE, pp. 27.1.1-27.1.4, 2010.
Written Opinion of the International Searching Authority for International Application No. PCT/JP2008/051300, dated Aug. 30, 2010, 8 pages.
International Preliminary Report on Patentability for International Application No. PCT/JP2008/051300, dated Aug. 31, 2010, 9 pages.
Written Opinion of the International Searching Authority for International Application No. PCT/JP2009/051459, dated Aug. 30, 2010, 8 pages.
International Preliminary Report on Patentability for International Application No. PCT/JP2009/051459, dated Aug. 31, 2010, 9 pages.
Office Action for U.S. Appl. No. 13/116,506, dated Jul. 18, 2013, 12 pages.
Supplementary Search Report for European Patent Application Serial No. 09 70 5550 dated Jul. 12, 2013, 8 pages.
Search Report for European Patent Application Serial No. 11 00 6235 dated Jul. 12, 2013, 7 pages.
Office Action for U.S. Appl. No. 13/917,040 dated Aug. 6, 2013, 5 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(BOX) (b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SEMICONDUCTOR DEVICE AND PRODUCTION METHOD THEREFOR

RELATED APPLICATIONS

Pursuant to 35 U.S.C. §119(e), this application claims the benefit of the filing date of Provisional U.S. Patent Application Ser. No. 61/207,567 filed on Feb. 13, 2009. This application is a continuation application of PCT/JP2009/051459 filed on Jan. 29, 2009 which claims priority under 35 U.S.C. §365(a) to PCT/JP2008/051300 filed on Jan. 29, 2008. The entire contents of these applications are hereby incorporated by reference.

TECHNICAL FIELD

The present invention relates to a semiconductor device and a production method therefor, and more particularly to a structure and a production method for an SGT (Surrounding Gate Transistor) which is a vertical MOS transistor comprising a pillar-shaped semiconductor layer having a sidewall serving as a channel region, and a gate electrode formed to surround the channel region.

BACKGROUND ART

With a view to achieving higher integration and higher performance of a semiconductor device, a vertical transistor SGT has been proposed which comprises a pillar-shaped semiconductor layer formed on a surface of a semiconductor substrate, and a gate formed to surround a sidewall of the pillar-shaped semiconductor layer (see, for example, the following Patent Documents 1 and 2). In the SGT, a source, a gate and a drain are arranged in a vertical direction, so that an occupancy area can be significantly reduced as compared with a conventional planar transistor. In addition, the gate is formed to surround a channel region, so that, as a size of a pillar-shaped semiconductor layer is reduced, channel controllability of the gate can be effectively improved to obtain steep subthreshold characteristics. Furthermore, an improvement in carrier mobility based on electric field relaxation in the channel region can be expected by setting an impurity concentration and a size of the pillar-shaped semiconductor layer to allow the pillar-shaped semiconductor layer to become fully depleted. Therefore, the use of the SGT makes it possible to simultaneously achieve higher integration and higher performance as compared with the conventional planar transistor.

As methodology to form such an SGT, there have been primarily known the following two methods. The first SGT forming method is disclosed in the Patent Document 1, wherein it comprises: forming a pillar-shaped semiconductor layer by etching in advance; then forming a gate dielectric film and a gate conductive film on the pillar-shaped semiconductor layer by respective desired thicknesses; and forming a gate electrode by etching. The second SGT forming method is disclosed in the Patent Document 2, wherein it comprises: forming a gate conductive film in advance; then forming a contact hole to penetrate through the gate conductive film; and forming a gate dielectric film and a pillar-shaped semiconductor layer inside the contact hole. A conventional example using each of the above two methods will be described below, by taking, for the sake of simplicity, a structure and a production method for a semiconductor device comprising an inverter circuit with a simple configuration, as an example of a structure and a production method for a semiconductor device comprising a transistor-based circuit.

As a conventional example using the first method, an SGT disclosed in the Patent Document 1 will be first described.

FIG. 123(*a*), FIG. 123(*b*) and FIG. 123(*c*) show an equivalent circuit of a CMOS inverter designed using the SGT disclosed in the Patent Document 1, a layout of the CMOS inverter, and a structure of the CMOS inverter in cross-section taken along the cutting-plane line B-B' in the layout diagram of FIG. 123(*b*), respectively. Referring to FIGS. 123(*b*) and 123(*c*), an N-well 1302 and a P-well 1303 are formed in an upper region of a Si substrate 1301. A pillar-shaped silicon layer 1305 forming a PMOS (PMOS-forming pillar-shaped silicon layer 1305) and a pillar-shaped silicon layer 1306 forming an NMOS (NMOS-forming pillar-shaped silicon layer 1306) are formed on a surface of the Si substrate, specifically on respective ones of the N-well region and the P-well region, and a gate 1308 is formed to surround the pillar-shaped silicon layers. Then, each of a $P^+$ drain diffusion layer 1310 formed underneath a PMOS-forming pillar-shaped semiconductor, and a $N^+$ drain diffusion layer 1312 formed underneath an NMOS-forming pillar-shaped semiconductor, is connected to an output terminal Vout 14. A source diffusion layer 1309 formed in an upper portion of the PMOS-forming pillar-shaped silicon layer is connected to a power supply potential Vcc 14 (1314), and a source diffusion layer 1311 formed in an upper portion of the NMOS-forming pillar-shaped silicon layer is connected to a ground potential Vss 14 (1315). Further, the gate 1308 common to the PMOS and the NMOS is connected to an input terminal Vin 14 (1316). In this manner, the CMOS inverter is formed.

In the above conventional example, the source, the gate and the drain are arranged in a vertical direction, so that an occupancy area of the transistor itself is less than that in the conventional planar transistor. However, element isolation (1304) is achieved based on a LOCOS (local oxidation of silicon) technique, and consequently an element isolation width is increased to cause deterioration in area efficiency in an integrated circuit and difficulty in fully taking advantage of the area reduction effect of the SGT. Moreover, in this SGT structure, it is necessary to reduce a resistance of the drain diffusion layer (1310, 1312), and, in cases where the drain diffusion layer (1310, 1312) is lined with a contact to reduce the resistance, the contact has to be formed on almost the entire region of a surface of the drain diffusion layer, which significantly restricts flexibility in laying lines in a first layer.

Secondly, an example of an NMOS sense amplifier of a DRAM using the SGT disclosed in the Patent Document 1 will be described below. FIG. 124(*a*), FIG. 124(*b*) and FIG. 124(*c*) are a diagrams showing an equivalent circuit of the NMOS sense amplifier, a top plan view showing a structure of the NMOS sense amplifier, and a sectional view taken along the cutting-plane line A-A' in the top plan view of FIG. 124(*b*), respectively.

Referring to FIG. 124(*a*), a flip-flop is formed using an NMOS Qn 151 and an NMOS Qn 152, wherein the NMOS Qn 151 and the NMOS Qn 152 are connected to a bit-line BL and a bit-line BLB, respectively. Each of the Qn 151 and the Qn 152 is also connected to an NMOS Qn 153 for activating the sense amplifier, wherein a source of the Qn 153 is connected to a ground potential Vss 15.

Referring to FIGS. 124(*b*) and 124(*c*), a P-well 1322 is formed in an upper region of a Si substrate 1321, and a plurality of pillar-shaped silicon layers 1323 to 1328 are formed on a surface of the Si substrate. The Qn 151 which is one of two NMOSs constituting the sense amplifier, is formed by two (1327, 1328) of the pillar-shaped silicon layers, and the Qn 152 which is the other NMOS, is formed by two (1324, 1325) of the remaining pillar-shaped silicon layers. A gate dielectric film 1329 and a gate electrode 1330 are formed around an outer periphery of each of the pillar-shaped silicon layers. Further, an N-type source diffusion layer 1331 and an N-type drain diffusion layer 1332 are formed, respectively, beneath and in an upper portion of each of the pillar-shaped silicon layers. Each of the bit-line BL 1333 and the bit-line BLB 1334 paired together is connected to the drain diffusion layers 1332 in the respective upper portions of the two pillar-shaped silicon layers of a corresponding one of the MOS transistors Qn 151, Qn 152, via polycrystalline silicon films (i.e., contacts) formed on the respective drain diffusion layers 1332. Further, the gate electrode 1330 of the transistor Qn 152 is extended to a top of the pillar-shaped silicon layer 1323 located on a left and obliquely upper side in the layout diagram of FIG. 124(*b*), and connected to the bit-line BL 1333 via a contact. The gate electrode 1330 of the transistor Qn 151 is extended to a top of the pillar-shaped silicon layer 1326 located on a right and obliquely lower side in the layout diagram of FIG. 124(*b*), and connected to the bit-line BLB 1334 via a contact.

Each of the two pillar-shaped silicon layers 1323, 1326 is not provided as an element forming the MOS transistor but as a seat for ensuring a bit-line contact during a process of connecting the bit-line to the gate electrode. The source diffusion layer 1331 formed underneath the pillar-shaped silicon layers is a common source node, and connected to the ground potential Vss 15 through a contact 1335. Further, although not illustrated, a PMOS sense amplifier comprising a PMOS is formed along the same bit-lines in the same structure and layout as those of the above NMOS sense amplifier.

In the above sense amplifier, considering that a length of a portion of the source diffusion layer 1331 extending between the contact 1335 connected to a ground line and an adjacent one of the transistors becomes longer, it is essential to allow the source diffusion layer 1331 to be lined with a contact. However, in the circuit having such a complicated layout, it is difficult to allow the source diffusion layer to be lined with a contact, and consequently a parasitic resistance of the source diffusion layer is increased to cause degradation in circuit performance.

FIGS. 125(*a*) to 125(*f*) show a schematic process flow for forming a pillar-shaped silicon layer and a gate electrode, in the above conventional examples of SGTs. This process flow will be described below. In FIG. 125(*a*), a pillar-shaped silicon layer 1401 is formed on a silicon substrate by etching. In FIG. 125(*b*), a gate dielectric film 1402 is formed. In FIG. 125(*c*), a gate conductive film 1403 is formed. In FIG. 125(*d*), a gate-line resist (resist for a gate line) 1404 is formed to be in contact with a portion of a gate conductive film surrounding the pillar-shaped silicon layer. In FIG. 125(*e*), a gate etch process is performed. Through this process, a gate electrode and a gate line 1405 of an SGT are formed. In FIG. 125(*f*), the resist is released.

In this SGT forming method, the resist 1404 must be formed to be accurately in contact with the portion of the gate conductive film around a sidewall of the pillar-shaped silicon layer. Therefore, a process margin for forming the gate line is narrow, which causes difficulty in ensuring stable production. The following description will be made in regard to this point.

FIGS. 126 (*a*) to 126(*f*) illustrate a process flow in case where the gate-line resist 1404 is positionally deviated to the right side in FIG. 125(*d*). FIG. 126(*d*) shows a state after the resist is positionally deviated to the right side during alignment of a lithographic exposure. In this state, there arises a space between a resist 1414 and a sidewall of a pillar-shaped silicon layer 1411. In FIG. 126(*e*), a gate etch process performed. In FIG. 126(*f*), the resist is released. In this case, a gate electrode 1413 and a gate line 1415 of a resulting SGT are undesirably disconnected from each other.

FIGS. 127 (*a*) to 127(*f*) illustrate a process flow in case where the gate-line resist 1404 is positionally deviated to the left side in FIG. 125(*d*). FIG. 127(*d*) shows a state after the resist is positionally deviated to the left side during alignment of a lithographic exposure. In this state, there arises an overlapped area 1426 between a resist 1424 and a portion of a gate electrode on a top of a pillar-shaped silicon layer 1421. In FIG. 127(*e*), a gate etch process performed. In FIG. 127(*f*), the resist is released. In this case, a gate electrode 1423 of a resulting SGT undesirably has a shape abnormality 1427 on a side where the resist is formed.

The above positional deviation of the resist arising from the alignment inevitably occurs depending on a type of pattern and/or a position on a wafer. Thus, in this SGT forming method, a process margin for forming the gate line becomes extremely narrow.

Thirdly, as a conventional example using the second method, an SGT disclosed in the Patent Document 2 will be described below.

FIGS. 128(*a*) to 128(*e*) show respective cross-sectional structures of a plurality of types of CMOS inverters designed using the SGT disclosed in the Patent Document 2. As shown in FIG. 128(*a*), an N-well 1502 and a P-well 1501 are formed in an upper region of a Si substrate. A $P^+$ diffusion layer 1504 and an $N^+$ diffusion layer 1503 are formed on a surface of the Si substrate, specifically on respective ones of the N-well region and the P-well region. The $P^+$ diffusion layer 1504 and the $N^+$ diffusion layer 1503 are isolated from each other by a LOCOS film 1505. A PMOS-forming pillar-shaped silicon layer 1510 and an NMOS-forming pillar-shaped silicon layer 1509 are formed on respective ones of the $P^+$ diffusion layer 1504 and the $N^+$ diffusion layer 1503, and a gate 1506 is formed to surround the pillar-shaped silicon layers. Although not illustrated, the diffusion layer 1504 beneath the PMOS-forming pillar-shaped silicon layer, the diffusion layer 1503 beneath the NMOS-forming pillar-shaped silicon layer, and the gate electrode 1506, are connected to a power supply potential, a ground potential, and an input potential, respectively. Further, a diffusion layer (1512, 1511) formed in an upper portion of each of the PMOS-forming and NMOS-forming pillar-shaped silicon layers is connected to a line layer 1513 which is connected to an output potential.

In the SGT having the structure illustrated in FIG. 128(*a*), element isolation is performed using a LOCOS technique, in the same manner as that in the SGT structure disclosed in the Patent Document 1. Therefore, an element isolation width is increased to cause deterioration in area efficiency in an integrated circuit, and difficulty in fully taking advantage of the area reduction effect of the SGT.

FIG. 128(*b*) shows a conventional example in which an inverter is formed based on the same structure as that illustrated in FIG. 128(*a*). In FIG. 128(*b*), two diffusion layers 1531, 1532 formed in respective upper portions of the NMOS-forming and PMOS-forming pillar-shaped silicon layers are connected to each other through a silicide layer 1533, and further connected to a line layer 1534 via a contact formed on the silicide layer 1533.

In this structure, the two diffusion layers in the respective upper portions of the NMOS-forming and PMOS-forming pillar-shaped silicon layers are connected to each other through the silicide layer 1533. This makes it possible to facilitate layout of the line layer. However, an area of the inverter cannot be reduced as compared with that in FIG. 128(*a*), because it is determined by a total area of a diffusion layer (1523, 1524) beneath the pillar-shaped silicon layers, and an element isolation 1525. Moreover, the number of production processes is increased due to a need for adding a production process to form and pattern the silicide layer. Furthermore, in both the inverters illustrated in FIGS. 128(*a*) and 128(*b*), a parasitic resistance of the source diffusion layer is increased to cause degradation in circuit performance, as with the SGT disclosed in the Patent Document 1.

Two inverters illustrated in FIGS. 128(*c*) and 128(*d*) are structurally different from those in FIGS. 128(*a*) and 128(*b*). Thus, the difference will be described below, primarily by taking the inverter illustrated in FIG. 128(*c*) as an example.

Referring to FIG. 128(*c*), a P-well 1541 is formed in a Si substrate. An $N^+$ diffusion layer 1542 is formed on a surface of the Si substrate, and a silicide layer 1543 is formed on a surface of the $N^+$ diffusion layer. Further, each of the $N^+$ diffusion layer 1542 and the silicide layer 1543 is isolated by a LOCOS film 1551. A PMOS-forming pillar-shaped silicon layer 1548 and an NMOS-forming pillar-shaped silicon layer 1547 are formed on the silicide layer 1543, and a gate 1544 is formed to surround the pillar-shaped silicon layers. Although not illustrated, the silicide layer 1543, the gate electrode 1544, a diffusion layer 1550 formed in an upper portion of the PMOS-forming pillar-shaped silicon layer, and a diffusion layer 1549 formed in an upper portion of the NMOS-forming pillar-shaped silicon layer, are connected to an output potential, an input potential, a power supply potential, and a ground potential, respectively. Thus, differently from the inverters illustrated in FIGS. 128(*a*) and 128(*b*), in this inverter, an output potential is output on the side of the substrate.

The inverter in FIG. 128(*c*) designed to output an output potential on the side of the substrate can employ a structure where and a $P^+$ diffusion layer 1546 formed in a bottom portion of the pillar-shaped silicon layer 1548 and an $N^+$ diffusion layer 1545 formed in a bottom portion of the pillar-shaped silicon layer 1547 are connected to each other through the silicide layer 1543. This structure is free of a need for element isolation to isolate between the $P^+$ diffusion layer 1546 and the $N^+$ diffusion layer 1545, and therefore an occupancy area of this inverter becomes reduced as compared with those of the inverters illustrated in FIGS. 128(*a*) and 128(*b*).

However, in this structure, a transistor must be formed after forming the silicide layer 1543 underneath the pillar-shaped silicon layer. Generally, a silicide layer is low in thermal resistance. In particular, nickel silicide (NiSi) employed in nano-devices since the 65-nm generation has an upper temperature limit of about 500 to 600° C. Thus, when the silicide layer is affected by an impurity activation heat treatment to be performed at about 1000° C. during transistor formation, an excessive reaction undesirably occurs therein to cause an increase in resistance and leak current. In view of this, it is practically difficulty to ensure stable production based on the structure of this conventional example. Moreover, due to the silicide layer 1543 located underneath the pillar-shaped silicon layer, silicon cannot be formed by epitaxial growth during crystal growth of the pillar-shaped silicon layer, to cause significant deterioration in transistor characteristics.

A conventional example illustrated in FIG. 128(*d*) is configured to generate an output potential on the side of a substrate, as with the inverter illustrated in FIG. 128(*c*). In this conventional example, a silicide layer 1563 is formed along an interface between a $P^+$ diffusion layer 1566 formed in a bottom portion of a pillar-shaped silicon layer 1568 and an $N^+$ diffusion layer 1562 on a Si substrate, to connect the $P^+$ diffusion layer 1566 to an $N^+$ diffusion layer 1565 formed in a bottom portion of an NMOS-forming pillar-shaped silicon layer 1567, and the $N^+$ diffusion layer 1562 on the substrate. Thus, this structure is free of a need for element isolation to isolate between the $N^+$ diffusion layer and the $P^+$ diffusion layer, and therefore an inverter occupancy area becomes reduced. However, in this conventional example, a transistor is formed after forming the silicide layer, in the same manner as that in the conventional example illustrated in FIG. 128(*b*), and, due to the problem with the thermal resistance of the silicide layer, it is difficult to ensure stable production. Moreover, due to the silicide layer 1563 located underneath the PMOS-forming pillar-shaped silicon layer, silicon cannot be formed by epitaxial growth during crystal growth of the PMOS-forming pillar-shaped silicon layer, to cause significant deterioration in transistor characteristics.

FIG. 128(*e*) shows a conventional example disclosed in the following Non-Patent Document 1 which describes an SGT inverter formed on an SOI substrate using the same production methods as those in FIGS. 128(*a*) to 128(*d*). In this conventional example, an inverter is formed on an SOI substrate. This eliminates a need for forming a well, and allows an element isolation width to be reduced, so that an occupancy area of the inverter can be reduced by just a reduction in element isolation width, as compared with those of the inverters having similar structures as illustrated in FIGS. 128 (*a*) and 128(*b*).

This inverter will be specifically described below. As shown in FIG. 128(*e*), an $N^+$ source diffusion layer 1572 and a $P^+$ source diffusion layer 1573 are formed on a buried oxide film 1571. An NMOS-forming pillar-shaped silicon layer 1574 is formed on the $N^+$ source diffusion layer 1572, and a PMOS-forming pillar-shaped silicon layer 1575 is formed on the $P^+$ source diffusion layer. Further, an $N^+$ drain diffusion layer 1576 is formed in an upper portion of the NMOS-forming pillar-shaped silicon layer 1574, and a $P^+$ drain diffusion layer 1577 is formed in an upper portion of the PMOS-forming pillar-shaped silicon layer 1575. A gate 1578 is formed around the pillar-shaped silicon layers. The $N^+$ source diffusion layer 1572 is connected to a ground potential via a contact extending from a line layer 1579, and the $P^+$ source diffusion layer 1573 is connected to a power supply potential via a contact extending from a line layer 1580. The diffusion layer (1576, 1577) in the upper portion of each of the NMOS-forming and PMOS-forming pillar-shaped silicon layers is connected to an output potential via a contact extending from a line layer 1581.

In this conventional example, an output potential is formed on the side of the lines, as with the inverters illustrated in FIGS. 128(*a*) and 128(*b*), and therefore there is a need for element isolation on the side of the substrate. However, this inverter using an SOI substrate is free of the need for forming a well, so that a required element isolation width can be achieved simply by isolating between the source diffusion layers 1572, 1573 through etching. This makes it possible to reduce an occupancy area by just a reduction in element isolation width, as compared with the inverters using a LOCOS technique for element isolation as illustrated in FIGS. 128(*a*) and 128(*b*). Nevertheless, this conventional example also involves a problem of a relatively large parasitic resistance in the source diffusion layer, causing degradation in circuit performance.

As above, all the inverters illustrated in FIGS. 128(*a*) to 128(*e*) are incapable of avoiding deterioration in circuit performance due to a parasitic resistance of the source diffusion layer.

FIGS. 129(*a*) to 129(*e*) show a schematic process flow for forming a pillar-shaped silicon layer and a gate electrode, in the SGTs illustrated in FIGS. 128(*a*) to 128(*e*). This process flow will be described below.

In FIG. 129(*a*), a silicon oxide film 1601, a gate conductive material 1602 and a silicon oxide film 1603 are formed on a silicon substrate in this order.

In FIG. 129(*b*), a contact hole 1604 is formed to penetrate through the silicon oxide film 1603, the gate conductive material 1602 and the silicon oxide film 1601.

In FIG. 129(*c*), a gate dielectric film 1605 is formed on an inner wall of the contact hole. In FIG. 129(*d*), a silicon film is formed inside the contact hole by epitaxial growth, to form a pillar-shaped silicon layer 1606. In FIG. 129(*e*), an upper portion of the pillar-shaped silicon layer is isolated.

In this SGT forming method, if the contact hole for forming the pillar-shaped silicon layer, and a gate line pattern, are formed by a single lithography process, gate patterning becomes complicated, and it is significant difficult to form a gate electrode of an SGT to have a sufficiently small film thickness. Thus, an area to be occupied by the gate electrode is increased. Otherwise, if the contact hole for forming the pillar-shaped silicon layer, and the gate line pattern, are formed by separate lithography processes, an area to be occupied by the gate electrode surrounding the pillar-shaped silicon layer must be formed to have an unnecessarily large size, in consideration of positional mismatching and dimensional error between the two processes. Consequently, in either case, an area occupied by the gate electrode becomes greater than an actually required area to cause an increase in circuit occupancy area.

The following point can be pointed out as a major difference between the above two SGT forming methods.

In the first method, the pillar-shaped silicon layer is formed by etching a single-crystal silicon substrate, so that a defect and irregularities in a channel region arising from etching or the like can be easily recovered by performing a surface treatment, such as sacrificial oxidation or hydrogen annealing (see the following Non-Patent Document 2). Thus, a high carrier mobility can be achieved in the channel region to facilitate obtaining high-performance transistor characteristics.

Differently, in the second method, the pillar-shaped silicon layer is formed of silicon epitaxially grown inside the contact hole. Generally, a sidewall of the contact hole has irregularities occurring during etching, and it is difficult to eliminate such irregularities. Consequently, the irregularities are transferred to a surface of a channel region formed in the sidewall of the contact hole to cause deterioration in carrier mobility and difficulty in forming a high-performance transistor. Moreover, considering that a size of the contact hole in currently produced LSIs in the 65-nm generation is about 80 nm, and the contact hole will become finer and finer in the future, it is difficult to form an epitaxial silicon film from the side of a bottom of such a fine contact hole, in adequate yield.

Patent Document 1: JP 2-188966A
Patent Document 2: JP 7-99311A
Non-Patent Document 1: S. Maeda, et al., "Impact of a Vertical Φ-Shape Transistor Cell for 1 Gbit DRAM and Beyond", IEEE TRANSACTIONS ON ELECTRON DEVICES, December 1995, VOL. 42, NO. 12, pp. 2117-2124
Non-Patent Document 2: Y.-K Choi, et al., "FinFET Process Refinements for Improved Mobility and Gate Work Function Engineering", International Electron Devices Meeting Technical Digest, 2002, p. 259

Thus, in terms of achieving an SGT capable of high integration and high performance and producible in high yield, the SGT structure and forming method based on the first method is superior to the SGT structure and forming method based on the second method. However, the SGT structure and forming method based on the first method has the following problems.

Firstly, there remains a need for achieving a reduction in area of each element, and element isolation excellent in area efficiency, to reduce a circuit occupancy area. Secondly, there remains a need for reducing a parasitic capacitance and a parasitic resistance of a source/drain region to improve transistor performance. Thirdly, there remains a need for achieving a gate-line forming process having a wide process margin.

SUMMARY OF THE INVENTION

In view of the above problems, it is an object of the present invention to propose an SGT capable of higher integration and higher performance as compared with the conventional SGTs.

In accordance with a first aspect of the present invention, there is provided a semiconductor device comprising a circuit which has a connection between one of a drain region and a source region of a first MOS transistor and one of a drain region and a source region of a second MOS transistor. The semiconductor device comprises: a substrate; a dielectric film on the substrate; and a planar semiconductor layer formed on the on-substrate dielectric film, wherein: the first MOS transistor includes a first drain or source region formed in the planar semiconductor layer, a first pillar-shaped semiconductor layer formed on the planar semiconductor layer, a second source or drain region formed in an upper portion of the first pillar-shaped semiconductor layer, and a first gate electrode formed in such a manner that the first gate electrode surrounds a sidewall of the first pillar-shaped semiconductor layer through a first dielectric film; and the second MOS transistor includes a third drain or source region formed in the planar semiconductor layer, a second pillar-shaped semiconductor layer formed on the planar semiconductor layer, a fourth source or drain region formed in an upper portion of the second pillar-shaped semiconductor layer, and a second gate electrode formed in such a manner that the second gate electrode surrounds a sidewall of the second pillar-shaped semiconductor layer through a second dielectric film, and wherein a first silicide layer is formed to connect at least a part of a surface of the first drain or source region and at least a part of a surface of the third drain or source region, wherein the first silicide layer is formed in an area other than an area in which a contact for at least the first drain or source region and the third drain or source region is formed.

For example, the first gate electrode and the second gate electrode are connected through a gate line extending from the first gate electrode and the second gate electrode, wherein a contact formed on the gate line is formed in an area between the first pillar-shaped semiconductor layer and the second pillar-shaped semiconductor layer.

For example, the semiconductor device further comprises a gate line, wherein the gate electrodes are integrally formed with the gate line in such a manner that top surfaces of the gate electrodes and the gate line have a same height and an entire area of a top surface of the integrated combination of the gate electrode and the gate line becomes parallel to the substrate, wherein a contact for the gate electrode is provided in such a manner as to be in contact with the top surface formed parallel to the substrate.

For example, the semiconductor device further comprises a third dielectric film interposed between the first dielectric film formed beneath a first gate electrode and a gate line extending from the first gate electrode and a second gate electrode and a gate line extending from the second gate electrode, and the planar semiconductor layer including the first drain or source region or the third drain or source region or the on-substrate dielectric film, wherein the third dielectric film has a thickness more than that of the first dielectric film.

For example, one or each of the first and second MOS transistors comprises a plurality of the pillar-shaped semiconductor layers, wherein a single common contact is formed commonly on source or drain regions formed in the upper portion of at least two said pillar-shaped semiconductor layers, the source or drain regions being connected to each other through the single common contact.

For example, the second source or drain region and the first gate electrode are connected through a single common contact.

For example, the first drain or source region and the gate line extending from the first gate electrode are connected through a single common contact.

For example, the gate electrodes are formed in a layered structure which comprises a thin metal film and a polysilicon layer, wherein the thin metal film is interposed between the polysilicon layer, and the first dielectric film formed on each of the pillar-shaped semiconductor layers, the first and third drain or source regions, and the first dielectric film formed on the on-substrate dielectric film.

For example, the semiconductor device further comprises a silicide layer formed on a top surface of the polysilicon layer of the integrated combination of the gate electrode and the gate line.

In accordance with a second aspect of the present invention, there is provided a method of producing a semiconductor device including a MOS transistor. The method comprises the steps of: forming a planar semiconductor layer on a dielectric film on a substrate and a plurality of pillar semiconductor layers on the planar semiconductor layer; isolating the planar semiconductor layer as an element; forming a drain or source region in the planar semiconductor layer; thereafter forming a first dielectric film on a surface of the resulting product; forming a conductive film on the first dielectric film to allow the pillar-shaped semiconductor layers to be buried therein; etching back the first dielectric film and the conductive film to allow each of the first dielectric film and the conductive film to have a height of a gate length; selectively removing by etching the remaining first dielectric film and the remaining conductive film including a portion of each of them corresponding to a portion in which the after-mentioned first silicide layer is formed, to form a gate electrode formed around each of the pillar-shaped semiconductor layers and a gate line integrated with the gate electrode; forming a source or drain region in an upper portion of each of the pillar-shaped semiconductor layers to have a same conductivity type as that of a portion of the drain or source region formed in the planar semiconductor layer beneath the pillar-shaped semiconductor layer; and forming a first silicide layer for connecting at least a part of a surface of the drain or source region formed in the planar semiconductor layer of each of first MOS transistors and at least a part of a surface of the drain or source region formed in the planar semiconductor layer of each of second MOS transistors, wherein each of the first and second MOS transistors is one of a plurality of MOS transistors corresponding to respective ones of the plurality of pillar-shaped semiconductor layers.

For example, the conductive film is a layered structure film comprising a thin metal film on the side of the first dielectric film, and a polysilicon film.

For example, the method further comprises the step of forming a third dielectric film on a surface of the resulting product, to have a height approximately equal to that of a lower end of a part to be a channel of each of the pillar-shaped semiconductor layers between the step of forming the drain or source region in the planar semiconductor layer and the step of forming the first dielectric film, wherein the forming the gate electrode and the gate line integrated with the gate electrode is selectively removing by etching the conductive film, the first dielectric film and the third dielectric film including a portion of each of them corresponding to a portion in which the after-mentioned first silicide layer is formed, to form a gate electrode formed around each of the pillar-shaped semiconductor and a gate line integrated with the gate electrode.

For example, the conductive film is a layered structure film comprising a thin metal film on the side of the first dielectric film, and a polysilicon film.

The semiconductor device of the present invention is capable of employing a substrate with an on-substrate dielectric film to facilitate a reduction in element isolation width, and stably forming a silicide layer for mutually connecting transistors, while forming a gate electrode around a pillar-shaped semiconductor layer in a self-alignment manner and with a desired film thickness. This simultaneously makes it possible to achieve element isolation capable of reducing an area of an element and enhancing area efficiency, a reduction in circuit occupancy area, a reduction in parasitic resistance and parasitic capacitance which would otherwise be increased along with a reduction in size, and enhanced flexibility in circuit design. Specifically, in a structure intended to mutually connect transistors in a diffusion layer formed in a planar semiconductor layer formed on a substrate with an on-substrate dielectric film, a stable silicide layer can be obtained by forming a silicide layer in an upper portion of the planar semiconductor layer. Based on this silicide layer, the resistance which would otherwise be increased along with a reduction in size can be reduced. Particularly, in a structure intended to mutually connect transistors having different conductivity types, the silicide layer capable of directly connecting diffusion layers having different conductivity types therethrough allows the transistors to be arranged closer to each other, so that an occupancy area of a circuit, such as an inverter circuit, can be significantly reduced as compared with conventional SGTs. In addition, the silicide layer capable of reducing the resistance which would otherwise be increased along with a reduction in size can minimize a need for arranging the transistors in positions closest to each other, so as to enhance flexibility in circuit design. Furthermore, the use of the substrate with an on-substrate dielectric film allows a parasitic resistance of a drain or source diffusion layer to be reduced.

According to the production method of the present invention, a gate electrode can be formed around a pillar-shaped silicon layer in a self-alignment manner and by a desired film thickness. This makes it possible to densely arrange a plurality of pillar-shaped silicon layers having different gate electrodes so as to reduce a circuit occupancy area. In addition, a process having sufficient process margin for forming a gate line can be established to facilitate gate line formation which has been a challenge in SGT.

Figure 120:
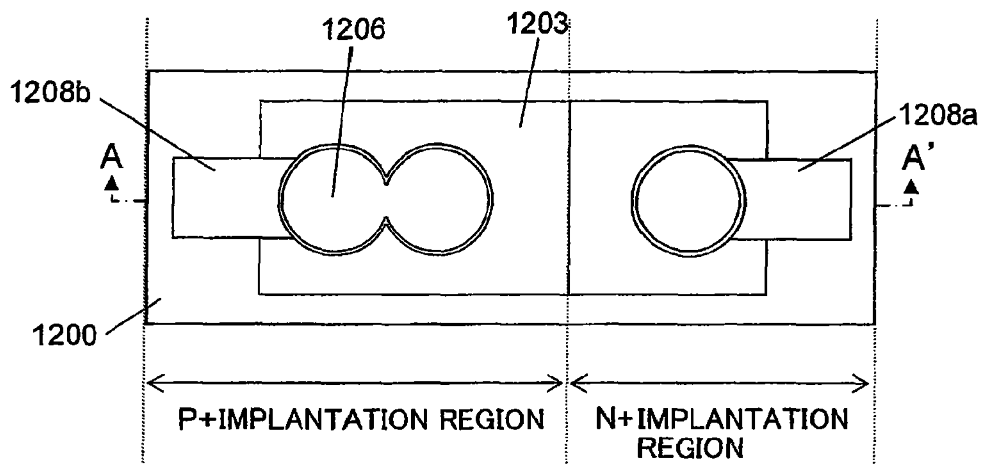
Figure 120:
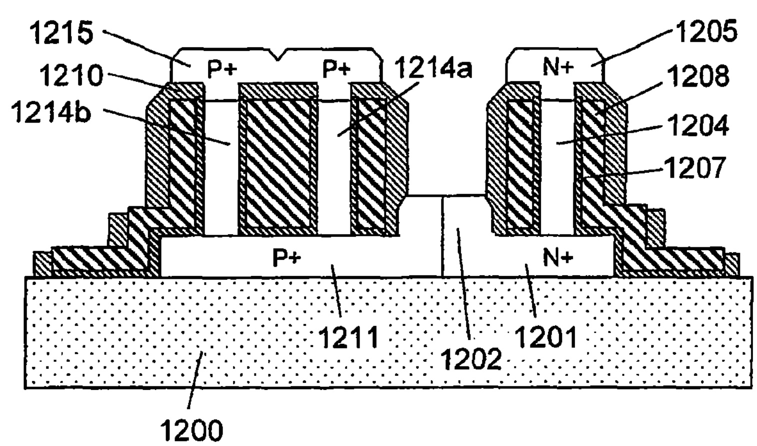

FIGS. 120(*a*) and 120(*b*) illustrate a part of production processes in the twelfth embodiment.

Figure 121:
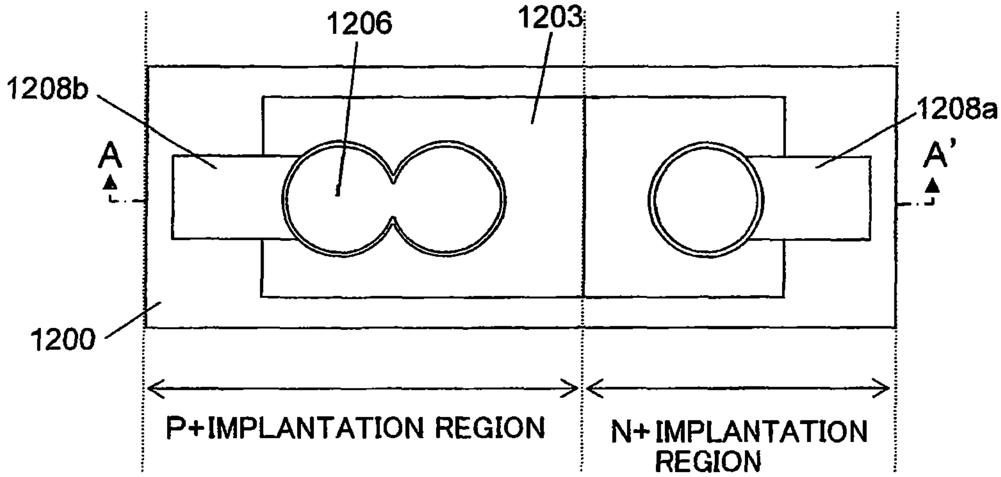
Figure 121:
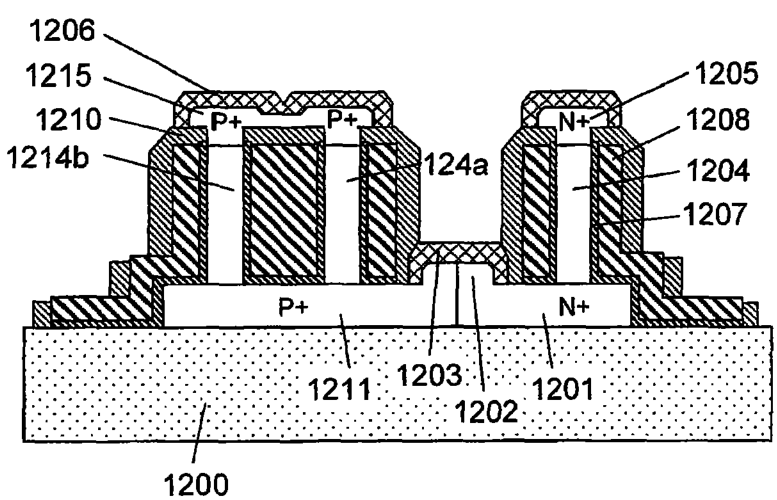

FIGS. 121(*a*) and 121(*b*) illustrate a part of production processes in the twelfth embodiment.

Figure 122:
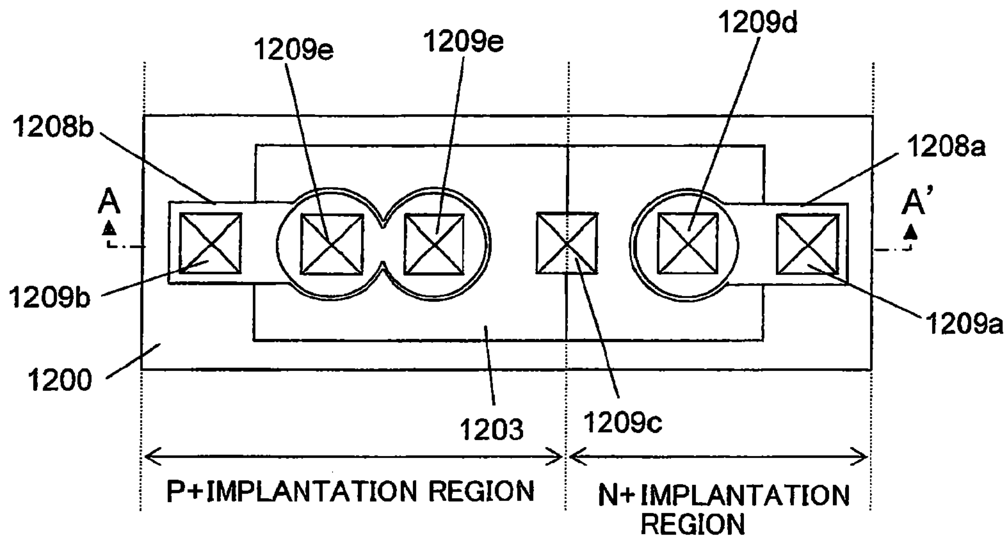
Figure 122:
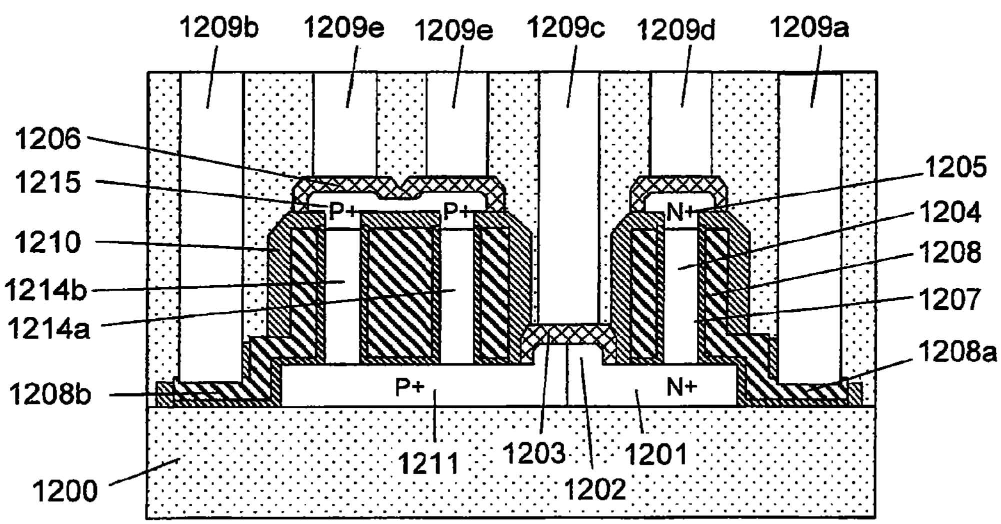

FIGS. 122(*a*) and 122(*b*) illustrate a part of production processes in the twelfth embodiment.

Figure 123:
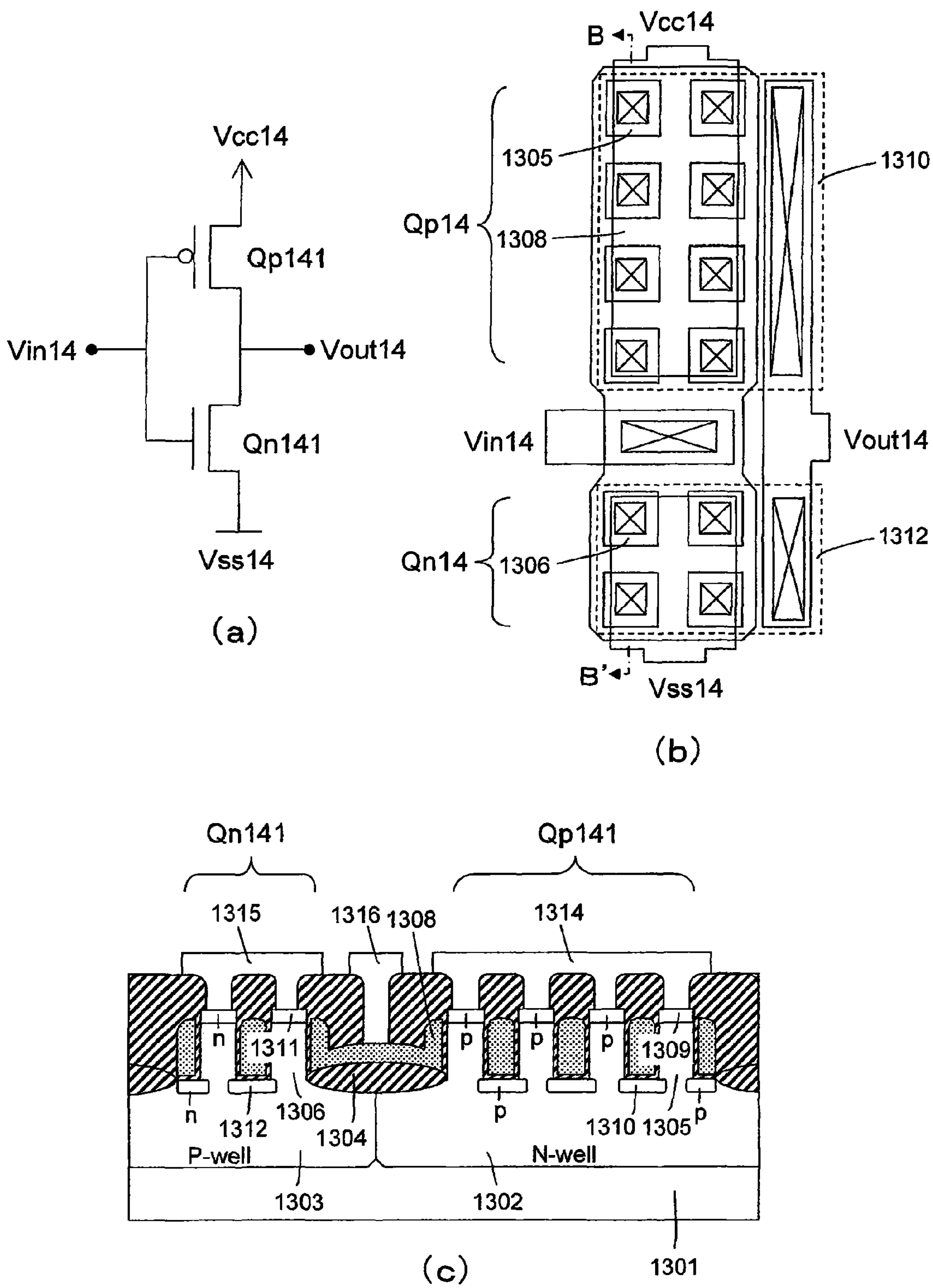

FIGS. 123(*a*) to 123(*c*) illustrate a conventional vertical transistor.

Figure 124:
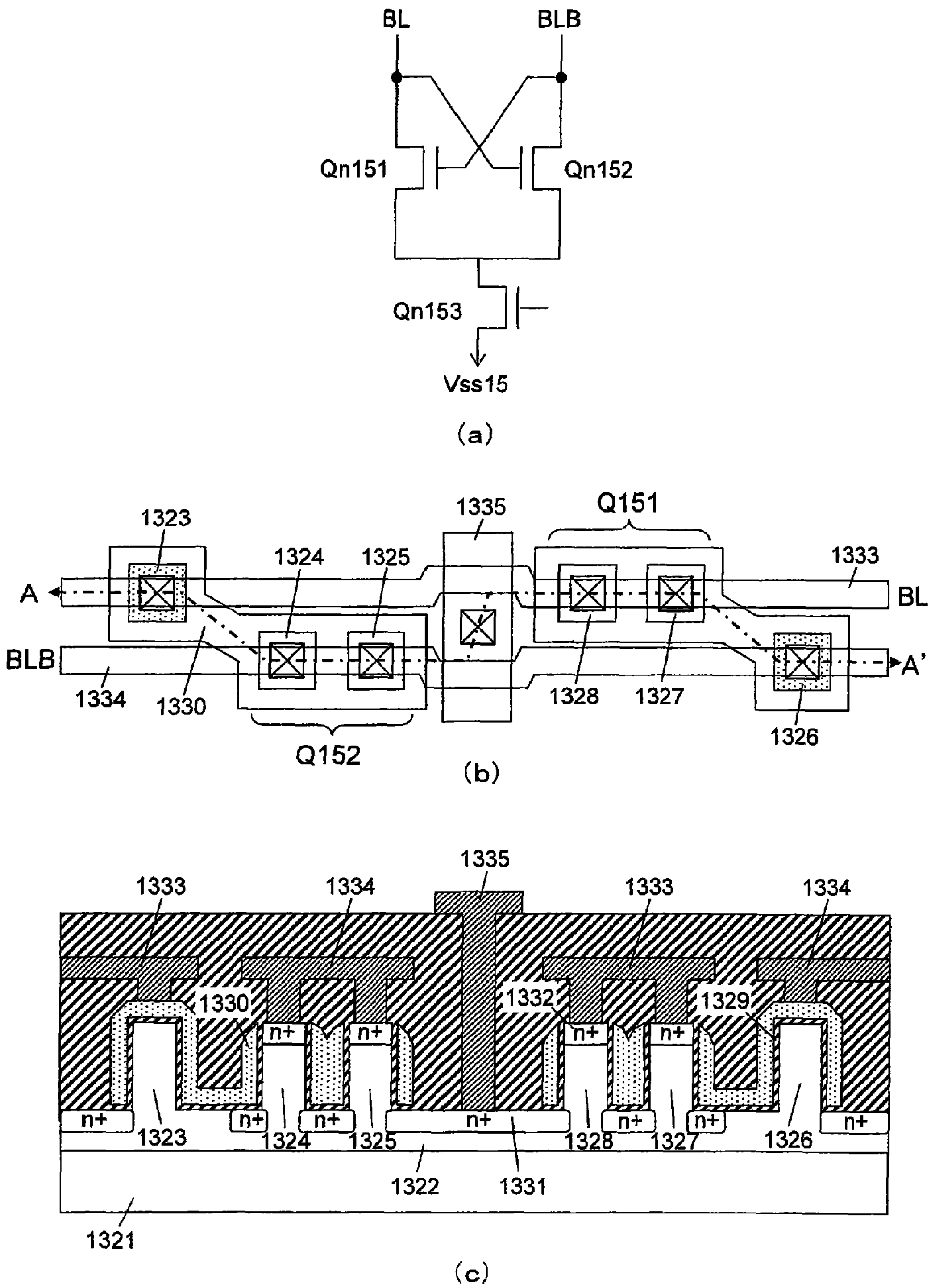

FIGS. 124(*a*) to 124(*c*) illustrate a conventional vertical transistor.

Figure 125:
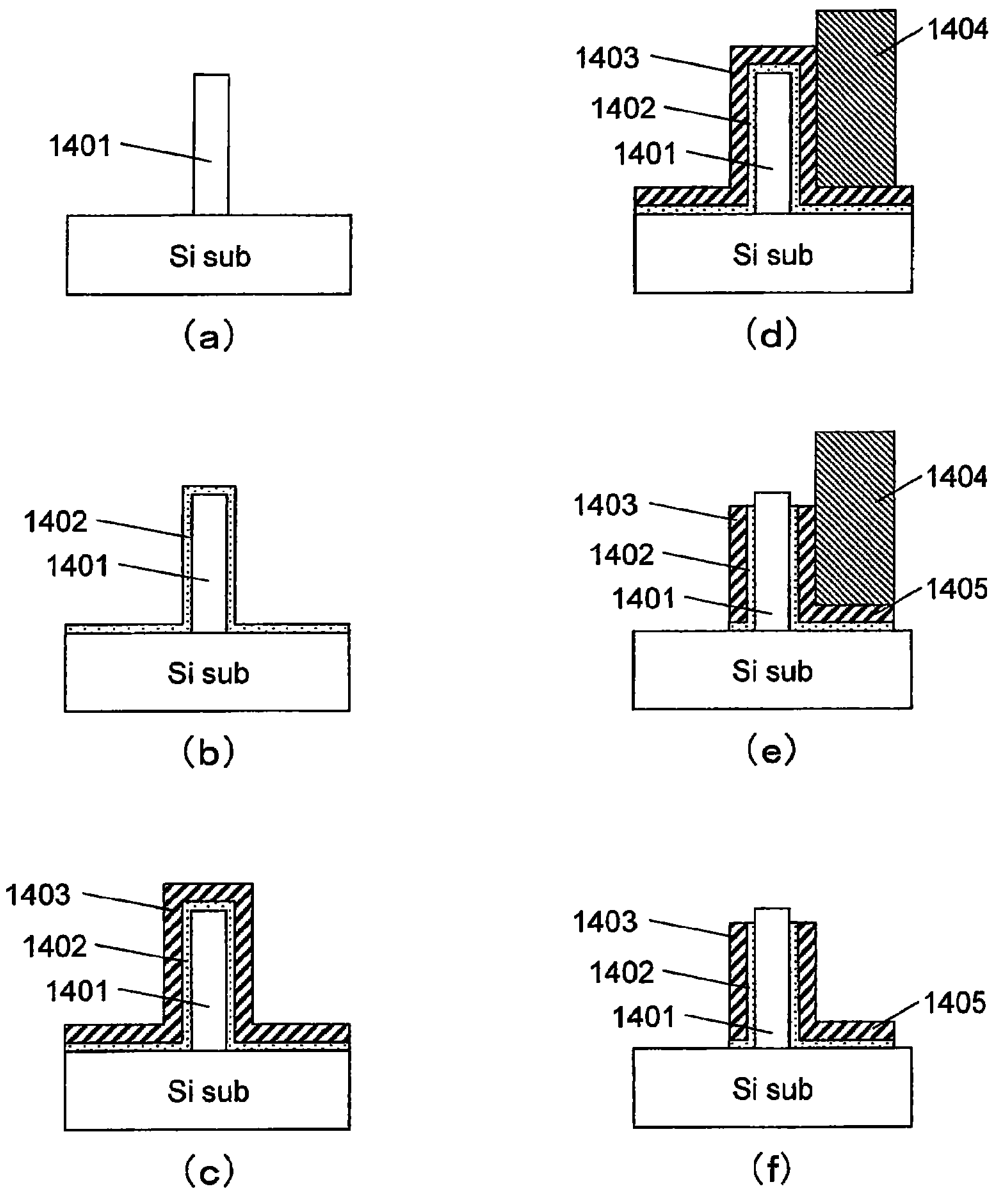

FIGS. 125(*a*) to 125(*f*) illustrate a production method for a conventional vertical transistor.

Figure 126:
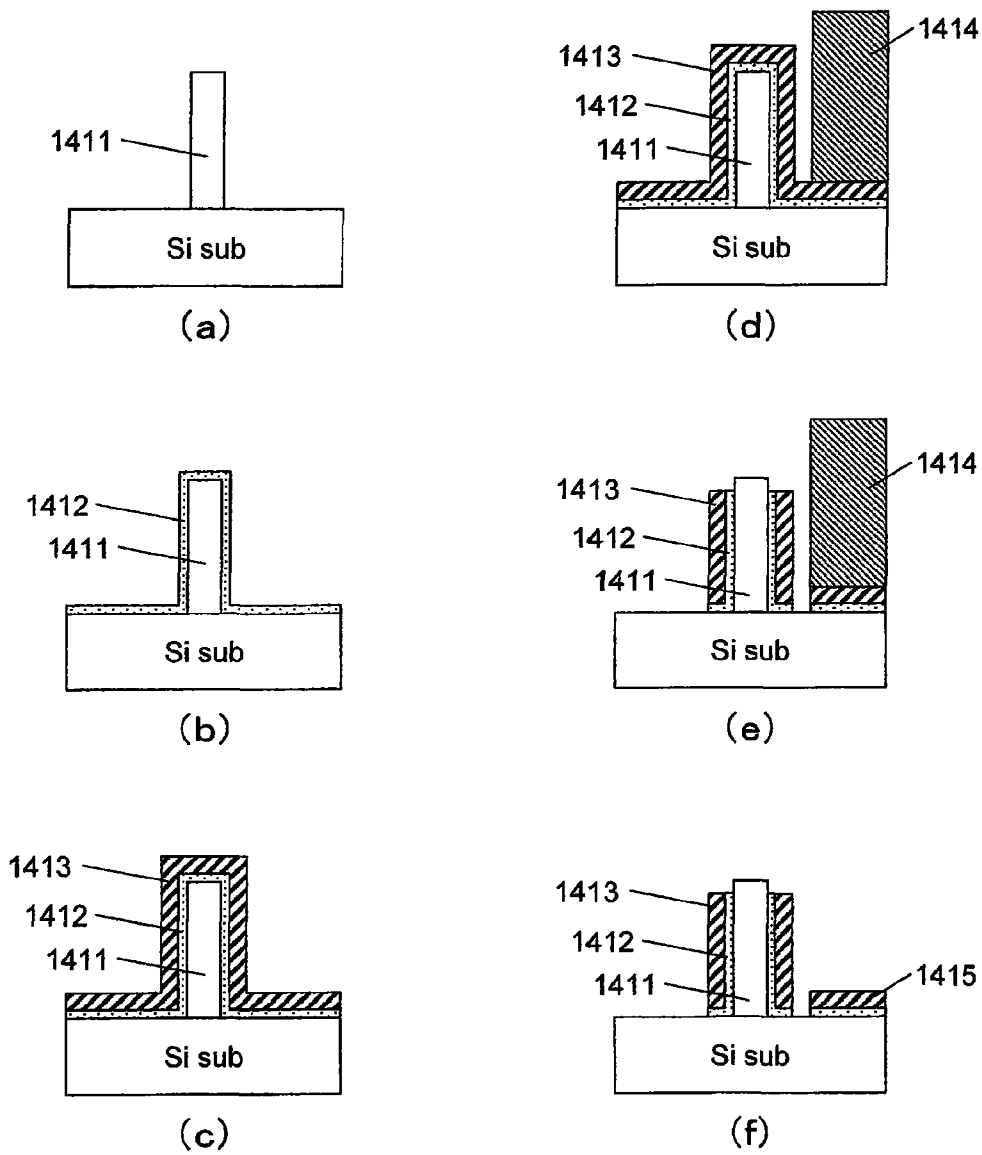

FIGS. 126(*a*) to 126(*f*) illustrate a production method for a conventional vertical transistor.

Figure 127:
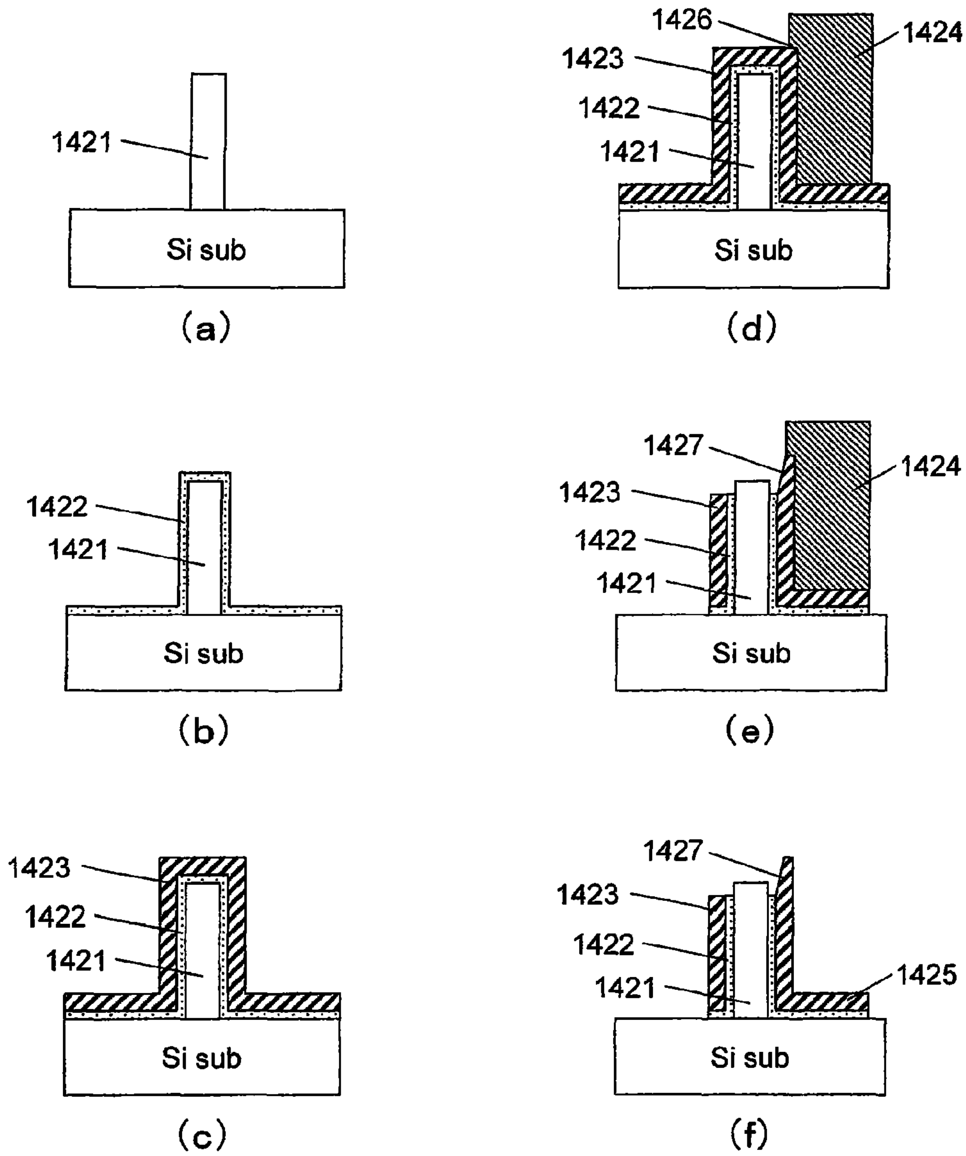
Figure 128A:
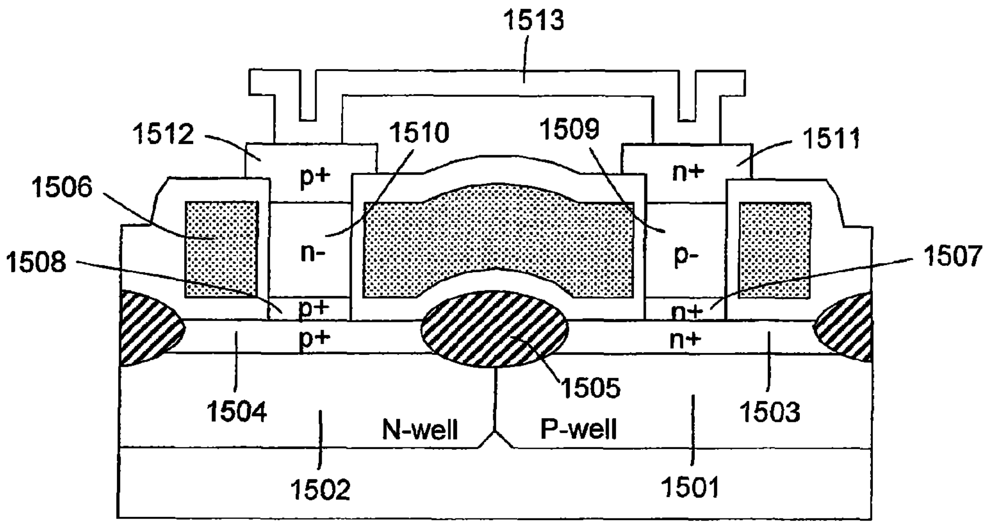
Figure 128B:
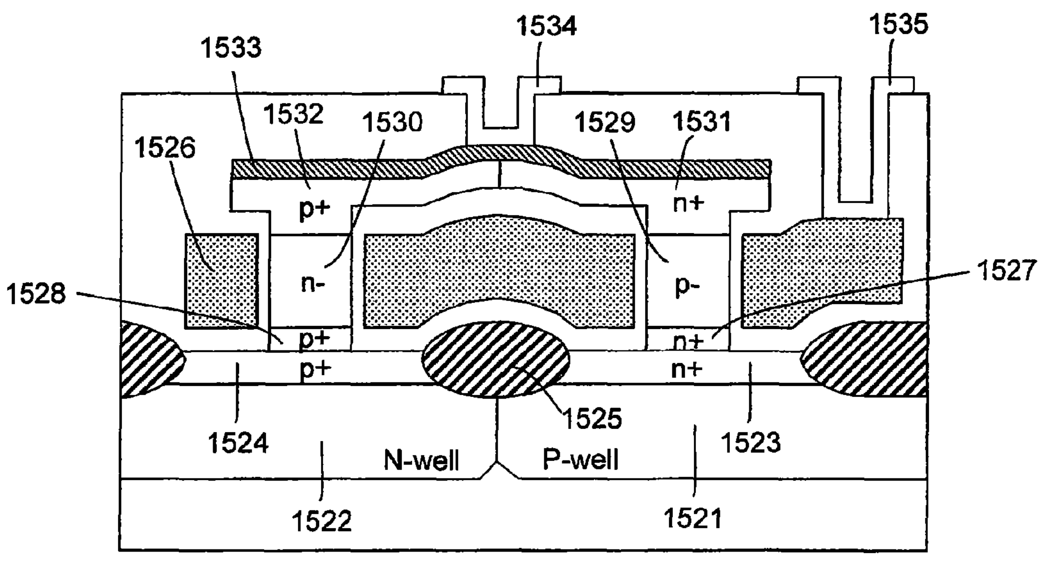
Figure 128C:
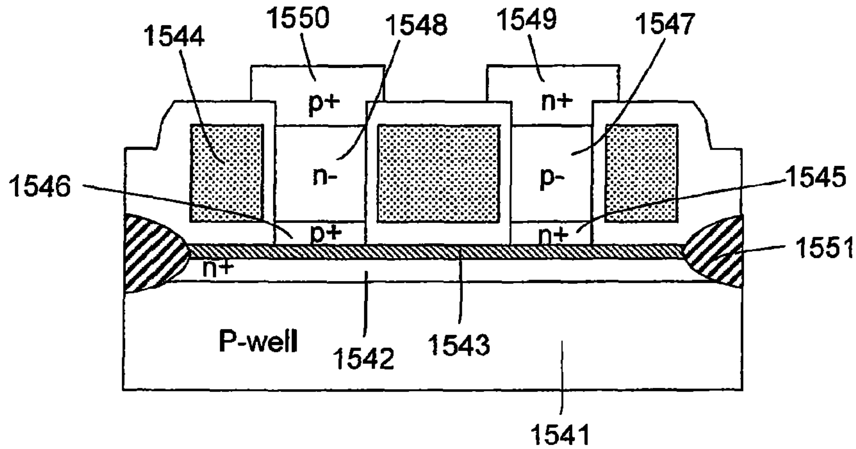
Figure 128D:
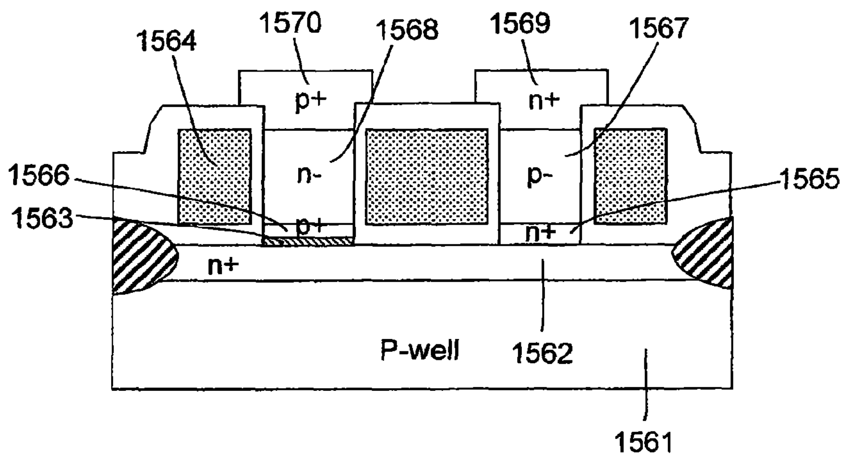
Figure 128E:
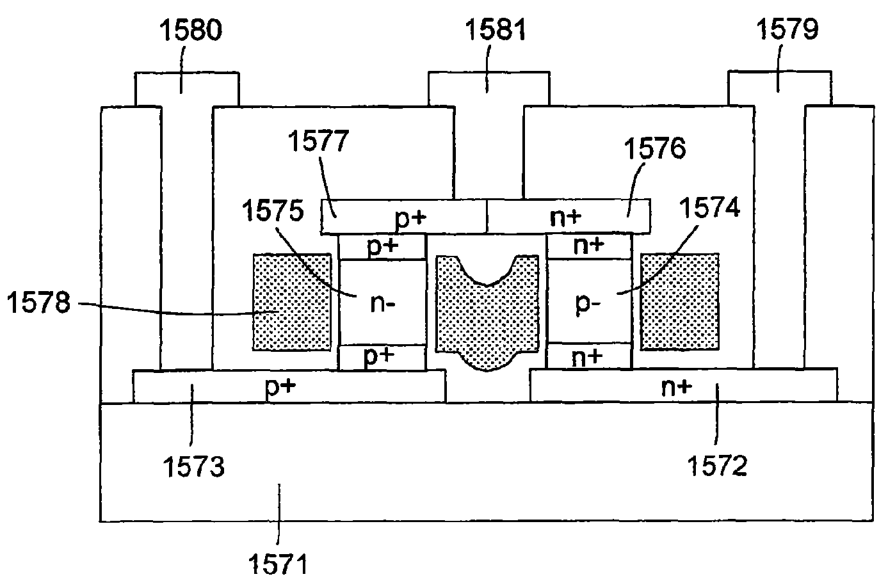

FIGS. 127(*a*) to 127(*f*) illustrate a production method for a conventional vertical transistor.

FIG. 128(*a*) illustrates a conventional vertical transistor.

FIG. 128(*b*) illustrates a conventional vertical transistor.

FIG. 128(*c*) illustrates a conventional vertical transistor.

FIG. 128(*d*) illustrates a conventional vertical transistor.

FIG. 128(*e*) illustrates a conventional vertical transistor.

Figure 129:
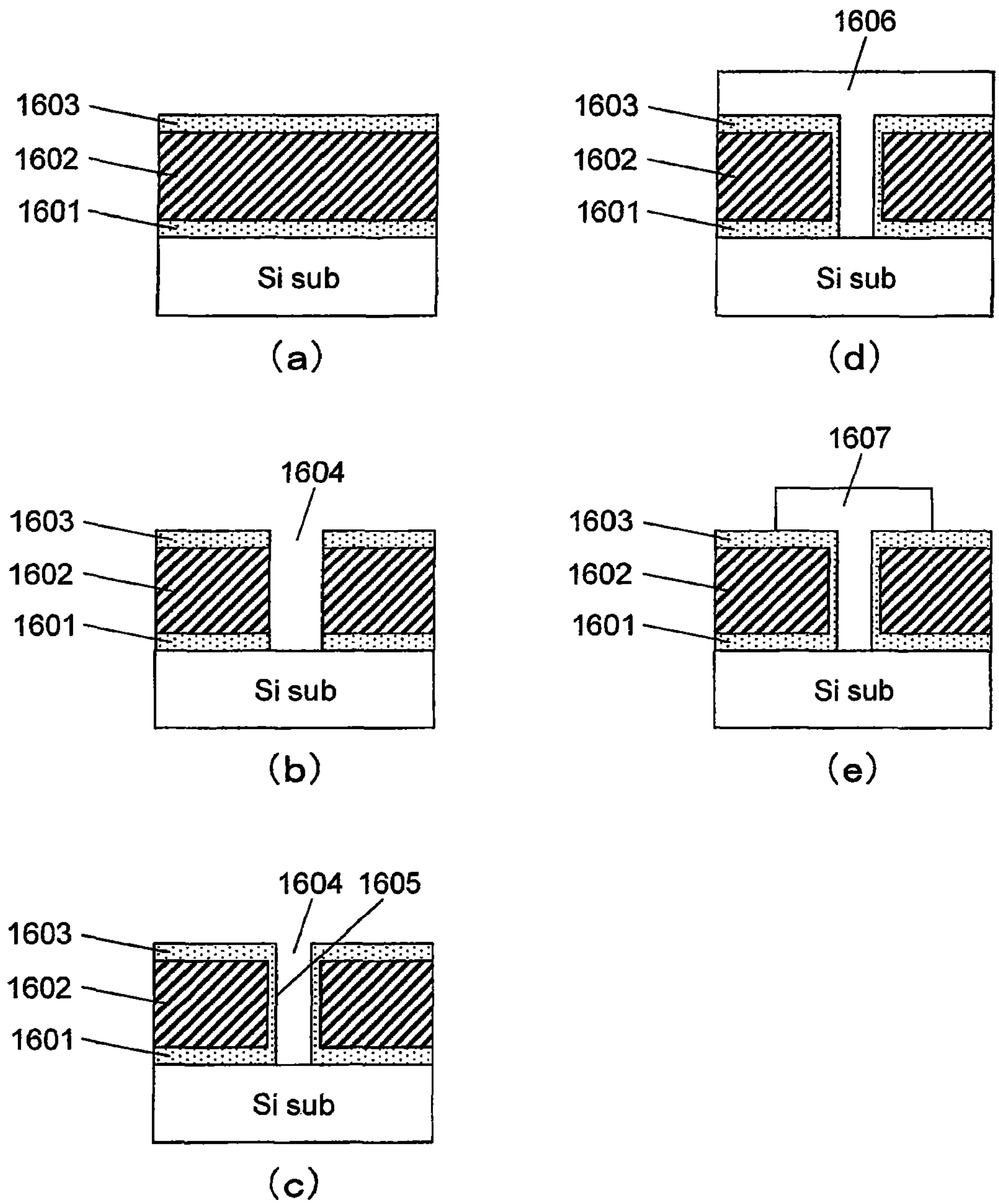

FIGS. 129(*a*) to (*e*) illustrate a production method for a conventional vertical transistor.

DETAILED DESCRIPTION OF THE PREFERRED EMBODIMENTS

Although the following embodiments of the present invention will be described by taking, for the sake of simplicity, a structure and a production method for a semiconductor device comprising an inverter circuit with a simple configuration, as an example of a structure and a production method for a semiconductor device comprising a transistor-based circuit, it would be apparent to those skilled in the art that the present invention can be applied to a structure and a production method for a semiconductor device comprising any other type of transistor-based circuit.

First Embodiment

Figure 1:
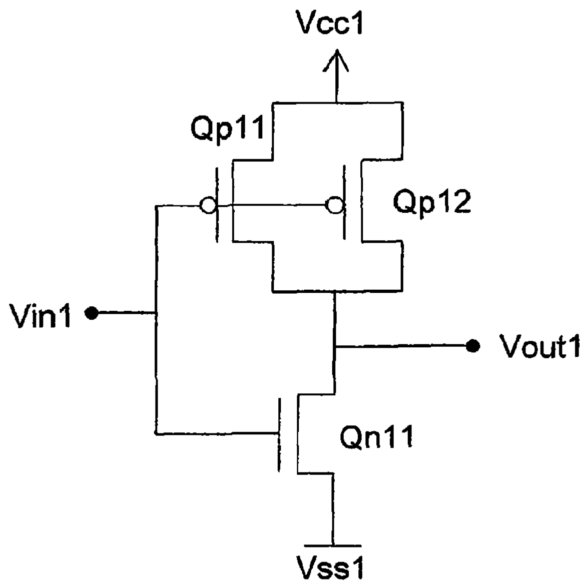
FIG. 1 is an equivalent circuit diagram of a CMOS inverter according to a first embodiment of the present invention.

FIG. 1 is an equivalent circuit diagram of a CMOS inverter according to a first embodiment of the present invention. A circuit operation of the CMOS inverter will be described below. An input signal Vin 1 is applied to a gate of an NMOS Qn 11 and respective gates of two PMOSs Qp 11, Qp 12. When the Vin 1 is "1", the NMOS Qn 11 is placed in an ON state, and each of the PMOSs Qp 11, Qp 12 is placed in an OFF state, so that an output signal Vout 1 becomes "0". Reversely, when the Vin 1 is "0", the NMOS Qn 11 is placed in an OFF state, and each of the PMOSs Qp 11, Qp 12 is placed in an ON state, so that the Vout 1 becomes "1". As above, the CMOS inverter is operable to allow the output signal Vout 1 to have a value opposite to that of the input signal Vin 1.

Figure 2:
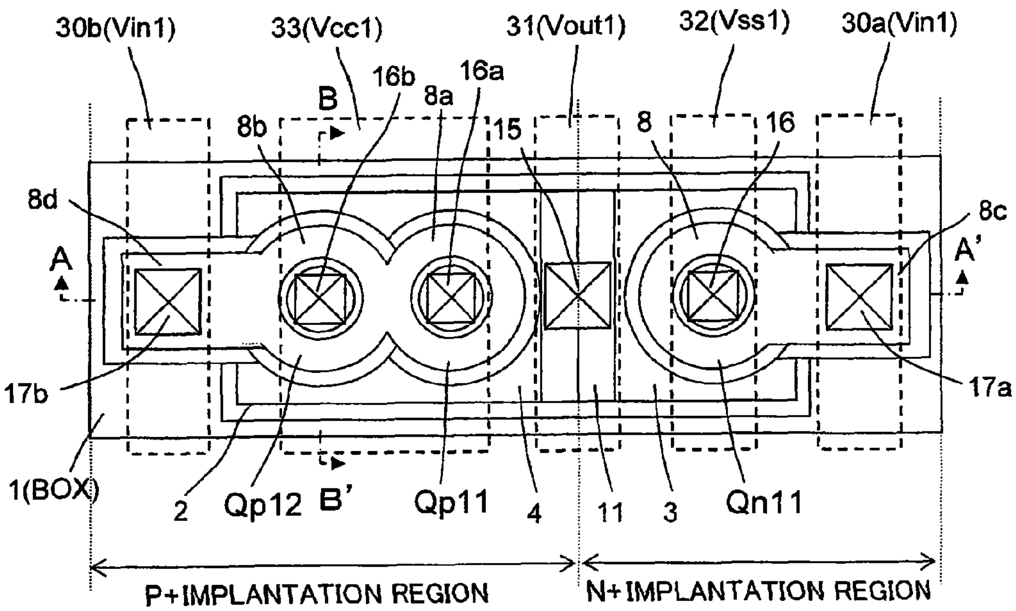
FIG. 2 is a top plan view of the CMOS inverter according to the first embodiment.
Figure 3:
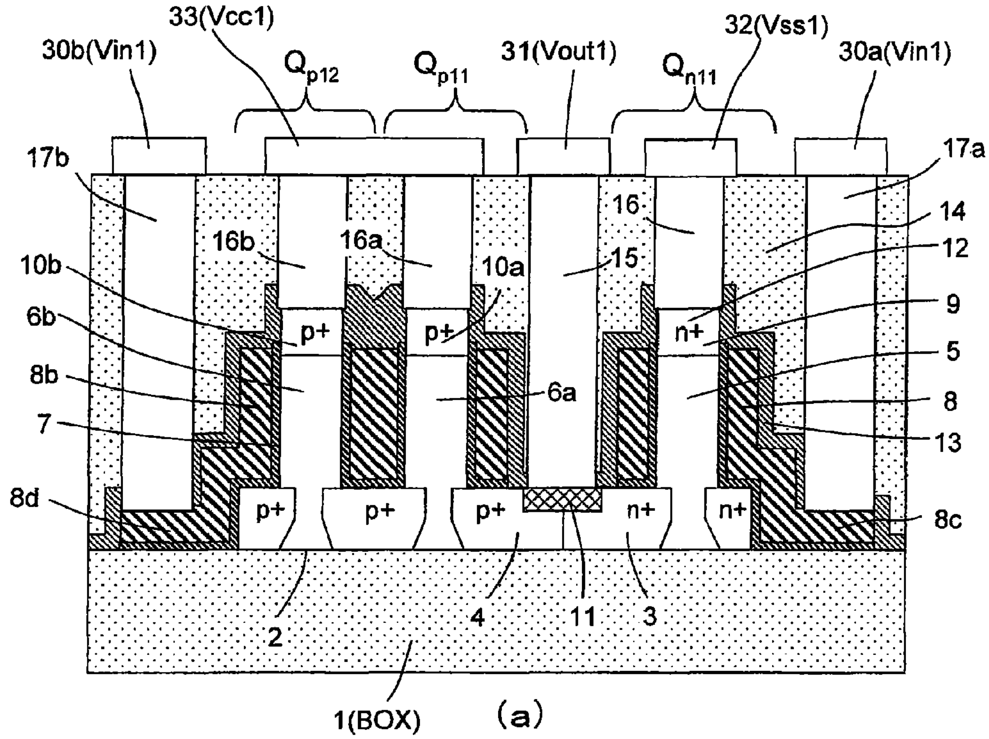
FIGS. 3(*a*) and 3(*b*) are sectional views of the CMOS inverter according to the first embodiment.
Figure 3:
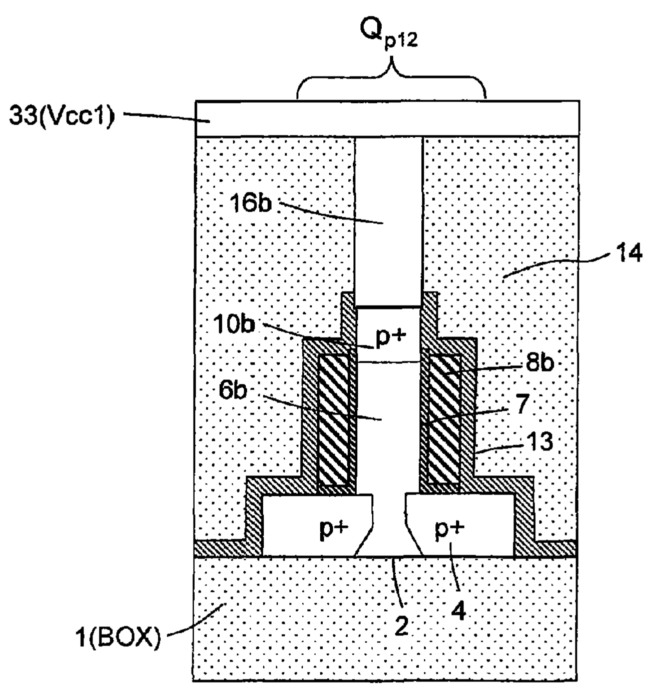

FIG. 2 is a top plan view of the CMOS inverter according to the first embodiment. FIGS. 3(*a*) and 3(*b*) are sectional views taken along the cutting-plane line A-A' and the cutting-plane line B-B' in FIG. 2, respectively. With reference to FIGS. 2, 3(*a*) and 3(*b*), a structure of the CMOS inverter according to the first embodiment will be described.

A planar silicon layer 2 is formed on a buried oxide film layer 1. The planar silicon layer 2 comprises an $N^+$ drain diffusion layer 3 and a $P^+$ drain diffusion layer 4, wherein a silicide layer is formed in a surface around a boundary between the $N^+$ drain diffusion layer 3 and the $P^+$ drain diffusion layer 4 to allow the $N^+$ drain diffusion layer 3 and the $P^+$ drain diffusion layer 4 to be directly connected to each other therethrough. This eliminates a need for a contact for connecting the $N^+$ drain diffusion layer 3 and the $P^+$ drain diffusion layer 4 and element isolation therebetween, so that an inverter occupancy area can be reduced.

In addition, element isolation can be performed simply by isolating the planar silicon layer 2 as an element, so that the element isolation can be achieved while reducing the number of processes and minimizing a processing size. The NMOS transistor Qn 11 is formed based on a pillar-shaped silicon layer 5 formed on the $N^+$ drain diffusion layer 3, and the PMOS transistor (Qp 11, Qp 12) is formed based on a pillar-shaped silicon layer (6*a*, 6*b*) formed on the $P^+$ drain diffusion layer 4. A first dielectric film 7, such as a high-k film, such as a $HfO_2$ film, is formed to surround the pillar-shaped silicon layer (5, 6*a*, 6*b*), and a gate electrode (8, 8*a*, 8*b*) consisting of a metal film, such as a TaN film or a TiN film, is formed to surround the first dielectric film 7. An $N^+$ source diffusion layer 9 is formed in an upper portion of the NMOS-forming pillar-shaped silicon layer 5, and a $P^+$ source diffusion layer (10*a*, 10*b*) is formed in an upper portion of the PMOS-forming pillar-shaped silicon layer (6*a*, 6*b*). A silicon nitride film 13 is formed to cover the above elements so as to serve as a contact stopper. Further, an interlayer silicon oxide film 14 is formed on the silicon nitride film 13, and a contact (15, 16, 16*a*, 16*b*, 17*a*, 17*b*) is formed to penetrate through the silicon oxide film 14 having a flattened surface. The silicon nitride film 13 may be formed to have a stress so as to apply a stress to a channel region of the pillar-shaped silicon layer to improve carrier mobility. In particular, a silicon nitride film having a tensile stress, and a silicon nitride film having a compressive stress, may be formed on the NMOS and the PMOS, respectively, to improve carrier mobility in both the NMOS and the PMOS.

The contact 15 formed on the boundary between the $N^+$ drain diffusion layer 3 and the $P^+$ drain diffusion layer 4 is connected to the output terminal Vout 1 via a line layer 31, and the contact 16 formed on the NMOS (Qn 11)-forming pillar-shaped silicon layer 5 is connected to a ground potential Vss 1 via a line layer 32. Further, the contact (16*a*, 16*b*) formed on the PMOS (Qp 11, Qp 12)-forming pillar-shaped silicon layer (6*a*, 6*b*) is connected to a power supply potential Vcc 1 via a line layer 33, and each of the contact 17*a* formed on a gate line 8*c* extending from the gate electrode surrounding the NMOS-forming pillar-shaped silicon layer 5, and the contact 17*b* formed on a gate line 8*d* extending from the gate electrode surrounding the PMOS-forming pillar-shaped silicon layer (6*a*, 6*b*), is connected to the input terminal Vin 1 via a line layer (30*a*, 30*b*). In this manner, the inverter is formed.

Preferably, the channel region of each of the pillar-shaped silicon layers is doped with no impurity, or has an impurity concentration of 1 $e^{-17}$ $cm^{-3}$ or less. The reason is that, if the impurity concentration is greater than this value, a variation in transistor characteristics due to statistical fluctuation of impurities becomes large. A threshold adjustment of the transistor can be performed, for example, by adjusting a work function of a gate material. The first dielectric film, such as a high-k film may be a silicon oxide film or a silicon nitride film, and the metal gate electrode may be a silicided polysilicon film.

Preferably, an impurity distribution is set to allow the drain diffusion layer (3, 4) to be formed in a region ranging from a bottom of the pillar-shaped silicon layer to the buried oxide film layer 1, and the impurity concentration and a size of the pillar-shaped silicon layer are set to allow an inside of the pillar-shaped silicon layer to become fully depleted during a transistor operation. As a result of setting the impurity distribution to form the drain diffusion layer (3, 4) in the above region, the inside of the pillar-shaped silicon layer is kept in a floating body structure irrespective of an operation condition. In addition, as a result of setting the impurity concentration and the size of the pillar-shaped silicon layer in the above manner, the inside of the pillar-shaped silicon layer is fully depleted during a transistor operation, so that an electric field inside the pillar-shaped silicon layer can be relaxed to improve carrier mobility. Furthermore, as a result of diffusing an impurity to allow the drain diffusion layer (3, 4) to be formed in the region reaching the buried oxide film layer 1, a capacitance component in a bottom of the drain diffusion layer is significantly reduced, so that a total parasitic capacitance of the drain diffusion layer can be reduced. The impurity may be diffused to cover a bottom of the pillar-shaped silicon layer.

The structure where the contact (17*a*, 17*b*) for the gate is formed on the gate line (8*c*, 8*d*) formed on the buried oxide film layer, makes it possible to reduce an opposed area between the drain diffusion layer (3, 4) and the gate, so that a gate-drain parasitic capacitance can be reduced. In a layout illustrated in FIG. 2, with a view to reducing an opposed area between the gate line and the drain diffusion layer (3, 4), the contacts 17*a*, 17*b* for the respective gate lines 8*c*, 8*d* are formed on the buried oxide film layer 1 independently in corresponding ones of the NMOS and the PMOS.

Preferably, the contact 15 formed on the drain diffusion layers is located on the boundary between the $N^+$ drain diffusion layer 3 and the $P^+$ drain diffusion layer 4. The reason is that the pillar-shaped silicon layer (5, 6*a*) needs to be spaced apart from the boundary between the $N^+$ drain diffusion layer and the $P^+$ drain diffusion layer, by a distance corresponding to a margin against overlapping between the pillar-shaped silicon layer and an injection region, and this space can be effectively utilized by forming the contact on the boundary. This makes it possible to reduce an occupancy area of the inverter circuit.

Figure 4:
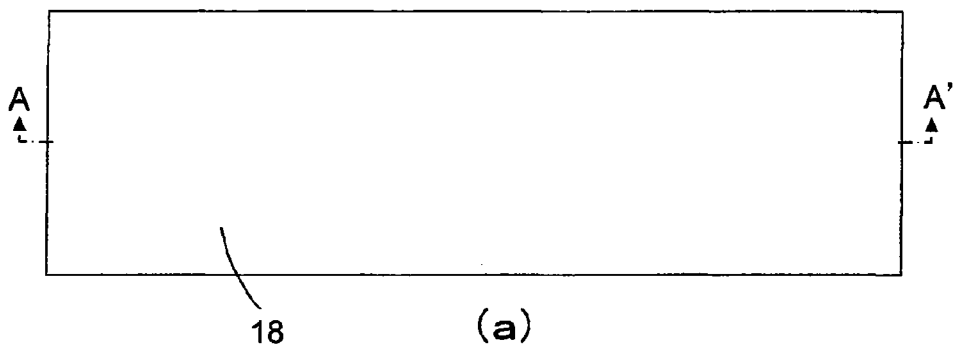
FIGS. 4(*a*) and 4(*b*) illustrate a part of production processes in the first embodiment.
Figure 4:
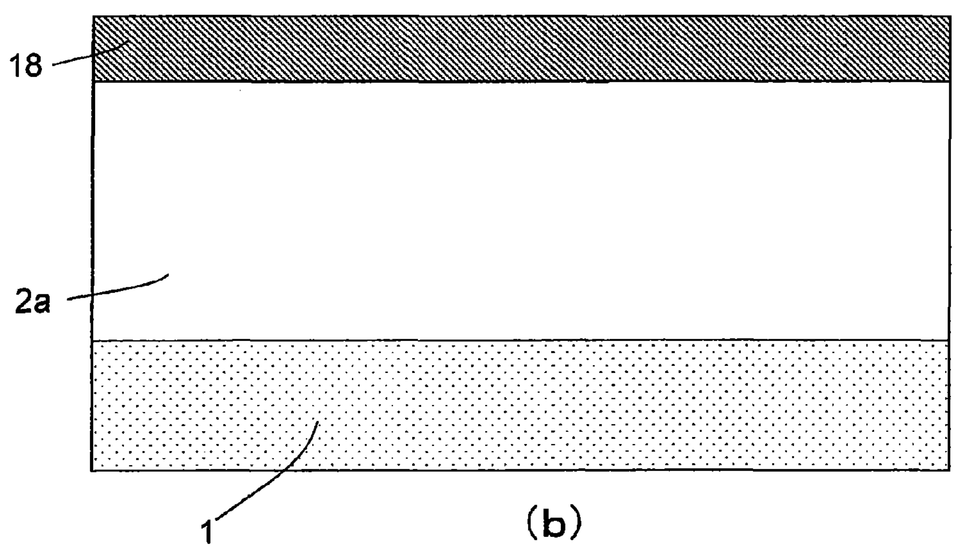

With reference to FIGS. 4(*a*) to 31(*b*), a method of forming the CMOS converter according the first embodiment, as one example of a semiconductor device production method of the present invention, will be described below. In FIGS. 4(*a*) to 31(*b*), the figure suffixed with (a) is a top plan view, and the figure suffixed with (b) is a sectional view taken along the line A-A'.

FIGS. 4 (*a*) and 4(*b*) show an SOI substrate having an impurity-undoped SOI layer 2*a* formed on a buried oxide film 1. A silicon nitride film 18 having a film thickness of about 50 to 100 nm is first formed on the SOI layer 2*a*.

Figure 5:
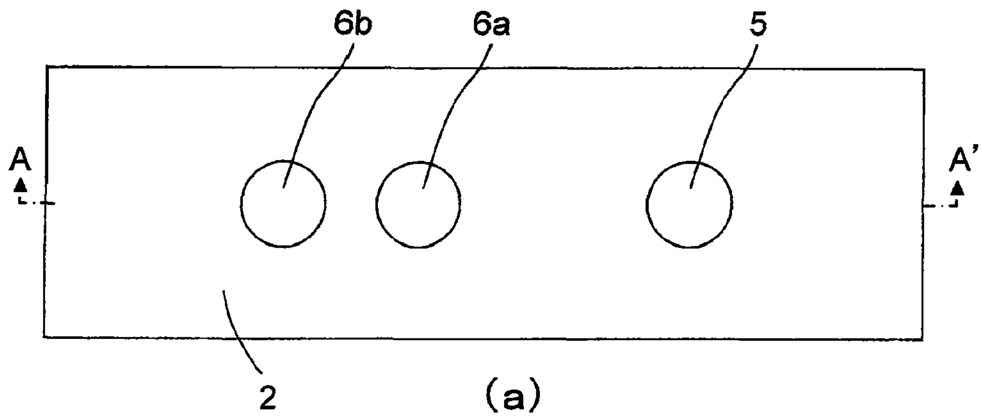
FIGS. 5(*a*) and 5(*b*) illustrate a part of production processes in the first embodiment.
Figure 5:
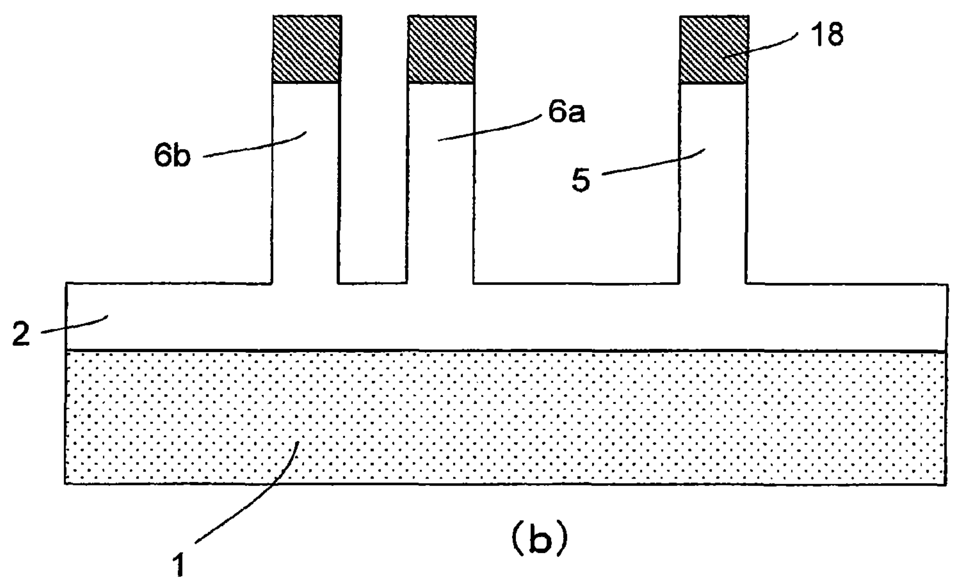

Then, as shown in FIGS. 5(*a*) and 5(*b*), the silicon nitride film 18 and the SOI layer 2*a* is etched by reactive ion etching, using a resist or a multilayer resist as a mask, to form a pillar-shaped silicon layer (5, 6*a*, 6*b*). The pillar-shaped silicon layer is formed to have a diameter of about 10 to 50 nm and a height dimension of about 50 to 200 nm. During this process, a planar silicon layer 2 is formed beneath the pillar-shaped silicon layer to have a thickness of about 10 to 100 nm.

Figure 6:
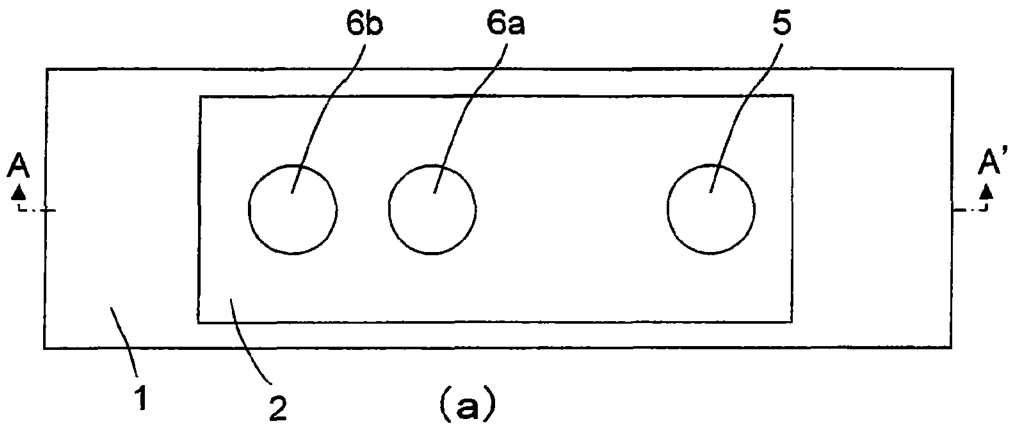
FIGS. 6(*a*) and 6(*b*) illustrate a part of production processes in the first embodiment.
Figure 6:
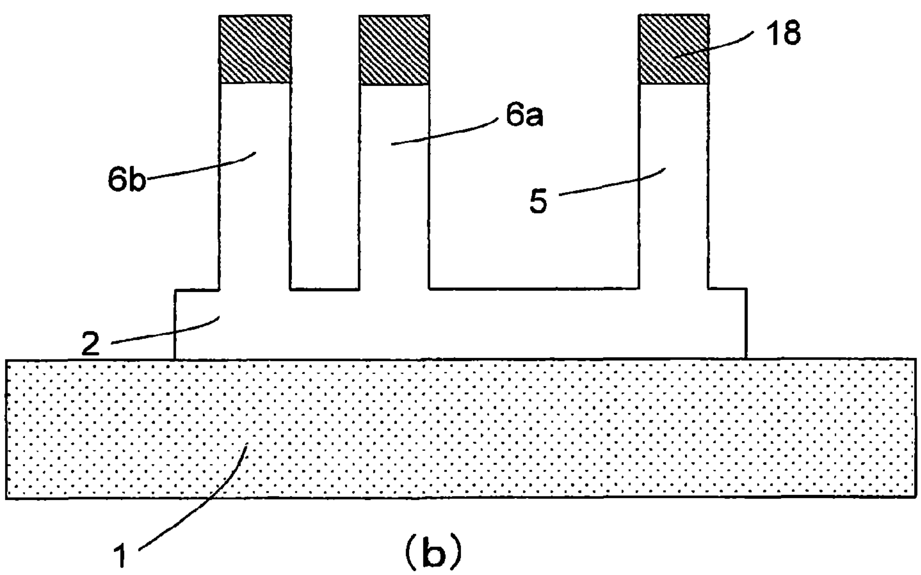

Then, as shown in FIGS. 6(*a*) and 6(*b*), the planar silicon layer 2 is isolated as an element by reactive ion etching, using a resist or a multilayer resist as a mask. In the first embodiment, the element isolation can be performed simply by isolating the planar silicon layer 2 as an element, so that a narrow element isolation width can be achieved while reducing the number of processes and minimizing a processing size.

Figure 7:
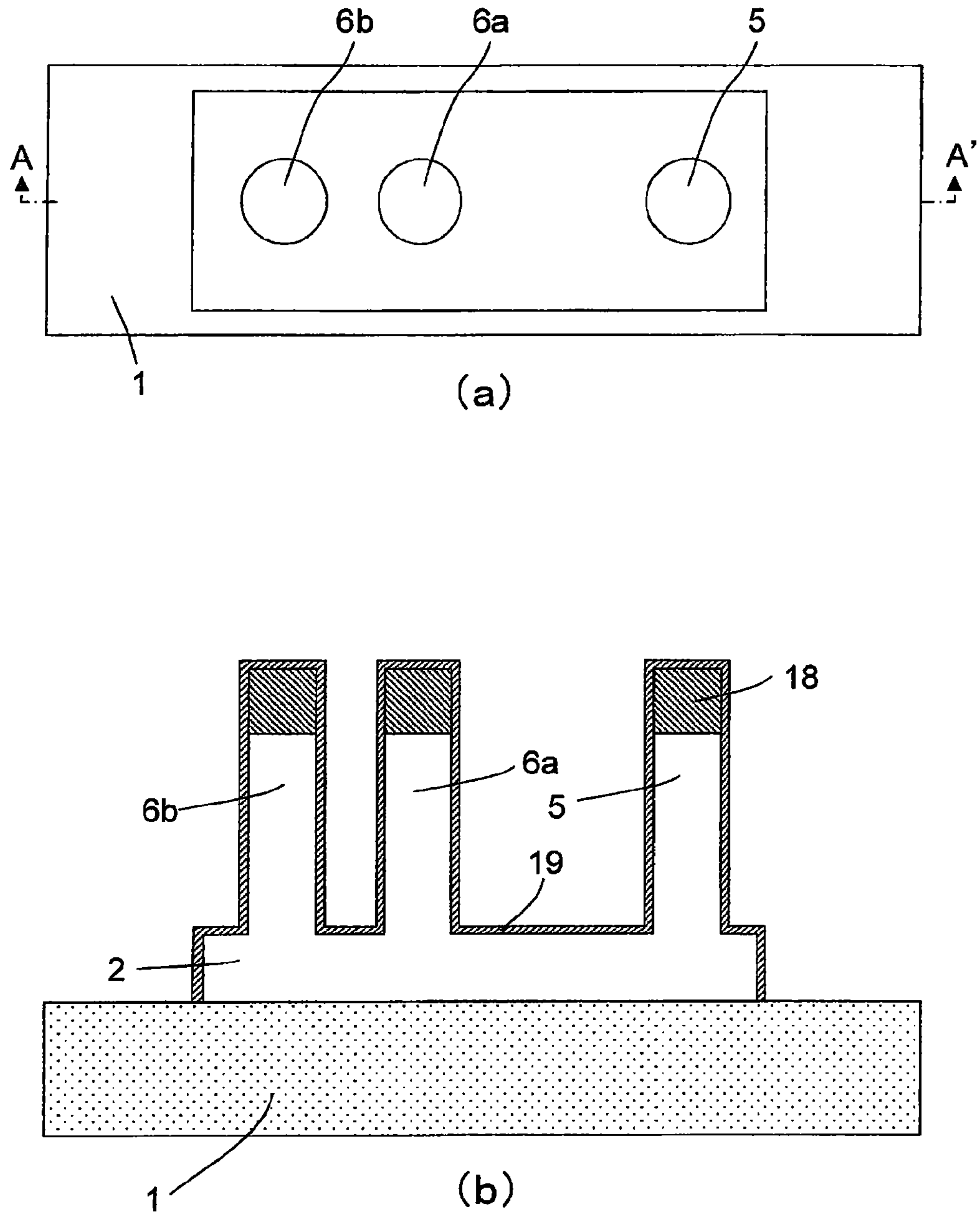
FIGS. 7(*a*) and 7(*b*) illustrate a part of production processes in the first embodiment.

Then, as shown in FIGS. 7(*a*) and 7(*b*), the pillar-shaped silicon layer is subjected to sacrificial oxidation to flatten a surface of the pillar-shaped silicon layer serving as a channel region. A sacrificial oxide film 19 can also be used as a through oxide film during ion implantation.

Figure 8:
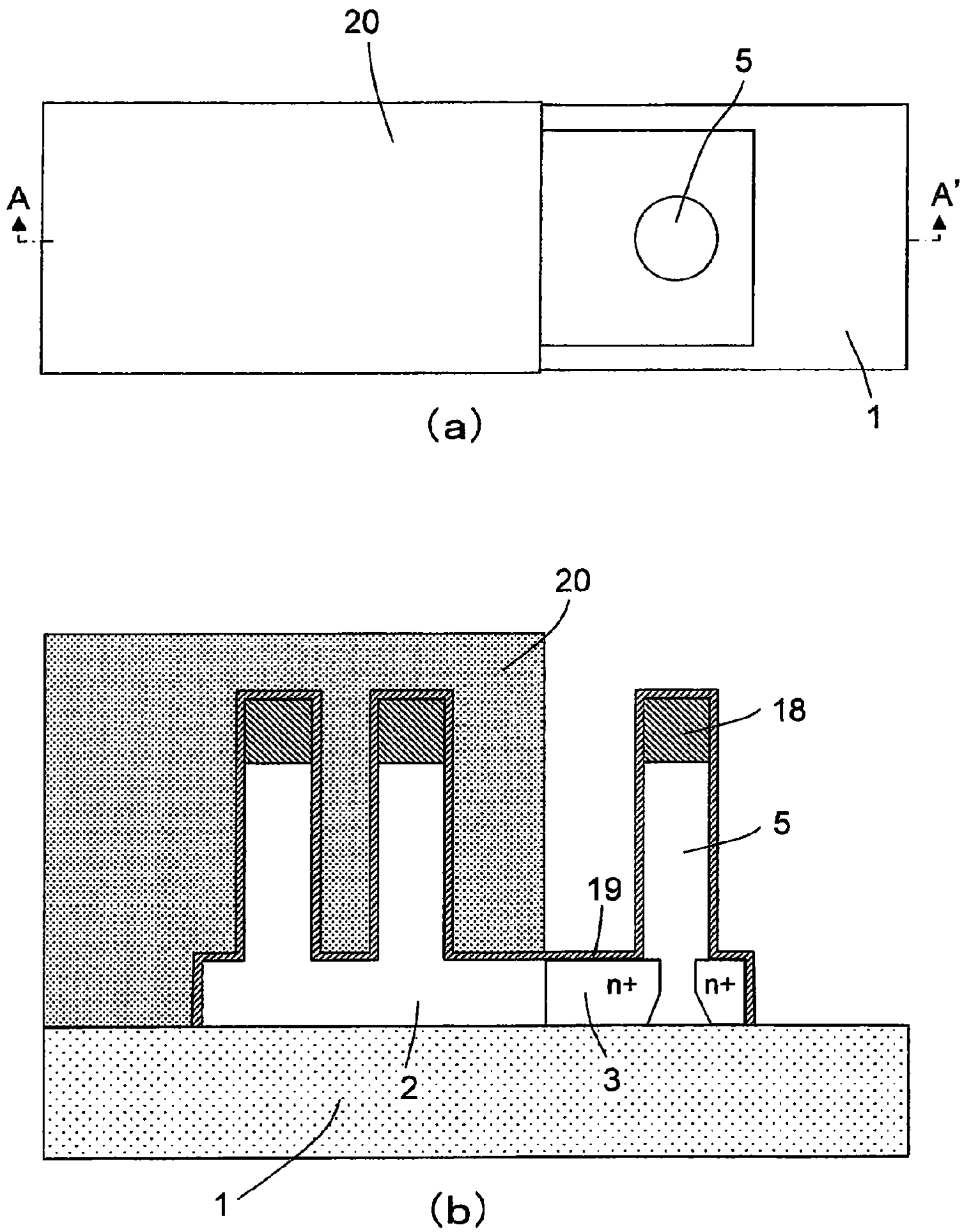
FIGS. 8(*a*) and 8(*b*) illustrate a part of production processes in the first embodiment.

Then, as shown in FIGS. 8(*a*) and 8(*b*), an impurity, such as As or P, is injected into the planar silicon layer 2 by ion implantation or other injection technique, using a resist mask 20, to form an $N^+$ drain diffusion layer 3. During this process, the silicon nitride film 18 on a top of the pillar-shaped silicon layer is used as a stopper for preventing the impurity from being injected into an upper portion of the pillar-shaped silicon layer.

Figure 9:
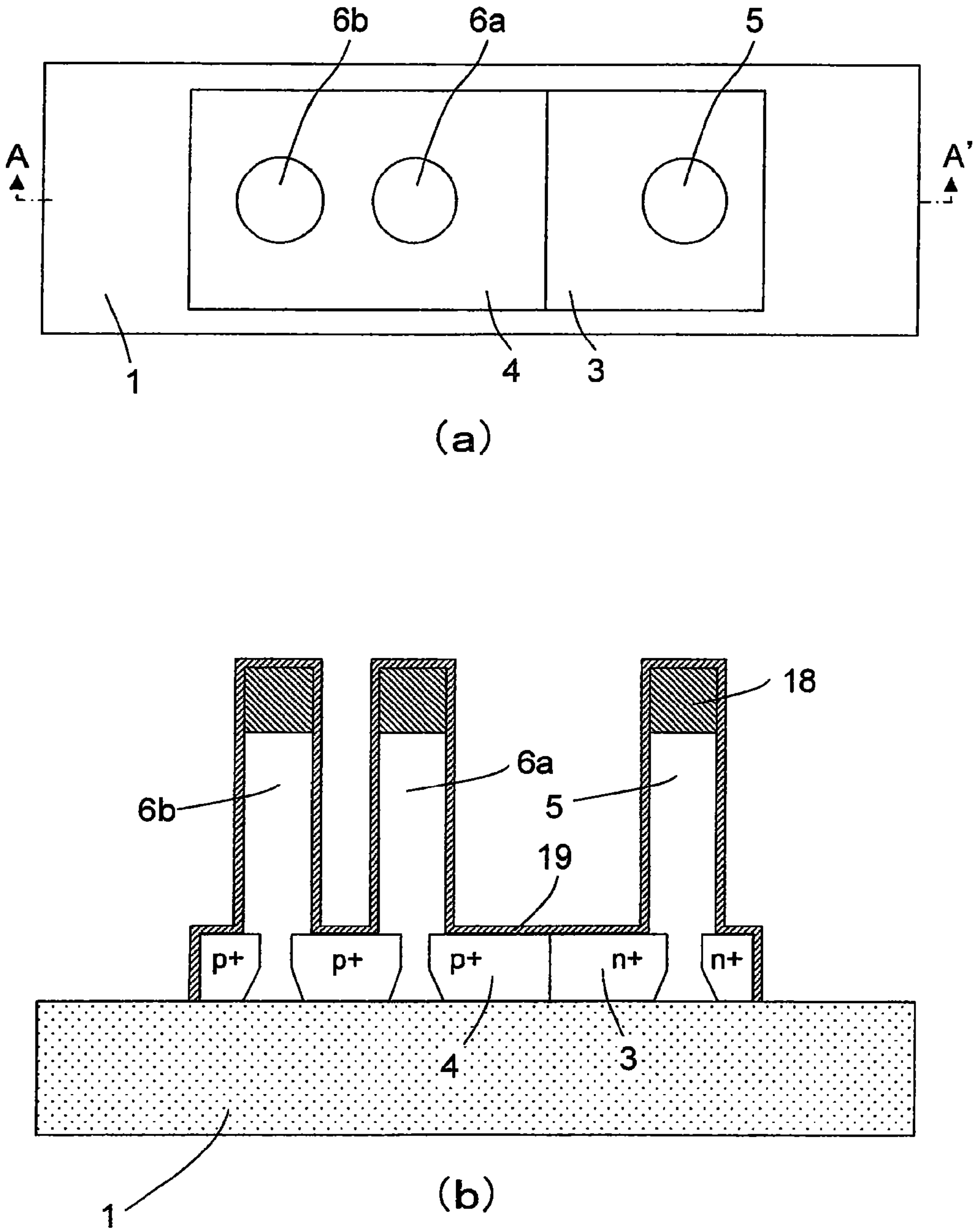
FIGS. 9(*a*) and 9(*b*) illustrate a part of production processes in the first embodiment.

Then, as shown in FIGS. 9(*a*) and 9(*b*), an impurity, such as B or $BF_2$, is injected into the planar silicon layer 2 in the same manner as that in the preceding process, to form a $P^+$ drain diffusion layer. A film thickness of the planer silicon layer 2, conditions of the ion implantation, and conditions of a subsequent heat treatment, are set to allow the impurities to be diffused in such a manner as to reach the buried oxide film 1, through the subsequent heat treatment.

Figure 10:
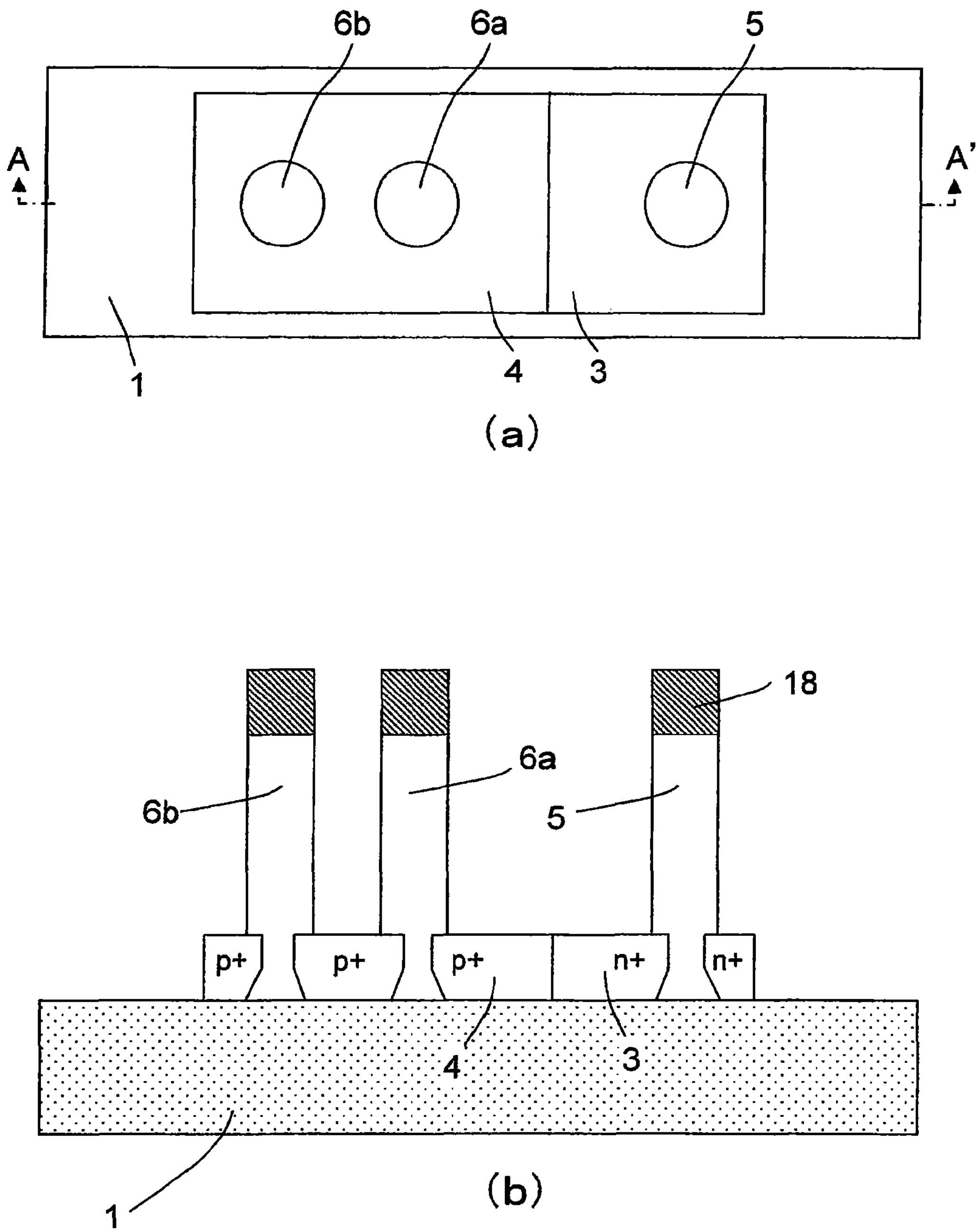
FIGS. 10(*a*) and 10(*b*) illustrate a part of production processes in the first embodiment.

Then, as shown in FIGS. 10(*a*) and 10(*b*), the sacrificial oxide film 19 is removed to expose a silicon surface.

Figure 11:
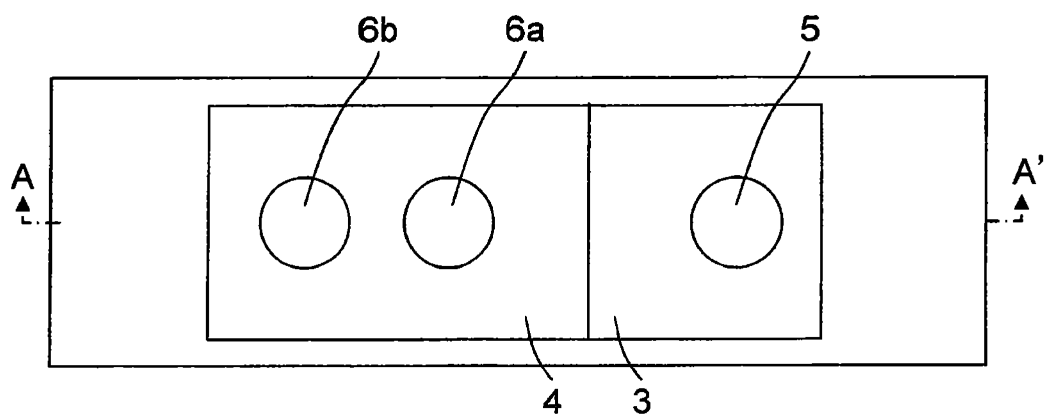
FIGS. 11(*a*) and 11(*b*) illustrate a part of production processes in the first embodiment.
Figure 11:
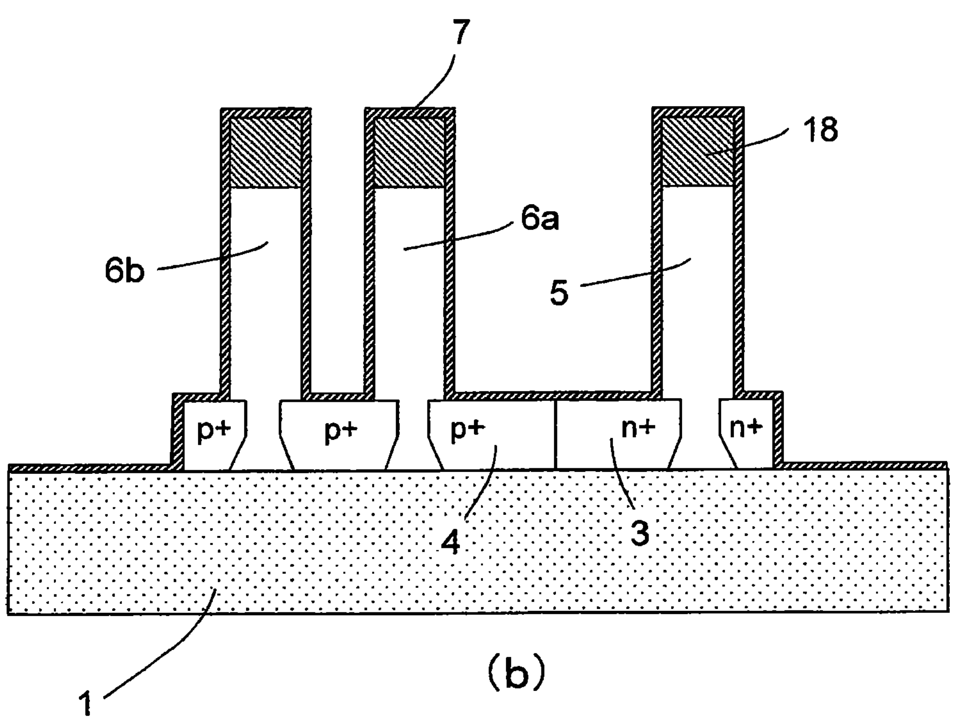

Then, as shown in FIGS. 11(*a*) and 11(*b*), a first dielectric film, such as a high-k film 7, such as a $HfO_2$ film, serving as a gate dielectric film, is formed to a thickness of about 1 to 5 nm by chemical vapor deposition (CVD) or atomic layer deposition (ALD).

Figure 12:
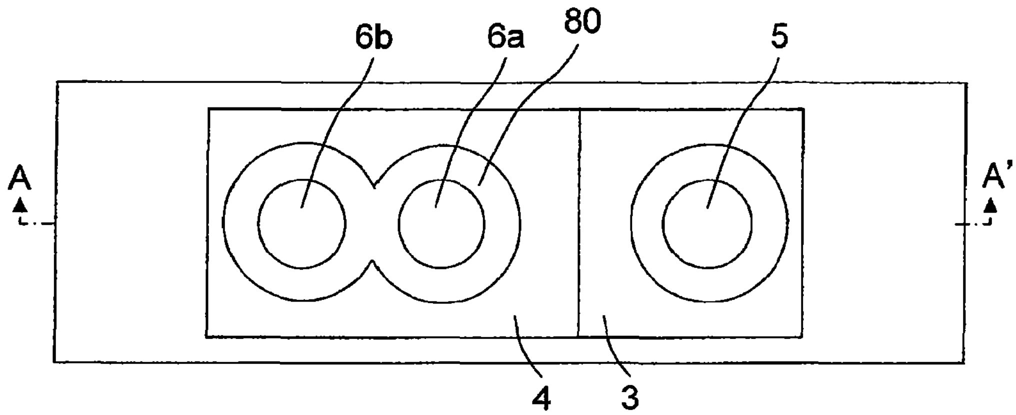
FIGS. 12(*a*) and 12(*b*) illustrate a part of production processes in the first embodiment.
Figure 12:
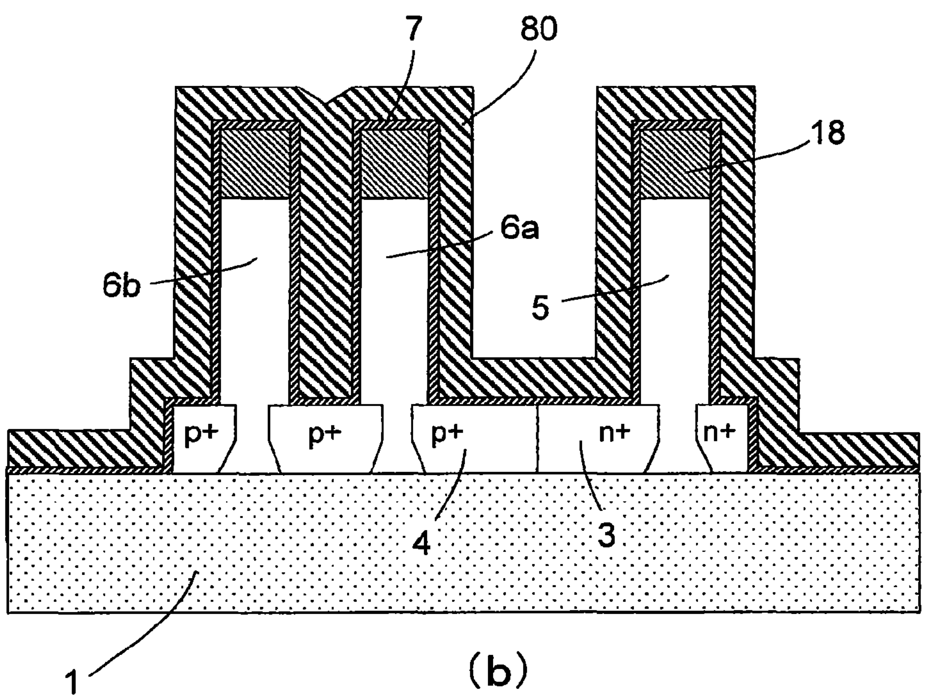

Then, as shown in FIGS. 12(*a*) and 12(*b*), a gate conductive film 80, such as a TiN film or a TaN film, serving as a gate conductive film, is formed to a thickness of about 10 to 60 nm.

Figure 13:
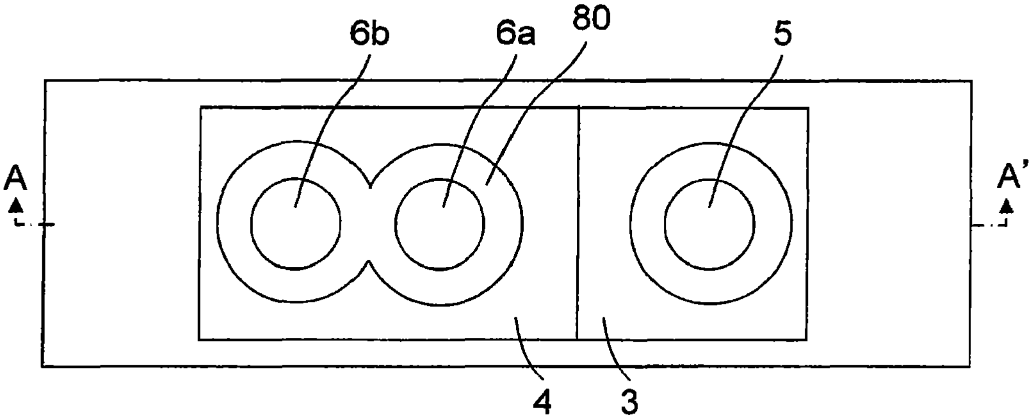
FIGS. 13(*a*) and 13(*b*) illustrate a part of production processes in the first embodiment.
Figure 13:
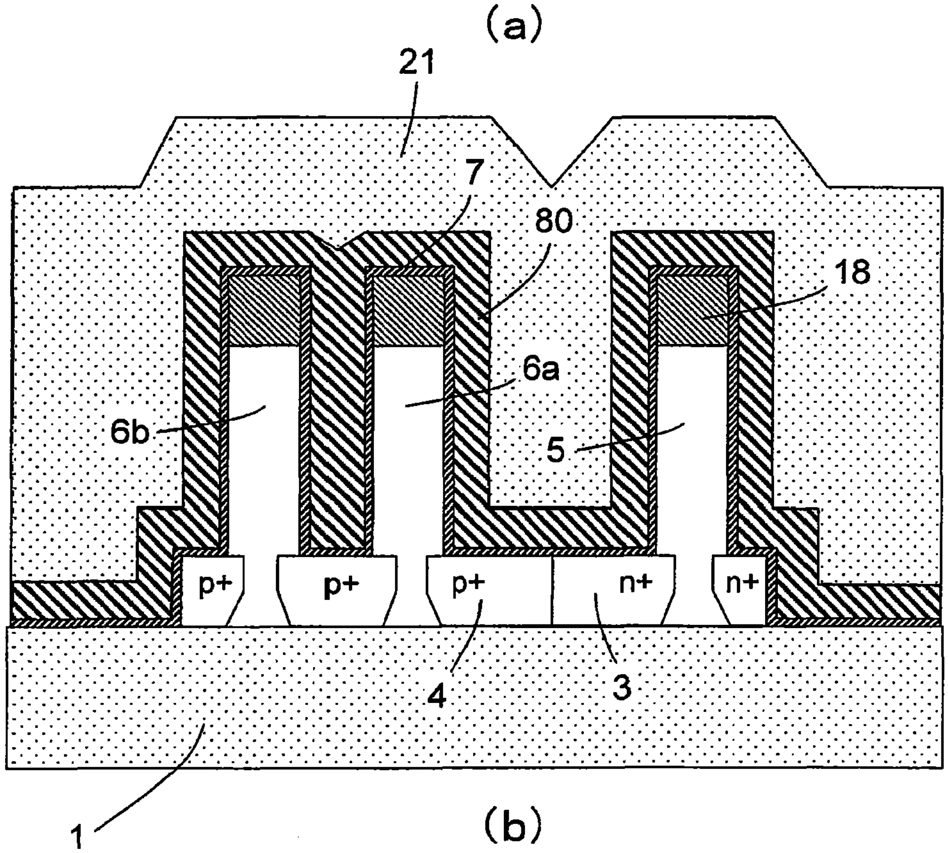

Then, as shown in FIGS. 13(*a*) and 13(*b*), a second dielectric film 21, such as a silicon oxide film, is formed to fill between the adjacent pillar-shaped silicon layers.

Figure 14:
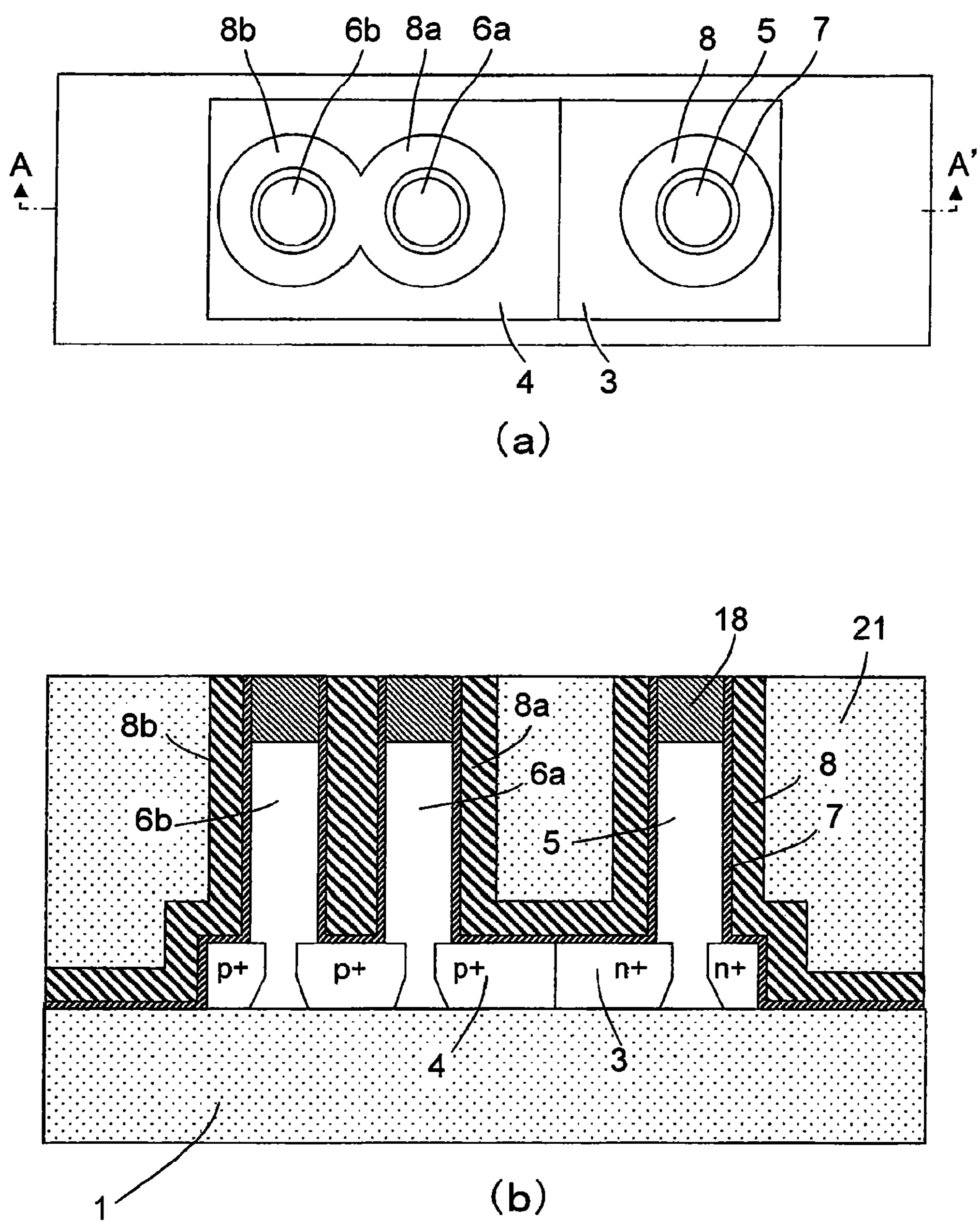
FIGS. 14(*a*) and 14(*b*) illustrate a part of production processes in the first embodiment.

Then, as shown in FIGS. 14(*a*) and 14(*b*), the second dielectric film 21, such as a silicon oxide film, and portions of the gate conductive film and the first dielectric film, such as a high-k film, above the pillar-shaped silicon layer, are polished by chemical mechanical polishing (CMP), to flatten a top surface of a gate. The flattening of the top surface of the gate by the CMP makes it possible to achieve an adequate gate configuration and suppress a variation in gate length. During the CMP, the silicon nitride film 18 on the top of the pillar-shaped silicon layer is used as a CMP stopper. The use of the silicon nitride film 18 as a CMP stopper makes it possible to control an amount of CMP with high repeatability. In place of the silicon nitride film, the film to be used as a CMP stopper may be any other suitable film capable of functioning as the CMP stopper film, and such a CMP stopper film may be formed on the SOI layer 2*a* in advance.

Figure 15:
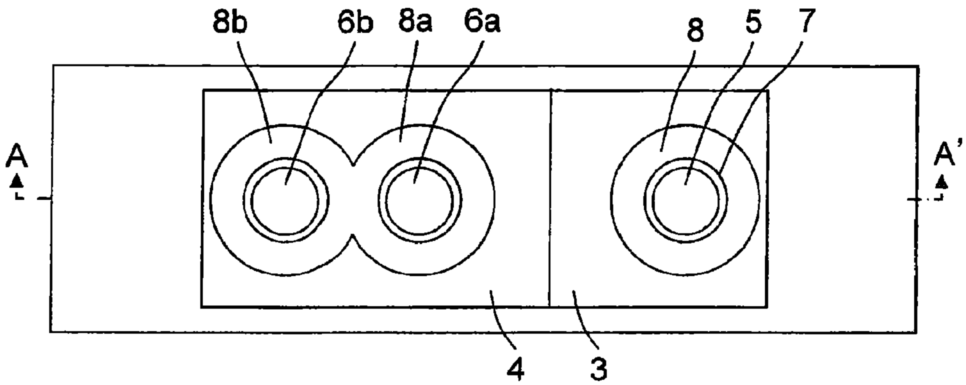
FIGS. 15(*a*) and 15(*b*) illustrate a part of production processes in the first embodiment.
Figure 15:
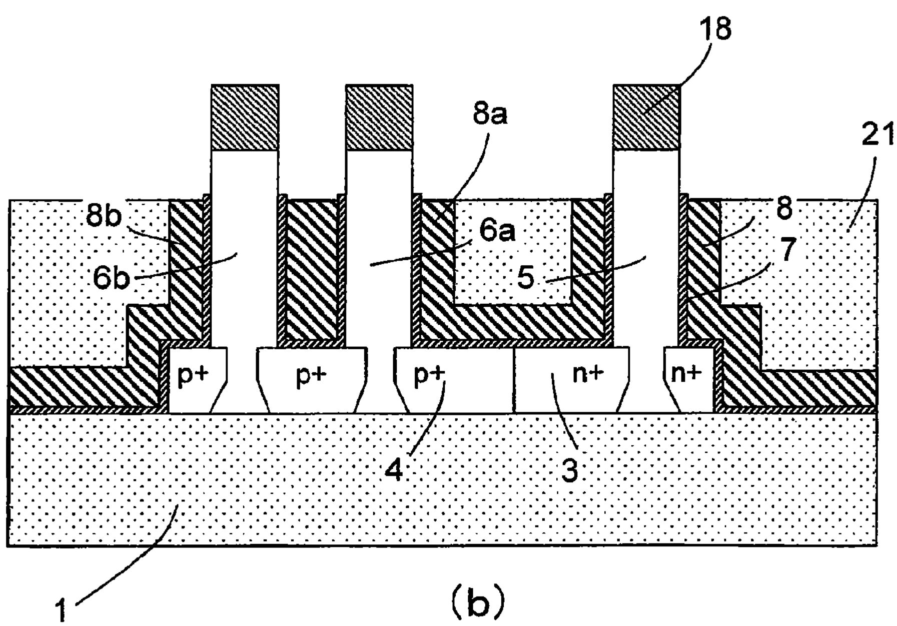

Then, as shown in FIGS. 15(*a*) and 15(*b*), the gate conductive film 80 and the second dielectric film 21, such as a silicon oxide film, are etched back to form a gate electrode (8, 8*a*, 8*b*) while fixing a gate length. Etching conditions to be used in this process are set to allow the gate conductive film 80 and the second dielectric film 21, such as a silicon oxide film, to be etched at approximately the same rate, and at a higher selectivity ratio relative to the silicon nitride film 18. The etching of the gate conductive film 80 and the second dielectric film 21, such as a silicon oxide film, at the same rate makes it possible to suppress occurrence of a step between respective top surfaces of the two films, which facilitates forming an after-mentioned silicon nitride film-based sidewall 23 in a process subsequent to a next process.

Figure 16:
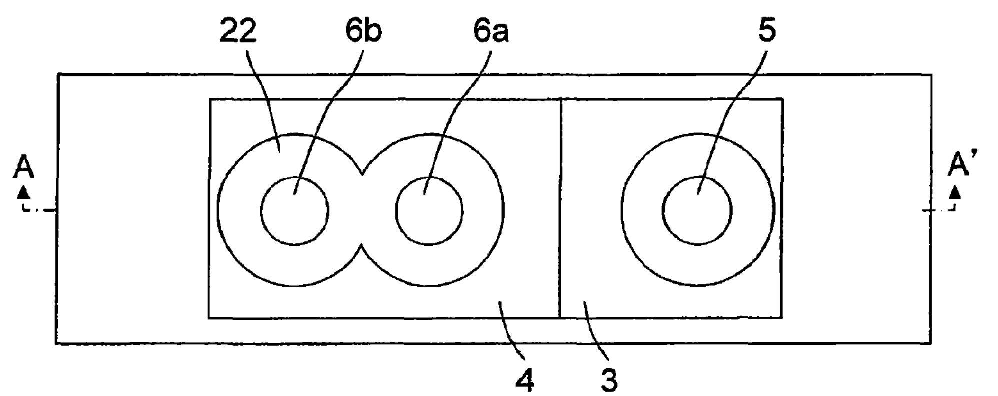
FIGS. 16(*a*) and 16(*b*) illustrate a part of production processes in the first embodiment.
Figure 16:
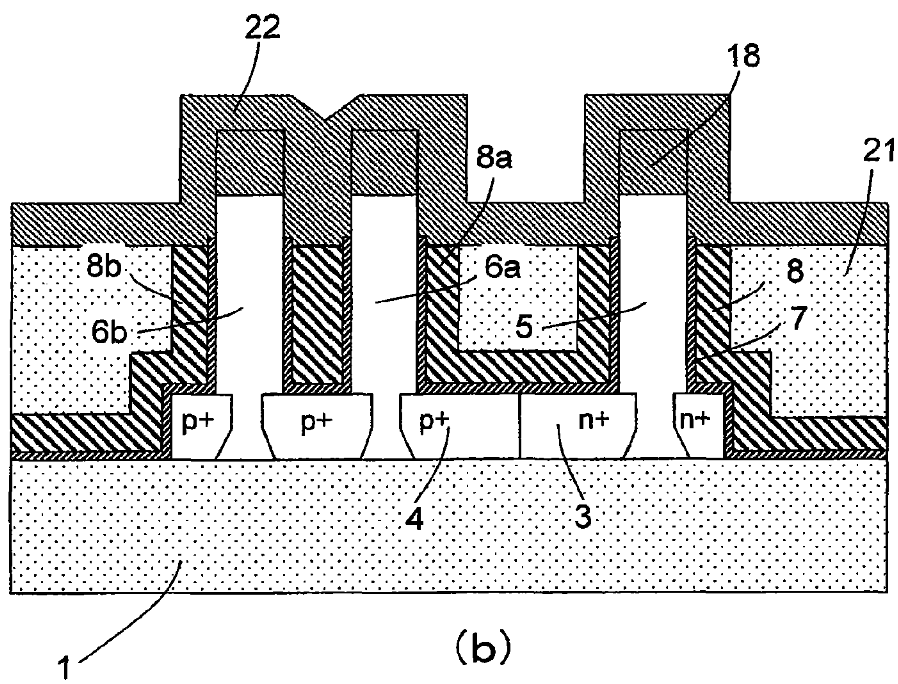

Then, as shown in FIGS. 16(*a*) and 16(*b*), a silicon nitride film 22 is formed.

Figure 17:
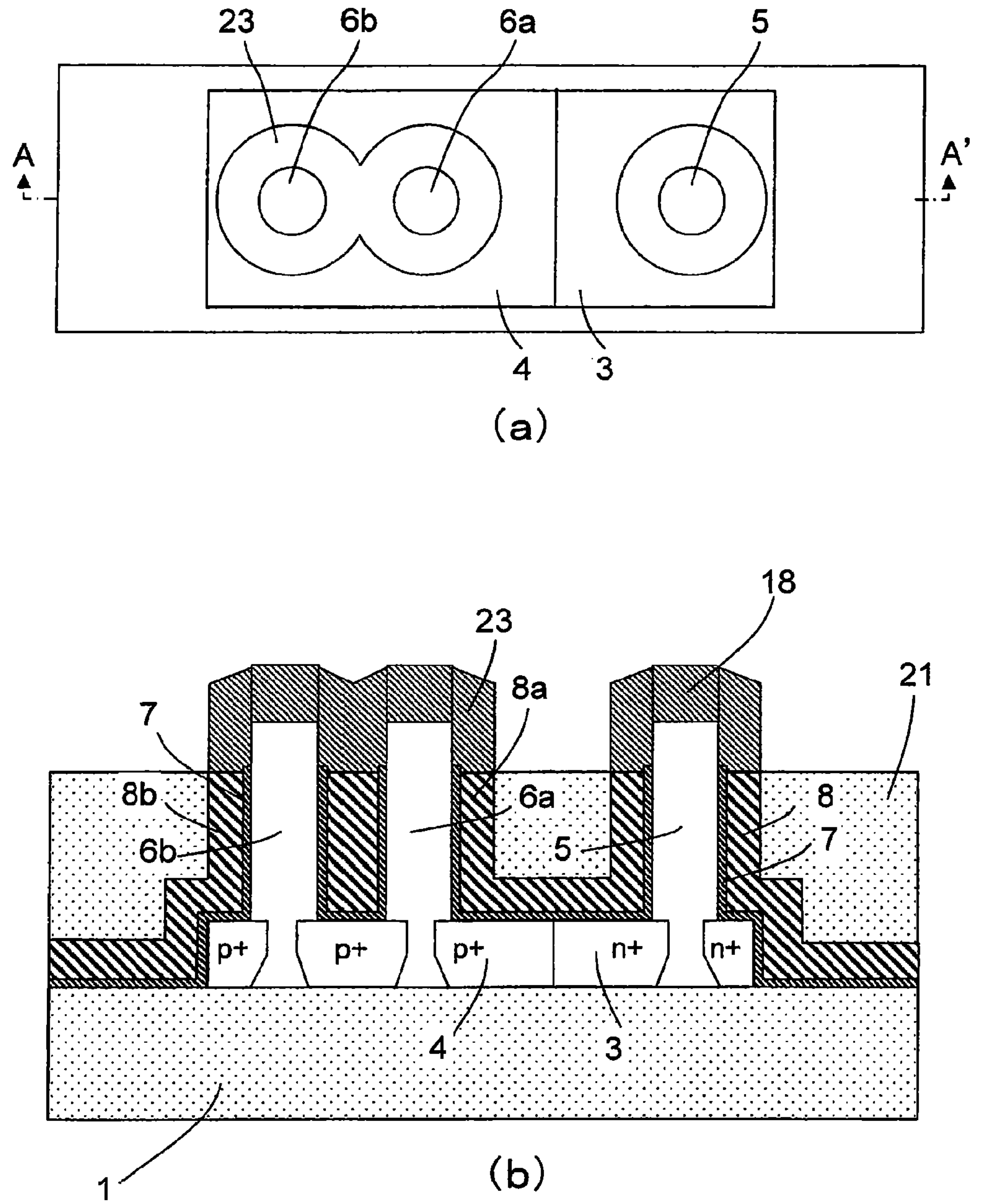
FIGS. 17(*a*) and 17(*b*) illustrate a part of production processes in the first embodiment.

Then, as shown in FIGS. 17(*a*) and 17(*b*), the silicon nitride film 22 is etched back to form a silicon nitride film-based sidewall 23 on a top of the metal gate. An amount of the silicon nitride film 22 to be formed in the preceding process and an amount of the silicon nitride film 22 to be etched back in this process, are set to allow the silicon nitride film-based sidewall 23 remaining on the gate to accurately cover the gate. A portion of the gate covered by the silicon nitride film-based sidewall 23 is protected during etching. This makes it possible to form the gate electrode to a desired film thickness, in a self-alignment manner, so as to reduce an occupancy area, and a parasitic capacitance between the gate and each of the diffusion layers. In the first embodiment, the silicon nitride film is used as a sidewall protective film. Alternatively, any other suitable film capable of functioning as the sidewall protective film, such as a silicon oxide film, may also be used.

Figure 18:
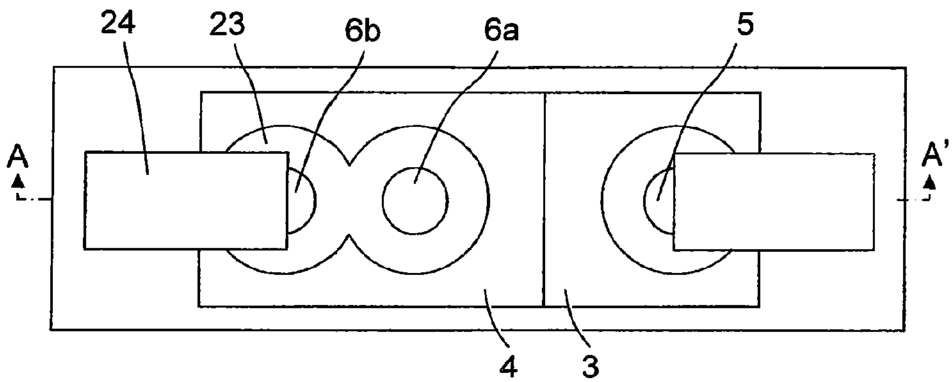
FIGS. 18(*a*) and 18(*b*) illustrate a part of production processes in the first embodiment.
Figure 18:
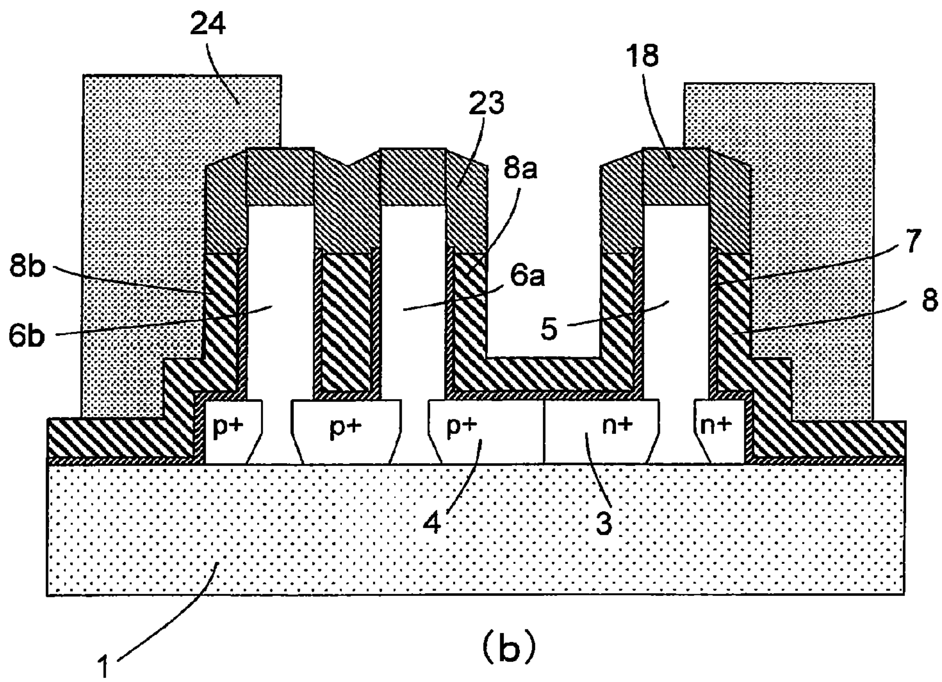

Then, as shown in FIGS. 18(*a*) and 18(*b*), after the second dielectric film 21, such as a silicon oxide film, remaining on the metal gate is removed by wet etching, a resist or a multilayer resist is applied, and a gate line pattern is formed by lithography, using the resist 24.

Figure 19:
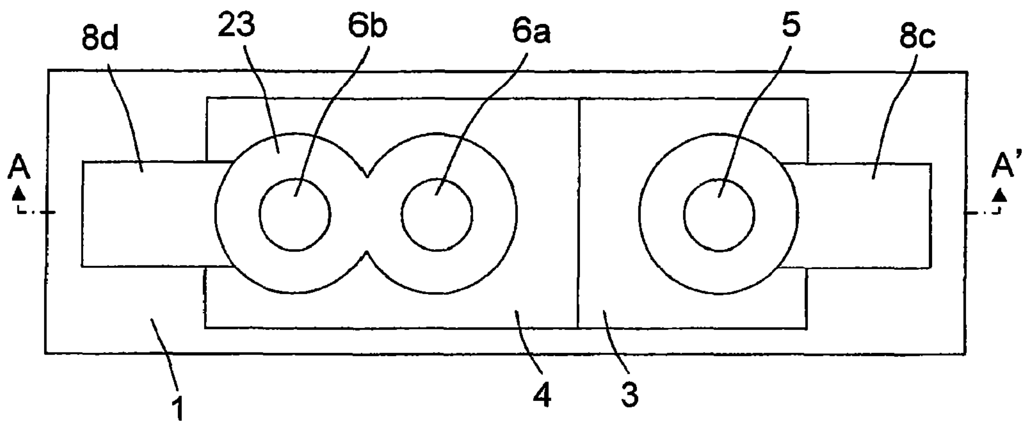
FIGS. 19(*a*) and 19(*b*) illustrate a part of production processes in the first embodiment.
Figure 19:
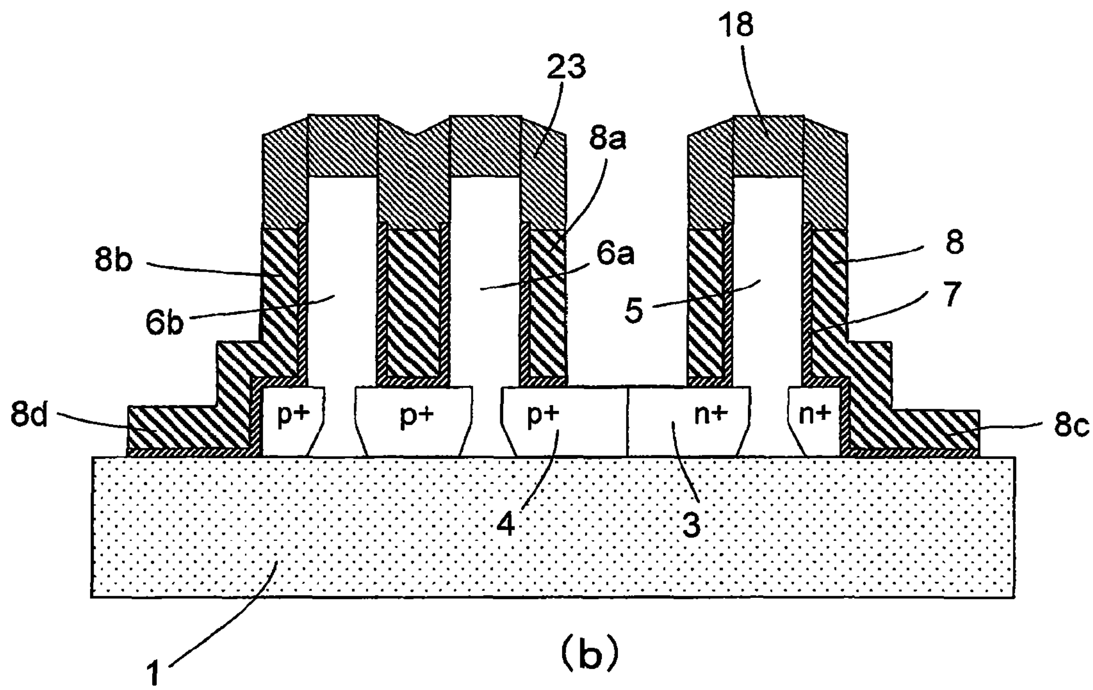

Then, as shown in FIGS. 19(*a*) and 19(*b*), a bottom portion of the gate and a portion of the first dielectric film, such as a high-k film, beneath the gate are partially etched by reactive ion etching, using a resist mask. Through this process, a gate line (8*c*, 8*d*) is formed. As described above, based on the structure where the silicon nitride film as a hard mask is formed on the top of the pillar-shaped silicon layer, the flattening of the top surface of the gate by CMP, the etching for fixing the gate length, the formation of the silicon nitride film-based sidewall for protecting the gate electrode, the patterning of the gate line, and the etching for forming the gate line, are sequentially performed. This makes it possible to form the gate in an adequate configuration and with a small variation in size, and freely form the gate line. In addition, the film thickness of the gate electrode can be controlled in a self-alignment manner to reduce an occupancy area, and a parasitic capacitance between the gate and each of the diffusion layers.

Figure 20:
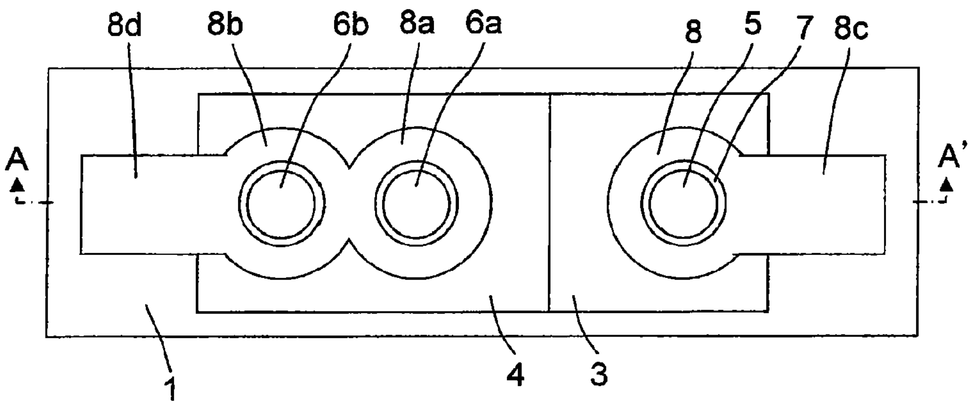
FIGS. 20(*a*) and 20(*b*) illustrate a part of production processes in the first embodiment.
Figure 20:
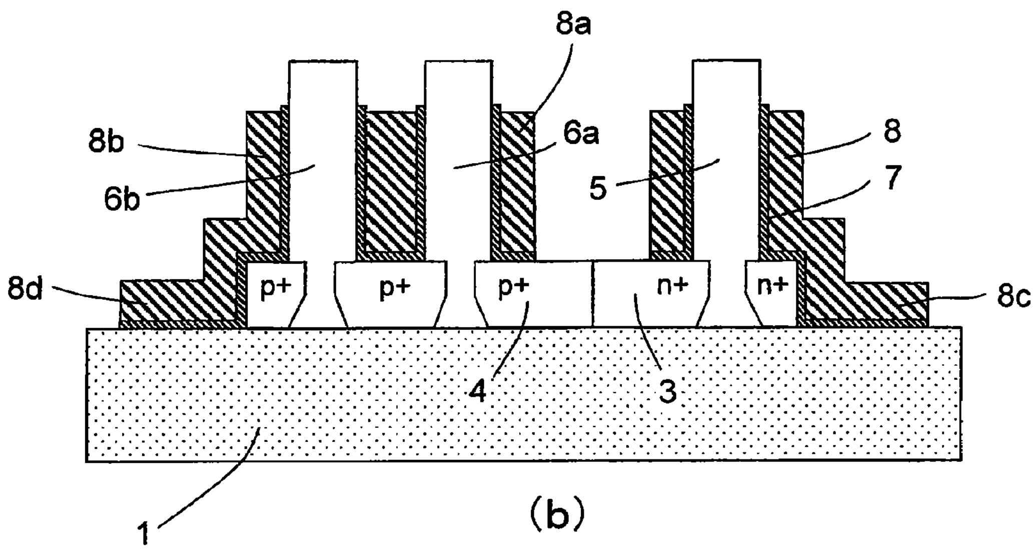

Then, as shown in FIGS. 20(*a*) and 20(*b*), the silicon nitride film 18 on the top of the pillar-shaped silicon layer, and the silicon nitride film-based sidewall 23, are removed by wet etching.

Figure 21:
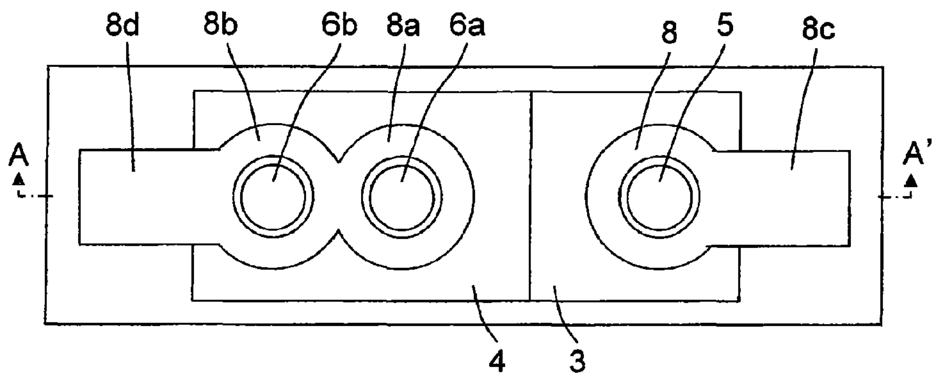
FIGS. 21(*a*) and 21(*b*) illustrate a part of production processes in the first embodiment.
Figure 21:
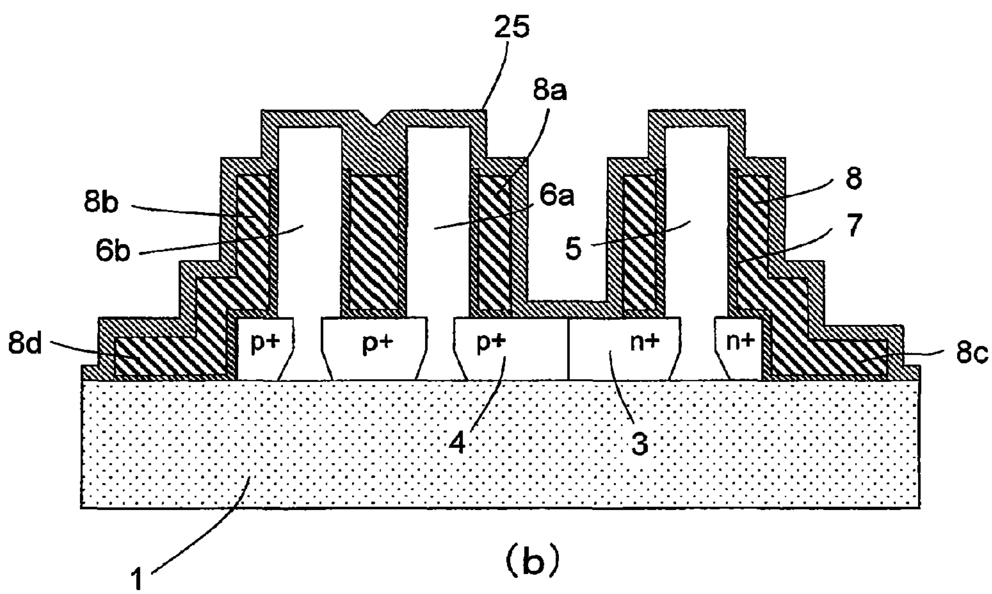

Then, as shown in FIGS. 21(*a*) and 21(*b*), a silicon nitride film 25 is formed to a film thickness of about 10 to 50 nm.

Figure 22:
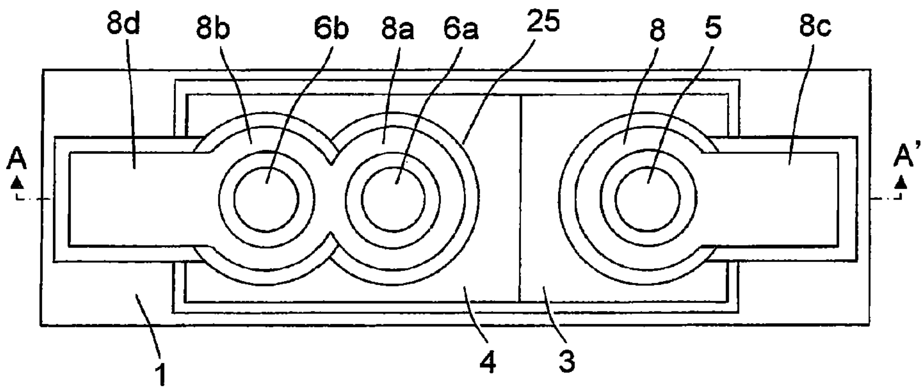
FIGS. 22(*a*) and 22(*b*) illustrate a part of production processes in the first embodiment.
Figure 22:
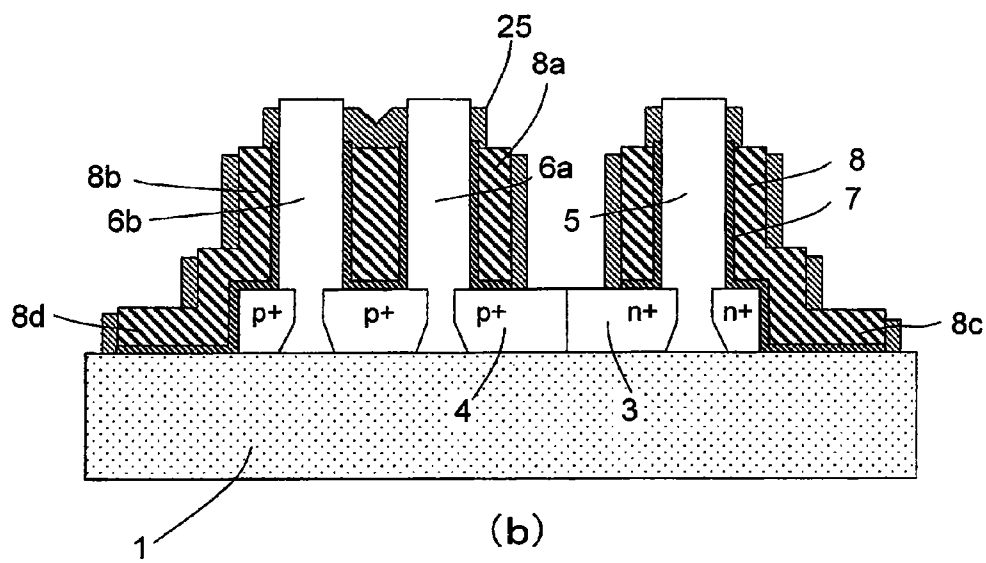

Then, as shown in FIGS. 22(*a*) and 22(*b*), the silicon nitride film 25 is etched back to form a structure where a sidewall of the pillar-shaped silicon layer and a sidewall of the gate are covered by the silicon nitride film 25 while exposing a top surface of the pillar-shaped semiconductor layer (5, 6*a*, 6*b*). This structure allows the first dielectric film 7, such as high-k film, to be covered by the silicon nitride film 25, so as to prevent the first dielectric film 7, such as a high-k film, from being damaged by wet treatment and ion implantation in subsequent processes. In this process, an excessively small film thickness of the silicon nitride film 25 makes it impossible to fully prevent the damage of the first dielectric film 7, such as a high-k film, and an excessively large film thickness of the silicon nitride film 25 causes an increase in occupancy area by just the film thickness of the first dielectric film 7, such as a high-k film, formed on the sidewall of the gate. Thus, it is necessary to select an optimal film thickness. In the first embodiment, the silicon nitride film is used as a protective film. Alternatively, any other suitable film capable of functioning as the protective film, such as a film having a layered structure of a silicon nitride film and a silicon oxide film, may also be used.

Figure 23:
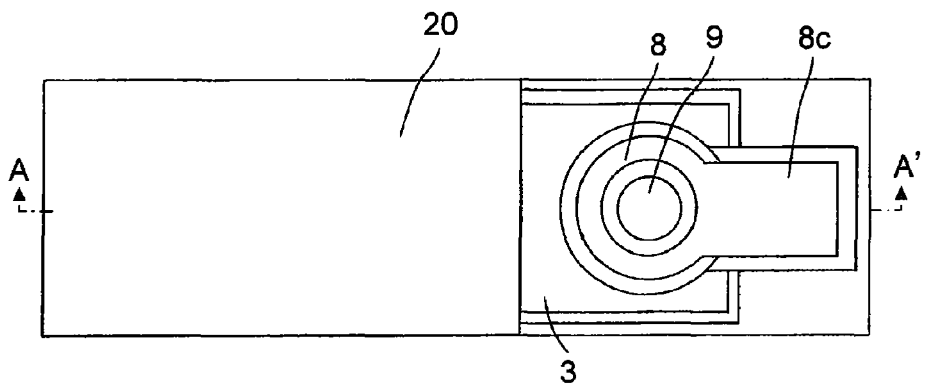
FIGS. 23(*a*) and 23(*b*) illustrate a part of production processes in the first embodiment.
Figure 23:
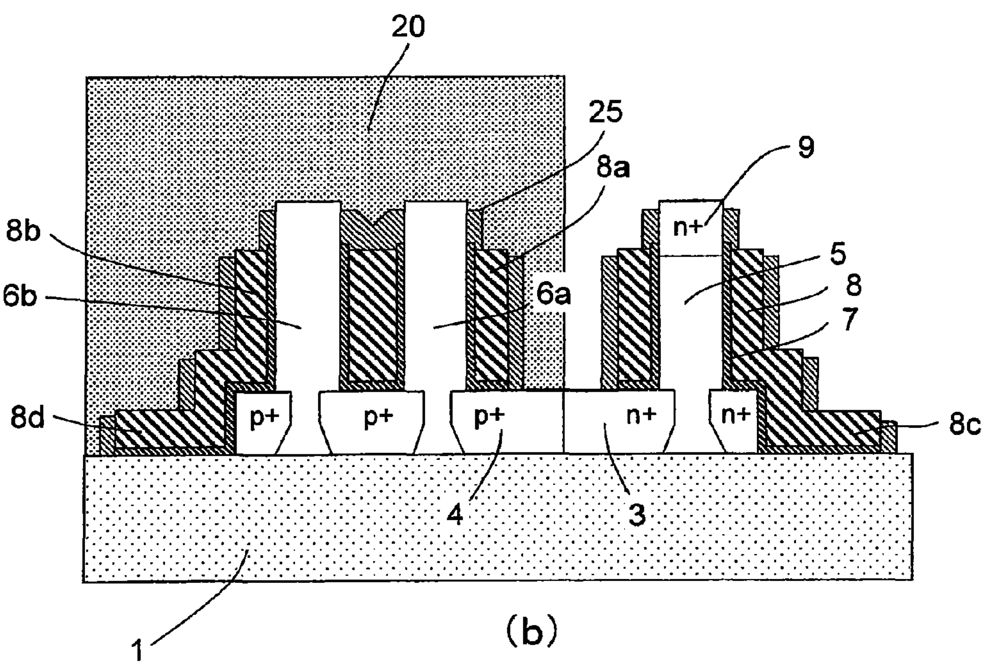

Then, as shown in FIGS. 23(*a*) and 23(*b*), patterning is performed using a resist 20, and an $N^+$ source diffusion layer 9 is formed in an upper portion of the pillar-shaped silicon layer 5 by ion implantation or other injection technique.

Figure 24:
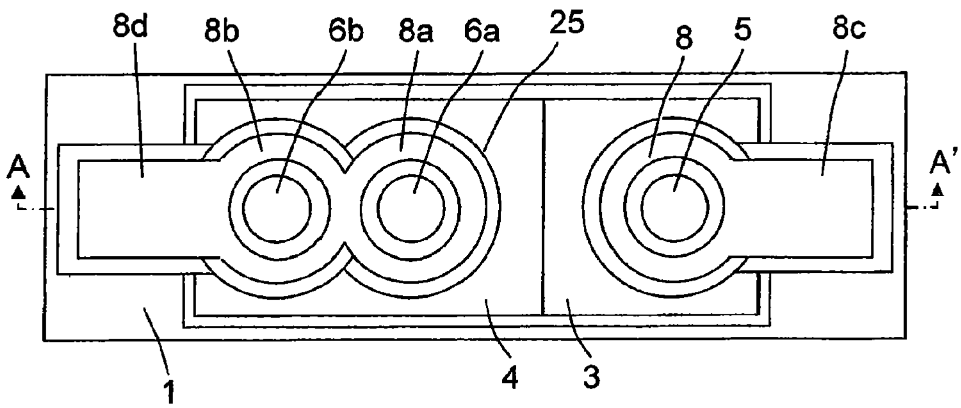
FIGS. 24(*a*) and 24(*b*) illustrate a part of production processes in the first embodiment.
Figure 24:
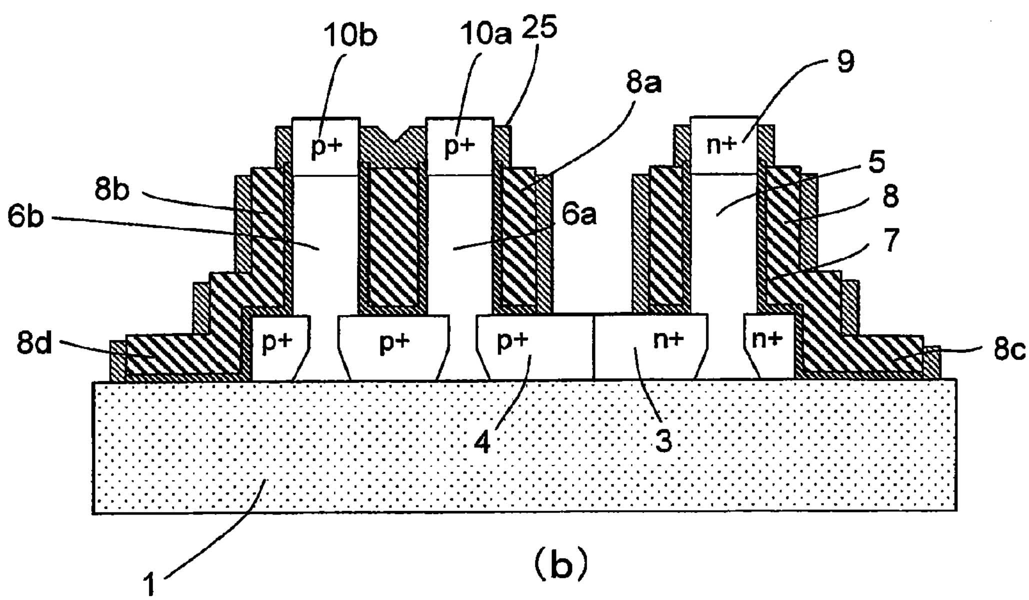

Then, as shown in FIGS. 24(*a*) and 24(*b*), a $P^+$ source diffusion layer (10*a*, 10*b*) is formed in an upper portion of the pillar-shaped silicon layer (6*a*, 6*b*) in the same manner as that in the preceding process.

Figure 25:
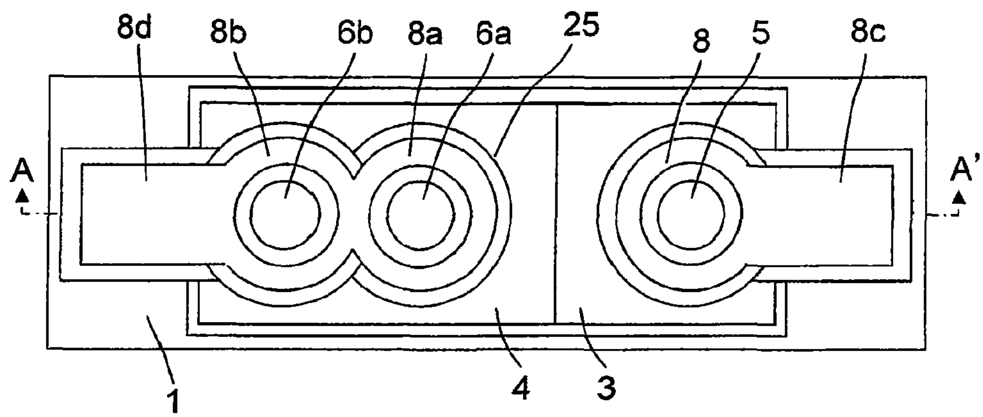
FIGS. 25(*a*) and 25(*b*) illustrate a part of production processes in the first embodiment.
Figure 25:
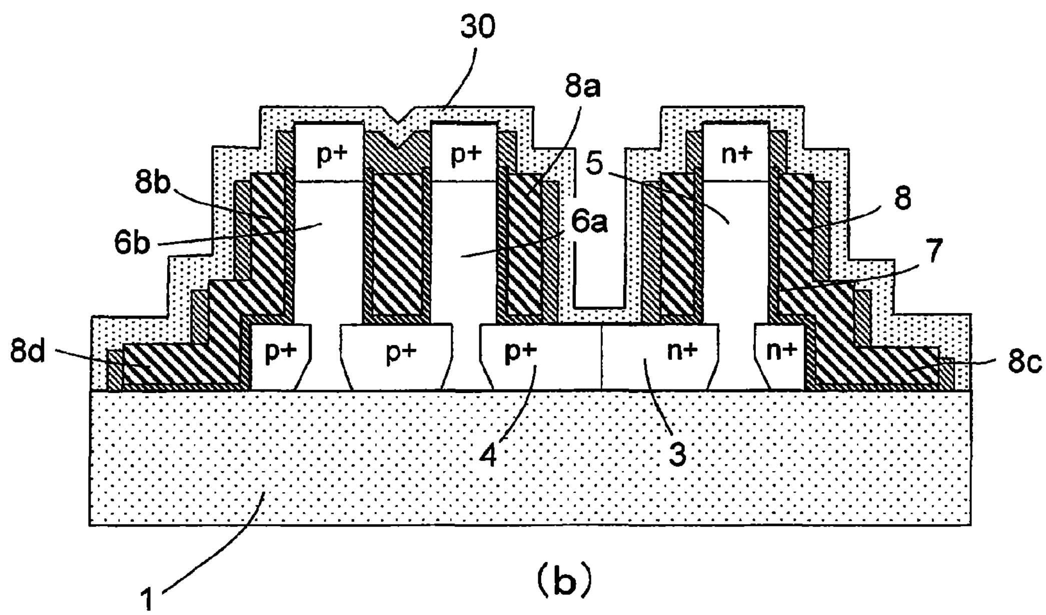

Then, as shown in FIGS. 25(*a*) and 25(*b*), a silicon oxide film 30 for protecting a non-silicidation region is formed to a film thickness of 10 to 50 nm.

Figure 26:
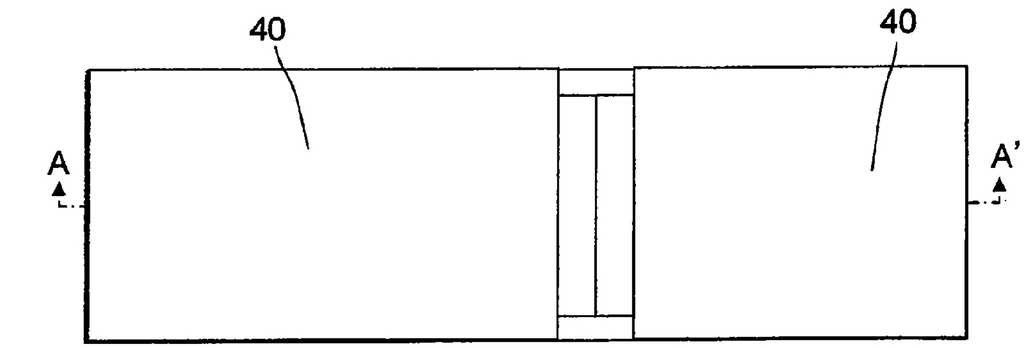
FIGS. 26(*a*) and 26(*b*) illustrate a part of production processes in the first embodiment.
Figure 26:
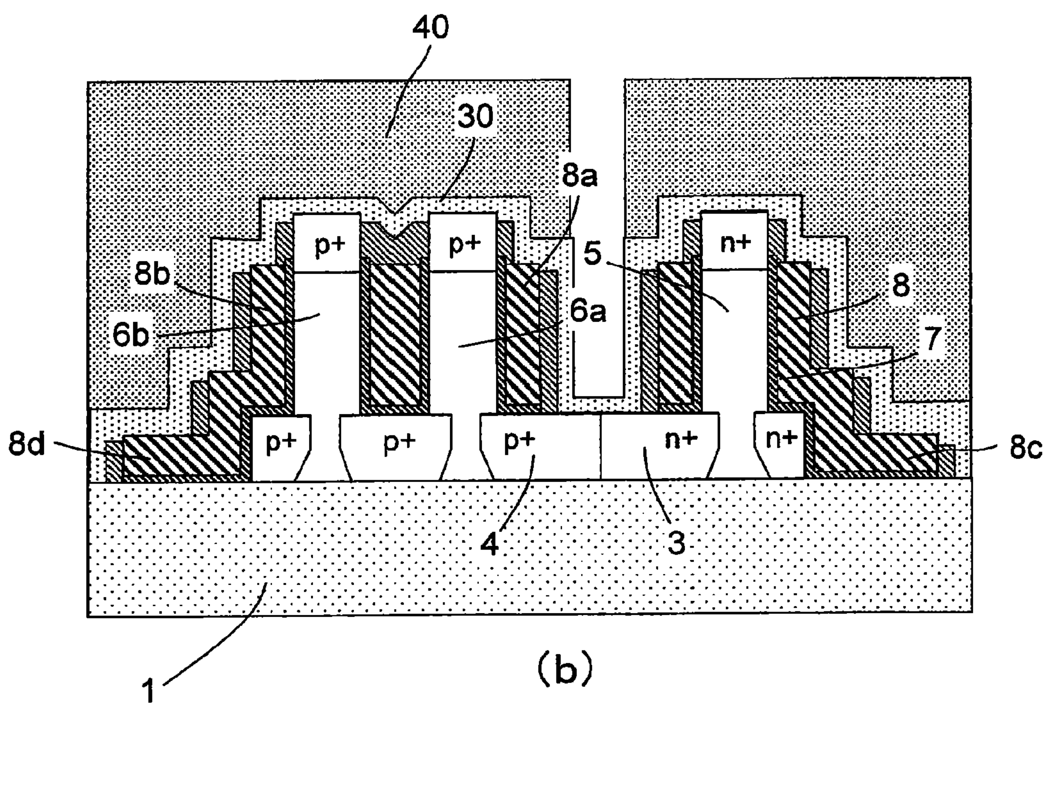

Then, as shown in FIGS. 26(*a*) and 26(*b*), a resist 40 is patterned by lithography, and a groove pattern is formed in a boundary region between the $N^+$ drain diffusion layer and the $P^+$ drain diffusion layer, where silicide is to be formed.

Figure 27:
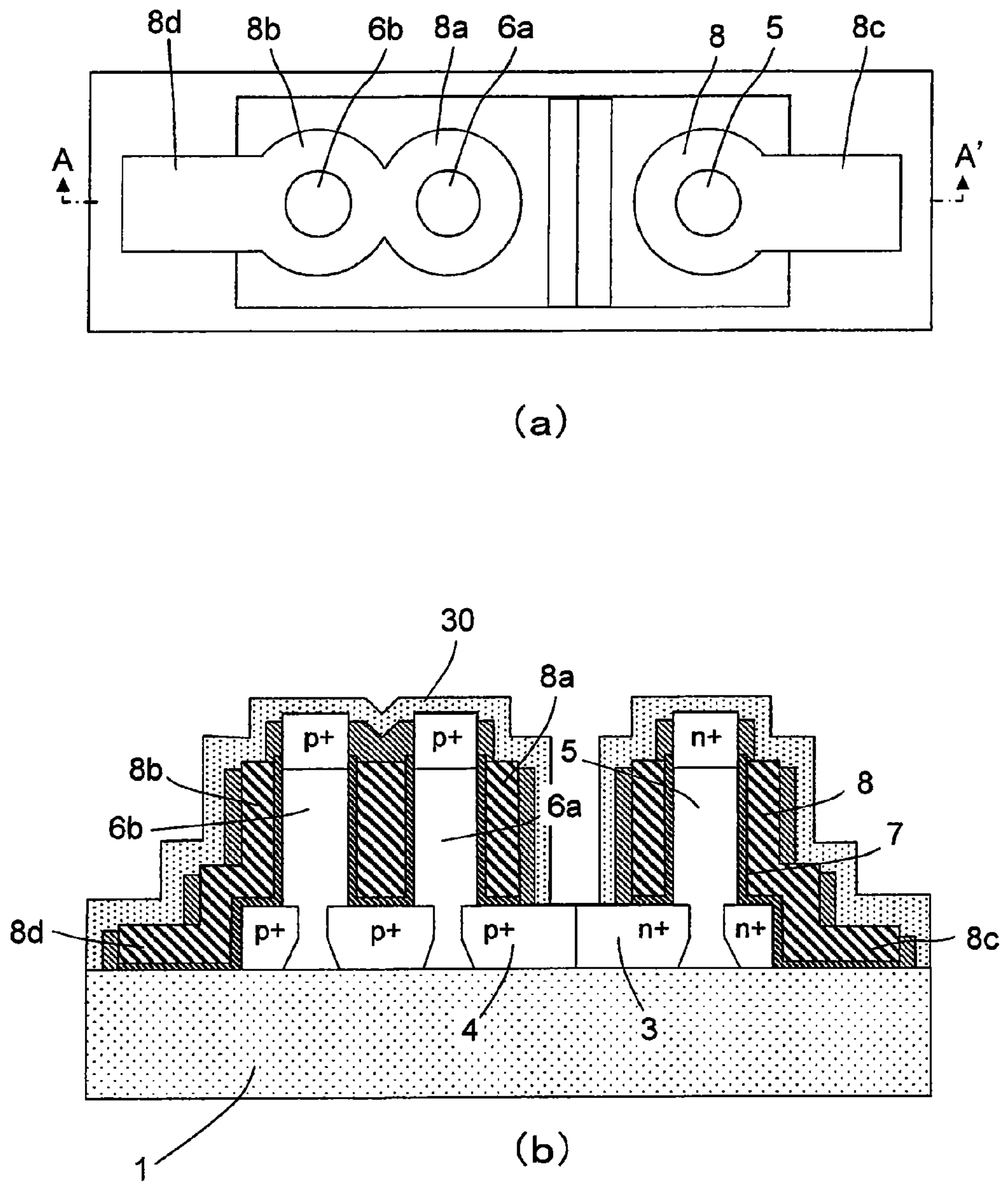
FIGS. 27(*a*) and 27(*b*) illustrate a part of production processes in the first embodiment.

Then, as shown in FIGS. 27(*a*) and 27(*b*), a portion of the silicon nitride film 30 located in a bottom of a groove formed using the resist 40 is etched to expose a surface of a corresponding portion of the drain diffusion layer.

Figure 28:
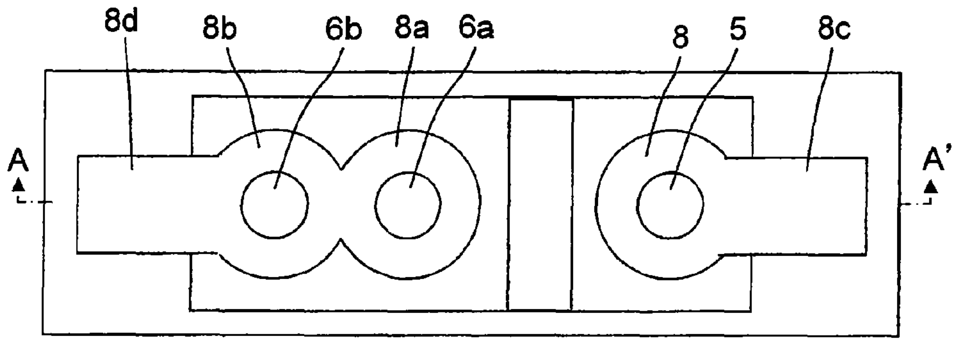
FIGS. 28(*a*) and 28(*b*) illustrate a part of production processes in the first embodiment.
Figure 28:
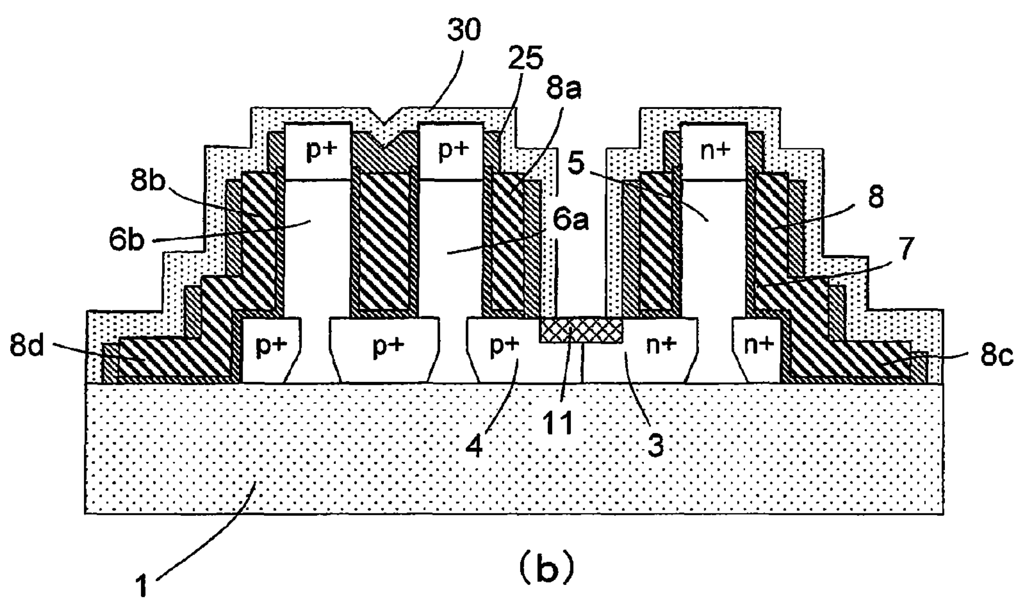

Then, as shown in FIGS. 28(*a*) and 28(*b*), a metal, such as Ni or Co, is sputtered onto the surface of the drain diffusion layer subjected to removal of the silicon oxide film 30, to form a metal film therein, and the metal film is silicided through a heat treatment, whereafter an unreacted portion of the metal film is removed to form a silicide layer 11 located around the boundary between the $N^+$ drain diffusion layer and the $P^+$ drain diffusion layer.

Figure 29:
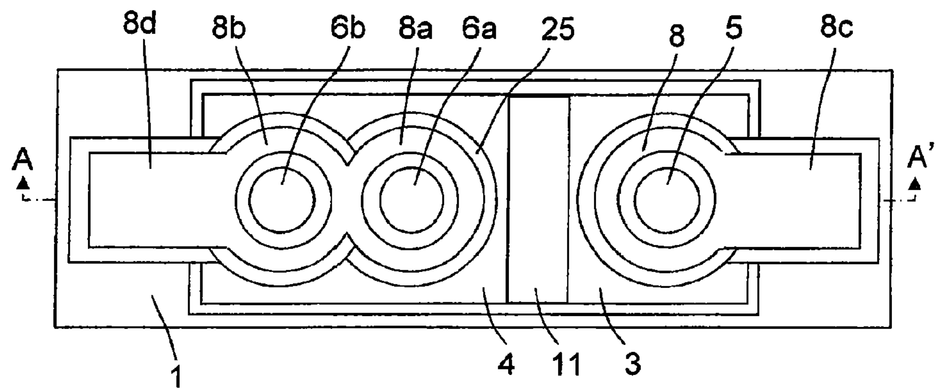
FIGS. 29(*a*) and 29(*b*) illustrate a part of production processes in the first embodiment.
Figure 29:
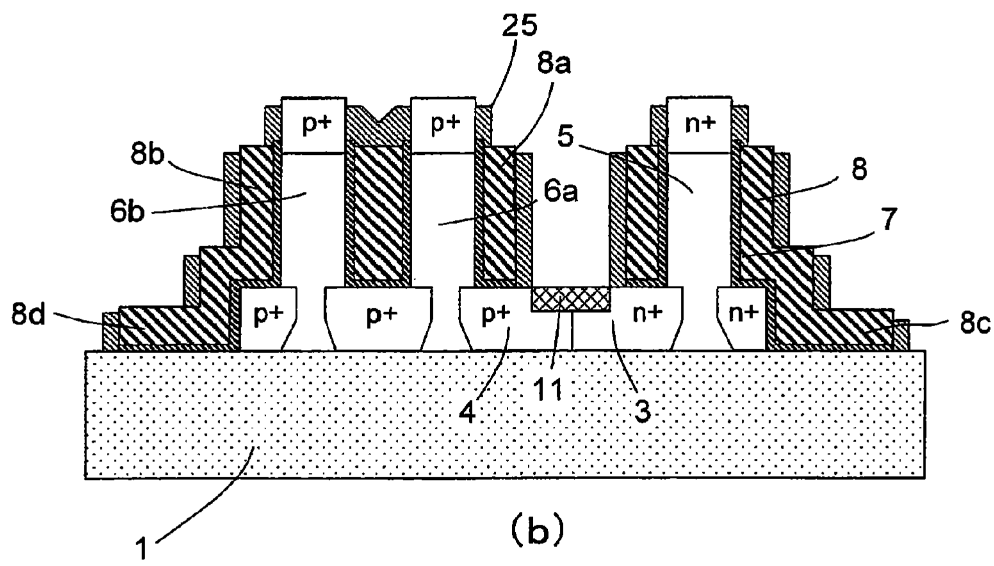

Then, as shown in FIGS. 29(*a*) and 29(*b*), the silicon oxide film 30 covering surfaces of the elements is removed by wet etching.

Figure 30:
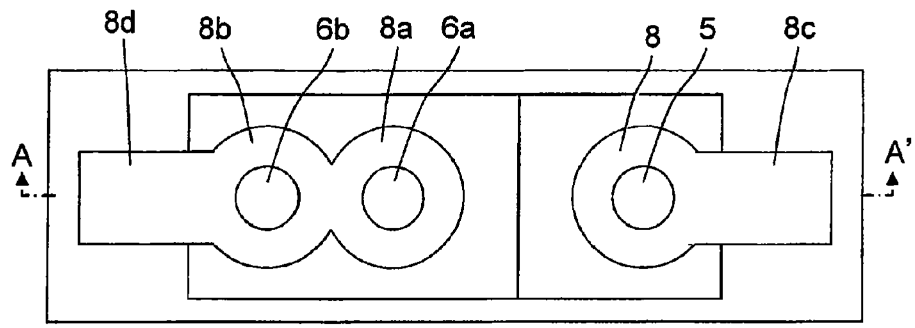
FIGS. 30(*a*) and 30(*b*) illustrate a part of production processes in the first embodiment.
Figure 30:
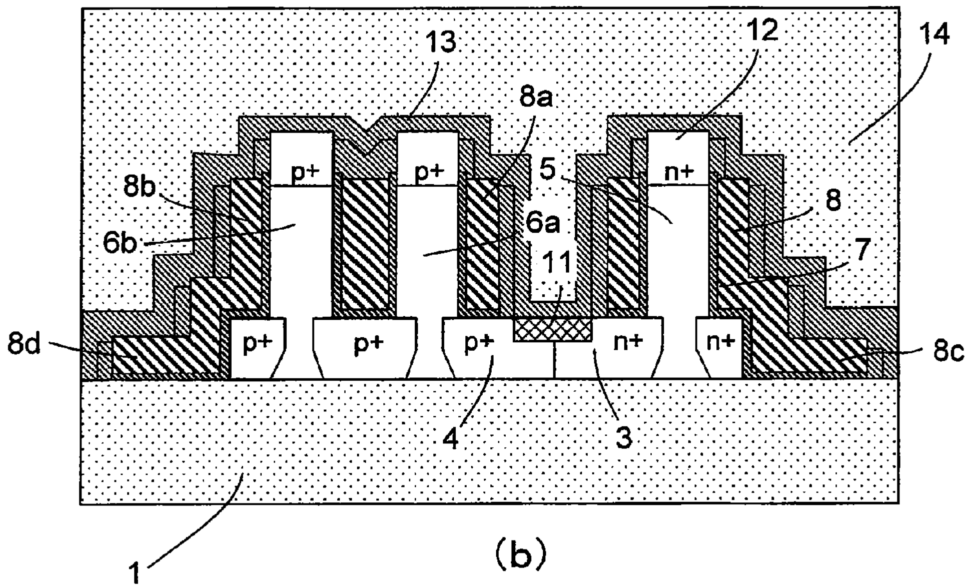

Then, as shown in FIGS. 30(*a*) and 30(*b*), after a silicon nitride liner film 13 is formed, a silicon oxide film 14 is formed, and flattened by CMP. The silicon nitride liner film 13 is used as an etching stopper during contact formation.

Figure 31:
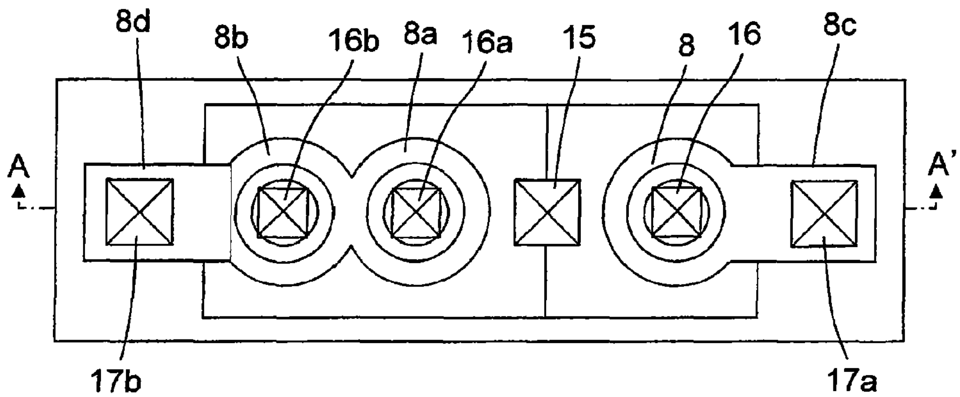
FIGS. 31(*a*) and 31(*b*) illustrate a part of production processes in the first embodiment.
Figure 31:
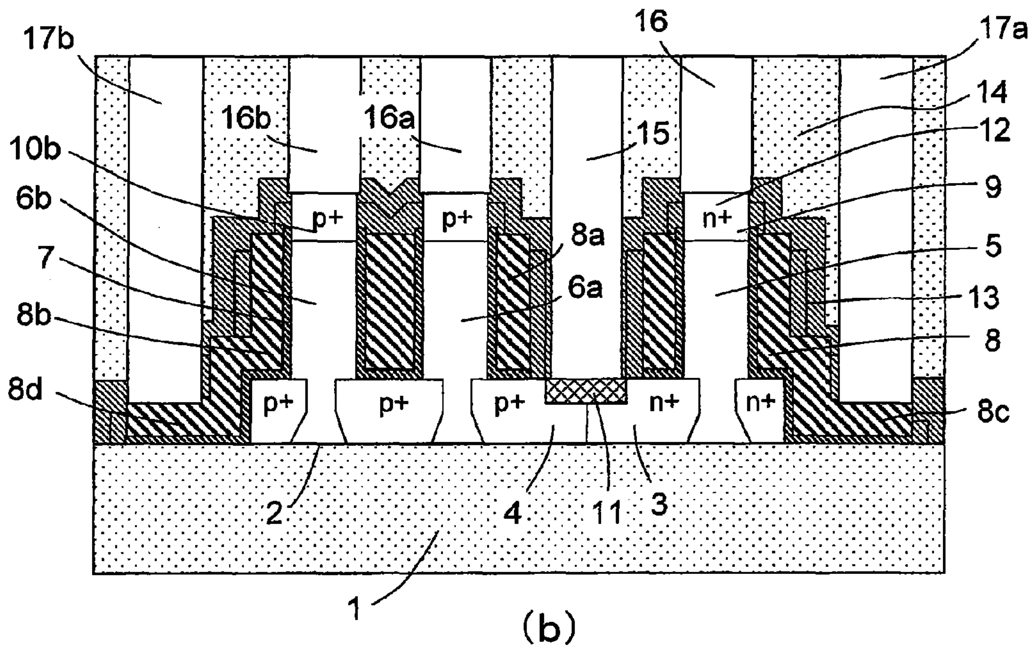

Then, as shown in FIGS. 31(*a*) and 31(*b*), a contact (15, 16, 16*a*, 16*b*, 17*a*, 17*b*) is formed on each of the drain diffusion layers on the planar silicon layer, the gates, and the source diffusion layer on the respective pillar-shaped silicon layers.

In the first embodiment, in order to allow the $N^+$ diffusion layer and the $P^+$ diffusion layer to be directly connected to each other in the planar silicon layer 2, the boundary region between the $N^+$ diffusion layer and the $P^+$ diffusion layer is silicided. However, in a structure where a contact is determinately formed on the boundary between the $N^+$ diffusion layer and the $P^+$ diffusion layer, there is no need to form the above silicide layer 11, because a contact generally has a silicide layer, such as a TiSi layer, which is formed on a bottom thereof through a reaction between Ti and Si as a part of contact barrier metals, and the direct connection between the $N^+$ diffusion layer and the $P^+$ diffusion layer in the planar silicon layer 2 can be established based on the silicide layer formed on the bottom of the contact.

In the first embodiment, the gate electrode can be formed around the pillar-shaped silicon layer by a desired film thickness, in a self-alignment manner. This makes it possible to densely arrange a plurality of pillar-shaped silicon layers having different gate electrodes so as to reduce a circuit occupancy area. In addition, a process having a sufficient process margin for forming the gate electrode can be established to facilitate gate line formation which has been a challenge in SGT.

The inverter circuit described in the first embodiment is designed to form the output potential Vout 1 on the side of the substrate, in the same manner as that in the conventional inverter circuits illustrated in FIGS. 128(*c*) and 128(*d*). However, there is no need to form an element isolation region in the circuit, and therefore a circuit occupancy area can be reduced. Further, differently from the conventional examples illustrated in FIGS. 128(*c*) and 128(*d*) which have difficulty in ensuring stable production due to the problem with the thermal resistance of silicide, in the production method in the first embodiment, after forming a transistor, the silicide layer 11 is formed on the planar silicon layer 2 to connect the $N^+$ diffusion layer 3 and the $P^+$ diffusion layer 4. Thus, there is not the problem with the thermal resistance of silicide.

In the inverter circuit described in the first embodiment, element isolation is performed by etchingly isolating the planar silicon layer 2 on the buried oxide layer 1, so that an element isolation width corresponding to a minimum processing size determined by lithography can be achieved. Thus, the use of the SGT structure according to the first embodiment makes it possible to arrange a plurality of circuit elements at intervals of a minimum width, which provides a great advantage in reducing a chip area.

In the first embodiment, a silicide layer is formed over the drain diffusion layers formed in the planer silicon layer, so that a resistance of the drain diffusion layers is reduced to suppress an influence of a parasitic resistance caused by the drain diffusion layers. This makes it possible to reduce the number of contacts onto the drain diffusion layers, and use the silicide layer as a line layer for the drain diffusion layers, which provides enhanced flexibility in layout design.

If the planar silicon layer 2 has an excessively large thickness, a step between the planar silicon layer 2 and the buried oxide layer 1 becomes larger in a position of an edge of the planar silicon layer 2, to cause difficulty in etching the gate line in a desired configuration and size. Thus, it is preferable to minimize a film thickness of the planar silicon layer 2.

In the structure according to the first embodiment, the silicide layer 11 on the drain diffusion layers is formed in such a manner as to avoid reaching a bottom of the planar silicon layer 2. This is intended to maximize an area of an interface between the drain diffusion layer (3, 4) and the silicide layer 11, considering that a resistance in the interface between the drain diffusion layer and the silicide layer is one major factor causing a source-drain parasitic resistance.

Preferably, the film thickness of the planar silicon layer 2 is set to be less than 100 nm to allow the gate line to be etched in a desired configuration and size. More preferably, the film thickness of the planar silicon layer 2 is set in the range of 20 to 40 nm, to facilitate gate processing while ensuring the area of the interface between the silicide layer and the drain diffusion layer.

Although a film thickness of the silicide layer 11 is in the range of about 10 to 30 nm, preferably, it is set to be in the range of 10 to 20 nm in order to ensure the area of the interface between the silicide layer and the drain diffusion layer.

Although it is desirable to minimize a film thickness of each of the gate electrode and the gate line in view of reducing an occupancy area of SGT integration circuit, the film thickness is required to be about 10 nm at minimum to prevent a sheet resistance of the gate line from posing a problem for the circuit. Thus, in view of forming a high-density SGT integration circuit, the film thickness of the gate line film is set preferably in the range of about 10 to 50 nm, more preferably in the range of 10 to 30 nm.

Figure 41:
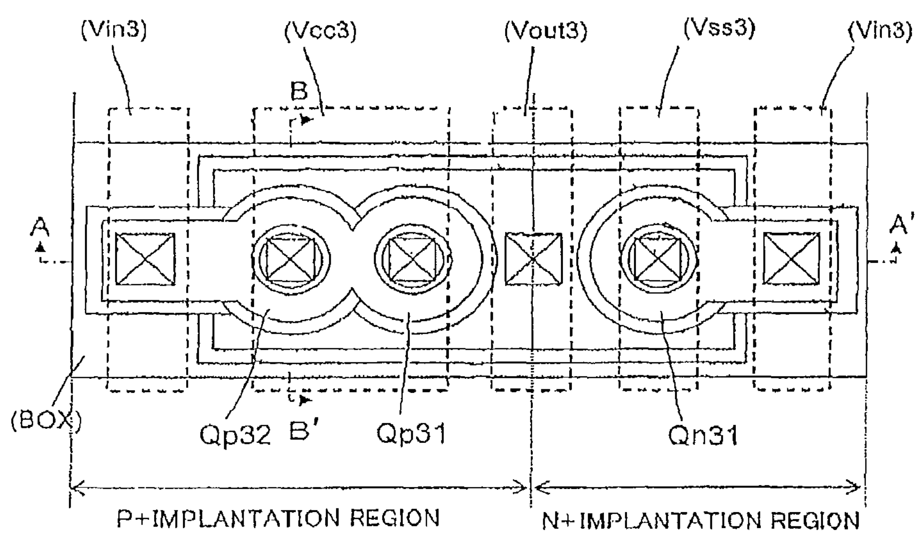
FIG. 41 is a top plan view of the example of modification of the CMOS inverter according to the first embodiment.
Figure 42:
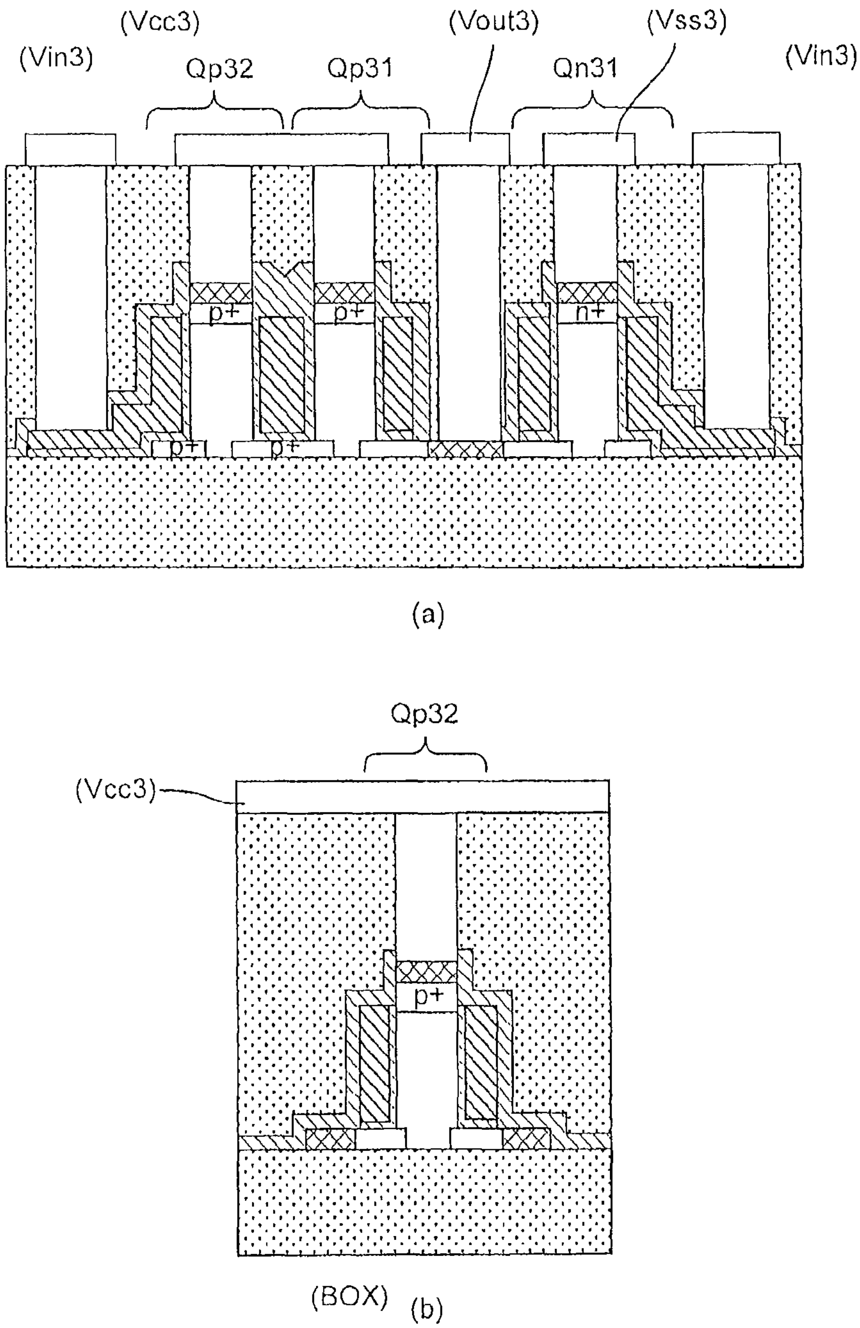
FIGS. 42(*a*) and 42(*b*) are sectional views of the example of modification of the CMOS inverter according to the second embodiment.

In the structure according to the first embodiment, the silicide layer 11 on the drain diffusion layers is formed in such a manner as to avoid reaching the bottom of the planar silicon layer 2, as mentioned above. Alternatively, with a focus on easiness of patterning during lithographic exposure for a gate line and of etching in a stepped portion and control of a gate size, during etching for the resulting gate line, the thickness of the planar silicon layer may be minimized (preferably in the range of about 10 to 30 nm) to form a structure where a silicide layer 211 is formed in such a manner as to reach the buried oxide film, as shown in FIGS. 41, 42(*a*) and 42(*b*).

Second Embodiment

A second embodiment of the present invention shows one example of a CMOS inverter made up using an SGT with a structure where a silicide layer is formed over the entire surface of drain diffusion layers formed in a planar silicon layer, and on a source diffusion layer formed in an upper portion of a pillar-shaped silicon layer. As a result of forming a silicide layer over the entire surface of the drain diffusion layers formed in the planar silicon layer, a parasitic resistance of the drain diffusion layers can be reduced. In addition, as a result of forming a silicide layer on the source diffusion layer formed in the upper portion of the pillar-shaped silicon layer, a parasitic resistance of the source diffusion layer can be reduced. The silicide layers to be formed on the drain diffusion layer and the source diffusion layer can be formed only on the drain diffusion layer and the source diffusion layer through a single process in a self-alignment manner.

Figure 32:
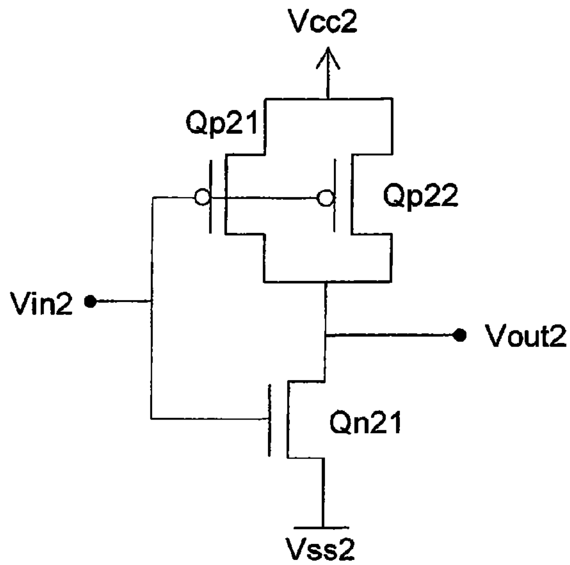
FIG. 32 is an equivalent circuit diagram of a CMOS inverter according to a second embodiment of the present invention.

FIG. 32 is an equivalent circuit diagram of the CMOS inverter according to the second embodiment. A circuit operation of the CMOS inverter will be described below. An input signal Vin 2 is applied to a gate of an NMOS Qn 21 and respective gates of two PMOSs Qp 21, Qp 22. When the Vin 2 is "1", the NMOS Qn 21 is placed in an ON state, and each of the PMOSs Qp 21, Qp 22 is placed in an OFF state, so that an output signal Vout 2 becomes "0". Reversely, when the Vin 2 is "0", the NMOS Qn 21 is placed in an OFF state, and each of the PMOSs Qp 21, Qp 22 is placed in an ON state, so that the Vout 2 becomes "1". As above, the CMOS inverter is operable to allow the output signal Vout 2 to have a value opposite to that of the input signal Vin 2.

Figure 33:
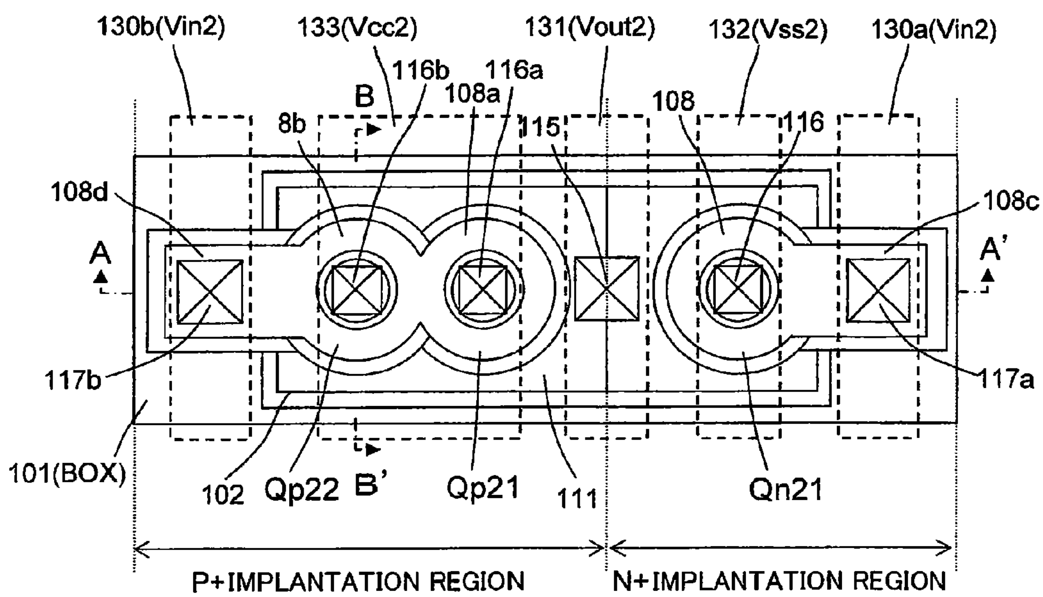
FIG. 33 is a top plan view of the CMOS inverter according to the second embodiment.
Figure 34:
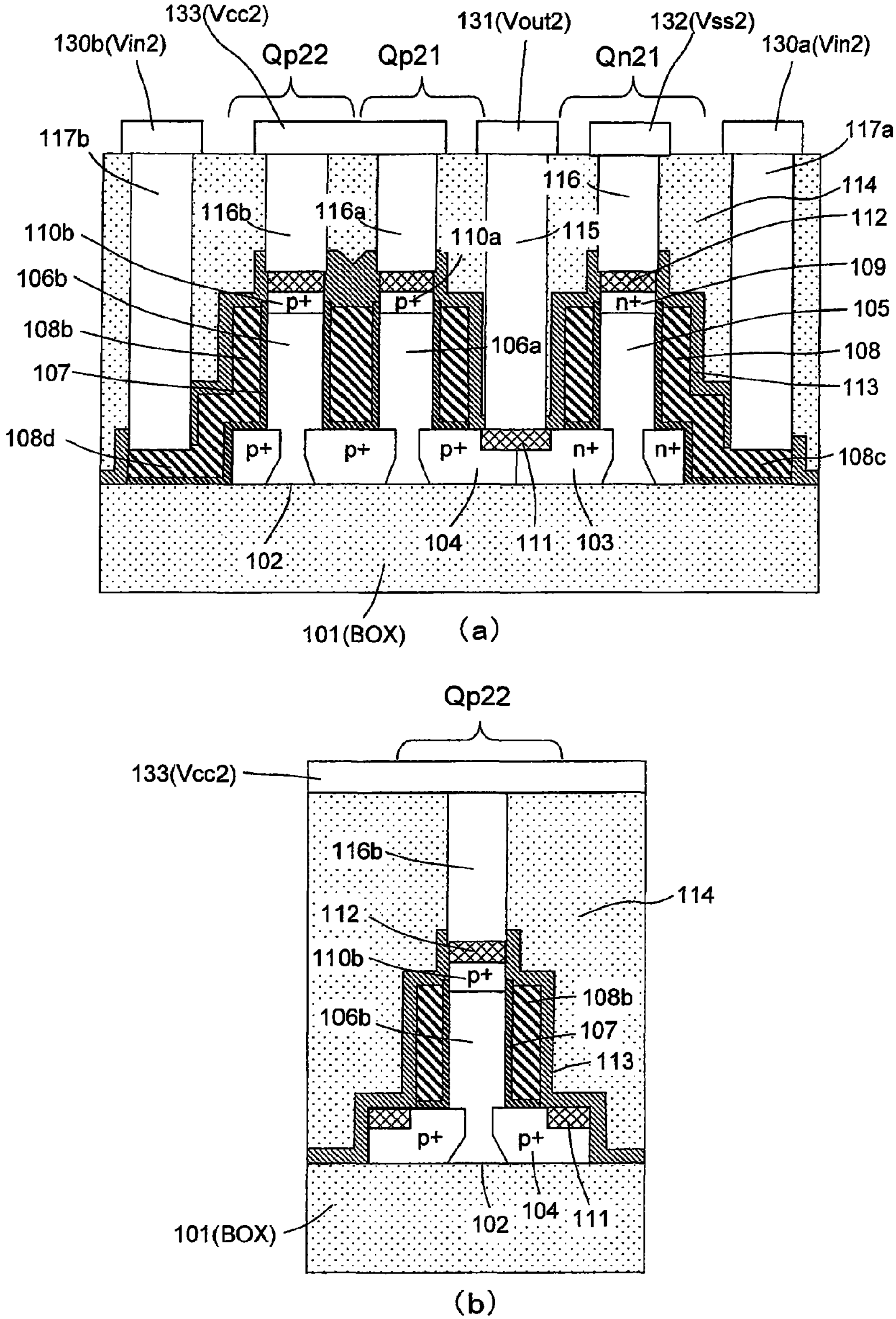
FIGS. 34(*a*) and 34(*b*) are sectional views of the CMOS inverter according to the second embodiment.

FIG. 33 is a top plan view of the CMOS inverter according to the second embodiment. FIGS. 34(*a*) and 34(*b*) are sectional views taken along the cutting-plane line A-A' and the cutting-plane line B-B' in FIG. 33, respectively. With reference to FIGS. 33, 34(*a*) and 34(*b*), a structure of the CMOS inverter according to the second embodiment will be described.

A planar silicon layer 102 is formed on a buried oxide film layer 101. The planar silicon layer 102 comprises an $N^+$ drain diffusion layer 103 and a $P^+$ drain diffusion layer 104. With a view to reducing a resistance of the drain diffusion layers, a silicide layer 111 is formed in surfaces of the $N^+$ drain diffusion layer 103 and the $P^+$ drain diffusion layer 104, in such a manner that the $N^+$ drain diffusion layer 103 and the $P^+$ drain diffusion layer 104 are directly connected to each other through the silicide layer 111. This eliminates a need for a contact for connecting the $N^+$ drain diffusion layer 103 and the $P^+$ drain diffusion layer 104 and element isolation therebetween, so that an inverter occupancy area can be reduced. In addition, element isolation can be achieved simply by isolating the planar silicon layer 102 as an element, so that the element isolation can be achieved while reducing the number of processes and minimizing a processing size. The NMOS transistor Qn 21 is formed based on a pillar-shaped silicon layer 105 formed on the $N^+$ drain diffusion layer 103, and the PMOS transistor (Qp 21, Qp 22) is formed based on a pillar-shaped silicon layer (106*a*, 106*b*) formed on the $P^+$ drain diffusion layer 104. A first dielectric film 107, such as a high-k film, such as a $HfO_2$ film, is formed to surround the pillar-shaped silicon layer (105, 106*a*, 106*b*), and a gate electrode (108, 108*a*, 108*b*) consisting of a metal film, such as a TaN film or a TiN film, is formed to surround the gate dielectric film 107. An $N^+$ source diffusion layer 109 is formed in an upper portion of the NMOS-forming pillar-shaped silicon layer 105, and a $P^+$ source diffusion layer (110*a*, 110*b*) is formed in an upper portion of the PMOS-forming pillar-shaped silicon layer (106*a*, 106*b*), wherein a silicide film 112 is formed in an upper portion of the source diffusion layer (109, 110*a*, 110*b*). A silicon nitride film 113 is formed to cover the above elements so as to serve as a contact stopper. Further, an interlayer silicon oxide film 114 is formed on the silicon nitride film 113, and a contact (115, 116, 116*a*, 116*b*, 117*a*, 117*b*) is formed to penetrate through the silicon oxide film 114 having a flattened surface. The silicon nitride film 113 may be formed to have a stress so as to apply a stress to a channel region of the pillar-shaped silicon layer to improve carrier mobility. In particular, a silicon nitride film having a tensile stress, and a silicon nitride film having a compressive stress, may be formed on the NMOS and the PMOS, respectively, to improve carrier mobility in both the NMOS and the PMOS.

The contact 115 formed on a boundary between the $N^+$ drain diffusion layer 103 and the $P^+$ drain diffusion layer 104 is connected to the output terminal Vout 2 via a line layer 131, and the contact 116 formed on the NMOS (Qn 11)-forming pillar-shaped silicon layer 105 is connected to a ground potential Vss 2 via a line layer 132. Further, the contact (116*a*, 116*b*) formed on the PMOS (Qp 11, Qp 12)-forming pillar-shaped silicon layer (106*a*, 106*b*) is connected to a power supply potential Vcc 2 via a line layer 133, and each of the contact 117*a* formed on a gate line 108*c* extending from the gate electrode surrounding the NMOS-forming pillar-shaped silicon layer 105, and the contact 117*b* formed on a gate line 108*d* extending from the gate electrode surrounding the PMOS-forming pillar-shaped silicon layer (106*a*, 106*b*), is connected to the input terminal Vin 2 via a line layer (130*a*, 130*b*). In this manner, the inverter is formed.

Preferably, the channel region of each of the pillar-shaped silicon layers is doped with no impurity, or has an impurity concentration of $1\ e^{-17}\ cm^{-3}$ or less. The reason is that, if the impurity concentration is greater than this value, a variation in transistor characteristics due to statistical fluctuation of impurities becomes large. A threshold adjustment of the transistor can be performed, for example, by adjusting a work function of a gate material. The first dielectric film, such as a high-k film, may be a silicon oxide film or a silicon nitride film, and the metal gate electrode may be a silicided polysilicon film.

Preferably, an impurity distribution is set to allow the drain diffusion layer (103, 104) to be formed in a region ranging from underneath the pillar-shaped silicon layer to the buried oxide film layer 101, and the impurity concentration and a size of the pillar-shaped silicon layer are set to allow an inside of the pillar-shaped silicon layer to become fully depleted during a transistor operation. As a result of setting the impurity distribution to form the drain diffusion layer (103, 104) in the above region, the inside of the pillar-shaped silicon layer is kept in a floating body structure irrespective of an operation condition. In addition, as a result of setting the impurity concentration and the size of the pillar-shaped silicon layer in the above manner, the inside of the pillar-shaped silicon layer is fully depleted during a transistor operation, so that an electric field inside the pillar-shaped silicon layer can be relaxed to improve carrier mobility. Furthermore, as a result of diffusing an impurity to allow the drain diffusion layer (103, 104) to be formed in the region reaching the buried oxide film layer 101, a capacitance component in a bottom of the drain diffusion layer is significantly reduced, so that a total parasitic capacitance of the drain diffusion layer can be reduced. The impurity may be diffused to cover a bottom of the pillar-shaped silicon layer.

The structure where the contact (117*a*, 117*b*) for the gate is formed on the gate line (108*c*, 108*d*) formed on the buried oxide film layer, makes it possible to reduce an opposed area between the drain diffusion layer (103, 104) and the gate, so that a parasitic capacitance between the gate and the drain can be reduced. In a layout illustrated in FIG. 33, with a view to reducing an opposed area between the gate line and the drain diffusion layer (103, 104), the contacts 117*a*, 117*b* for the respective gate lines 108*c*, 108*d* are formed on the buried oxide film layer 101 independently in corresponding ones of the NMOS and the PMOS.

Preferably, the contact 115 formed on the drain diffusion layer is formed on the boundary between the drain diffusion layer 103 and the $P^+$ drain diffusion layer 104. The reason is that the pillar-shaped silicon layer (105, 106*a*) needs to be spaced apart from the boundary between the drain diffusion layer and the $P^+$ drain diffusion layer, by a distance corresponding to a margin against overlapping between the pillar-shaped silicon layer and an injection region, and this space can be effectively utilized by forming the contact on the boundary. This makes it possible to reduce an occupancy area of the inverter circuit.

Figure 35:
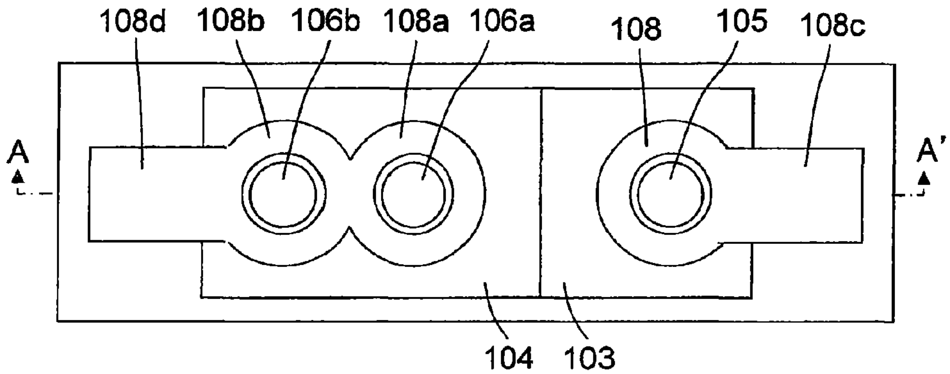
FIGS. 35(*a*) and 35(*b*) illustrate a part of production processes in the second embodiment.
Figure 35:
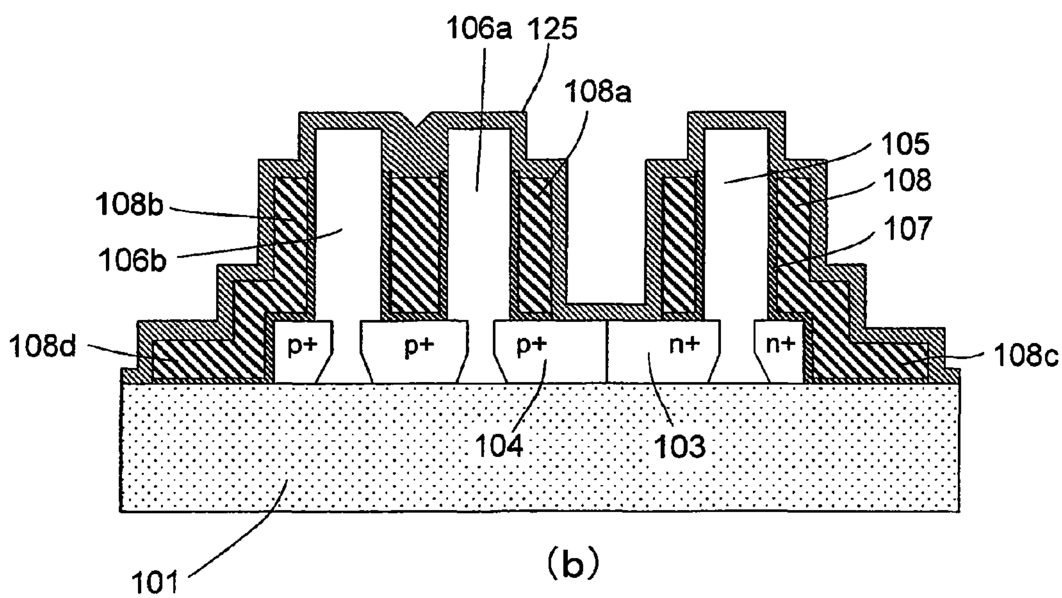

With reference to FIGS. 35(*a*) to 39(*b*), a method of forming the CMOS converter according the second embodiment, as one example of a semiconductor device production method of the present invention, will be described below. In FIGS. 35(*a*) to 39(*b*), the figure suffixed with (a) is a top plan view, and the figure suffixed with (b) is a sectional view taken along the line A-A'.

Any production process before completion of gate formation in the second embodiment is the same as that in the first embodiment. Thus, the following description will be made about processes after the completion of gate formation.

As shown in FIGS. 35(*a*) and 35(*b*), a silicon nitride film 125 is formed to a film thickness of about 10 to 50 nm.

Figure 36:
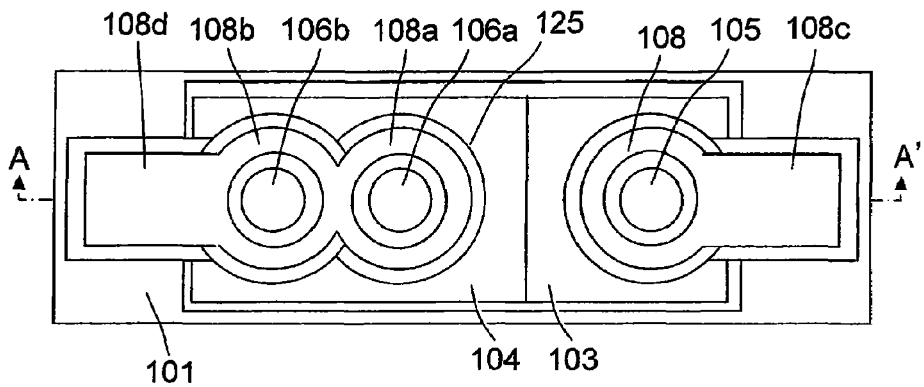
FIGS. 36(*a*) and 36(*b*) illustrate a part of production processes in the second embodiment.
Figure 36:
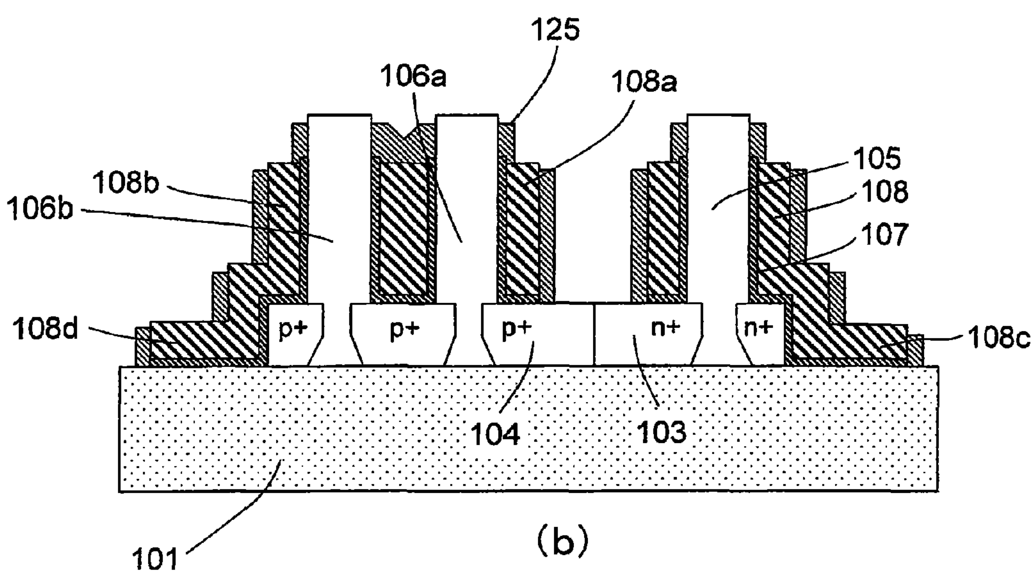

Then, as shown in FIGS. 36(*a*) and 36(*b*), the silicon nitride film 125 is etched back in such a manner that a sidewall of the pillar-shaped silicon layer and a sidewall of the gate are covered by the silicon nitride film 125 while exposing a top surface of the pillar-shaped silicon layer, and a surface of the drain diffusion layer (103, 104). This structure provides the following advantages. Firstly, the silicon nitride film 125 is disposed to isolate between the gate electrode (108, 108*a*, 108*b*) and the upper portion of the pillar-shaped silicon layer and between the gate electrode (108, 108*a*, 108*b*) and the drain diffusion layer (103, 104). This makes it possible to prevent short-circuiting between the gate electrode and the upper portion of the pillar-shaped silicon layer, and short-circuiting between the gate electrode and the drain diffusion layer, which would otherwise be caused by excessive formation of silicide.

Secondly, the silicon nitride film is disposed to cover the sidewall of the upper portion of the pillar-shaped silicon layer. This makes it possible to prevent the pillar-shaped silicon layer from being excessively silicided through the sidewall of the pillar-shaped silicon layer, during a silicidation process in FIGS. 38(*a*) and 38(*b*). If a silicide layer is excessively formed in the upper portion of the pillar-shaped silicon layer to get closer to a junction of the source diffusion layer, it causes an increase in junction leak. Thus, it is necessary to control the silicide layer to keep from being excessively formed. Thirdly, the silicon nitride film 125 is disposed to cover the first dielectric film 107, such as a high-k. This makes it possible to prevent the first dielectric film, such as a high-k film, from being damaged during ion implantation in a next process and during wet treatment and ion implantation in subsequent processes. As above, this process of forming the protective silicon nitride film includes a purpose of preventing the excessive silicidation and the damage of the high-k film. Thus, this process may be performed after an after-mentioned ion implantation process and before an after-mentioned process of siliciding the surfaces of the source and drain diffusion layers.

If a silicon oxide film is used in place of the silicon nitride film, it will be undesirably wet-etched by hydrofluoric acid used in a cleaning/releasing process and a silicidation pre-treatment. Thus, it is preferable to use a film insoluble in hydrofluoric acid, such as the silicon nitride film. Further, an excessively small film thickness of the silicon nitride film makes it impossible to fully protect the first dielectric film 107, such as a high-k film, and an excessively large film thickness of the silicon nitride film causes an increase in occupancy area by just the film thickness of the high-k film formed on the sidewall of the gate. In the second embodiment, the silicon nitride film is used as a protective film.

Alternatively, any other suitable film capable of functioning as the protective film, such as a film having a layered structure comprising a silicon nitride film and a silicon oxide film, may also be used.

Figure 37:
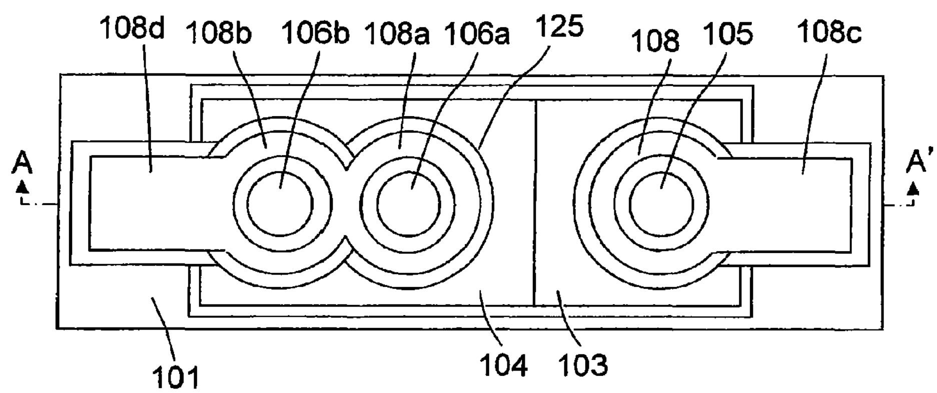
FIGS. 37(*a*) and 37(*b*) illustrate a part of production processes in the second embodiment.
Figure 37:
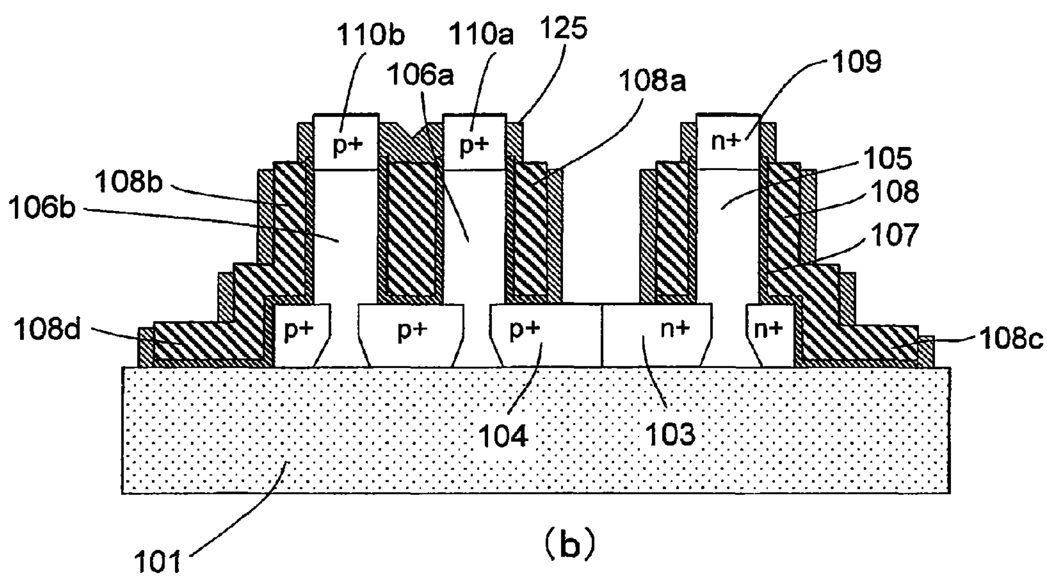

Then, as shown in FIGS. 37(*a*) and 37(*b*), patterning is performed using a resist, and an $N^+$ source diffusion layer 109 is formed in an upper portion of the pillar-shaped silicon layer 105 by ion implantation or other injection technique. In the same manner, a $P^+$ source diffusion layer (110*a*, 110*b*) is formed in an upper portion of the pillar-shaped silicon layer (106*a*, 106*b*).

Figure 38:
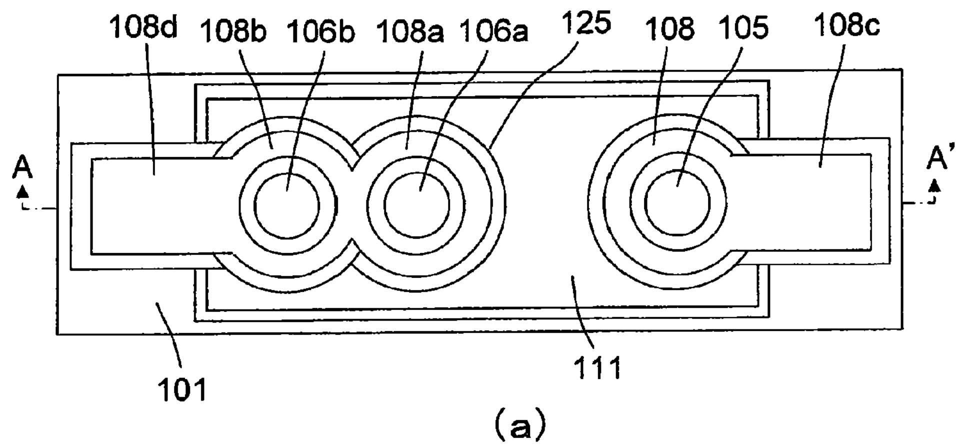
FIGS. 38(*a*) and 38(*b*) illustrate a part of production processes in the second embodiment.
Figure 38:
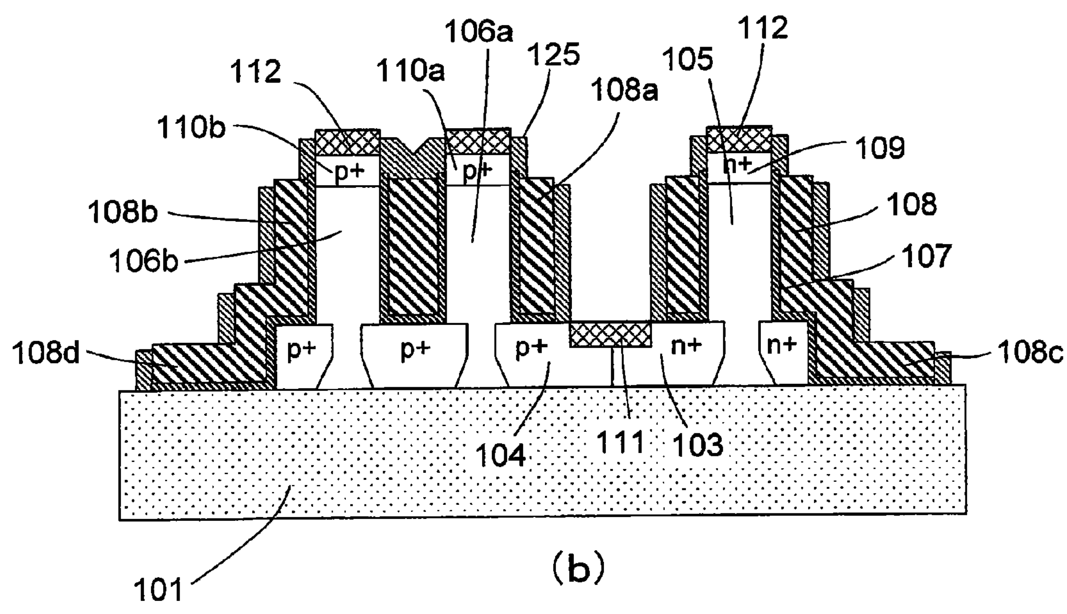

Then, as shown in FIGS. 38(*a*) and 38(*b*), a metal, such as Ni or Co, is sputtered onto each of the surfaces of the source and drain diffusion layers to form a metal film therein, and the metal film is silicided through a heat treatment, whereafter an unreacted portion of the metal film is removed to form a silicide layer 111 on the drain diffusion layer (103, 104) and a silicide layer 112 on the source diffusion layer (109, 110*a*, 110*b*).

Figure 39:
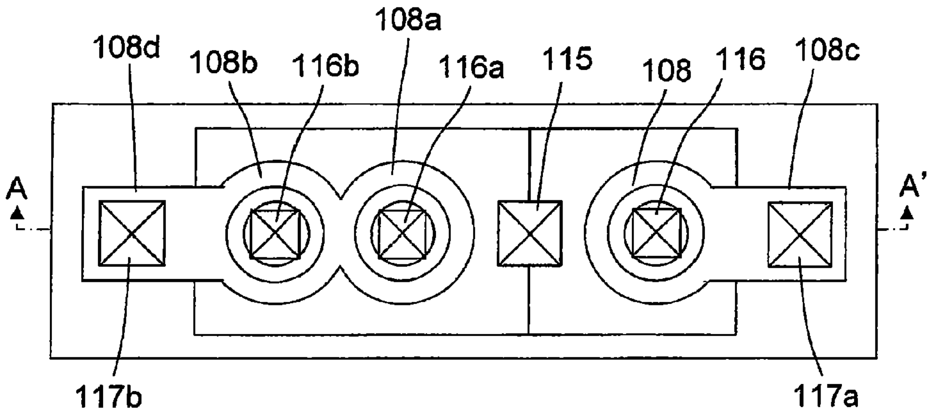
FIGS. 39(*a*) and 39(*b*) illustrate a part of production processes in the second embodiment.
Figure 39:
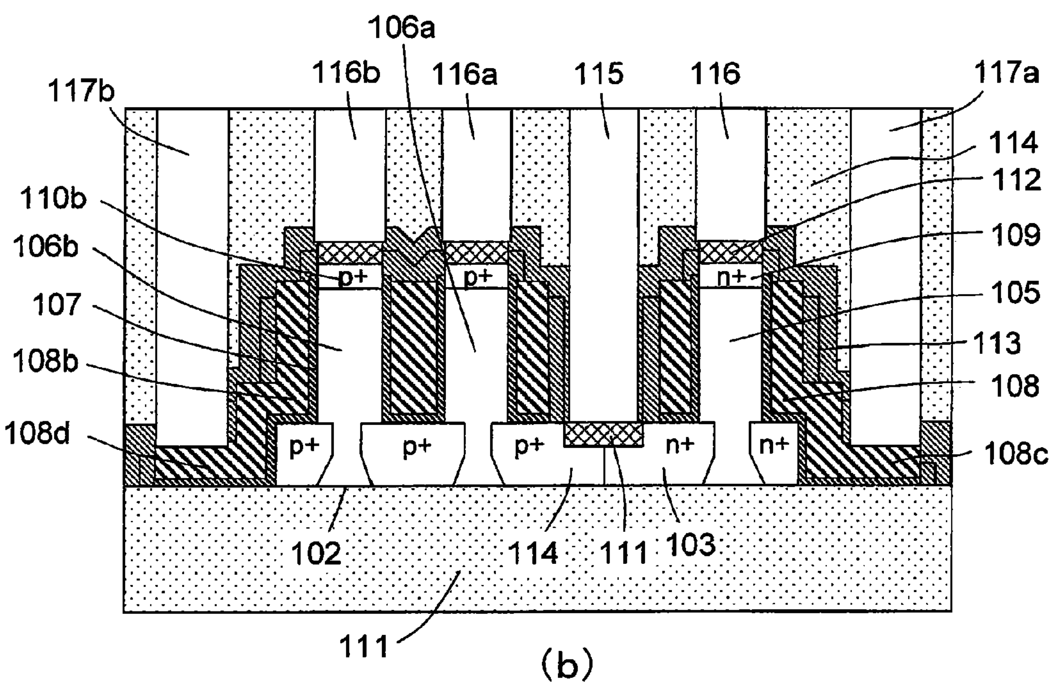
Figure 40:
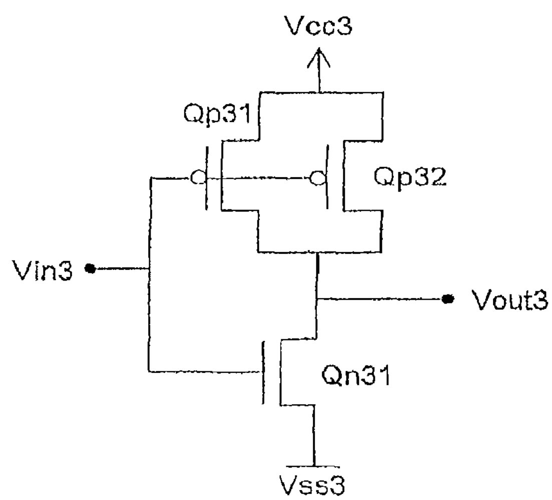
FIG. 40 is an equivalent circuit diagram of one example of modification of the CMOS inverter according to the first embodiment.

Then, as shown in FIGS. 39(*a*) and 39(*b*), after a silicon nitride liner film 113 is formed, a silicon oxide film 114 is formed, and flattened by CMP. Subsequently, a contact (115, 116, 116*a*, 116*b*, 117*a*, 117*b*) is formed on each of the drain diffusion layers on the planar silicon layer, the gates, and the source diffusion layer on the respective pillar-shaped silicon layers. During this contact formation, the silicon nitride liner film 113 is used as an etching stopper.

In the second embodiment, the gate electrode can be formed around the pillar-shaped silicon layer by a desired film thickness, in a self-alignment manner. This makes it possible to densely arrange a plurality of pillar-shaped silicon layers having different gate electrodes so as to reduce a circuit occupancy area. In addition, a process having a sufficient process margin for forming the gate electrode can be established to facilitate gate line formation which has been a challenge in SGT.

Further, in the second embodiment, the silicide layer is formed over the entire area of the surfaces of the drain diffusion layers formed in the planar silicon layer, so that a resistance of the drain diffusion layers is significantly reduced to suppress an influence of a parasitic resistance caused by the drain diffusion layers. This makes it possible to reduce the number of contacts onto the drain diffusion layers, and use the silicide layer as a line layer for the drain diffusion layers, which provides enhanced flexibility in layout design.

Third Embodiment

A third embodiment of the present invention shows one example of an SGT having a structure where a single contact is formed on tops of two or more pillar-shaped silicon layers in such a manner as to be shared by the pillar-shaped silicon layers.

Figure 43:
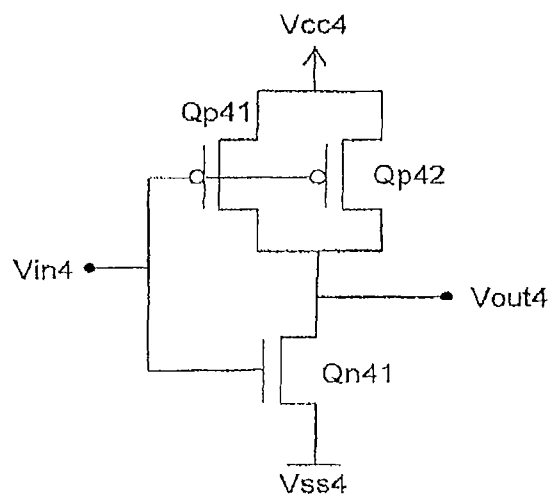
FIG. 43 is an equivalent circuit diagram of a CMOS inverter according to a third embodiment of the present invention.

FIG. 43 is an equivalent circuit diagram of a CMOS inverter according to the third embodiment. A circuit operation of the CMOS inverter is the same as that in the second embodiment, and its description will be omitted here.

Figure 44:
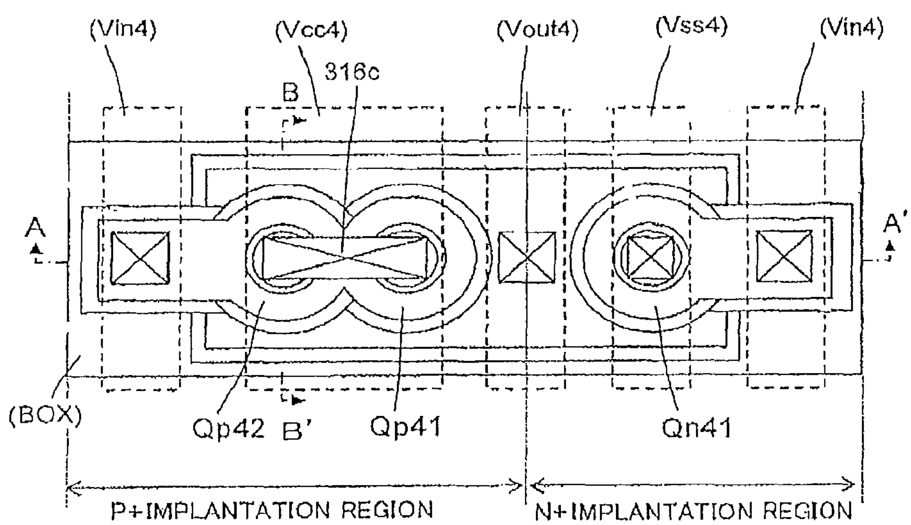
FIG. 44 is a top plan view of the CMOS inverter according to the third embodiment.
Figure 45:
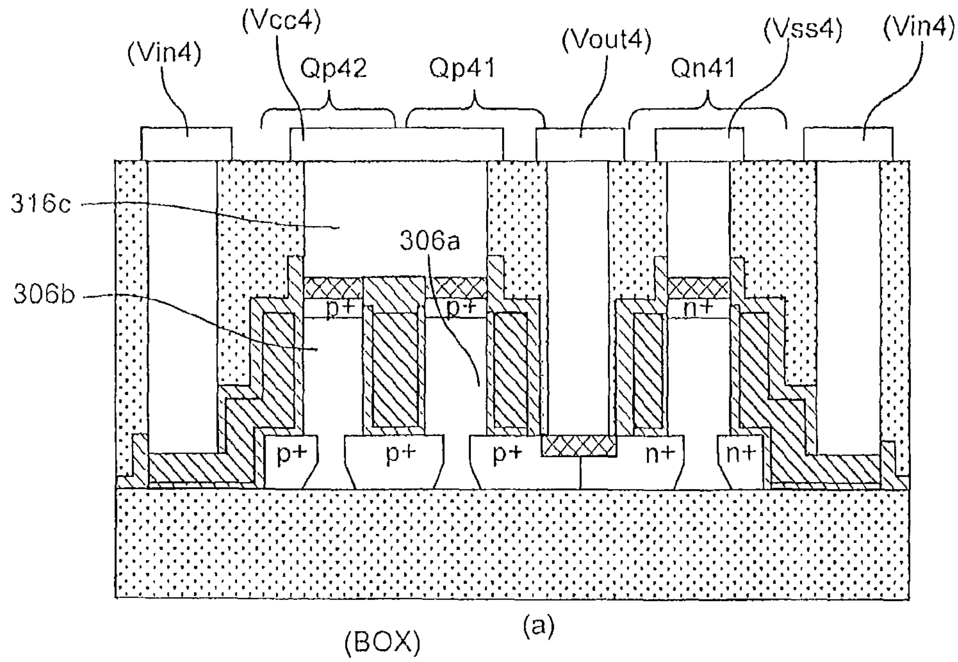
FIGS. 45(*a*) and 45(*b*) are sectional views of the CMOS inverter according to the third embodiment.
Figure 45:
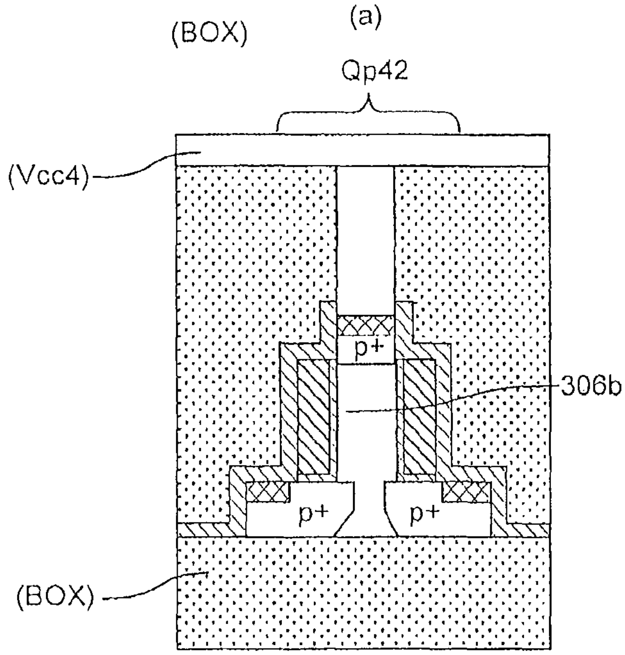

FIG. 44 is a top plan view of the CMOS inverter according to the third embodiment. FIGS. 45(*a*) and 45(*b*) are sectional views taken along the cutting-plane line A-A' and the cutting-plane line B-B' in FIG. 44, respectively.

The third embodiment is different from the second embodiment in that, in the third embodiment, source diffusion layers formed in respective upper portions of adjacent two pillar-shaped silicon layers 306*a*, 306*b* forming PMOSs Qp 41, Qp 42, are connected to each other through a rectangular common contact 316*c*. Particularly, in cases where a distance between adjacent ones of a plurality of pillar-shaped silicon layers is less than a minimum size of a contact, it is difficult to form a commonly-used contact on a top of each of all the pillar-shaped silicon layers. Even in such cases, the technique according to the third embodiment makes it possible to facilitate contact formation. The remaining structure and a production method are the same as those in the second embodiment, and their description will be omitted here.

Fourth Embodiment

A fourth embodiment of the present invention relates to a layout intended to modify a technique of forming a contact onto a gate line so as to reduce an occupancy area of a CMOS inverter.

Figure 46:
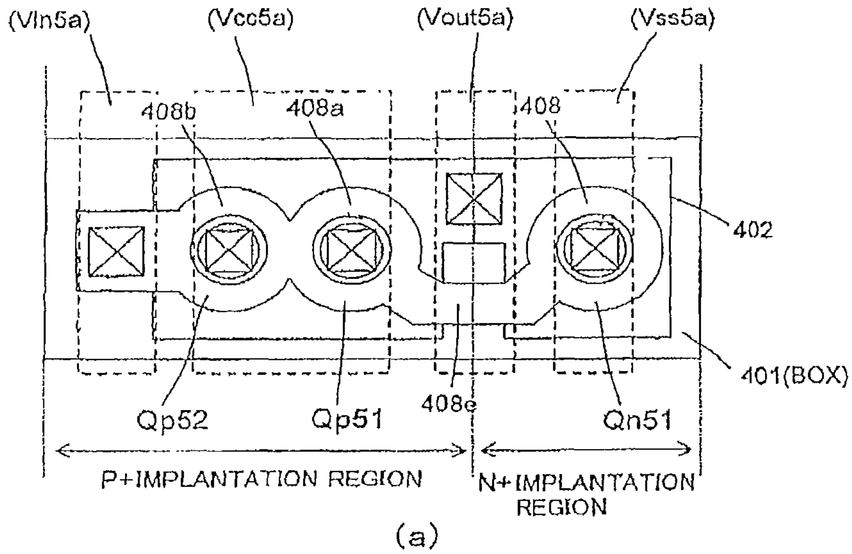
FIGS. 46(*a*) and 46(*b*) are top plan views of a CMOS inverter according to a fourth embodiment of the present invention.
Figure 46:
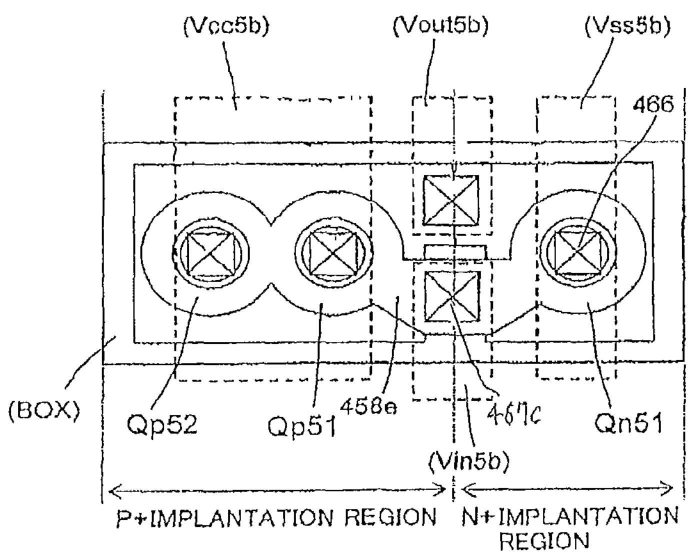

FIGS. 46(*a*) and 46(*b*) are respective top plan views of two types of CMOS inverters according to the fourth embodiment. In the CMOS converter illustrated in FIG. 46(*a*), a gate 408 of an NMOS Qn, a gate 408*a* of a PMOS Qp 51, and a gate 408*b* of a PMOS Qp 52, are connected to each other through a gate line 408*e* so as to reduce the number of contacts onto the gates to reduce an inverter occupancy area. Further, with a view to reducing a parasitic capacitance between a drain diffusion layer and the gate, a configuration of a planar silicon layer 402 is modified to allow the gate line 408*e* to be formed on a buried oxide film 401 so as to minimize an opposed area between the gate line 408*e* and the planar silicon layer 402.

In the CMOS inverter illustrated in FIG. 46(*b*), a contact 467*c* onto a gate is formed on a gate line 458*e* to further reduce the inverter occupancy area.

Fifth Embodiment

A fifth embodiment of the present invention relates to an SGT designed such that respective connections to a gate electrode and a source diffusion layer formed in an upper portion of a pillar-shaped silicon layer are achieved by a single contact. The following description will be made by taking an E-type NMOS inverter as an example.

Figure 47:
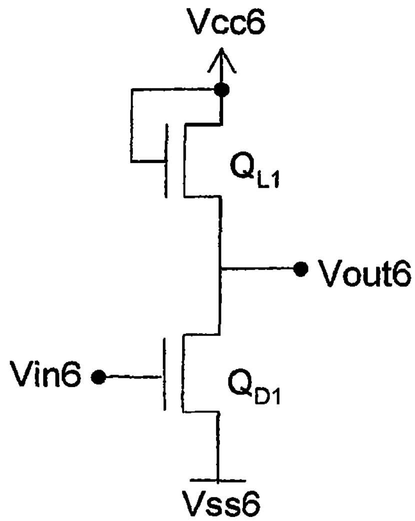
FIG. 47 is an equivalent circuit diagram of an NMOS inverter according to a fifth embodiment of the present invention.

FIG. 47 is an equivalent circuit diagram of an E-type NMOS inverter according to the fifth embodiment. A circuit operation of the E-type NMOS inverter will be described below. A gate and a source of a load NMOS $Q_{L1}$ are connected to each other. An input signal Vin 6 is applied to a gate of a driver NMOS $Q_{D1}$. When the Vin 6 is "1", the driver NMOS $Q_{D1}$ is placed in an ON state, and the load NMOS $Q_{L1}$ is also placed in an ON state. However, the driver NMOS $Q_{D1}$ has a higher driving capability, and thereby an output signal Vout 6 becomes "0". Reversely, when the Vin 6 is "0", the driver NMOS $Q_{IN}$ is placed in an OFF state, and the load NMOS $Q_{L1}$ is placed in the ON state, so that the Vout 6 becomes "1". As above, the E-type NMOS inverter is operable to allow the output signal Vout 6 to have a value opposite to that of the input signal Vin 6.

Figure 48:
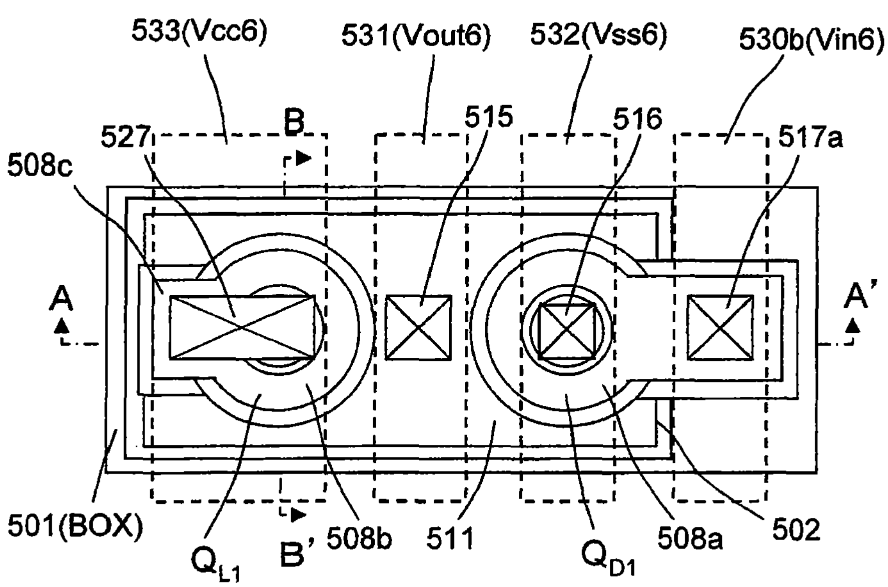
FIG. 48 is a top plan view of the NMOS inverter according to the fifth embodiment.
Figure 49:
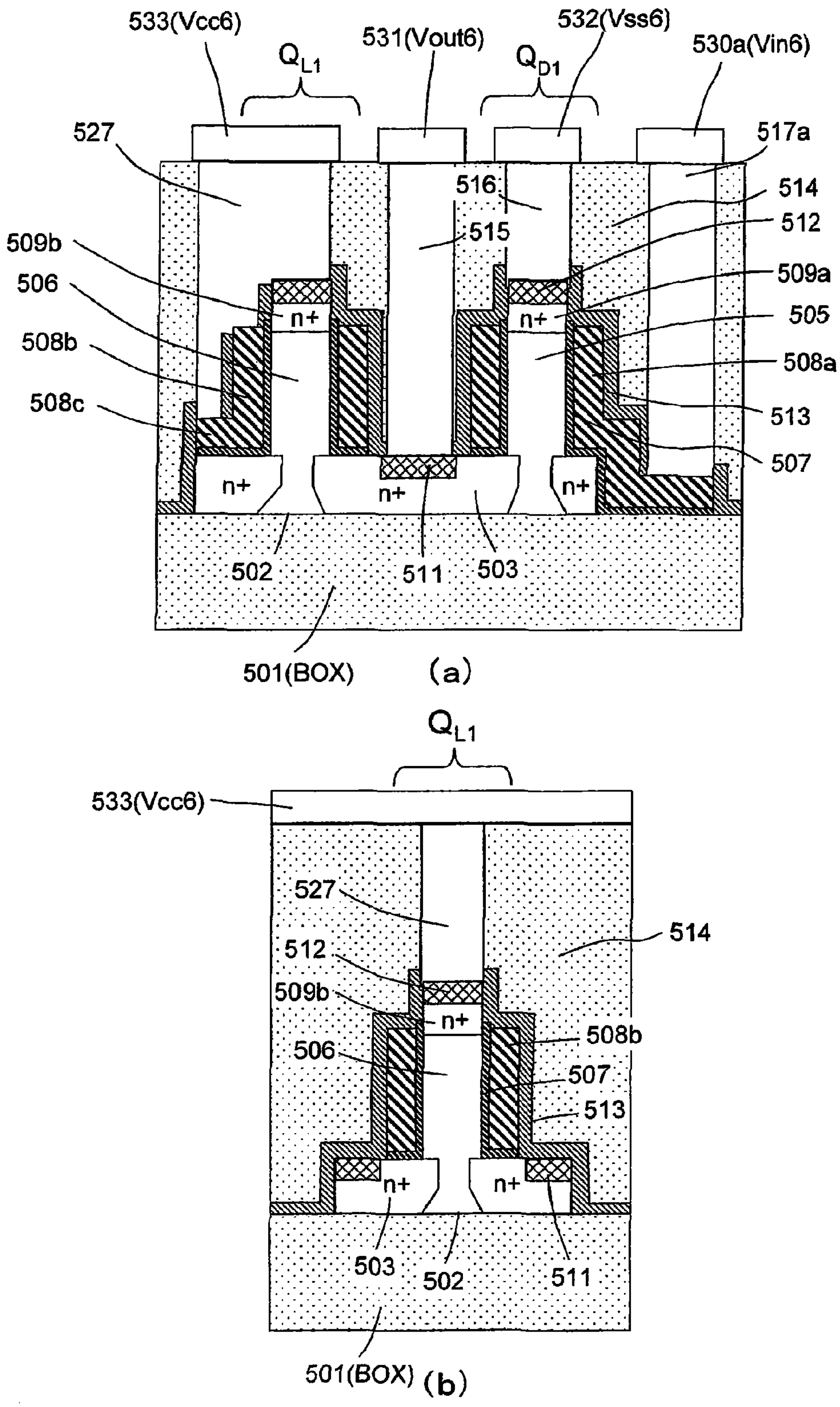
FIGS. 49(*a*) and 49(*b*) are sectional views of the CMOS inverter according to the fifth embodiment.

FIG. 48 is a top plan view of the E-type NMOS inverter according to the fifth embodiment. FIGS. 49(*a*) and 49(*b*) are sectional views taken along the cutting-plane line A-A' and the cutting-plane line B-B' in FIG. 48, respectively. With reference to FIGS. 48, 49(*a*) and 49(*b*), a structure of the E-type NMOS inverter according to the fifth embodiment will be described.

A planar silicon layer 502 is formed on a buried oxide film layer 501. The planar silicon layer 502 comprises an $N^+$ drain diffusion layer 503. With a view to reducing a resistance of the drain diffusion layer, a silicide layer 511 is formed in a surface of the $N^+$ drain diffusion layer 503. The NMOS drive transistor $Q_{D1}$ is formed based on a pillar-shaped silicon layer 505 formed on the $N^+$ drain diffusion layer 503, and the NMOS load transistor $Q_{L1}$ is formed based on a pillar-shaped silicon layer 506 formed on the $N^+$ drain diffusion layer 503. A first dielectric film 507, such as a high-k film, such as a $HfO_2$ film, is formed to surround the pillar-shaped silicon layer (505, 506), and a gate electrode (508*a*, 508*b*) consisting of a metal film, such as a TaN film or a TiN film, is formed to surround the gate dielectric film 507. An $N^+$ source diffusion layer 509*a* is formed in an upper portion of the drive NMOS-forming pillar-shaped silicon layer 505, and an $N^+$ source diffusion layer 509*b* is formed in an upper portion of the load NMOS-forming pillar-shaped silicon layer 506. A silicide film 512 is formed in an upper portion of each of the source diffusion layers. A silicon nitride film 513 is formed to cover the above elements so as to serve as a contact stopper. Further, an interlayer silicon oxide film 514 is formed on the silicon nitride film 513, and a contact (515, 516, 517*a*, 527) is formed to penetrate through the silicon oxide film 514 having a flattened surface.

The contact 517*a* connected onto the gate of the drive NMOS $Q_{D1}$ is connected to the input terminal Vin 6 via a line layer 530*a*, and the contact 516 formed on the drive NMOS ($Q_{D1}$)-forming pillar-shaped silicon layer 505 is connected to a ground potential Vss 6 via a line layer 532. The single contact 527 formed on both a gate line 508*c* of the load NMOS Qu, and the source diffusion layer 509*b* in the upper portion of the load NMOS-forming pillar-shaped silicon layer, is connected to a power supply potential Vcc 6 via a line layer 533. Further, the contact 515 formed on the $N^+$ drain diffusion layer 503 is connected to the output terminal Vout 6 via a line layer 531. In this manner, the E-type NMOS inverter is formed.

In the fifth embodiment, the silicide layer 511 is formed over the entire area of the surface of the $N^+$ drain diffusion layer 503. Alternatively, the silicide layer 511 may be formed in a part (an area between the drive transistor $Q_{D1}$ and the load transistor $Q_{L1}$) of the surface of the $N^+$ drain diffusion layer 503.

A method of forming or producing the semiconductor device according to the fifth embodiment is substantially the same as those in the first and second embodiments, and its description will be omitted.

In the fifth embodiment, a contact onto the gate line 508*c* extending from the gate electrode of the load NMOS $Q_{L1}$ and a contact onto the source diffusion layer 509*b* in the upper portion of the load NMOS-forming pillar-shaped silicon layer, are formed as the single common contact 527. This makes it possible to reduce the number of contacts, and reduce an area of the inverter and an associated device.

Further, in the fifth embodiment, a silicide layer is formed on the drain diffusion layer formed in the planar silicon layer, so that a resistance of the drain diffusion layer is reduced to suppress an influence of a parasitic resistance caused by the drain diffusion layer. This makes it possible to reduce the number of contacts onto the drain diffusion layer, and use the silicide layer as a line layer for the drain diffusion layer, which provides enhanced flexibility in layout design.

Although the fifth embodiment has been described by taking a common contact onto a gate line and a source diffusion layer in an E-type NMOS inverter, as an example, the common contact may be employed in a circuit based on a commonly-used CMOS, as well as the E-type NMOS inverter.

Sixth Embodiment

A sixth embodiment of the present invention relates to an SGT designed such that respective connection to a gate electrode and a drain diffusion layer formed underneath a pillar-shaped silicon layer are achieved by a single contact. The following description will be made by taking a D-type NMOS inverter as an example.

Figure 50:
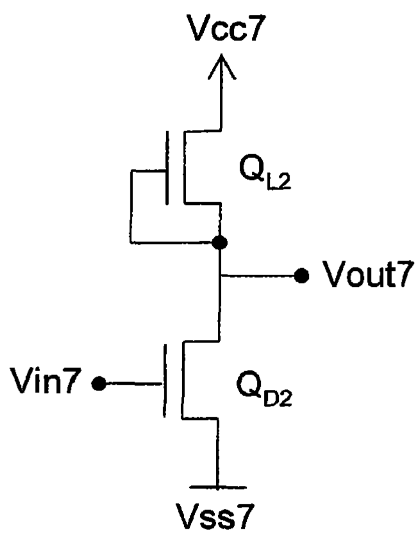
FIG. 50 is an equivalent circuit diagram of an NMOS inverter according to a sixth embodiment of the present invention.

FIG. 50 is an equivalent circuit diagram of a D-type NMOS inverter according to the sixth embodiment. A circuit operation of the D-type NMOS inverter will be described below. A load NMOS $Q_{L2}$ is a depletion-type transistor, wherein a gate and a source thereof are connected to each other. An input signal Vin 7 is applied to a gate of a driver NMOS $Q_{D2}$. When the Vin 7 is "1", the driver NMOS $Q_{D2}$ is placed in an ON state, and the load NMOS $Q_{L2}$ is also placed in an ON state. However, the driver NMOS $Q_{D2}$ has a higher driving capability, and thereby an output signal Vout 7 becomes "0". Reversely, when the Vin 7 is "0", the driver NMOS $Q_{D2}$ is placed in an OFF state, and the load NMOS $Q_{L2}$ is placed in the ON state, so that the Vout 7 becomes "1". As above, the D-type NMOS inverter is operable to allow the output signal Vout 7 to have a value opposite to that of the input signal Vin 7.

Figure 51:
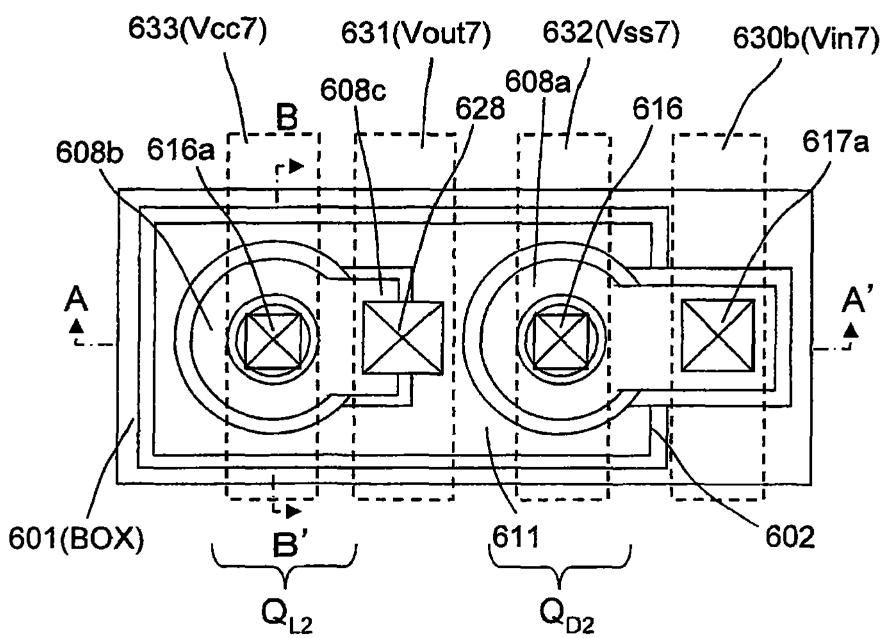
FIG. 51 is a top plan view of the NMOS inverter according to the sixth embodiment.
Figure 52:
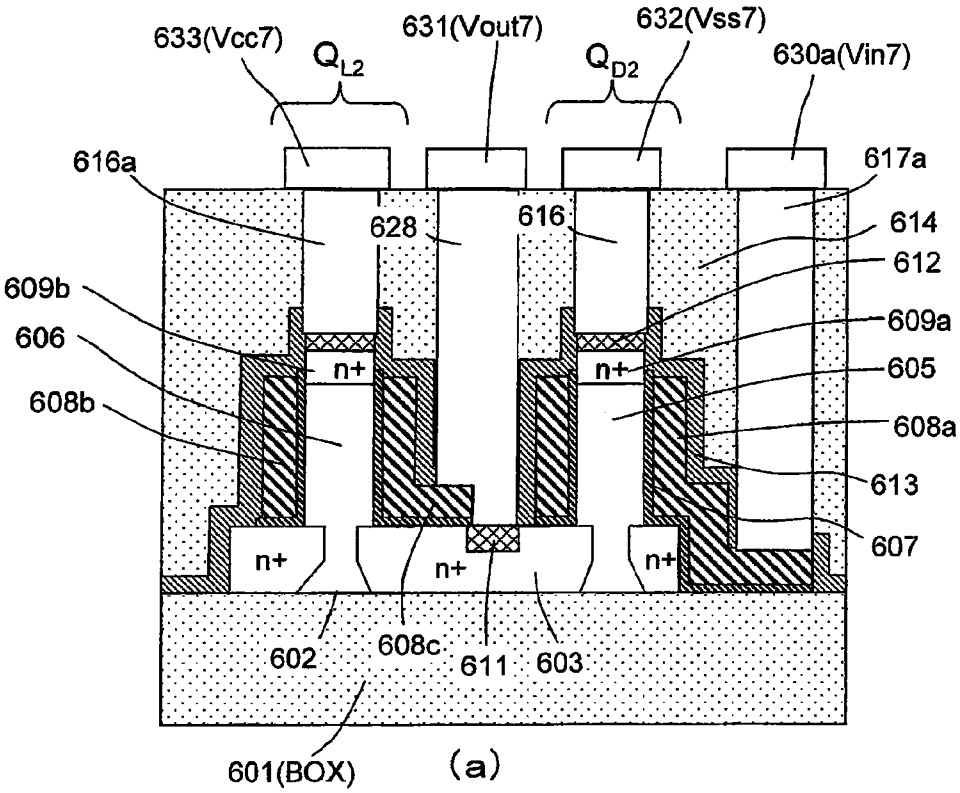
FIGS. 52(*a*) and 52(*b*) are sectional views of the NMOS inverter according to the sixth embodiment.
Figure 52:
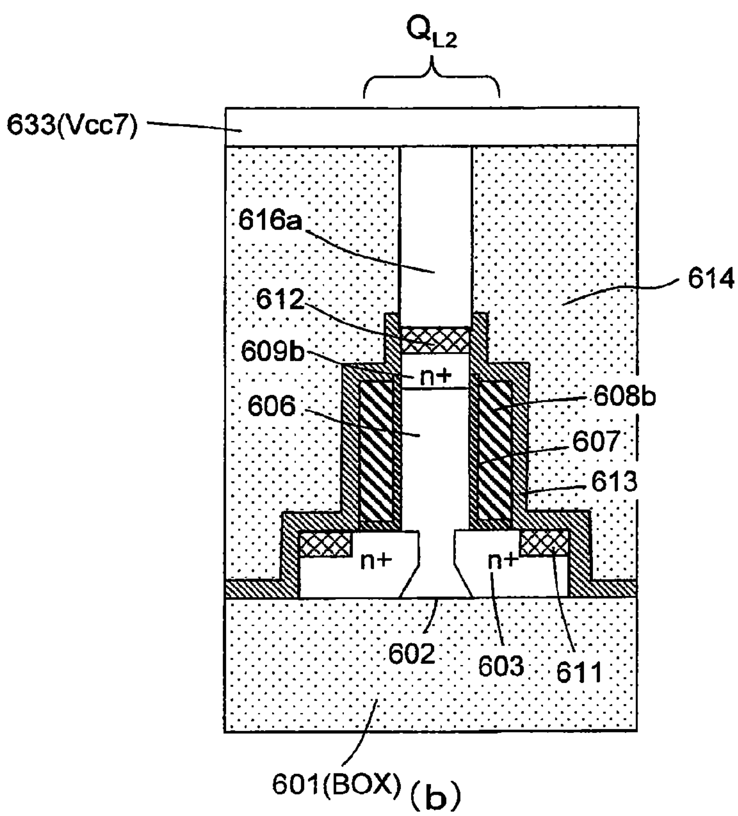

FIG. 51 is a top plan view of the D-type NMOS inverter according to the sixth embodiment. FIGS. 52(*a*) and 52(*b*) are sectional views taken along the cutting-plane line A-A' and the cutting-plane line B-B' in FIG. 51, respectively. With reference to FIGS. 51, 52(*a*) and 52(*b*), a structure of the D-type NMOS inverter according to the sixth embodiment will be described.

A planar silicon layer 602 is formed on a buried oxide film layer 601. The planar silicon layer 602 comprises an $N^+$ drain diffusion layer 603. With a view to reducing a resistance of the drain diffusion layer, a silicide layer 611 is formed in a surface of the $N^+$ drain diffusion layer 603. The NMOS drive transistor $Q_{D2}$ is formed based on a pillar-shaped silicon layer 605 formed on the $N^+$ drain diffusion layer 603, and the NMOS load transistor $Q_{L2}$ is formed based on a pillar-shaped silicon layer 606 formed on the $N^+$ drain diffusion layer 603. A first dielectric film 607, such as a high-k film, such as a $HfO_2$ film, is formed to surround the pillar-shaped silicon layer (605, 606), and a gate electrode (608*a*, 608*b*) consisting of a metal film, such as a TaN film or a TiN film, is formed to surround the gate dielectric film 607. An $N^+$ source diffusion layer 609*a* is formed in an upper portion of the drive NMOS-forming pillar-shaped silicon layer 605, and an $N^+$ source diffusion layer 609*b* is formed in an upper portion of the load NMOS-forming pillar-shaped silicon layer 606. A silicide film 612 is formed in an upper portion of each of the source diffusion layers. A silicon nitride film 613 is formed to cover the above elements so as to serve as a contact stopper. Further, an interlayer silicon oxide film 614 is formed on the silicon nitride film 613, and a contact (615, 616*a*, 517*a*, 628) is formed to penetrate through the silicon oxide film 614 having a flattened surface.

The contact 617*a* connected onto the gate of the drive NMOS $Q_{D2}$ is connected to the input terminal Vin 7 via a line layer 630*a*, and the contact 616 formed on the drive NMOS ($Q_{D2}$)-forming pillar-shaped silicon layer 605 is connected to a ground potential Vss 7 via a line layer 632. The single contact 628 formed on both a gate line 608*c* of the load NMOS $Q_{L2}$, and the drain diffusion layer 603 is connected to the output terminal Vout 7 (631). Further, the contact 616*a* formed on the $N^+$ source diffusion layer 609*a* in the upper portion of the drive NMOS-forming pillar-shaped silicon layer is connected to a power supply potential Vcc 7 (633). In this manner, the D-type NMOS inverter is formed.

In the six embodiment, the silicide layer 611 is formed over the entire area of the surface of the $N^+$ drain diffusion layer 603. Alternatively, the silicide layer 611 may be formed in a part (an area between the drive transistor $Q_{D2}$ and the load transistor $Q_{L2}$) of the surface of the $N^+$ drain diffusion layer 603.

A method of forming or producing the semiconductor device according to the sixth embodiment is substantially the same as those in the first and second embodiments, and its description will be omitted.

In the sixth embodiment, a contact onto the gate line 608*c* extending from the gate electrode of the load NMOS $Q_{L2}$ and a contact onto the drain diffusion layer 603 are formed as the single common contact 628. This makes it possible to reduce the number of contacts, and reduce an area of the inverter and an associated device.

Further, in the sixth embodiment, a silicide layer is formed on the drain diffusion layer formed in the planar silicon layer, so that a resistance of the drain diffusion layer is reduced to suppress an influence of a parasitic resistance caused by the drain diffusion layer. This makes it possible to reduce the number of contacts onto the drain diffusion layer, and use the silicide layer as a line layer for the drain diffusion layer, which provides enhanced flexibility in layout design.

Although the sixth embodiment has been described by taking a common contact onto a gate line and a source diffusion layer in a D-type NMOS inverter, as an example, the common contact may be employed in a circuit based on a commonly-used CMOS, as well as the D-type NMOS inverter.

Seventh Embodiment

A seventh embodiment of the present invention shows one example of a technique capable of simplifying a gate forming process.

Figure 53:
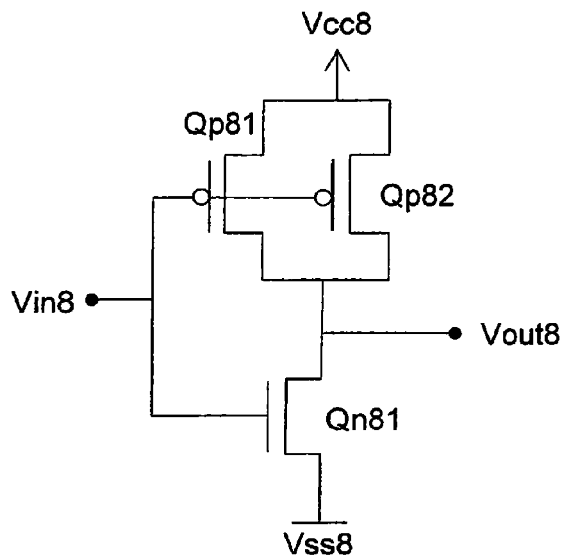
FIG. 53 is an equivalent circuit diagram of a CMOS inverter according to a seventh embodiment of the present invention.

FIG. 53 is an equivalent circuit diagram of a CMOS inverter according to the seventh embodiment. A circuit operation of the CMOS inverter is the same as that in the second embodiment, and its description will be omitted here.

Figure 54:
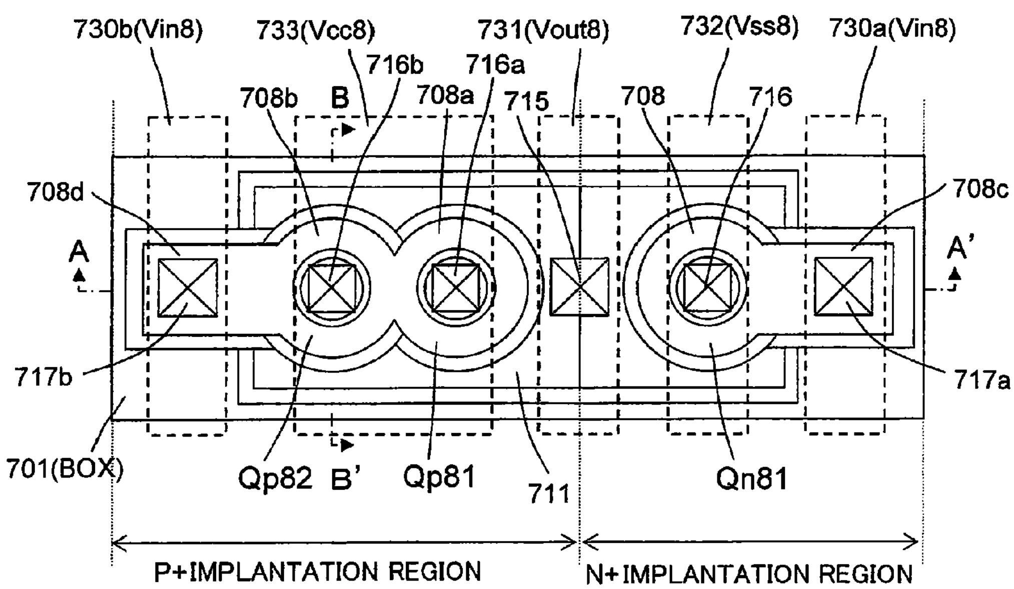
FIG. 54 is a top plan view of the CMOS inverter according to the seventh embodiment.
Figure 55:
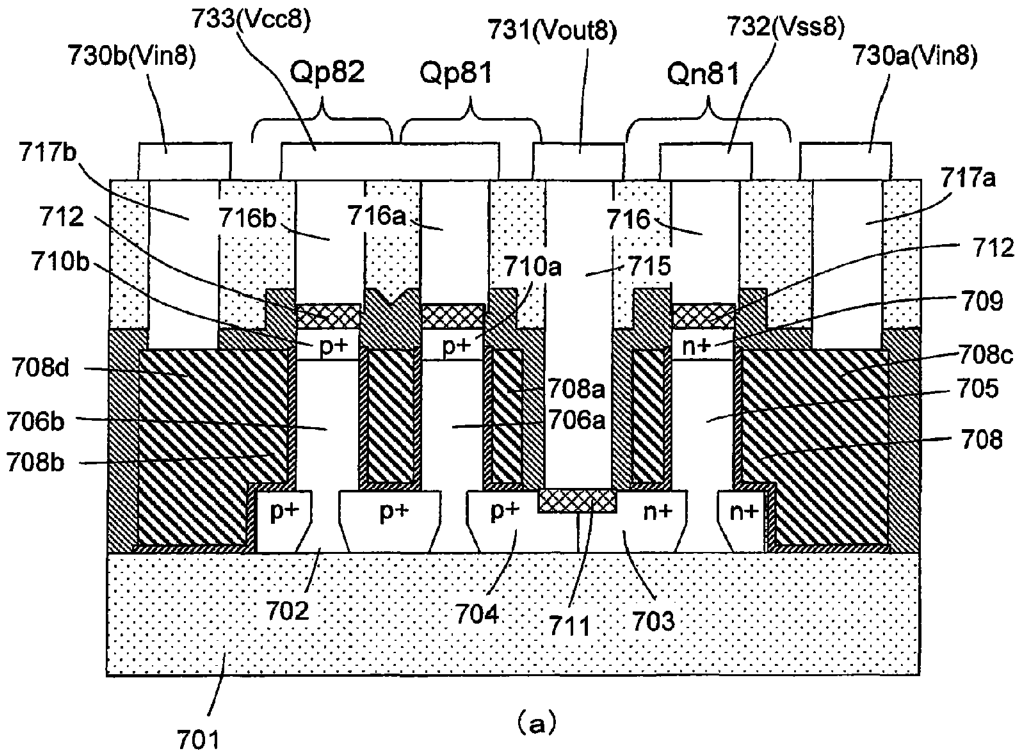
FIGS. 55(*a*) and 55(*b*) are sectional views of the CMOS inverter according to the seventh embodiment.
Figure 55:
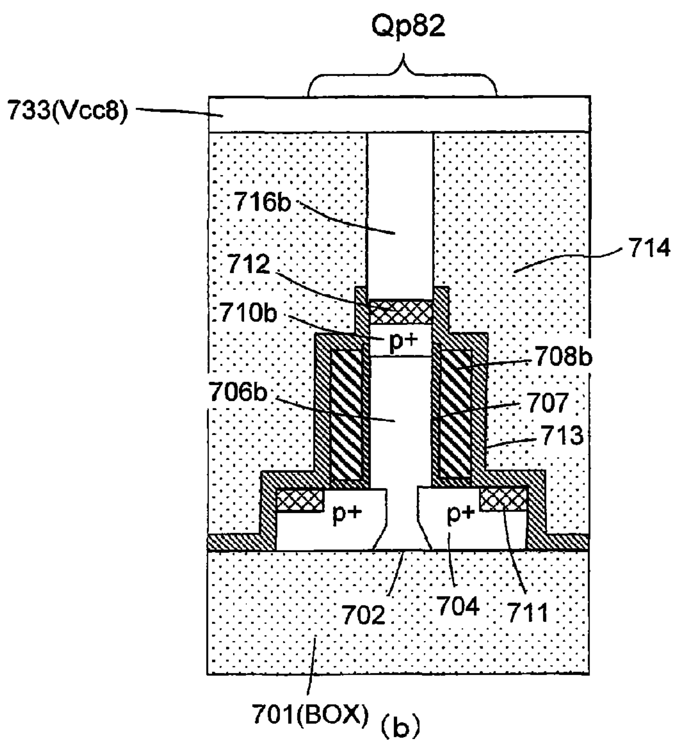

FIG. 54 is a top plan view of the CMOS inverter according to the seventh embodiment. FIGS. 55(*a*) and 55(*b*) are sectional views taken along the cutting-plane line A-A' and the cutting-plane line B-B' in FIG. 54, respectively. The seventh embodiment is characterized in that a top surface of a gate electrode (708, 708*a*, 708*b*) surrounding a pillar-shaped silicon layer, and a top surface of a gate line (708*c*, 708*d*) extending from the gate electrode, have the same height. In other words, the gate electrode and the gate line are integrally formed in such a manner that the entire area of a top surface of the integrated combination of the gate electrode and the gate line becomes parallel to a substrate. The technique in the seventh embodiment makes it possible to reduce the number of production processes for forming a gate, and facilitate forming a gate line during production. With reference to FIGS. 54, 55(*a*) and 55(*b*), a structure of the CMOS inverter according to the seventh embodiment will be described.

A planar silicon layer 702 is formed on a buried oxide film layer 701. The planar silicon layer 702 comprises an $N^+$ drain diffusion layer 703 and a $P^+$ drain diffusion layer 704. With a view to reducing a resistance of the drain diffusion layers, a silicide layer 711 is formed in surfaces of the $N^+$ drain diffusion layer 703 and the $P^+$ drain diffusion layer 704, in such a manner that the $N^+$ drain diffusion layer 703 and the $P^+$ drain diffusion layer 704 are directly connected to each other through the silicide layer 711. This eliminates a need for a contact for connecting the $N^+$ drain diffusion layer 703 and the $P^+$ drain diffusion layer 704 and element isolation therebetween, so that an inverter occupancy area can be reduced. In addition, element isolation can be performed simply by isolating the planar silicon layer 702 as an element, so that the element isolation can be achieved while reducing the number of processes and minimizing a processing size. An NMOS transistor Qn 81 is formed based on a pillar-shaped silicon layer 705 formed on the $N^+$ drain diffusion layer 703, and each of two PMOS transistors Qp 81, Qp 82, is formed based on a pillar-shaped silicon layer (706*a*, 706*b*) formed on the $P^+$ drain diffusion layer 704. A first dielectric film 707, such as a high-k film, such as a $HfO_2$ film, is formed to surround the pillar-shaped silicon layer (705, 706*a*, 706*b*), and a gate electrode (708, 708*a*, 708*b*) consisting of a metal film, such as a TaN film or a TiN film, is formed to surround the gate dielectric film 707. An $N^+$ source diffusion layer 709 is formed in an upper portion of the NMOS-forming pillar-shaped silicon layer 705, and a $P^+$ source diffusion layer (710*a*, 710*b*) is formed in an upper portion of the PMOS-forming pillar-shaped silicon layer (706*a*, 706*b*), wherein a silicide layer 712 is formed on the source diffusion layer (709, 710*a*, 710*b*). A silicon nitride film 713 is formed to cover the above elements so as to serve as a contact stopper. Further, an interlayer silicon oxide film 714 is formed on the silicon nitride film 713, and a contact (715, 716, 716*a*, 717*a*, 717*b*) is formed to penetrate through the silicon oxide film 714 having a flattened surface. The silicon nitride film 13 may be formed to have a stress so as to apply a stress to a channel region of the pillar-shaped silicon layer to improve carrier mobility. In particular, a silicon nitride film having a tensile stress, and a silicon nitride film having a compressive stress, may be formed on the NMOS and the PMOS, respectively, to improve carrier mobility in both the NMOS and the PMOS.

The contact 715 formed on a boundary between the $N^+$ drain diffusion layer 703 and the $P^+$ drain diffusion layer 704 is connected to an output terminal Vout 8 via a line layer 731, and the contact 716 formed on the NMOS (Qn 81)-forming pillar-shaped silicon layer 705 is connected to a ground potential Vss 8 via a line layer 732. Further, the contact (716*a*, 716*b*) formed on the PMOS (Qp 11, Qp 12)-forming pillar-shaped silicon layer (706*a*, 706*b*) is connected to a power supply potential Vcc 8 via a line layer 733, and each of the contact 717*a* formed on a gate line 708*c* extending from the gate electrode surrounding the NMOS-forming pillar-shaped silicon layer 705, and the contact 717*b* formed on a gate line 708*d* extending from the gate electrode surrounding the PMOS-forming pillar-shaped silicon layer (706*a*, 706*b*), is connected to an input terminal Vin 8 via a line layer (730*a*, 730*b*). In this manner, the inverter is formed.

Figure 56:
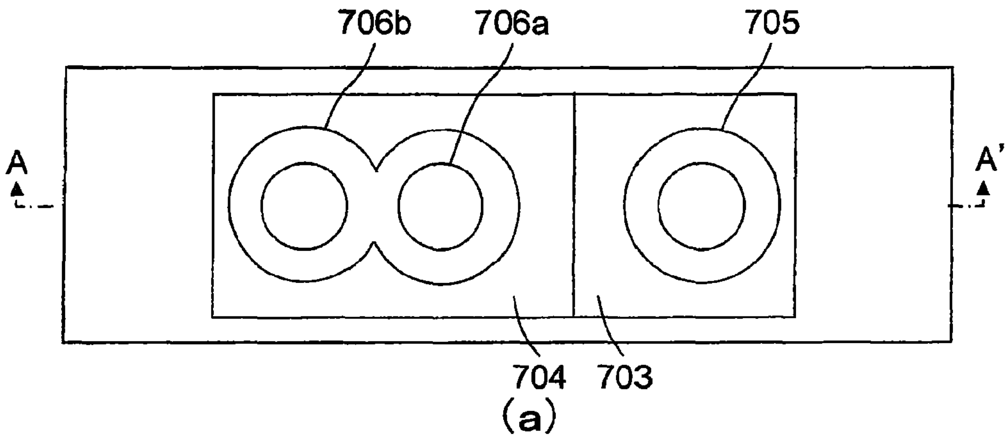
FIGS. 56(*a*) and 56(*b*) illustrate a part of production processes in the seventh embodiment.
Figure 56:
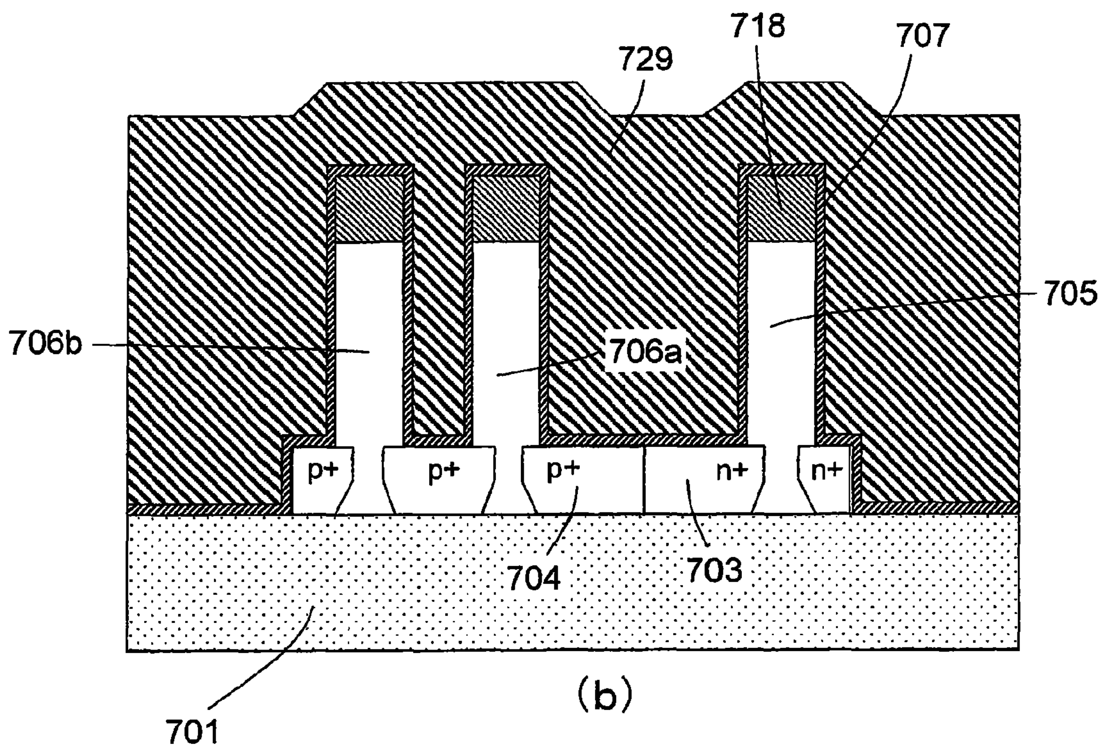

With reference to FIGS. 56(*a*) to 69(*b*), a method of forming the CMOS converter according the seventh embodiment, as one example of a semiconductor device production method of the present invention, will be described below. In FIGS. 56(*a*) to 69(*b*), the figure suffixed with (a) is a top plan view, and the figure suffixed with (b) is a sectional view taken along the line A-A'.

Any production process before a process of forming a gate dielectric film, in the seventh embodiment, is the same as that in the second embodiment. Thus, the following description will start from the process of forming a gate conductive film.

A shown in FIGS. 56(*a*) and 56(*b*), after a first dielectric film 707, such as a high-k film, such as a $HfO_2$ film, serving as a gate dielectric film, is formed to a thickness of about 1 to 5 nm by CVD or ALD, a metal film 729, such as a TiN film or a TaN film, serving as a gate conductive film, is formed to a thickness of about 100 to 400 nm. In this process, the film may be formed such that an initial stage of the film formation requiring good coverage is performed by CVD or ALD, and the subsequent film formation is performed by sputtering having a high film formation rate, so as to more efficiently perform the film formation.

Figure 57:
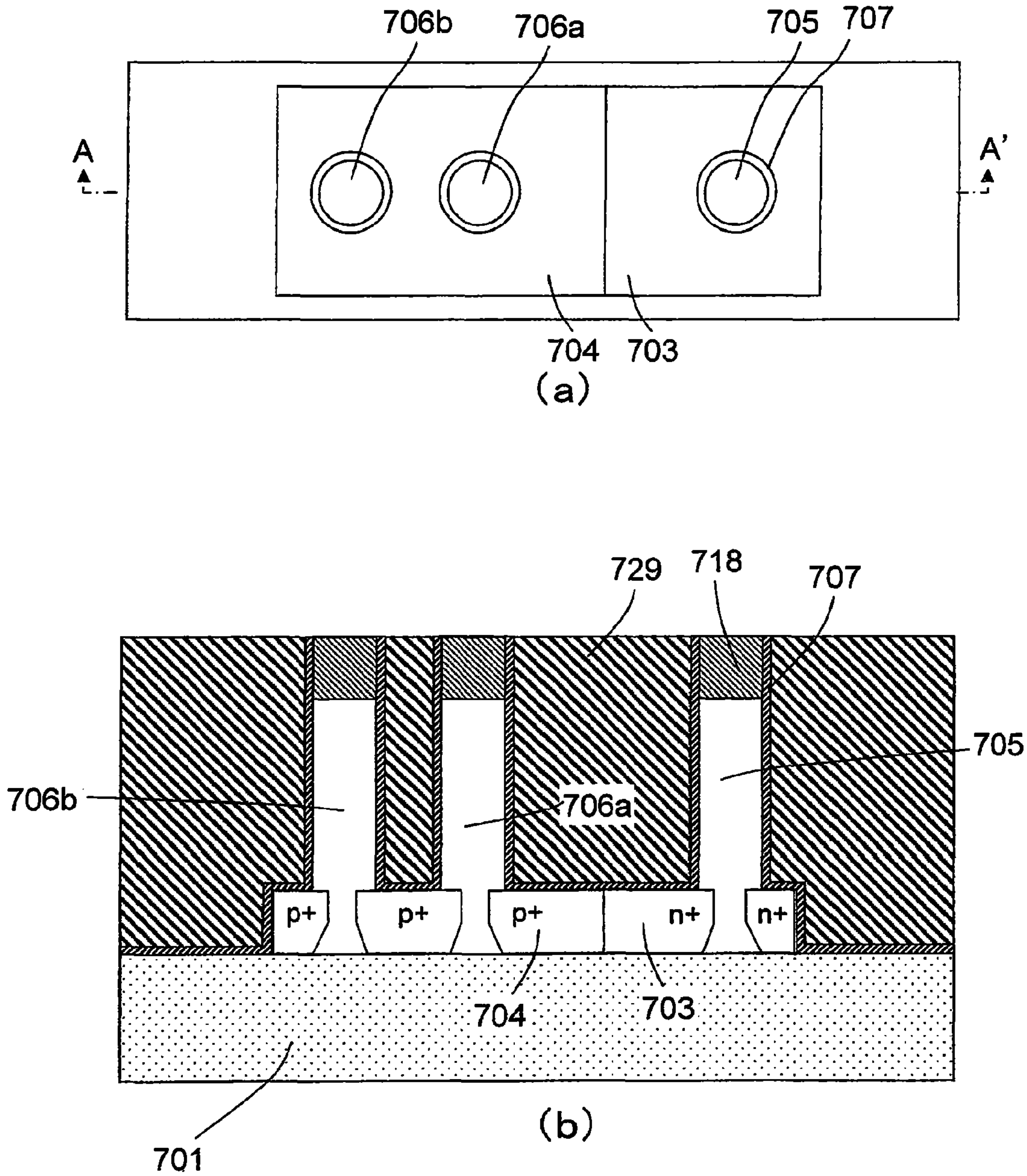
FIGS. 57(*a*) and 57(*b*) illustrate a part of production processes in the seventh embodiment.

Then, as shown in FIGS. 57(*a*) and 57(*b*), the gate conductive film 729 is flattened by CMP. This makes it possible to achieve an adequate gate configuration and suppress a variation in gate length. Further, the CMP is stopped by a silicon nitride film 718 on a top of the pillar-shaped silicon layer. The use of the silicon nitride film 718 as a CMP stopper makes it possible to control an amount of CMP with high repeatability. In place of the silicon nitride film, the film to be used as a CMP stopper may be any other suitable film capable of functioning as the CMP stopper film.

Figure 58:
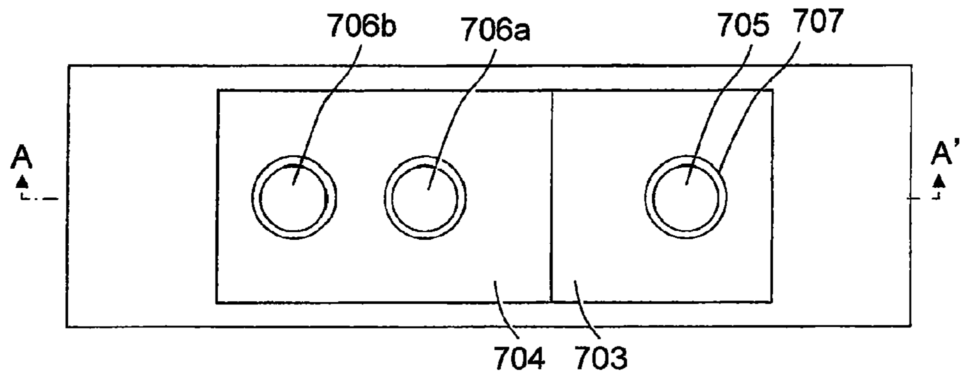
FIGS. 58(*a*) and 58(*b*) illustrate a part of production processes in the seventh embodiment.
Figure 58:
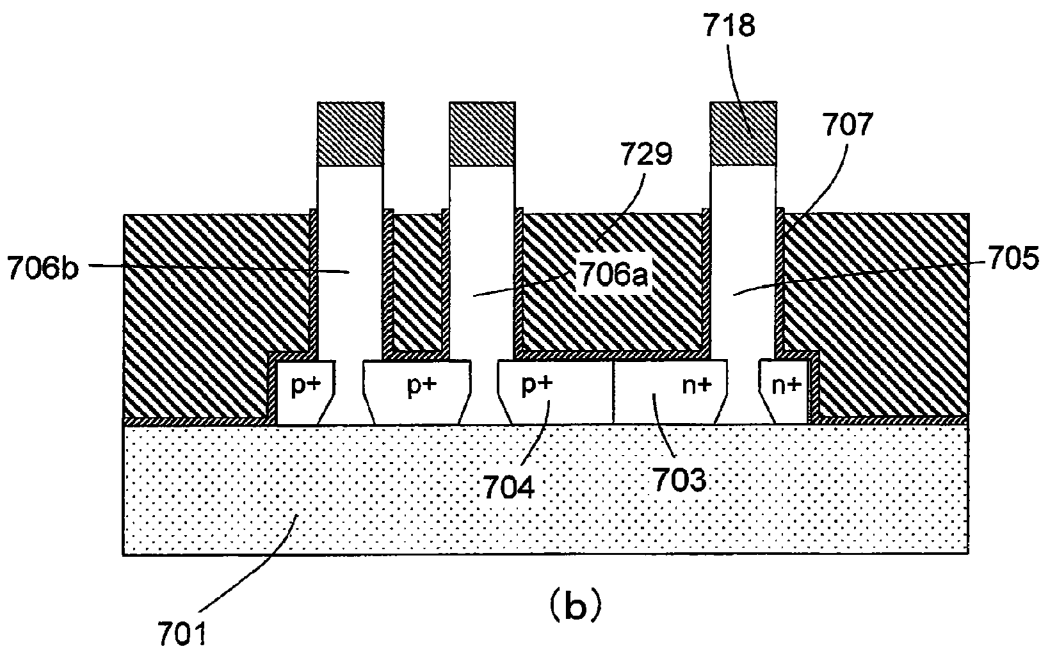

Then, as shown in FIGS. 58(*a*) and 58(*b*), the gate conductive film 729 is etched back to fix a gate length.

Figure 59:
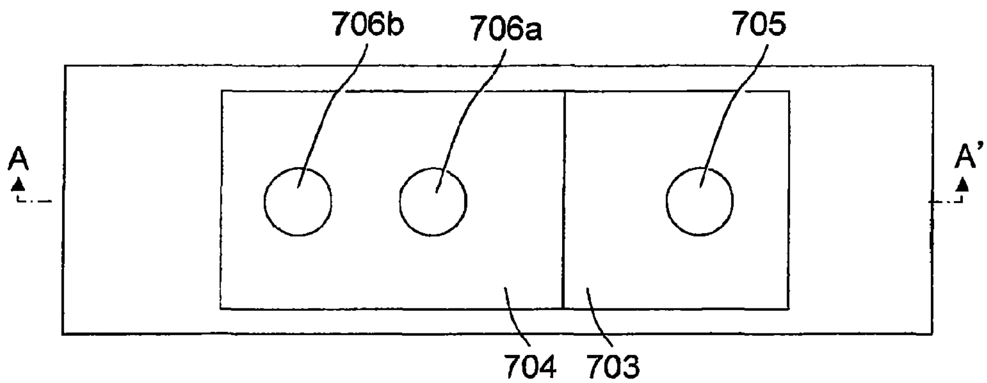
FIGS. 59(*a*) and 59(*b*) illustrate a part of production processes in the seventh embodiment.
Figure 59:
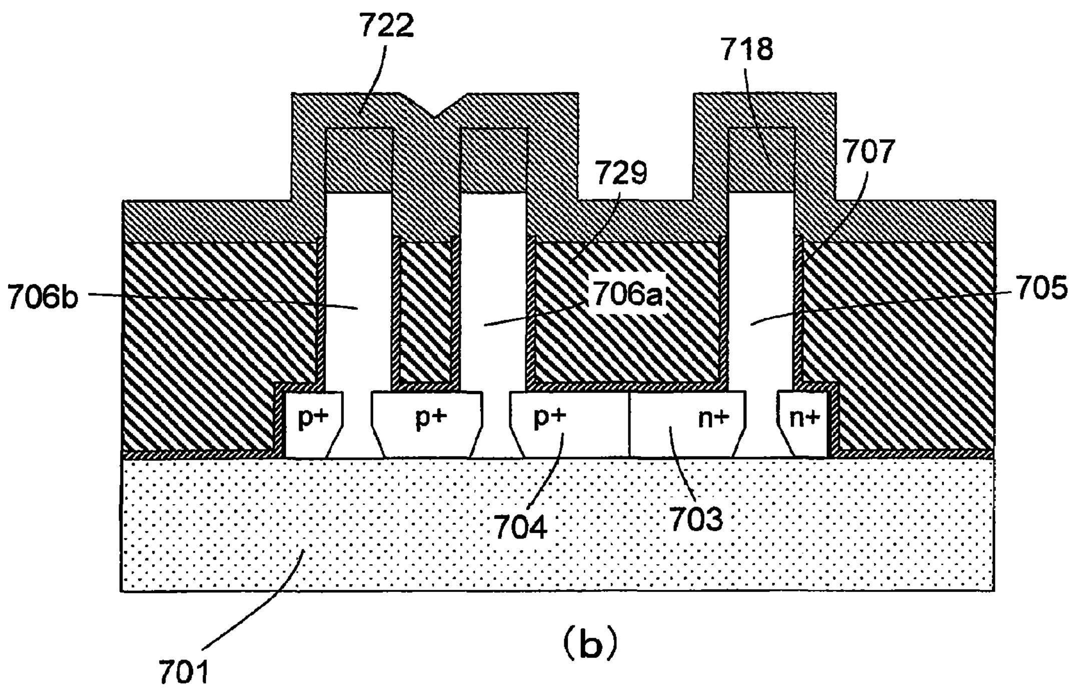

Then, as shown in FIGS. 59(*a*) and 59(*b*), a silicon nitride film 722 is formed.

Figure 60:
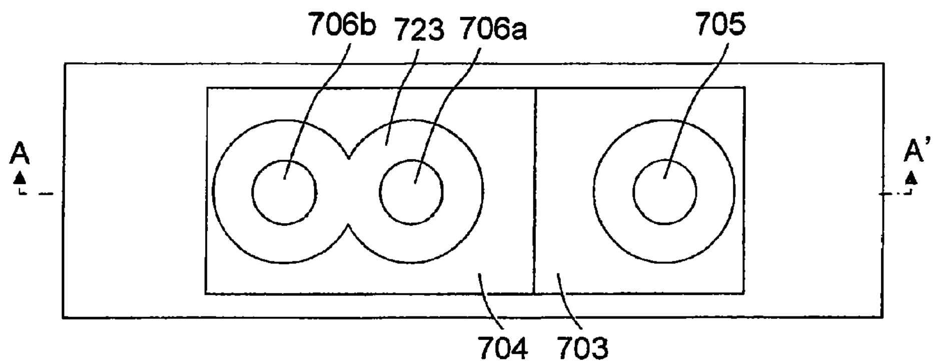
FIGS. 60(*a*) and 60(*b*) illustrate a part of production processes in the seventh embodiment.
Figure 60:
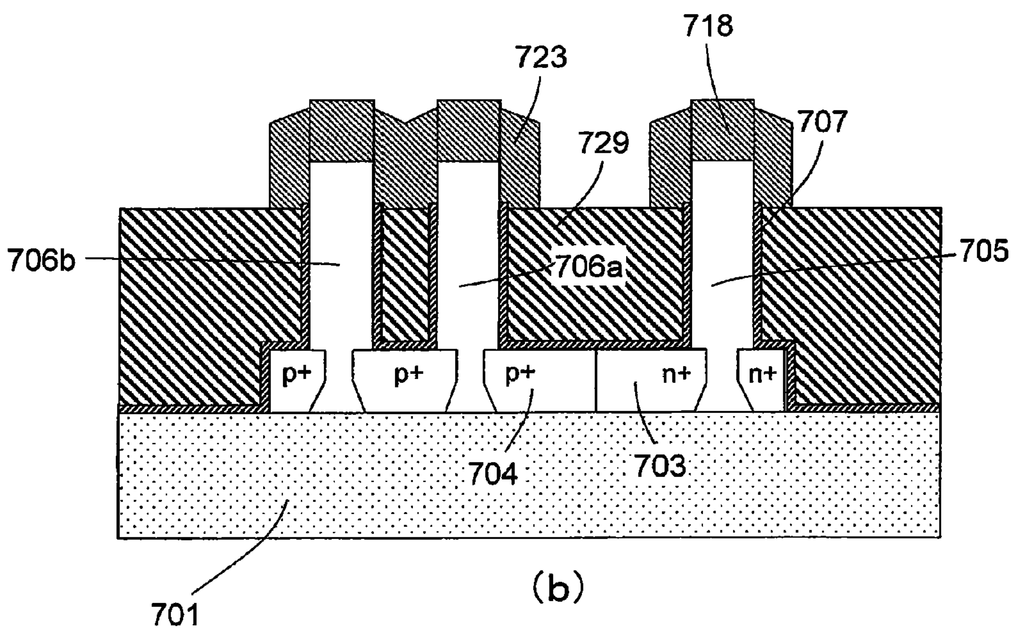

Then, as shown in FIGS. 60(*a*) and 60(*b*), the silicon nitride film 722 is etched back to form a silicon nitride film-based sidewall 723 on a top of the metal gate. This silicon nitride film-based sidewall allows a gate electrode to be formed around the pillar-shaped silicon layer by a film thickness corresponding to that of the silicon nitride film-based sidewall remaining on the gate, in a self-alignment manner. Thus, a film thickness of the silicon nitride film 722 to be formed in the preceding process and an amount of the silicon nitride film 722 to be etched back in this process, may be set to allow the gate electrode to have a desired film thickness. In the seventh embodiment, the silicon nitride film is used as a sidewall protective film. Alternatively, any other suitable film capable of functioning as the sidewall protective film, such as a silicon oxide film, may also be used.

Figure 61:
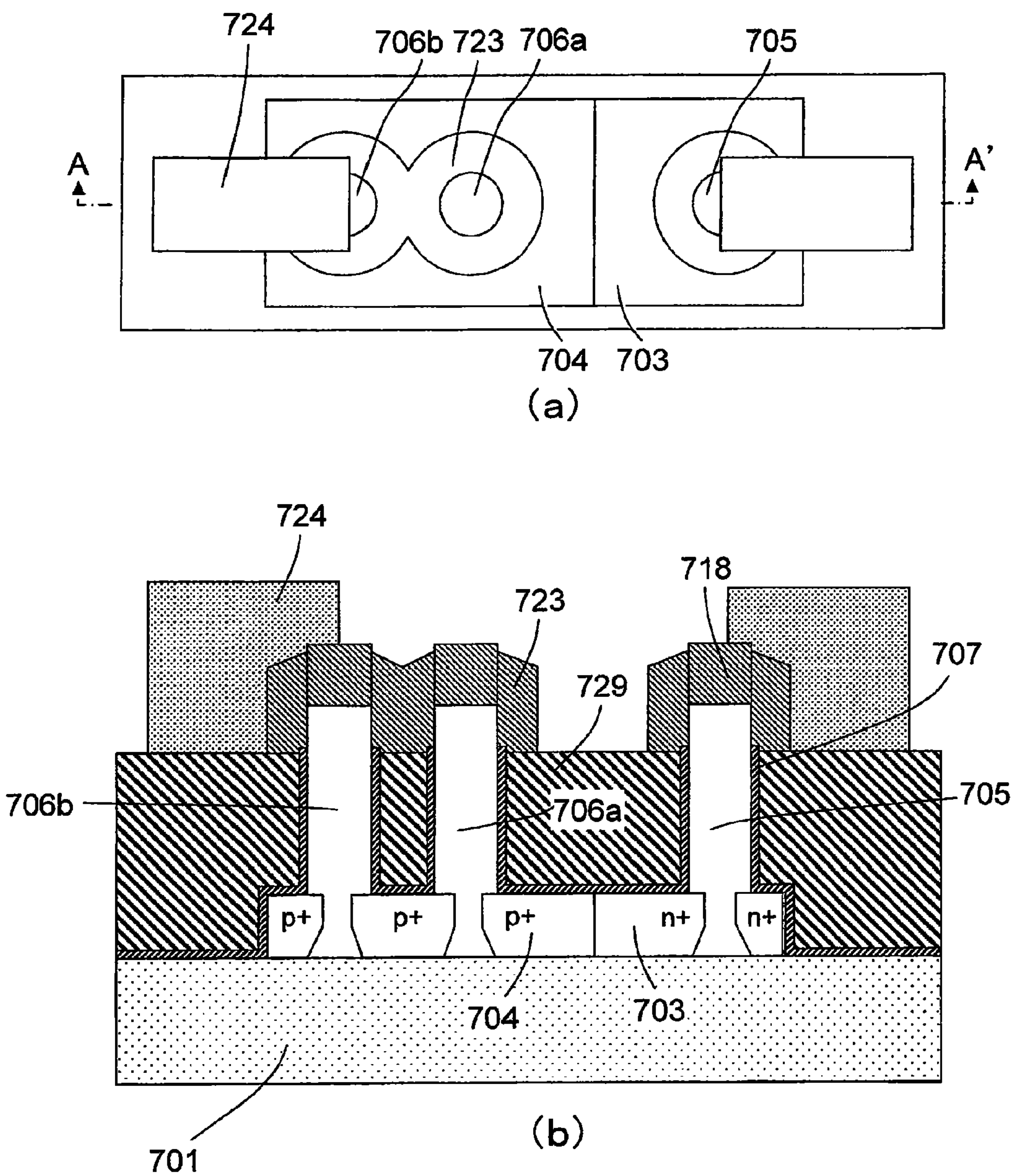
FIGS. 61(*a*) and 61(*b*) illustrate a part of production processes in the seventh embodiment.

Then, as shown in FIGS. 61(*a*) and 61(*b*), a resist or a multilayer resist is applied, and a gate line pattern is formed by lithography, using the resist 724.

Figure 62:
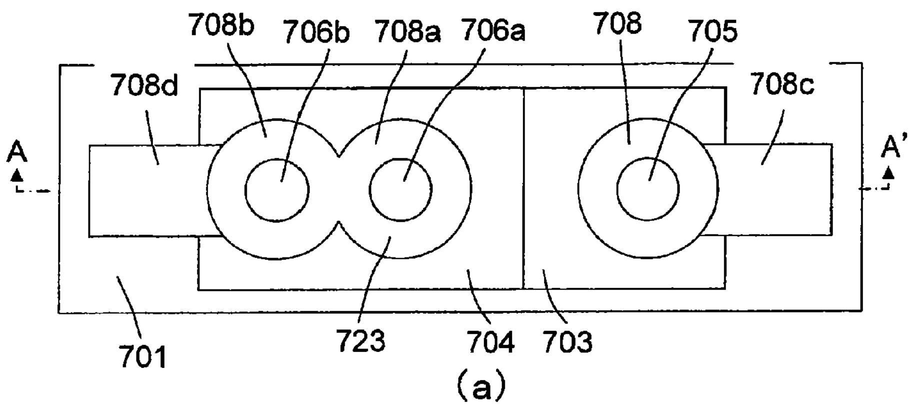
FIGS. 62(*a*) and 62(*b*) illustrate a part of production processes in the seventh embodiment.
Figure 62:
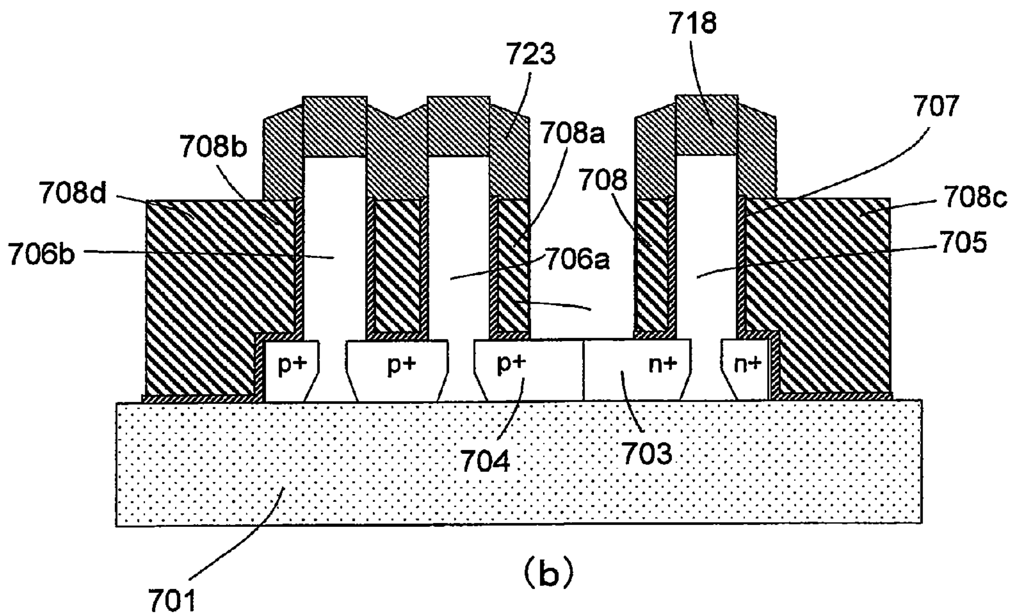

Then, as shown in FIGS. 62(*a*) and 62(*b*), a bottom portion of the gate and a portion of the first dielectric film, such as a high-k film, beneath the gate are partially etched by reactive ion etching, using a resist mask. Through this process, the gate electrode (708, 708*a*, 708*b*) and a gate line (708*c*, 708*d*) are formed.

Figure 63:
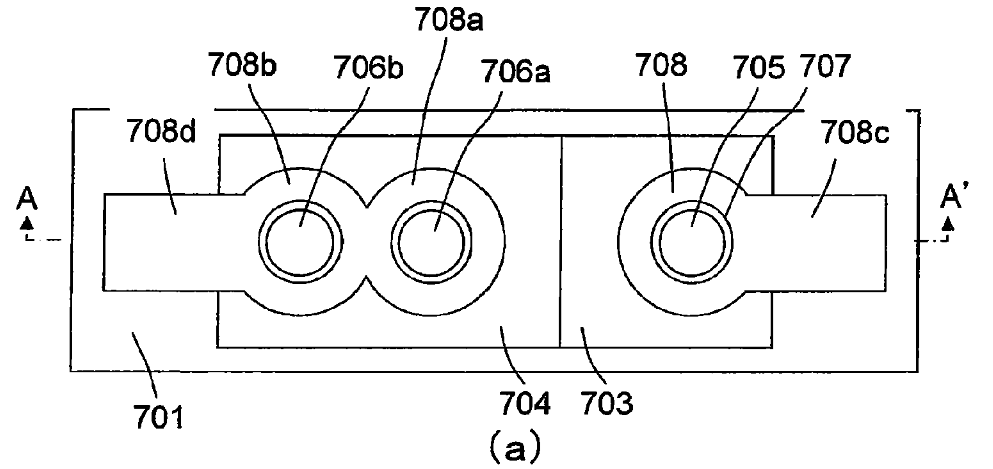
FIGS. 63(*a*) and 63(*b*) illustrate a part of production processes in the seventh embodiment.
Figure 63:
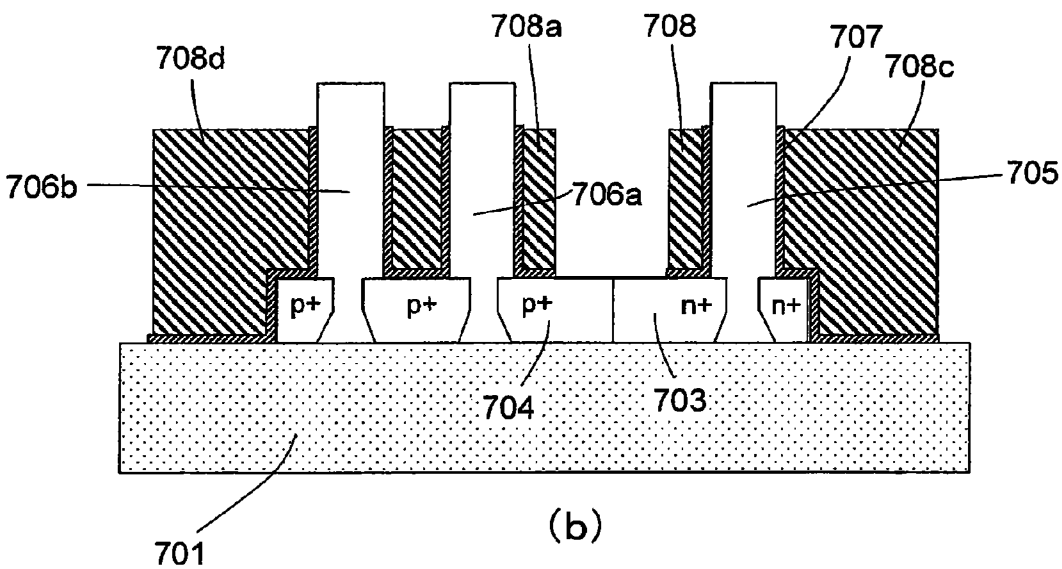

Then, as shown in FIGS. 63(*a*) and 63(*b*), the silicon nitride film 718 on the top of the pillar-shaped silicon layer, and the silicon nitride film-based sidewall 723, are removed by wet etching.

Figure 64:
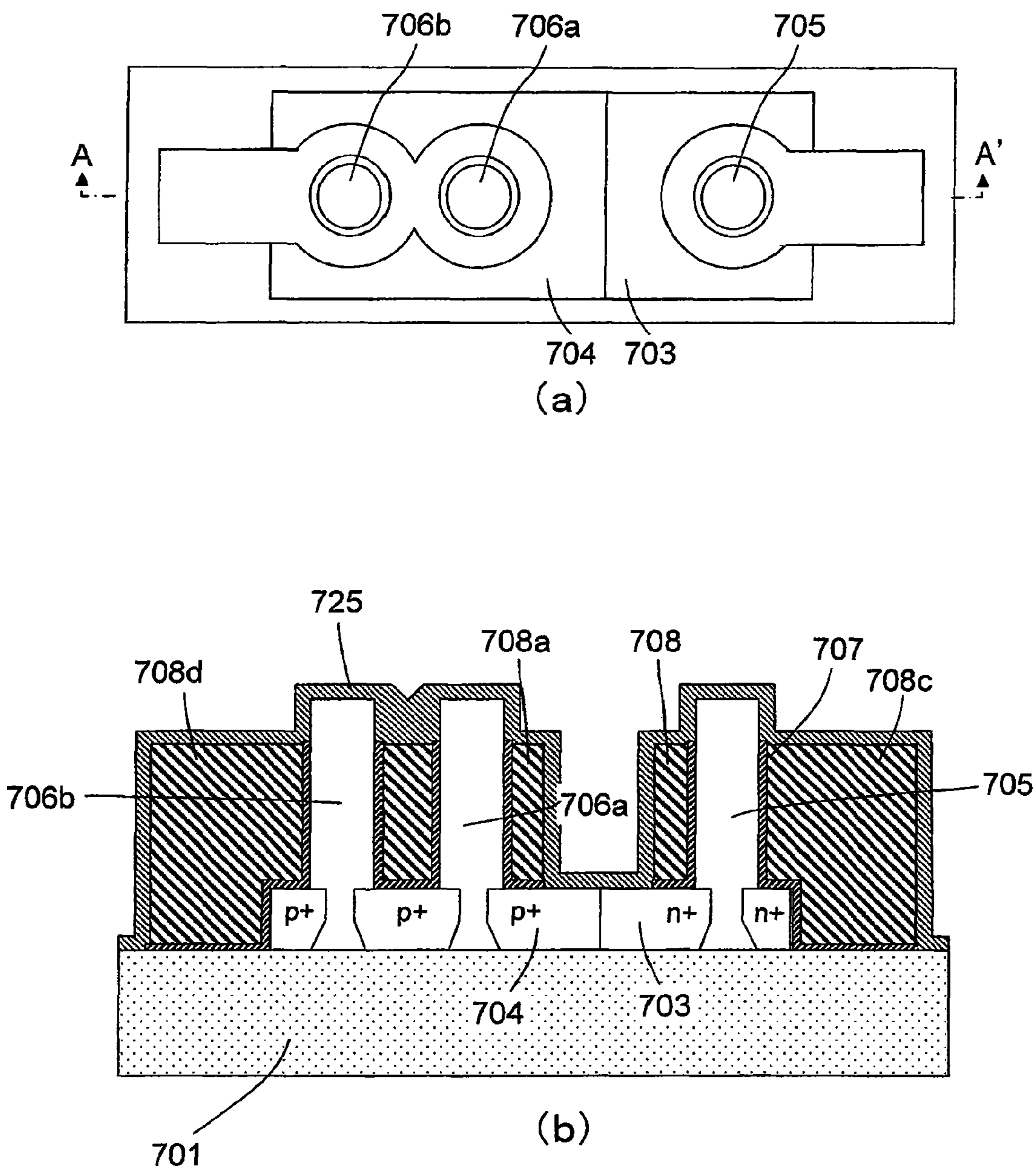
FIGS. 64(*a*) and 64(*b*) illustrate a part of production processes in the seventh embodiment.

Then, as shown in FIGS. 64(*a*) and 64(*b*), a silicon nitride film 725 is formed to a film thickness of about 10 to 50 nm.

Figure 65:
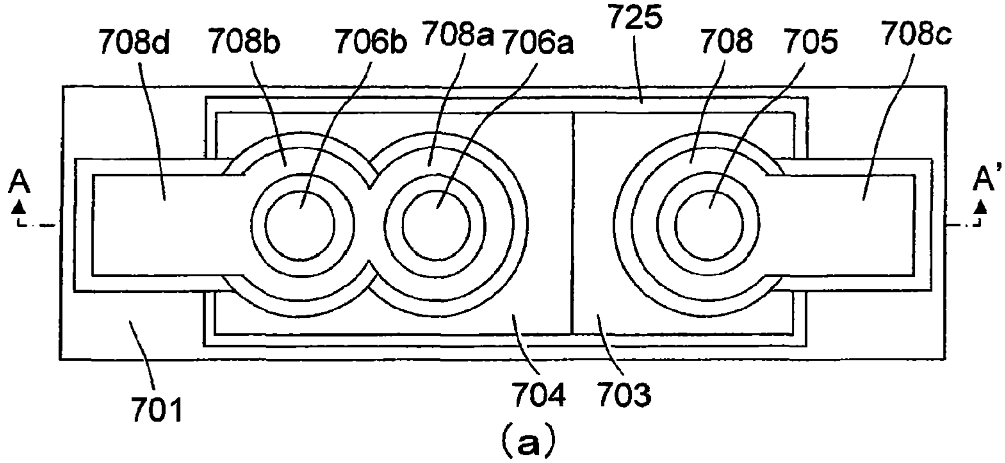
FIGS. 65(*a*) and 65(*b*) illustrate a part of production processes in the seventh embodiment.
Figure 65:
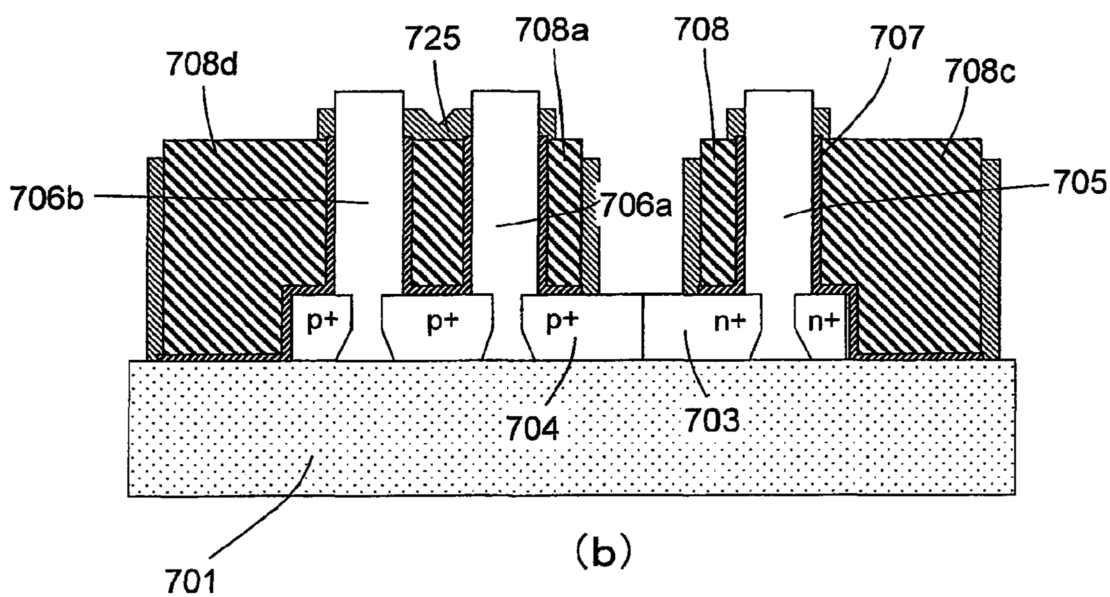

Then, as shown in FIGS. 65(*a*) and 65(*b*), the silicon nitride film 725 is etched back to form a structure where a sidewall of an upper portion of the pillar-shaped silicon layer and a sidewall of the gate are covered by the silicon nitride film 725 while exposing a top surface of the pillar-shaped silicon layer, and a top surface of the planar silicon layer. This structure provides the following advantages. Firstly, the silicon nitride film 725 is disposed to isolate between the gate electrode (708, 708*a*, 708*b*) and the upper portion of the pillar-shaped silicon layer and between the gate electrode (708, 708*a*, 708*b*) and the drain diffusion layer (703, 704). This makes it possible to prevent short-circuiting between the gate electrode and the upper portion of the pillar-shaped silicon layer, and short-circuiting between the gate electrode and the drain diffusion layer, which would otherwise be caused by excessive formation of silicide.

Secondly, the silicon nitride film is disposed to cover the sidewall of the upper portion of the pillar-shaped silicon layer. This makes it possible to prevent the pillar-shaped silicon layer from being excessively silicided through the sidewall of the pillar-shaped silicon layer, during a silicidation process in FIGS. 67(*a*) and 67(*b*). If a silicide layer is excessively formed in the upper portion of the pillar-shaped silicon layer to get closer to a junction of the source diffusion layer, it causes an increase in junction leak. Thus, it is necessary to control the silicide layer to keep from being excessively formed. Thirdly, the silicon nitride film 725 is disposed to cover the first dielectric film 707, such as a high-k film. This makes it possible to prevent the first dielectric film, such as a high-k film, from being damaged during ion implantation in a next process and during wet treatment and ion implantation in subsequent processes.

If a silicon oxide film is used in place of the silicon nitride film, it will be undesirably wet-etched by hydrofluoric acid used in a cleaning/releasing process and a silicidation pretreatment. Thus, it is preferable to use a film insoluble in hydrofluoric acid, such as the silicon nitride film. Further, an excessively small film thickness of the silicon nitride film makes it impossible to fully protect the first dielectric film, such as a high-k film, and an excessively large film thickness of the silicon nitride film causes an increase in occupancy area by just the film thickness of the high-k film formed on the sidewall of the gate. In the seventh embodiment, the silicon nitride film is used as a protective film. Alternatively, any other suitable film capable of functioning as the protective film, such as a film having a layered structure comprising a silicon nitride film and a silicon oxide film, may also be used.

Figure 66:
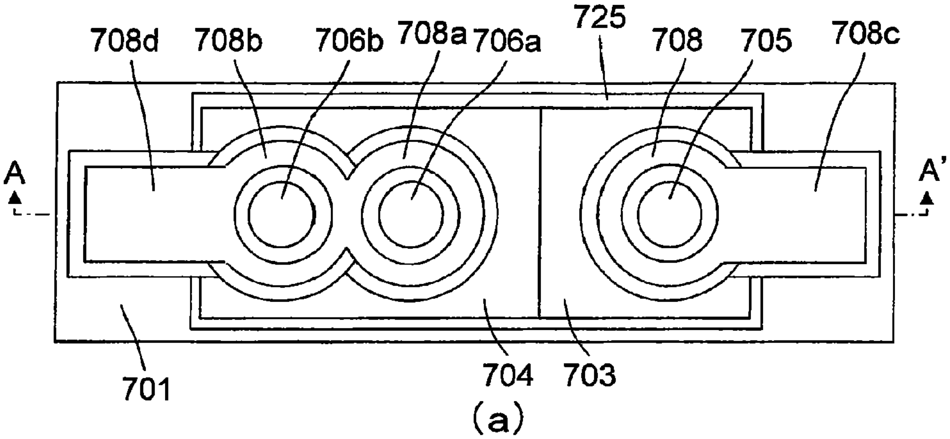
FIGS. 66(*a*) and 66(*b*) illustrate a part of production processes in the seventh embodiment.
Figure 66:
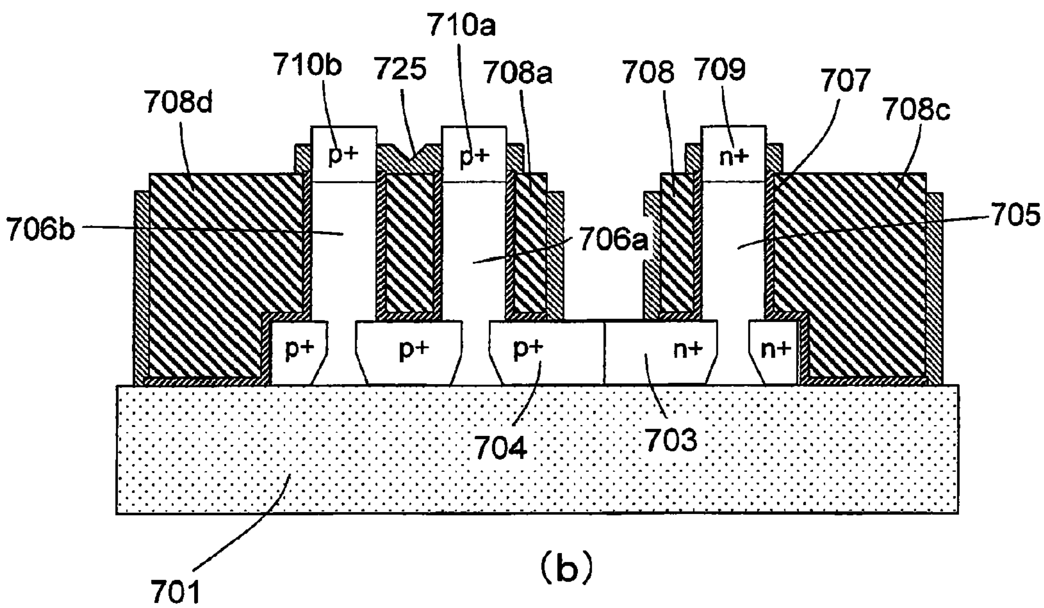

Then, as shown in FIGS. 66(*a*) and 66(*b*), an $N^+$ source diffusion layer 709 is formed in an upper portion of the pillar-shaped silicon layer 705 by ion implantation or other injection technique. In the same manner, a $P^+$ source diffusion layer (710*a*, 710*b*) is formed in an upper portion of the pillar-shaped silicon layer (706*a*, 706*b*).

Figure 67:
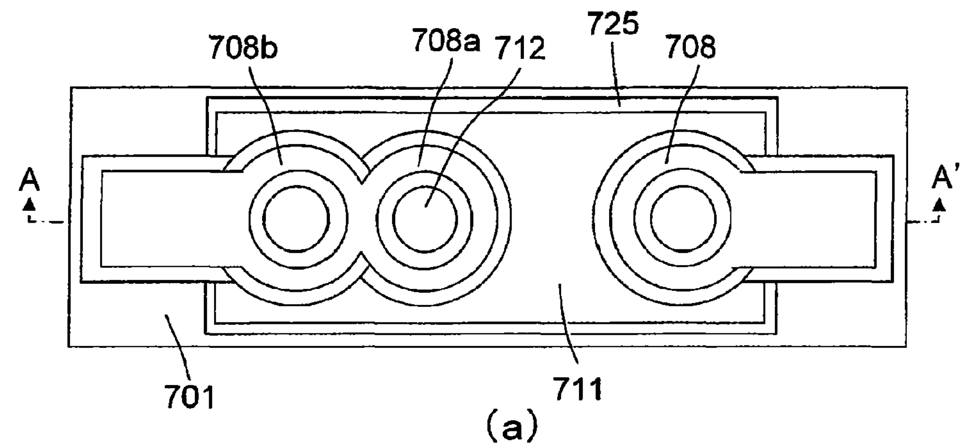
FIGS. 67(*a*) and 67(*b*) illustrate a part of production processes in the seventh embodiment.
Figure 67:
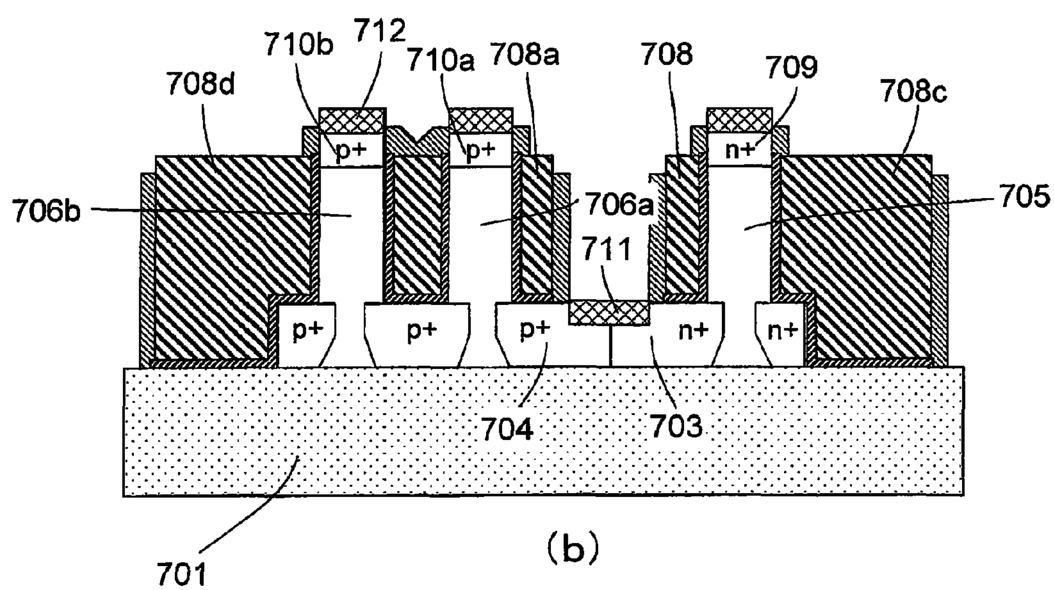

Then, as shown in FIGS. 67(*a*) and 67(*b*), a metal, such as Ni or Co, is sputtered onto each of the surfaces of the source and drain diffusion layers to form a metal film therein, and the metal film is silicided through a heat treatment, whereafter an unreacted portion of the metal film is removed to form a silicide layer 711 on the drain diffusion layer (703, 704) and a silicide layer 712 on the source diffusion layer (709, 710*a*, 710*b*).

Figure 68:
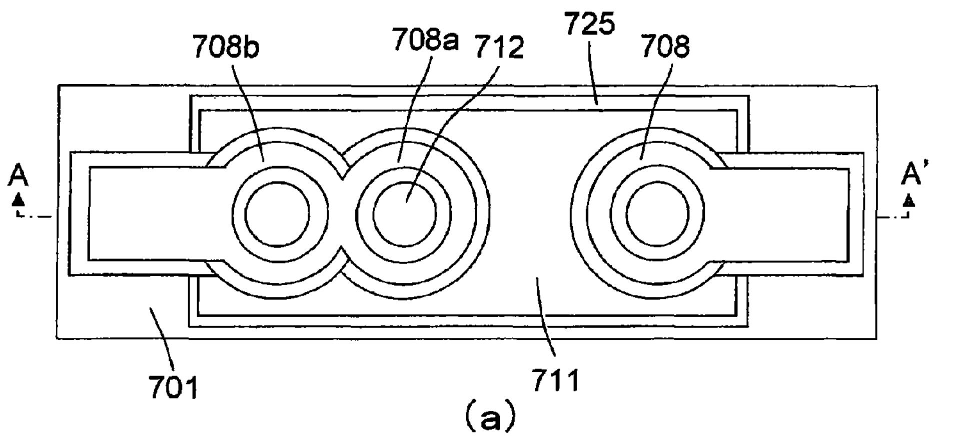
FIGS. 68(*a*) and 68(*b*) illustrate a part of production processes in the seventh embodiment.
Figure 68:
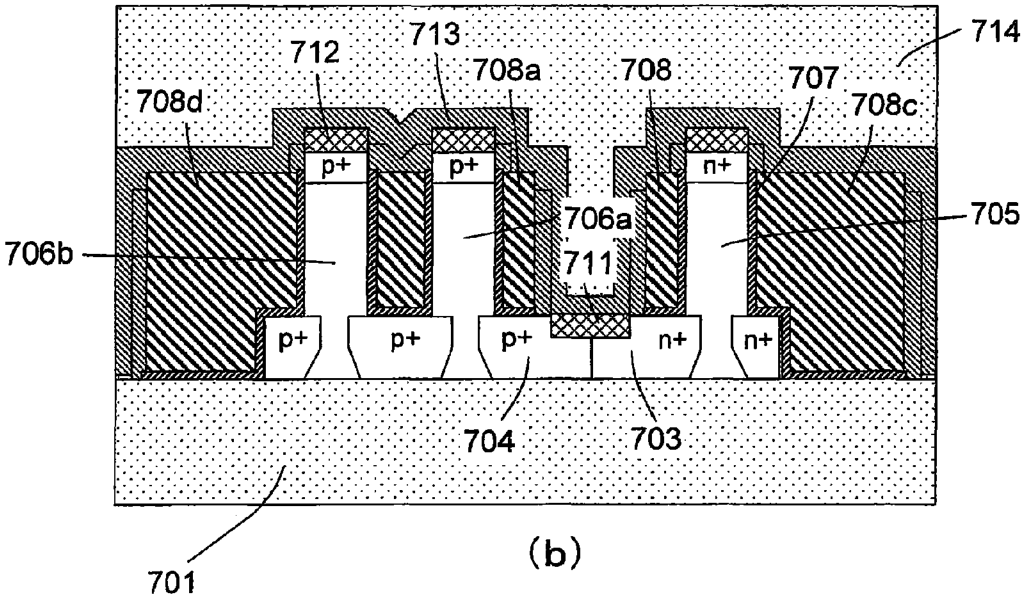

Then, as shown in FIGS. 68(*a*) and 68(*b*), after a silicon nitride liner film 713 is formed, a silicon oxide film 714 is formed, and flattened by CMP. The silicon nitride liner film is used as an etching stopper during contact formation.

Figure 69:
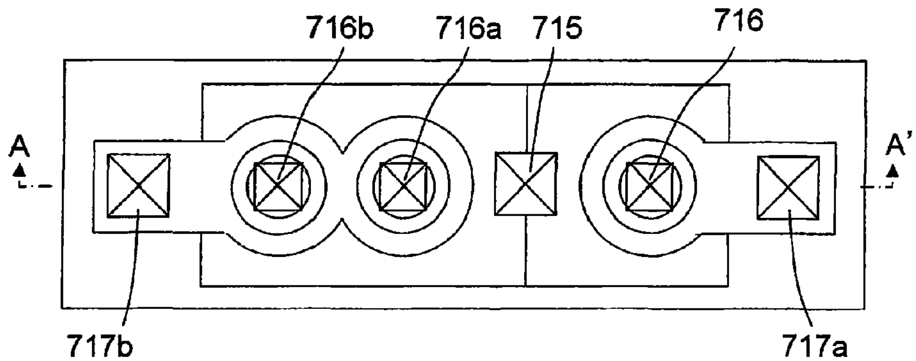
FIGS. 69(*a*) and 69(*b*) illustrate a part of production processes in the seventh embodiment.
Figure 69:
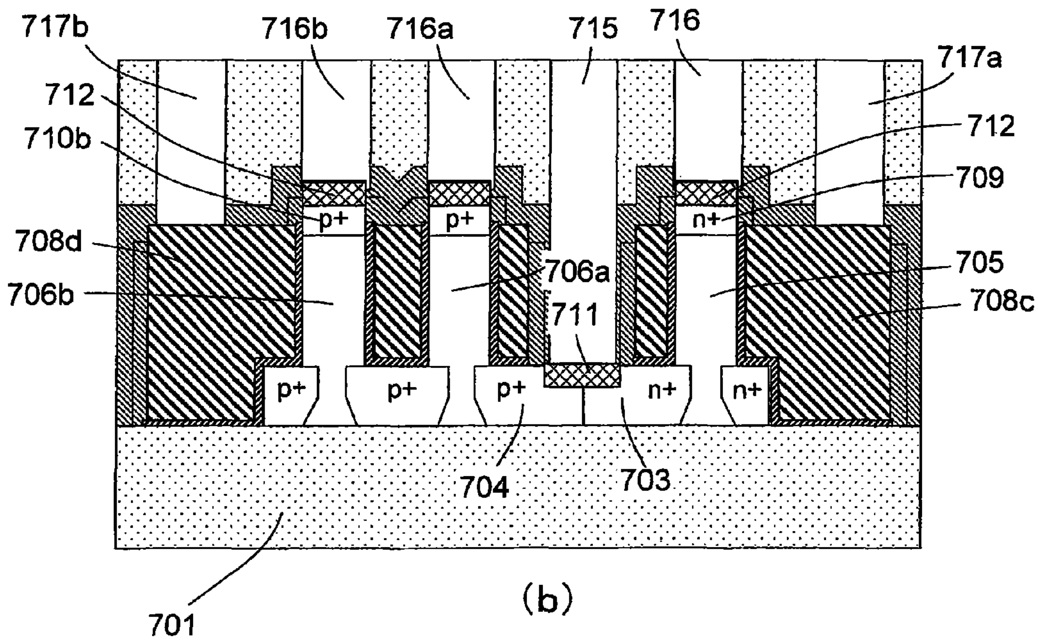

Then, as shown in FIGS. 69(*a*) and 69(*b*), a contact (715, 716, 716*a*, 716*b*, 717*a*, 717*b*) is formed on each of the drain diffusion layers on the planar silicon layer, the gates, and the source diffusion layer on the respective pillar-shaped silicon layers.

As above, the technique in the seventh embodiment makes it possible to reduce the number of production processes for forming a gate, and facilitate forming a gate line during production.

Eighth Embodiment

An eighth embodiment of the present invention shows one example of an SGT designed to reduce a parasitic capacitance between a drain diffusion layer underneath a pillar-shaped silicon layer, and each of a gate electrode and a gate line.

Figure 70:
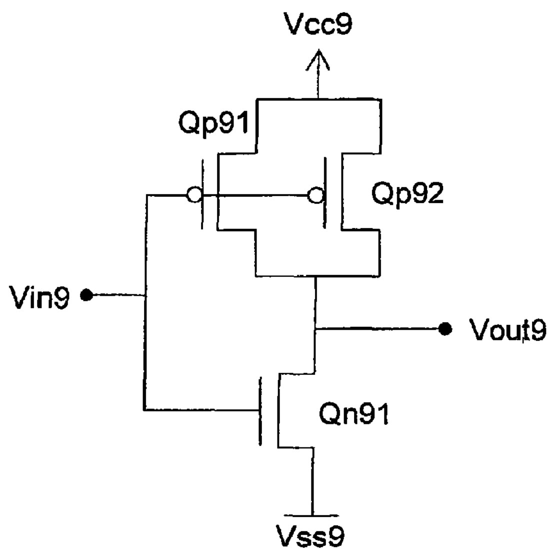
FIG. 70 is an equivalent circuit diagram of a CMOS inverter according to an eighth embodiment of the present invention.

FIG. 70 is an equivalent circuit diagram of a CMOS inverter according to the eighth embodiment. A circuit operation of the CMOS inverter is the same as that in the second embodiment, and its description will be omitted here.

Figure 71:
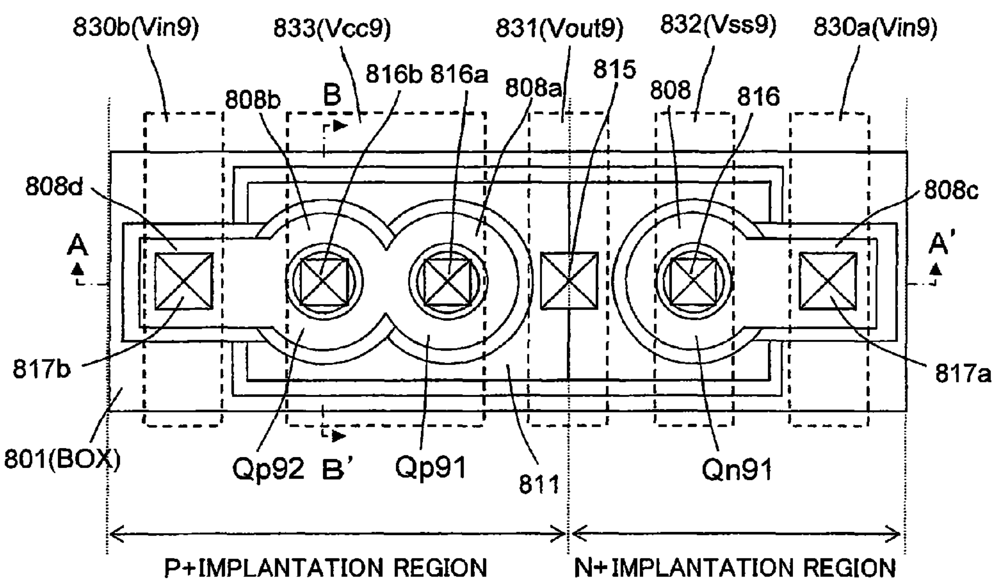
FIG. 71 is a top plan view of the CMOS inverter according to the eighth embodiment.
Figure 72:
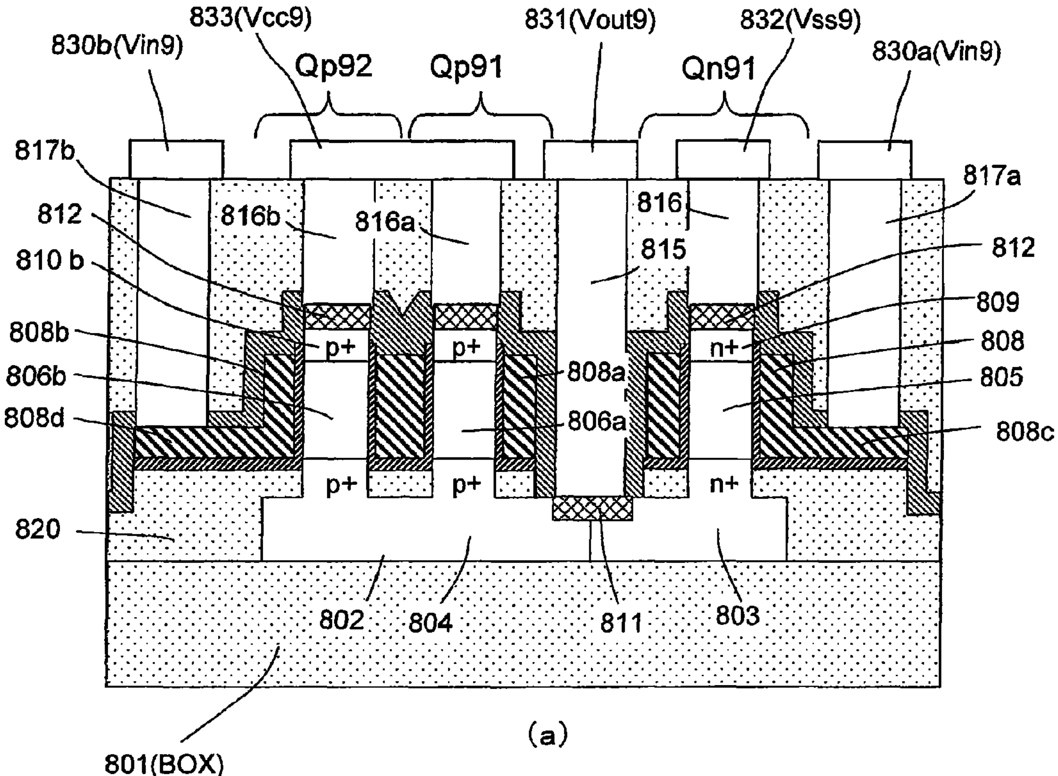
FIGS. 72(*a*) and 72(*b*) are sectional views of the CMOS inverter according to the eighth embodiment.
Figure 72:
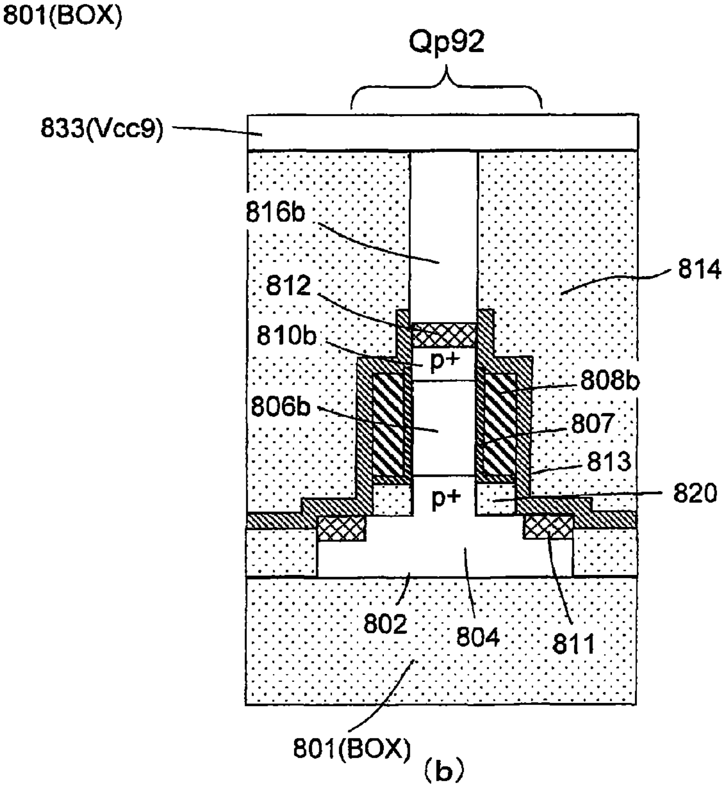

FIG. 71 is a top plan view of the CMOS inverter according to the eighth embodiment. FIGS. 72(*a*) and 72(*b*) are sectional views taken along the cutting-plane line A-A' and the cutting-plane line B-B' in FIG. 71, respectively. The eighth embodiment is characterized in that a third dielectric film 820, such as a silicon oxide film, exists between a drain diffusion layer (803, 804) and each of a gate electrode (808, 808a, 808b) and a gate line (808c, 808d). In this structure, a thickness of a dielectric film between the drain diffusion layer and each of the gate electrode and the gate line is increased, and therefore a parasitic capacitance between the gate and the drain diffusion layer is reduced. Particularly, in case where a first dielectric film, such as a high-k film, is used as a gate dielectric film, the parasitic capacitance between the gate and the drain diffusion layer becomes larger due to a high dielectric constant of the high-k film. Thus, the parasitic capacitance can be largely reduced by inserting the third dielectric film, such as a silicon oxide layer, having a lower dielectric constant than the high-k film, between the gate line and the drain diffusion layer. With reference to FIGS. 71, 72(*a*) and 72(*b*), a structure of the CMOS inverter according to the eighth embodiment will be described.

A planar silicon layer 802 is formed on a buried oxide film layer 801. The planar silicon layer 802 comprises an $N^+$ drain diffusion layer 803 and a $P^+$ drain diffusion layer 804. With a view to reducing a resistance of the drain diffusion layers, a silicide layer 811 is formed in surfaces of the $N^+$ drain diffusion layer 803 and the $P^+$ drain diffusion layer 804, in such a manner that the $N^+$ drain diffusion layer 803 and the $P^+$ drain diffusion layer 804 are directly connected to each other through the silicide layer 811. This eliminates a need for a contact for connecting the $N^+$ drain diffusion layer 803 and the $P^+$ drain diffusion layer 804 and element isolation therebetween, so that an inverter occupancy area can be reduced. In addition, element isolation can be achieved simply by isolating the planar silicon layer 802 as an element, so that the element isolation can be achieved while reducing the number of processes and minimizing a processing size. An NMOS transistor Qn 91 is formed based on a pillar-shaped silicon layer 805 formed on the $N^+$ drain diffusion layer 803, and each of two PMOS transistors Qp 91, Qp 92, is formed based on a pillar-shaped silicon layer (806*a*, 806*b*) formed on the $P^+$ drain diffusion layer 804. A first dielectric film 807, such as a high-k film, such as a $HfO_2$ film, is formed to surround the pillar-shaped silicon layer (805, 806*a*, 806*b*), and a gate electrode (808, 808*a*, 808*b*) consisting of a metal film, such as a TaN film or a TiN film, is formed to surround the gate dielectric film 807. The third dielectric film 820, such as a silicon oxide film, exists between the gate electrode and the drain diffusion layer, so that a parasitic capacitance between the gate and the drain diffusion layer can be reduced. An $N^+$ source diffusion layer 809 is formed in an upper portion of the NMOS-forming pillar-shaped silicon layer 805, and a $P^+$ source diffusion layer (810*a*, 810*b*) is formed in an upper portion of the PMOS-forming pillar-shaped silicon layer (806*a*, 806*b*), wherein a silicide film 812 is formed in an upper portion of the source diffusion layer (809, 810*a*, 810*b*). A silicon nitride film 813 is formed to cover the above elements so as to serve as a contact stopper. Further, an interlayer silicon oxide film 814 is formed on the silicon nitride film 813, and a contact (815, 816, 816*a*, 816*b*, 817*a*, 817*b*) is formed to penetrate through the silicon oxide film 814 having a flattened surface. The silicon nitride film 813 may be formed to have a stress so as to apply a stress to a channel region of the pillar-shaped silicon layer to improve carrier mobility. In particular, a silicon nitride film having a tensile stress, and a silicon nitride film having a compressive stress, may be formed on the NMOS and the PMOS, respectively, to improve carrier mobility in both the NMOS and the PMOS.

The contact 815 formed on a boundary between the $N^+$ drain diffusion layer 803 and the $P^+$ drain diffusion layer 804 is connected to an output terminal Vout 9 via a line layer 831, and the contact 816 formed on the NMOS (Qn 91)-forming pillar-shaped silicon layer 805 is connected to a ground potential Vss 9 via a line layer 832. Further, the contact (816*a*, 816*b*) formed on the PMOS (Qp 91, Qp 92)-forming pillar-shaped silicon layer (806*a*, 806*b*) is connected to a power supply potential Vcc 9 via a line layer 833, and each of the contact 817*a* formed on a gate line 808*c* extending from the gate electrode surrounding the NMOS-forming pillar-shaped silicon layer 805, and the contact 817*b* formed on a gate line 808*d* extending from the gate electrode surrounding the PMOS-forming pillar-shaped silicon layer (806*a*, 806*b*), is connected to an input terminal Vin 9 via a line layer (830*a*, 830*b*). In this manner, the inverter is formed.

Figure 73:
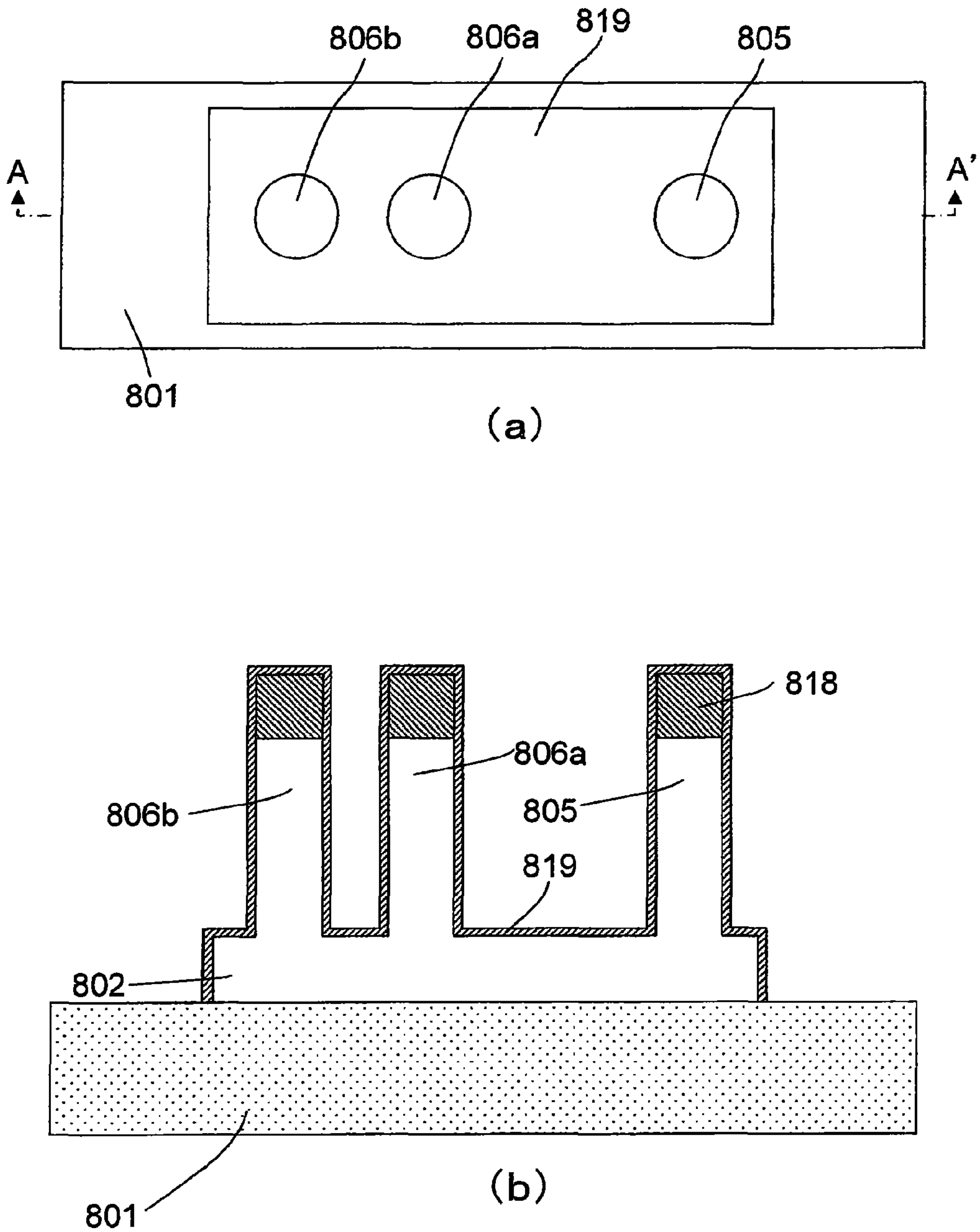
FIGS. 73(*a*) and 73(*b*) illustrate a part of production processes in the eighth embodiment.

With reference to FIGS. 73(*a*) to 90(*b*), a method of forming the CMOS converter according the eighth embodiment, as one example of a semiconductor device production method of the present invention will be described below. In FIGS. 73(*a*) to 90(*b*), the figure suffixed with (a) is a top plan view, and the figure suffixed with (b) is a sectional view taken along the line A-A'.

Any production process before a process of sacrificially oxidizing a pillar-shaped silicon layer, in the eighth embodiment, is the same as that in the first embodiment. Thus, the following description will be made about the sacrificial oxidation process and subsequent processes.

As shown in FIGS. 73(*a*) and 73(*b*), the pillar-shaped silicon layer is subjected to sacrificial oxidation to flatten a surface of the pillar-shaped silicon layer serving as a channel region. A sacrificial oxide film 819 can also be used as a through oxide film during ion implantation.

Figure 74:
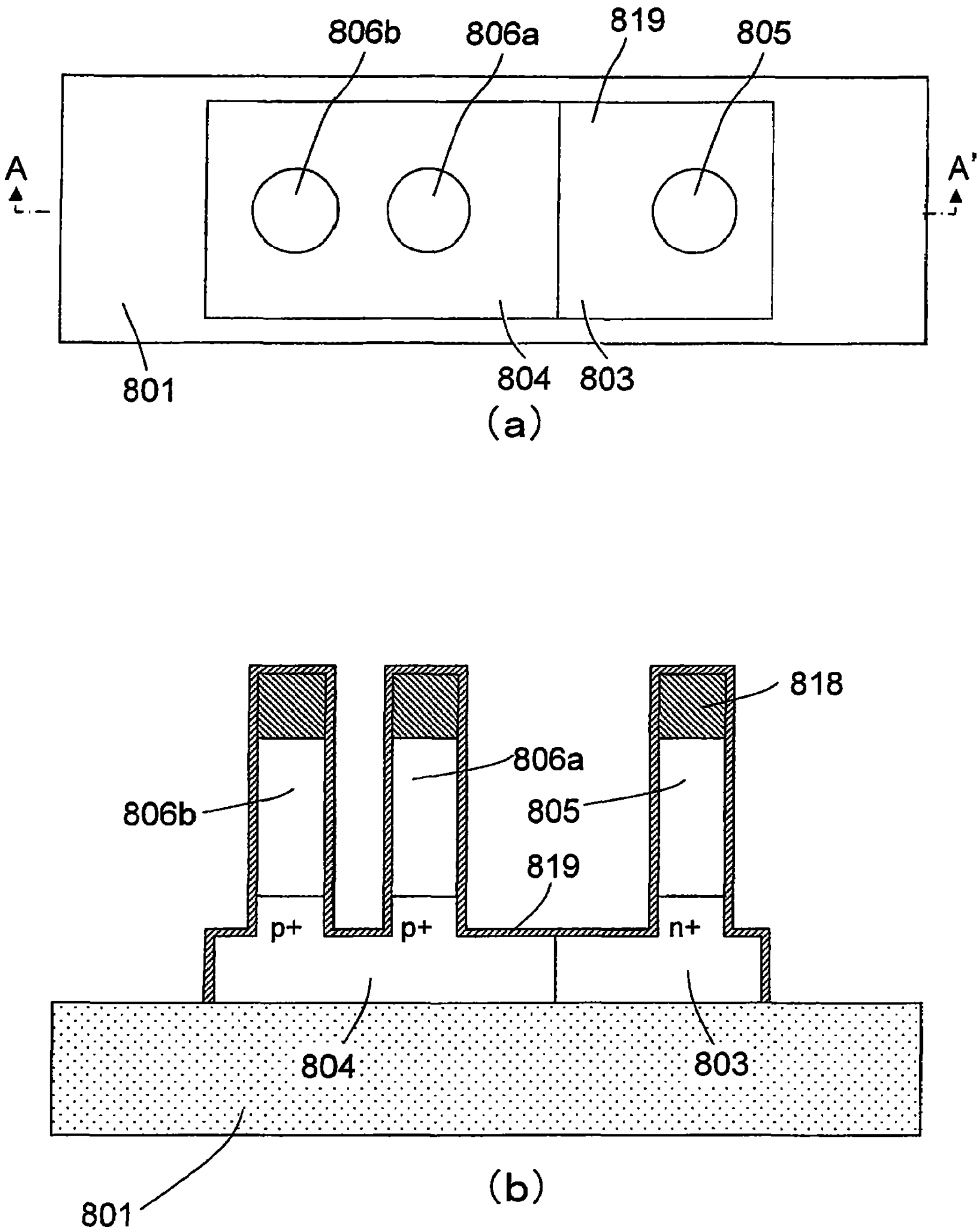
FIGS. 74(*a*) and 74(*b*) illustrate a part of production processes in the eighth embodiment.

Then, as shown in FIGS. 74(*a*) and 74(*b*), an impurity, such as As or P, is injected into the planar silicon layer 802 by ion implantation or other injection technique using a resist mask, to form a $N^+$ drain diffusion layer 803, and an impurity, such as B or $BF_2$, is injected into the planar silicon layer 802 in the same manner to form a $P^+$ drain diffusion layer. During this process, a nitride film 818 on a top of the pillar-shaped silicon layer is used as a stopper for preventing the impurity from being injected into an upper portion of the pillar-shaped silicon layer. Conditions of the ion implantation, and conditions of a subsequent heat treatment, are set to allow the impurities to be diffused in such a manner as to reach the buried oxide film 801 while reaching a bottom of the pillar-shaped silicon layer, through the subsequent heat treatment.

Figure 75:
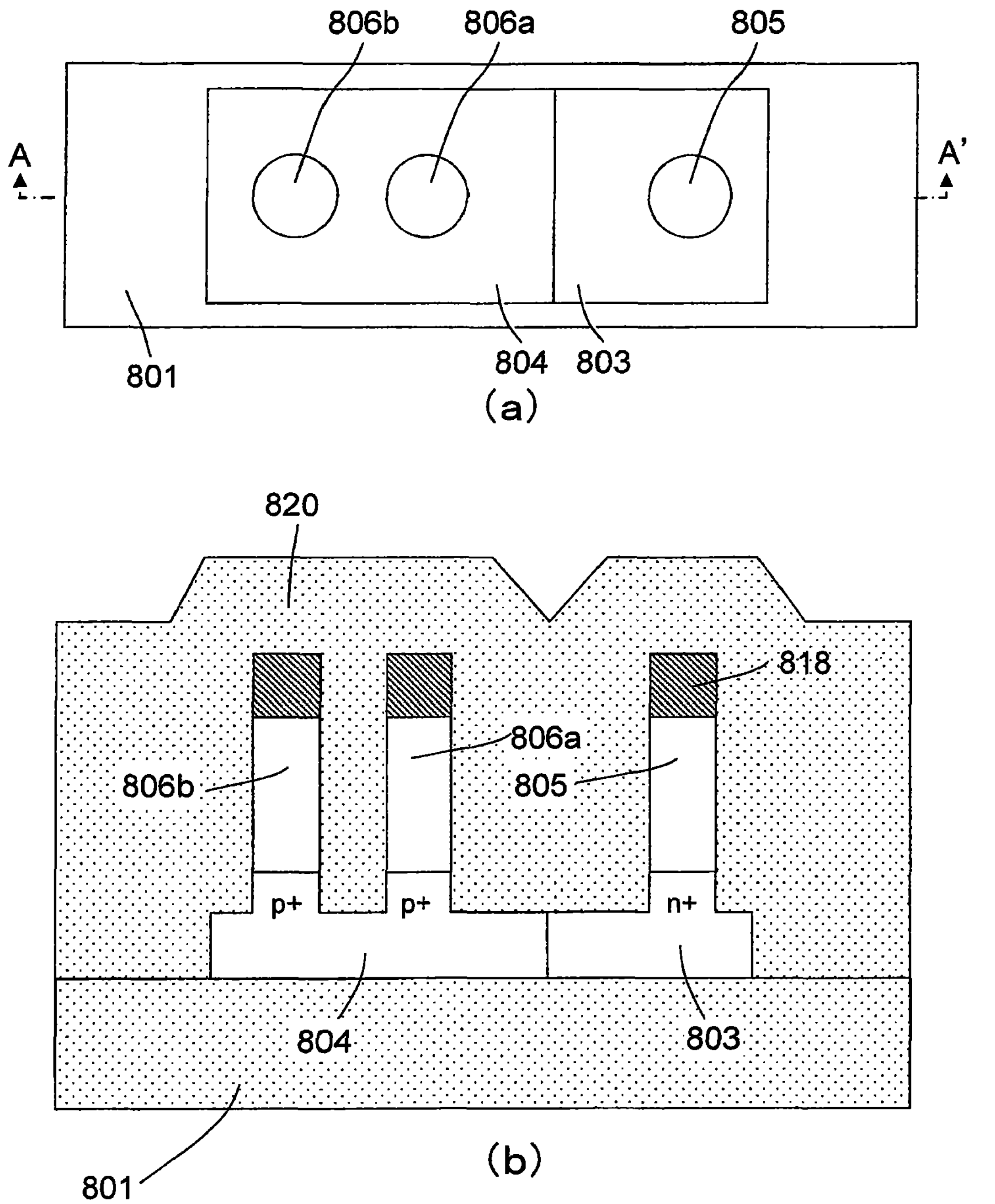
FIGS. 75(*a*) and 75(*b*) illustrate a part of production processes in the eighth embodiment.

Then, as shown in FIGS. 75(*a*) and 75(*b*), a third dielectric film 820, such as a silicon oxide film, is formed to a film thickness of about 200 to 500 nm to fill between the adjacent pillar-shaped silicon layers.

Figure 76:
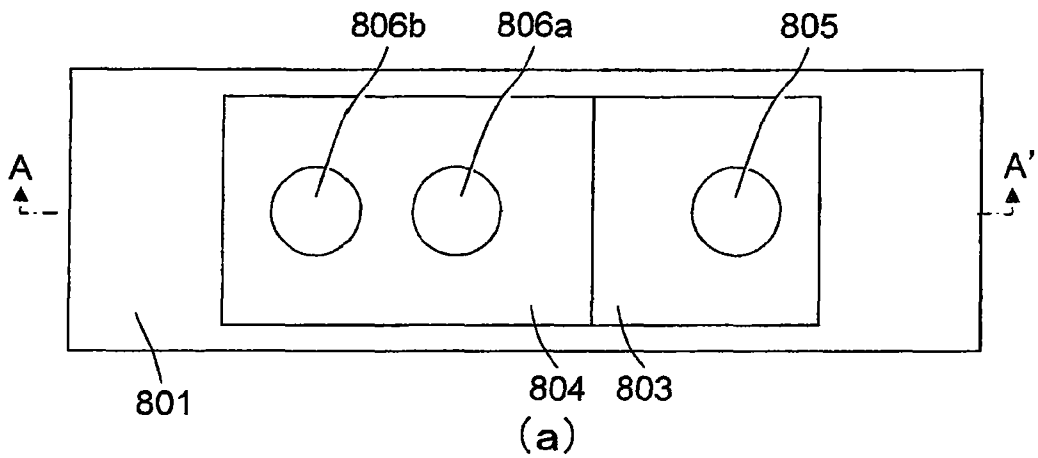
FIGS. 76(*a*) and 76(*b*) illustrate a part of production processes in the eighth embodiment.
Figure 76:
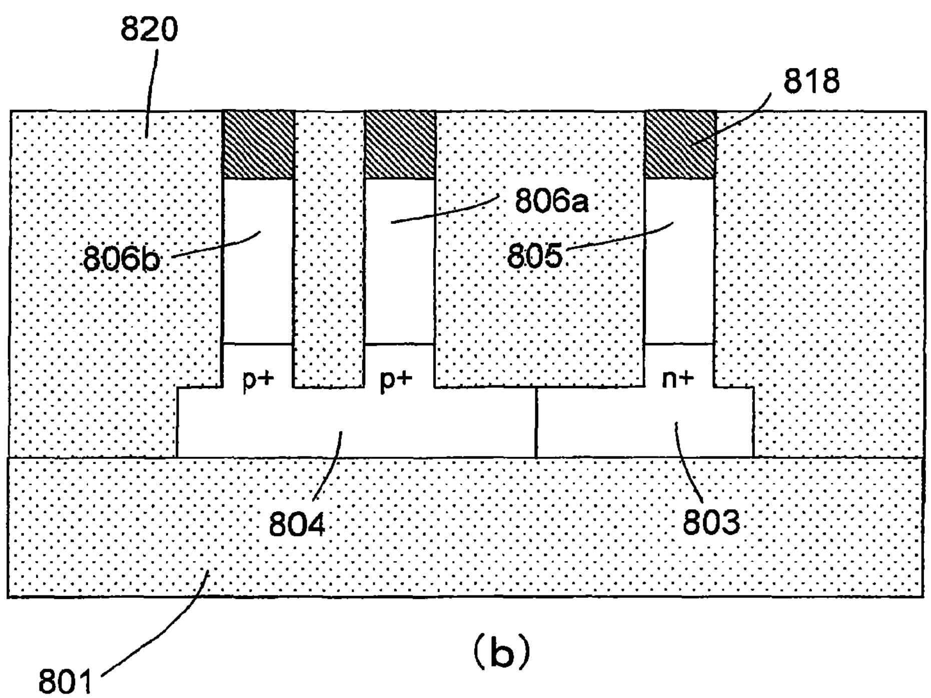

Then, as shown in FIGS. 76(*a*) and 76(*b*), the third dielectric film 820, such as a silicon oxide film, is flattened by CMP, and the CMP is stopped by the silicon nitride film 818. The use of the silicon nitride film 820 as a CMP stopper makes it possible to control an amount of CMP with high repeatability. In place of the silicon nitride film, the film to be used as a CMP stopper may be any other suitable film capable of functioning as the CMP stopper film.

Figure 77:
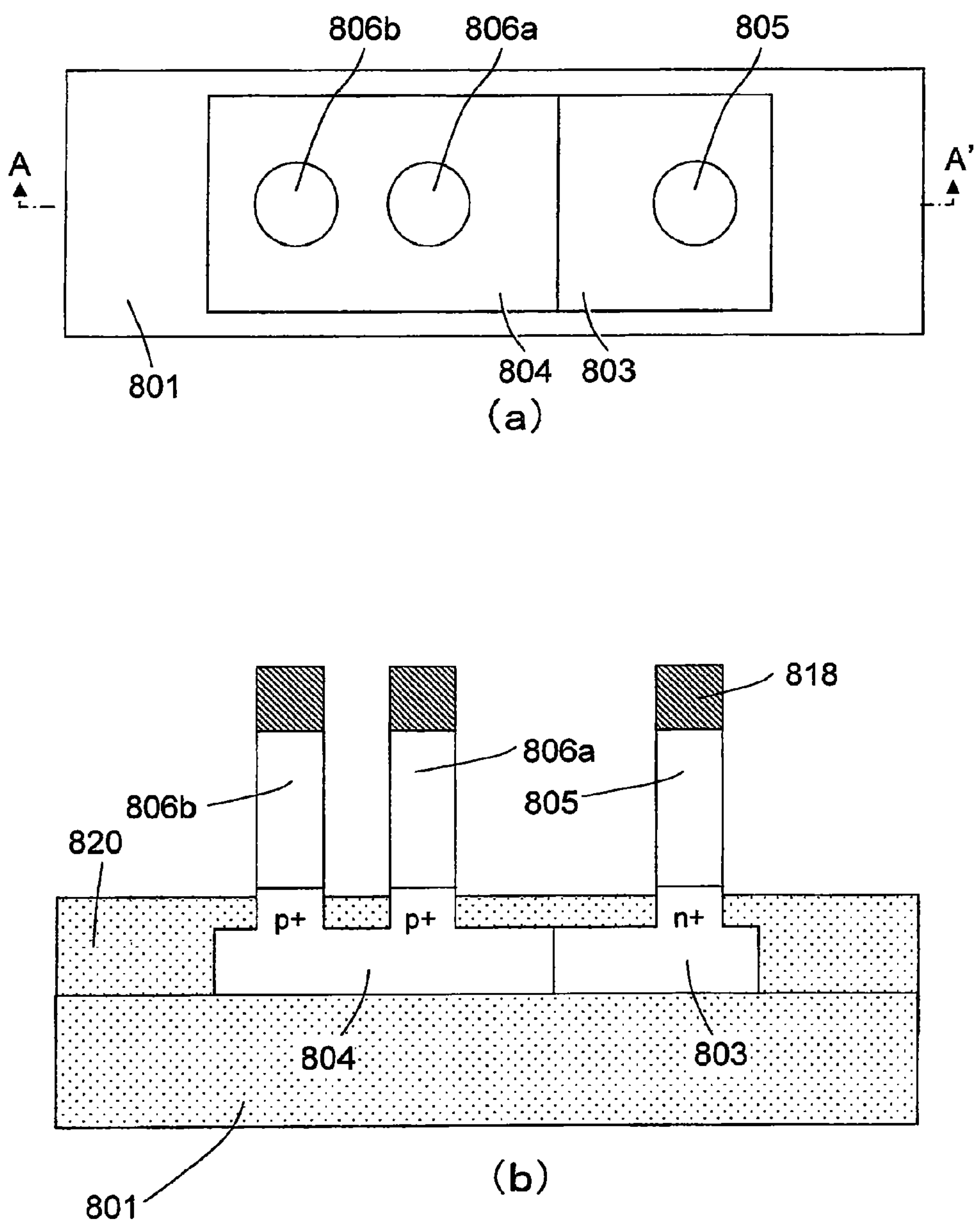
FIGS. 77(*a*) and 77(*b*) illustrate a part of production processes in the eighth embodiment.

Then, as shown in FIGS. 77(*a*) and 77(*b*), the third dielectric film 820, such as a silicon oxide film, is etched back to expose a portion of the pillar-shaped silicon layer serving as a channel region. In this process, the third dielectric film 820, such as a silicon oxide film, is left on the drain diffusion layer (803, 804) by a thickness of about 5 to 50 nm.

Figure 78:
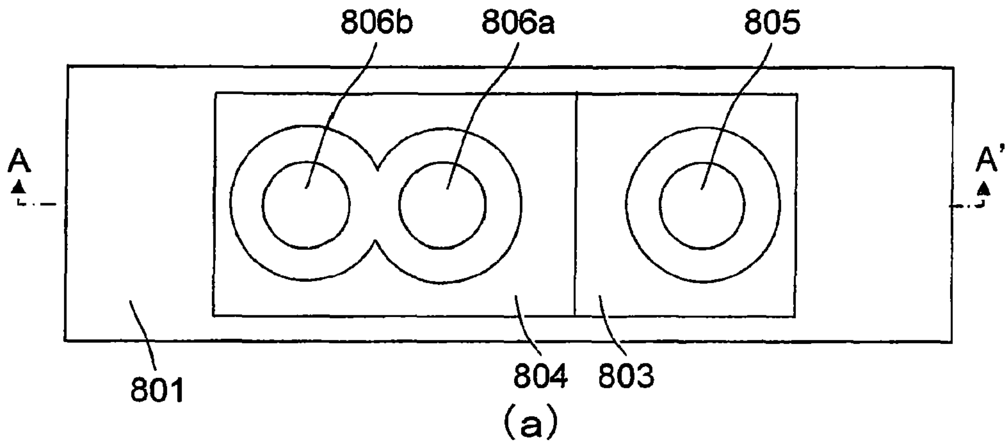
FIGS. 78(*a*) and 78(*b*) illustrate a part of production processes in the eighth embodiment.
Figure 78:
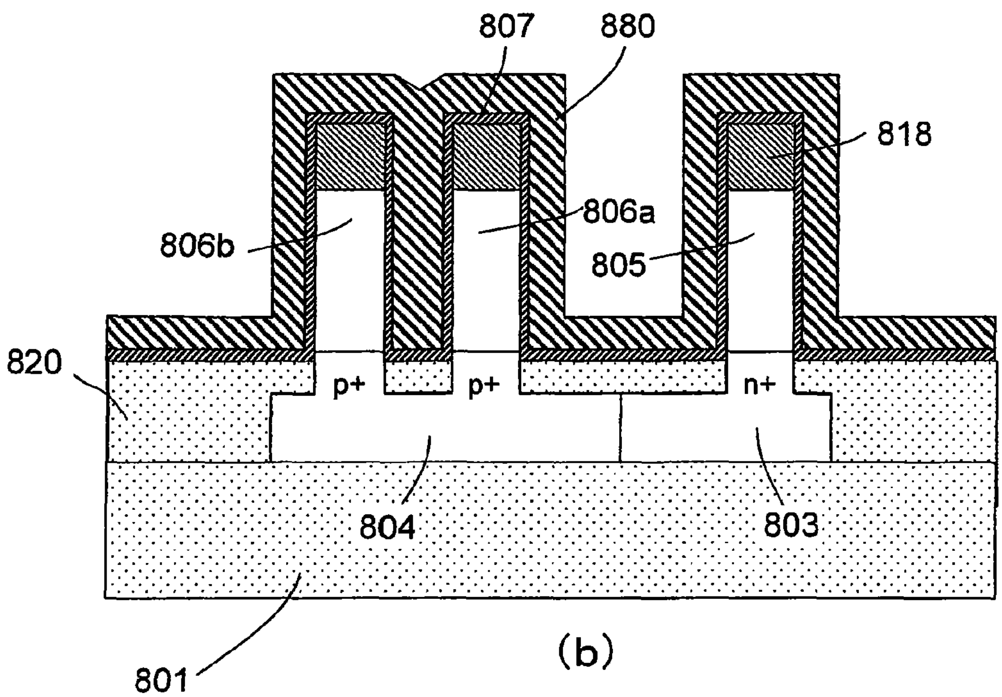

A shown in FIGS. 78(*a*) and 78(*b*), a first dielectric film 807, such as a high-k film 807, such as a $HfO_2$ film, serving as a gate dielectric film, is formed to a thickness of about 1 to 5 nm by CVD or ALD. Subsequently, a metal film 880, such as a TiN film or a TaN film, serving as a gate conductive film, is formed to a thickness of about 10 to 60 nm. The third dielectric film 820, such as a silicon oxide film, having a lower dielectric constant than the gate dielectric film 807 is inserted between the gate dielectric film 807 and the drain diffusion layer (803, 804), so that a parasitic capacitance therebetween is reduced.

Figure 79:
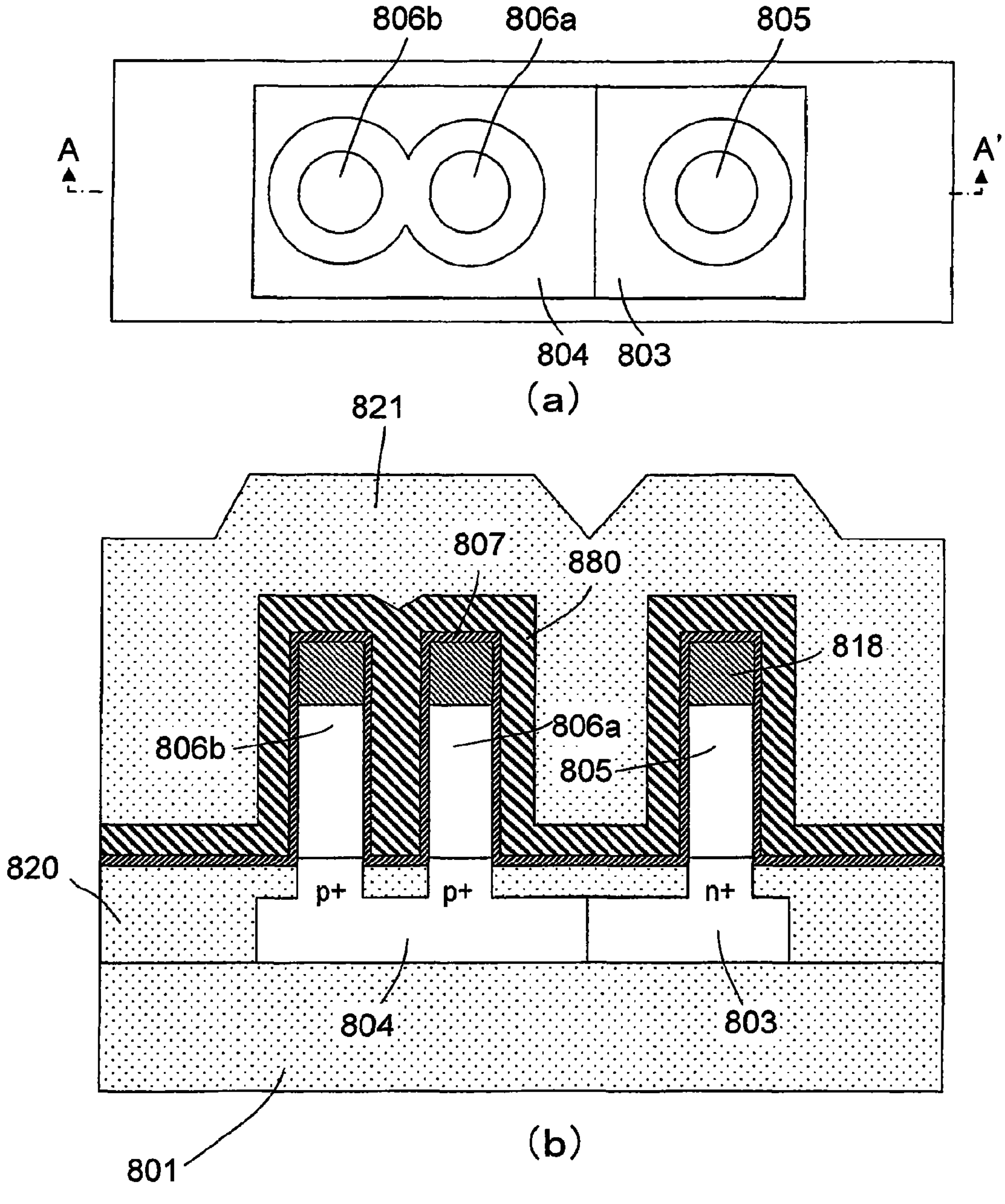
FIGS. 79(*a*) and 79(*b*) illustrate a part of production processes in the eighth embodiment.

Then, as shown in FIGS. 79(*a*) and 79(*b*), a second dielectric film 821, such as a silicon oxide film, is formed to fill between the adjacent pillar-shaped silicon layers.

Figure 80:
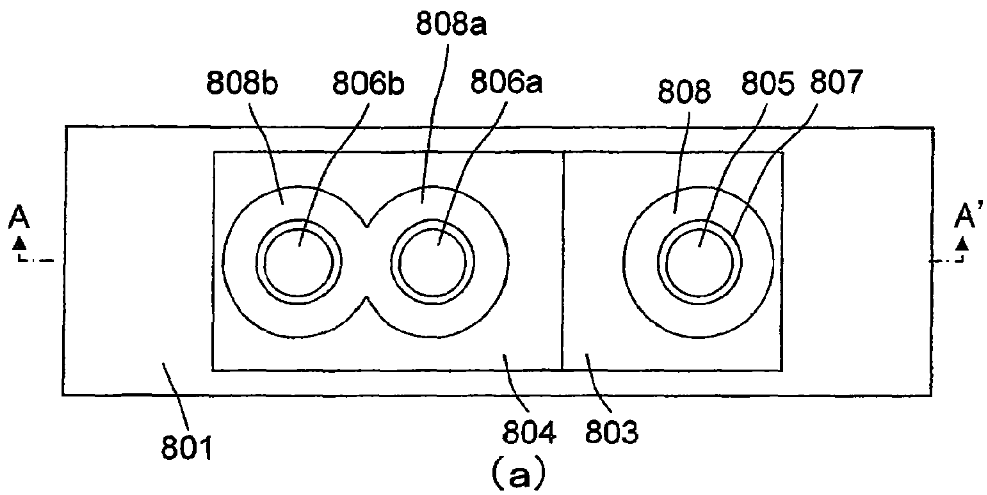
FIGS. 80(*a*) and 80(*b*) illustrate a part of production processes in the eighth embodiment.
Figure 80:
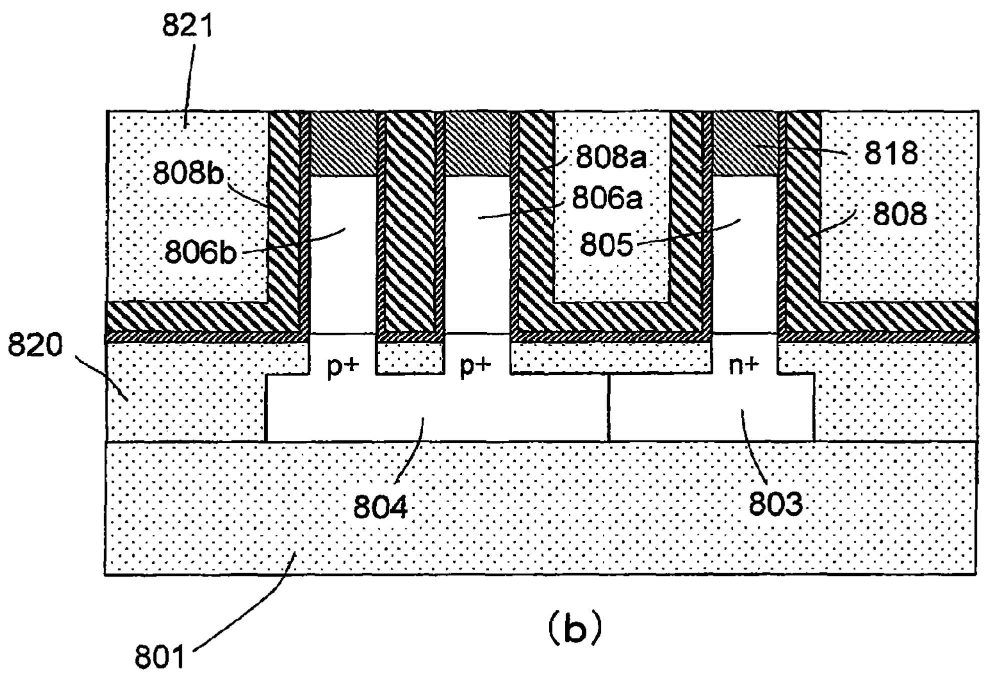

Then, as shown in FIGS. 80(*a*) and 80(*b*), the second dielectric film 821, such as a silicon oxide film, and portions of the gate conductive film and the first dielectric film, such as a high-k film, above the pillar-shaped silicon layer, are polished by CMP to flatten a top surface of a gate. The flattening of the top surface of the gate by the CMP makes it possible to achieve an adequate gate configuration and suppress a variation in gate length. During the CMP, the silicon nitride film 818 on the top of the pillar-shaped silicon layer is used as a CMP stopper. The use of the silicon nitride film 818 as a CMP stopper makes it possible to control an amount of CMP with high repeatability. In place of the silicon nitride film, the film to be used as a CMP stopper may be any other suitable film capable of functioning as the CMP stopper film.

Figure 81:
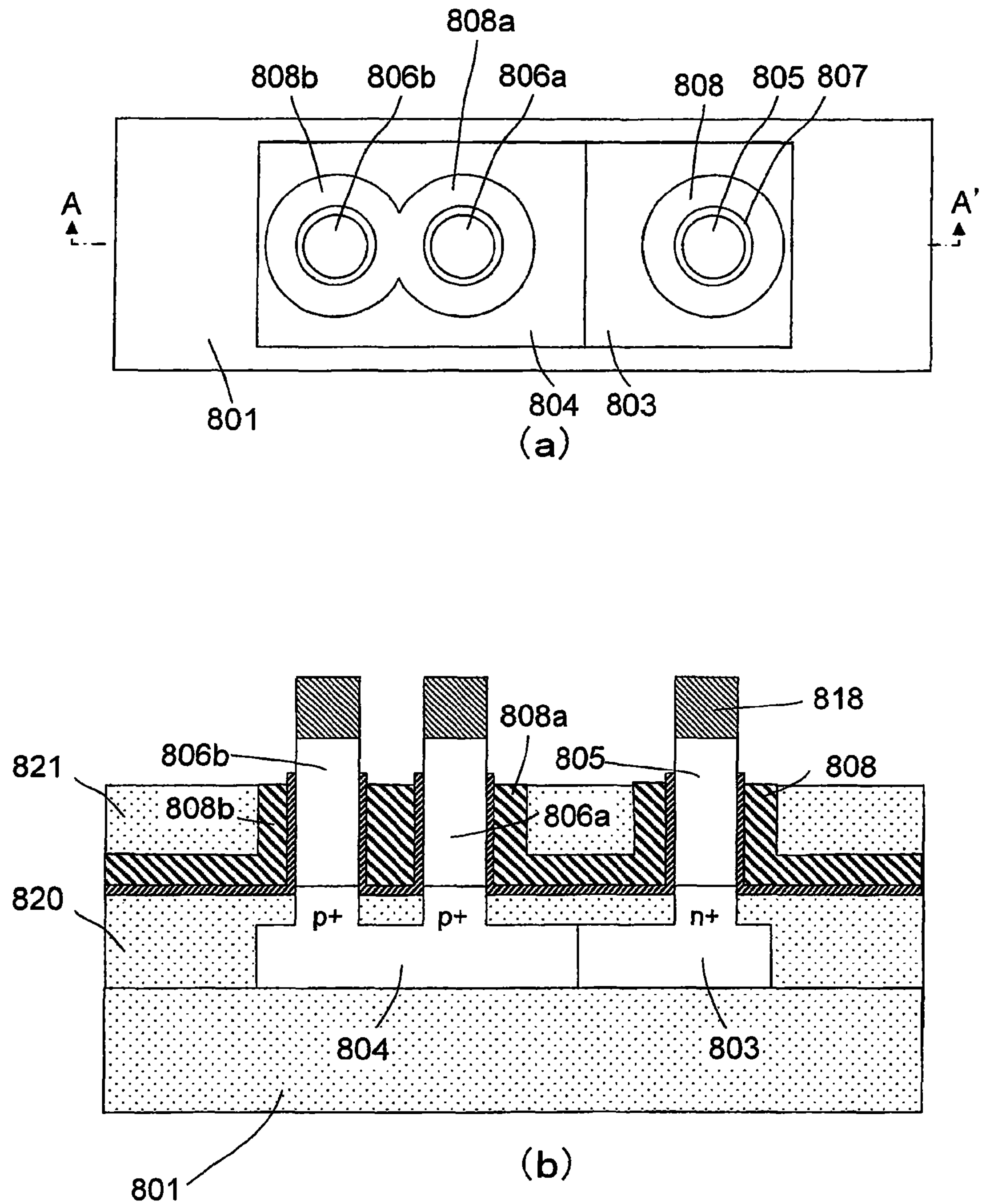
FIGS. 81(*a*) and 81(*b*) illustrate a part of production processes in the eighth embodiment.

Then, as shown in FIGS. 81(*a*) and 81(*b*), the gate conductive film and the second dielectric film 821, such as a silicon oxide film, are etched back to form a gate electrode (808, 808*a*, 808*b*) while fixing a gate length. Etching conditions to be used in this process are set to allow the gate conductive film (808, 808*a*, 808*b*) and the second dielectric film 821, such as a silicon oxide film, to be etched preferably at the same rate, and at a higher selectivity ratio relative to the silicon nitride film 818. The etching of the gate conductive film (808, 808*a*, 808*b*) and the second dielectric film 821, such as a silicon oxide film, at the same rate makes it possible to suppress occurrence of a step between respective top surfaces of the two films, which facilitates forming an after-mentioned silicon nitride film-based sidewall in a process subsequent to a next process.

Figure 82:
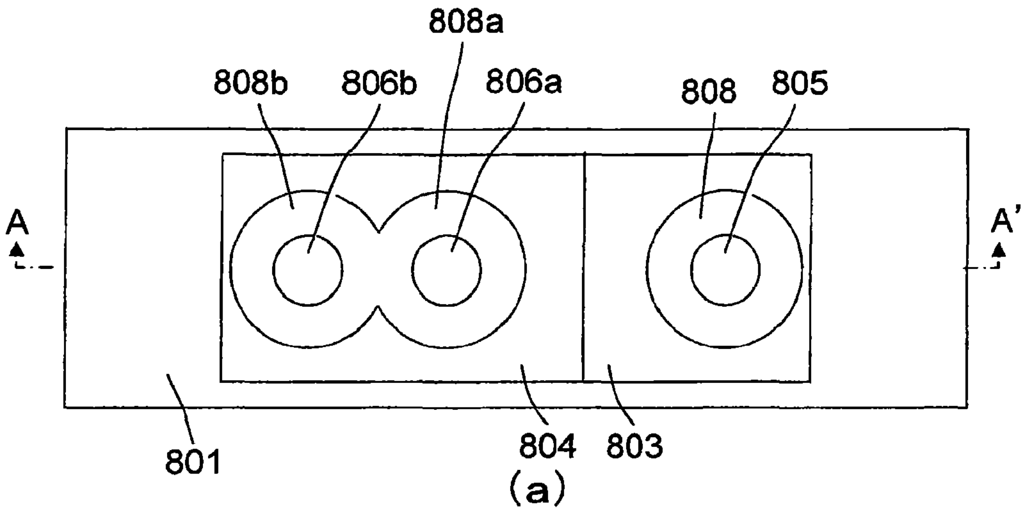
FIGS. 82(*a*) and 82(*b*) illustrate a part of production processes in the eighth embodiment.
Figure 82:
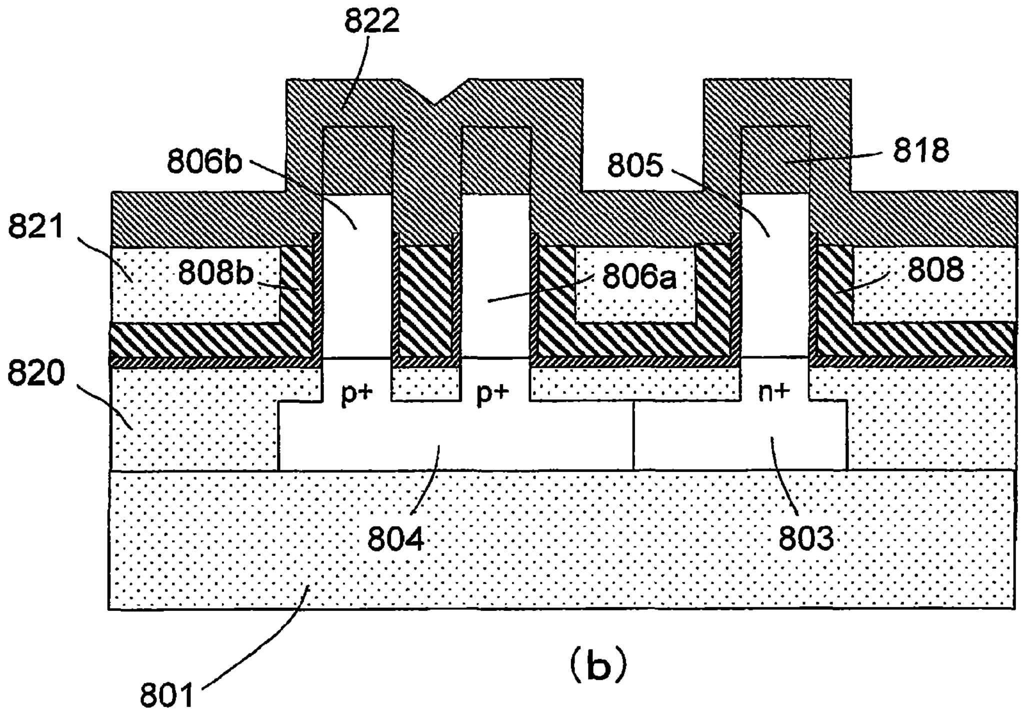

Then, as shown in FIGS. 82(*a*) and 82(*b*), a silicon nitride film 822 is formed.

Figure 83:
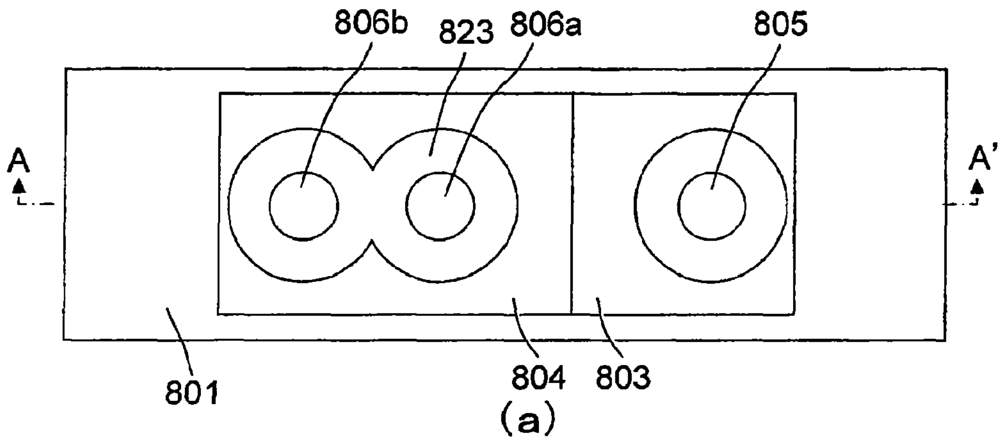
FIGS. 83(*a*) and 83(*b*) illustrate a part of production processes in the eighth embodiment.
Figure 83:
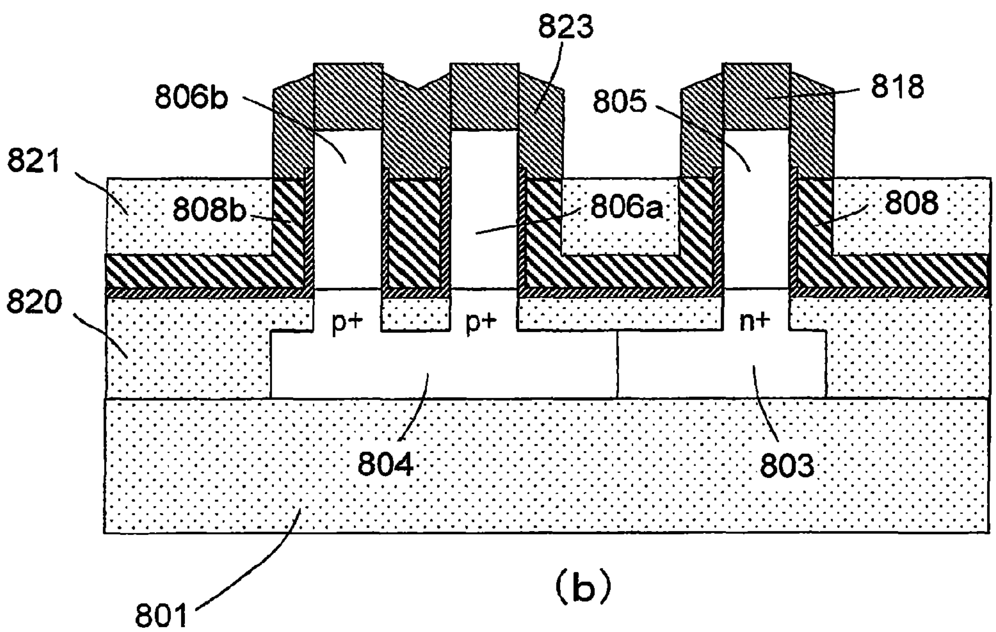

Then, as shown in FIGS. 83(*a*) and 83(*b*), the silicon nitride film 822 is etched back to form a silicon nitride film-based sidewall 823 on a top of the metal gate. An amount of the silicon nitride film to be formed in the preceding process and an amount of the silicon nitride film to be etched back in this process, are set to allow the silicon nitride film-based sidewall 823 remaining on the gate to accurately cover the gate. A portion of the gate covered by the silicon nitride film-based sidewall is protected during etching. This makes it possible to form the gate electrode to a desired film thickness, in a self-alignment manner, so as to reduce an occupancy area, and a parasitic capacitance between the gate and the diffusion layer. In the eighth embodiment, the silicon nitride film is used as a sidewall protective film. Alternatively, any other suitable film capable of functioning as the sidewall protective film, such as a silicon oxide film, may also be used.

Figure 84:
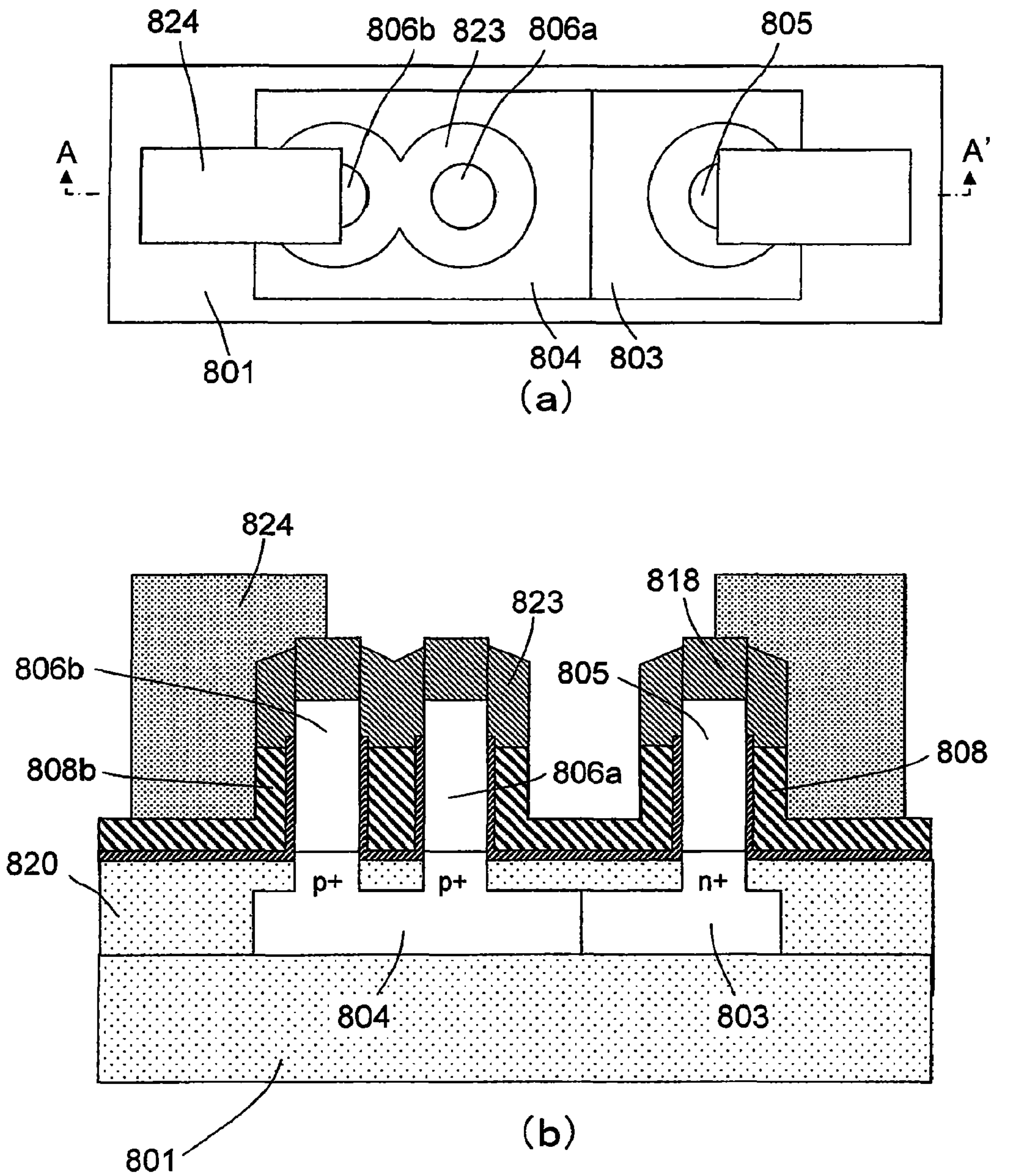
FIGS. 84(*a*) and 84(*b*) illustrate a part of production processes in the eighth embodiment.

Then, as shown in FIGS. 84(*a*) and 84(*b*), after the second dielectric film 821, such as a silicon oxide film, remaining on the metal gate is removed by wet etching, a resist or a multilayer resist is applied, and a gate line pattern is formed by lithography, using the resist 824.

Figure 85:
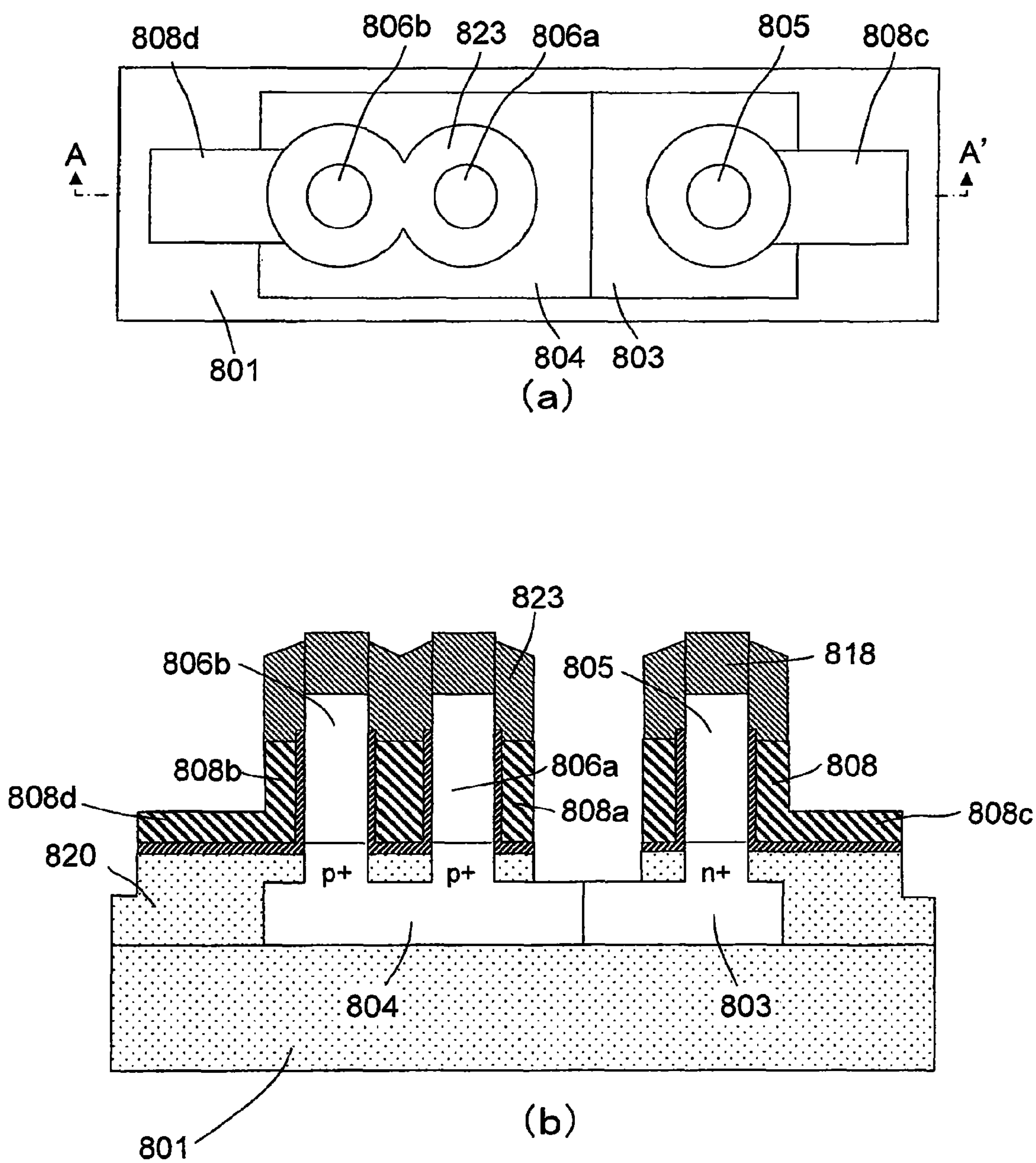
FIGS. 85(*a*) and 85(*b*) illustrate a part of production processes in the eighth embodiment.

Then, as shown in FIGS. 85(*a*) and 85(*b*), a bottom portion of the gate and a portion of the first dielectric film, such as a high-k film, and the third dielectric film 820, such as a silicon oxide film beneath the gate are partially etched by reactive ion etching, using a resist mask. Through this process, a gate electrode (808, 808*a*, 808*b*) and a gate line (808*c*, 808*d*) are formed.

Figure 86:
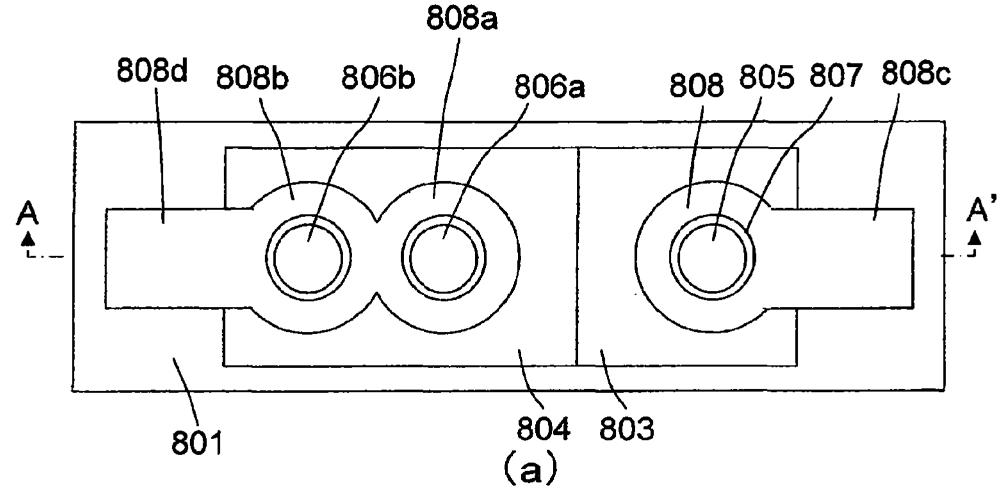
FIGS. 86(*a*) and 86(*b*) illustrate a part of production processes in the eighth embodiment.
Figure 86:
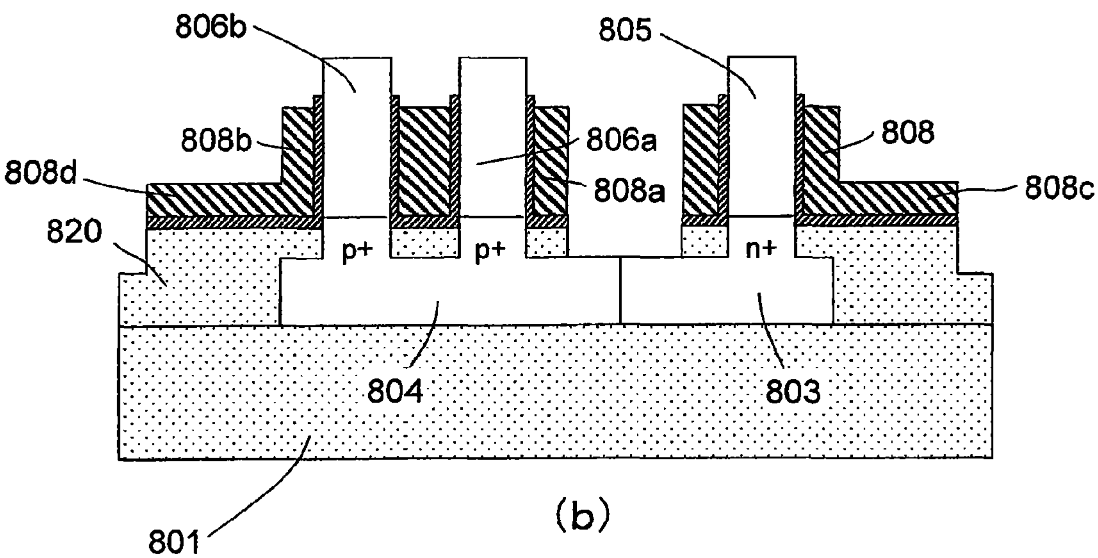

Then, as shown in FIGS. 86(*a*) and 86(*b*), the silicon nitride film 818 on the top of the pillar-shaped silicon layer, and the silicon nitride film-based sidewall 823, are removed by wet etching.

Figure 87:
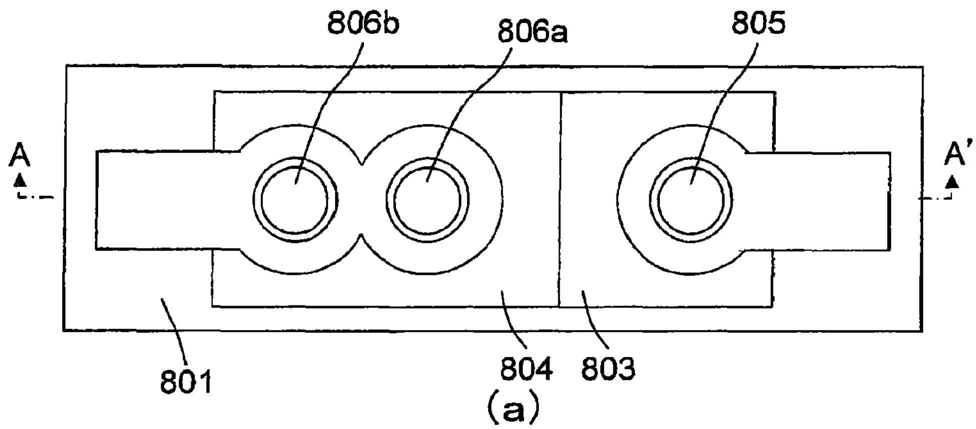
FIGS. 87(*a*) and 87(*b*) illustrate a part of production processes in the eighth embodiment.
Figure 87:
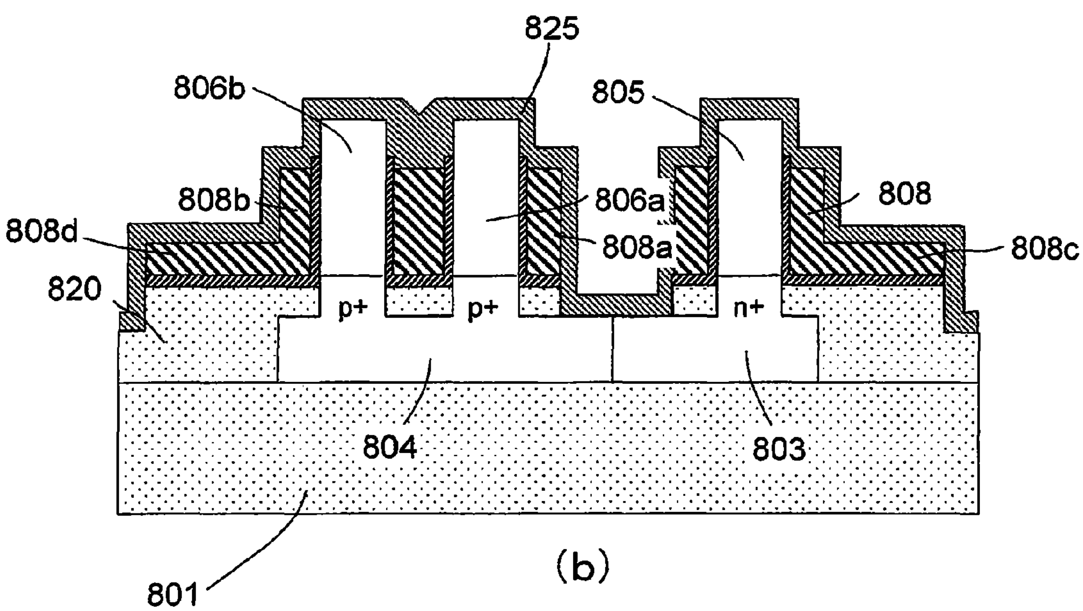

Then, as shown in FIGS. 87(*a*) and 87(*b*), a silicon nitride film 825 is formed to a film thickness of about 10 to 50 nm.

Figure 88:
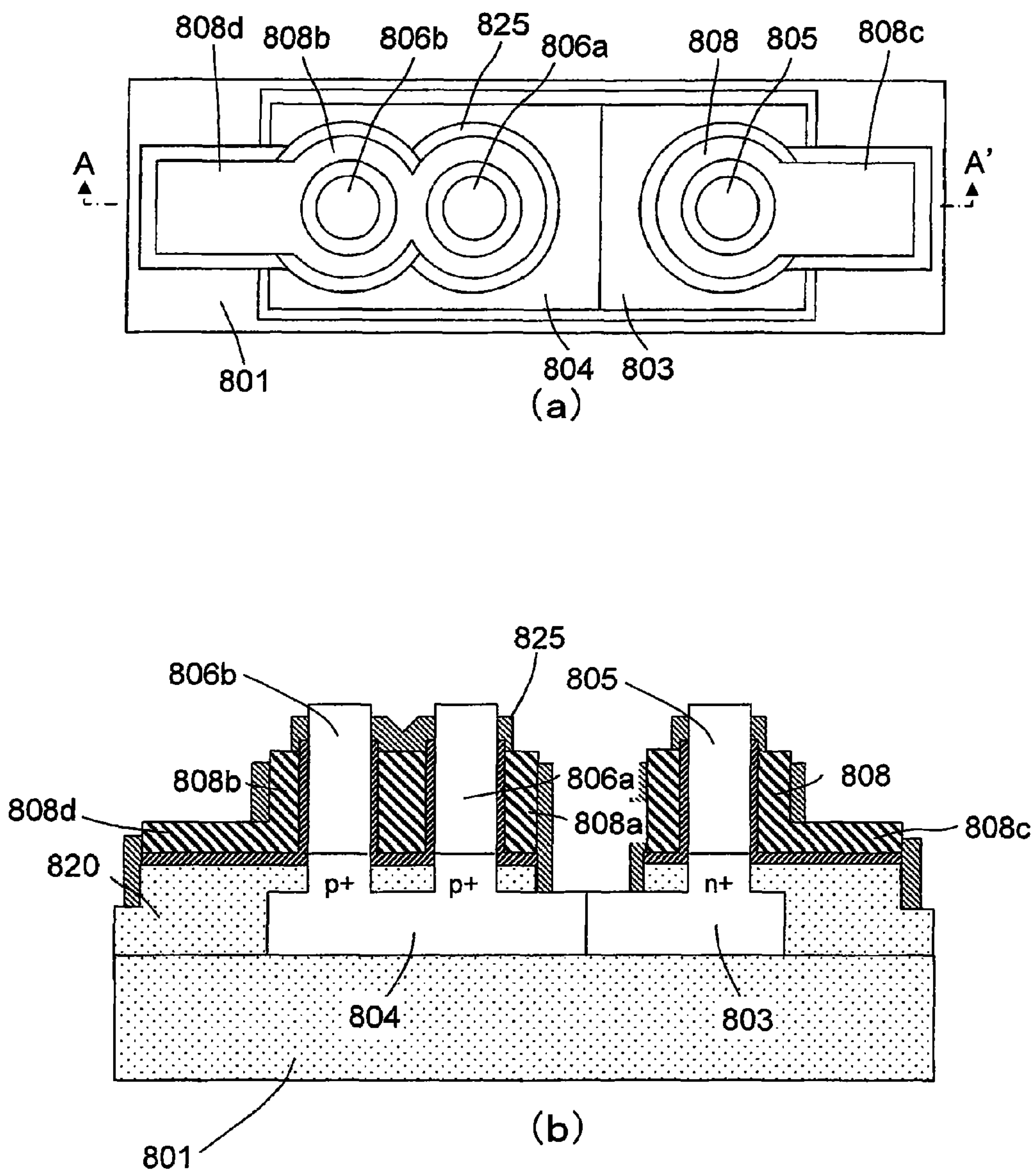
FIGS. 88(*a*) and 88(*b*) illustrate a part of production processes in the eighth embodiment.

Then, as shown in FIGS. 88(*a*) and 88(*b*), the silicon nitride film 825 is etched back to form a structure where a sidewall of an upper portion of the pillar-shaped silicon layer and a sidewall of the gate are covered by the silicon nitride film 825 while exposing a top surface of the pillar-shaped silicon layer, and a top surface of the planar silicon layer. This structure provides the following advantages. Firstly, the silicon nitride film 825 is disposed to isolate between the gate electrode (808, 808*a*, 808*b*) and the upper portion of the pillar-shaped silicon layer. This makes it possible to prevent short-circuiting between the gate electrode and the upper portion of the pillar-shaped silicon layer, and short-circuiting between the gate electrode and the drain diffusion layer, which would otherwise be caused by excessive formation of silicide.

Secondly, the silicon nitride film is disposed to cover the sidewall of the upper portion of the pillar-shaped silicon layer. This makes it possible to prevent the pillar-shaped silicon layer from being excessively silicided through the sidewall of the pillar-shaped silicon layer, during a silicidation process in FIGS. 89(*a*) and 89(*b*). If a silicide layer is excessively formed in the upper portion of the pillar-shaped silicon layer to get closer to a junction of the source diffusion layer, it causes an increase in junction leak. Thus, it is necessary to control the silicide layer to keep from being excessively formed. Thirdly, the silicon nitride film 825 is disposed to cover the first dielectric film, such as a high-k film 807. This makes it possible to prevent the first dielectric film, such as a high-k film, from being damaged during ion implantation in a next process and during wet treatment and ion implantation in subsequent processes.

If a silicon oxide film is used in place of the silicon nitride film 825, it will be undesirably wet-etched by hydrofluoric acid used in a cleaning/releasing process and a silicidation pretreatment. Thus, it is preferable to use a film insoluble in hydrofluoric acid, such as the silicon nitride film. Further, an excessively small film thickness of the silicon nitride film makes it impossible to fully protect the first dielectric film, such as a high-k film 807, and an excessively large film thickness of the silicon nitride film causes an increase in occupancy area by just the film thickness of the high-k film formed on the sidewall of the gate. In the eighth embodiment, the silicon nitride film is used as a protective film. Alternatively, any other suitable film capable of functioning as the protective film, such as a film having a layered structure comprising a silicon nitride film and a silicon oxide film, may also be used.

Figure 89:
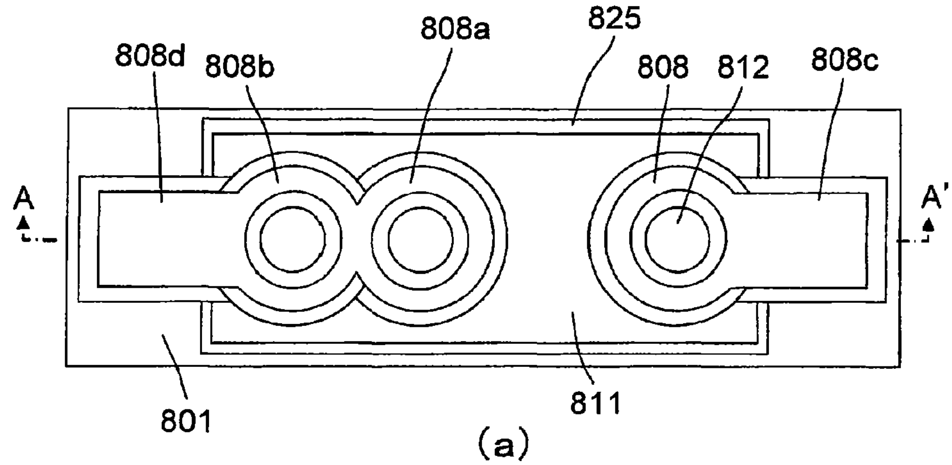
FIGS. 89(*a*) and 89(*b*) illustrate a part of production processes in the eighth embodiment.
Figure 89:
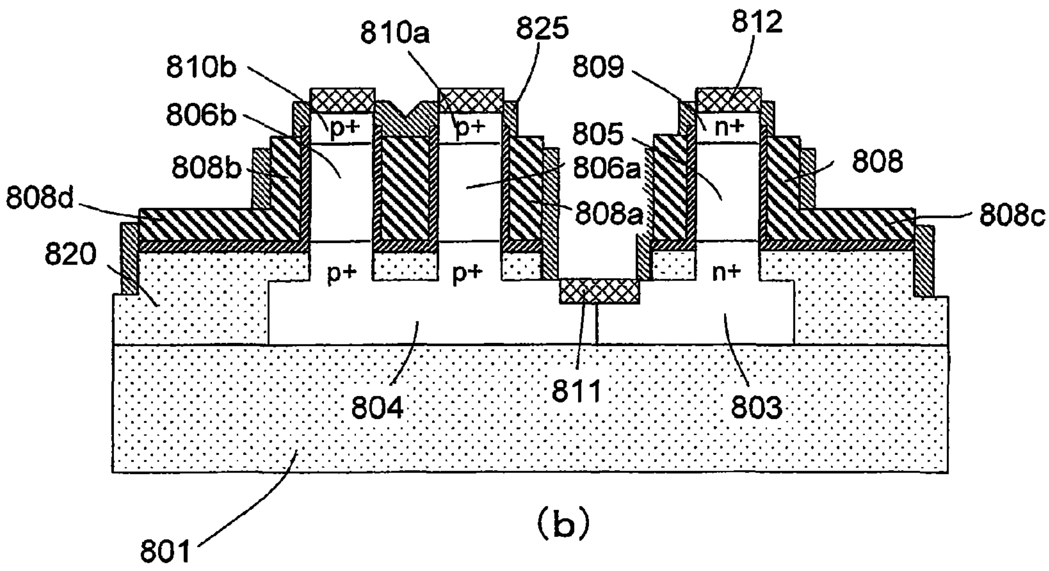

Then, as shown in FIGS. 89(*a*) and 89(*b*), an $N^+$ source diffusion layer 805 is formed in an upper portion of the pillar-shaped silicon layer 805 by ion implantation or other injection technique. In the same manner, a $P^+$ source diffusion layer (810*a*, 810*b*) is formed in an upper portion of the pillar-shaped silicon layer (86*a*, 86*b*). Subsequently, a metal, such as Ni or Co, is sputtered onto each of the surfaces of the source and drain diffusion layers to form a metal film therein, and the metal film is silicided through a heat treatment, whereafter an unreacted portion of the metal film is removed to form a silicide layer 811 on the drain diffusion layer and a silicide layer 812 on the source diffusion layer.

Figure 90:
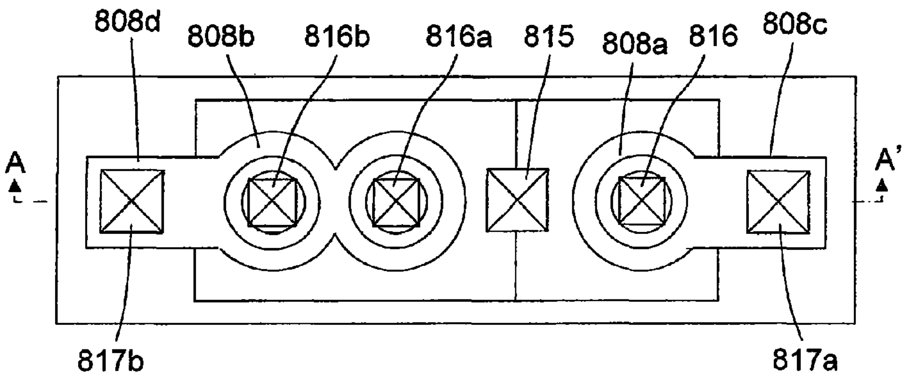
FIGS. 90(*a*) and 90(*b*) illustrate a part of production processes in the eighth embodiment.
Figure 90:
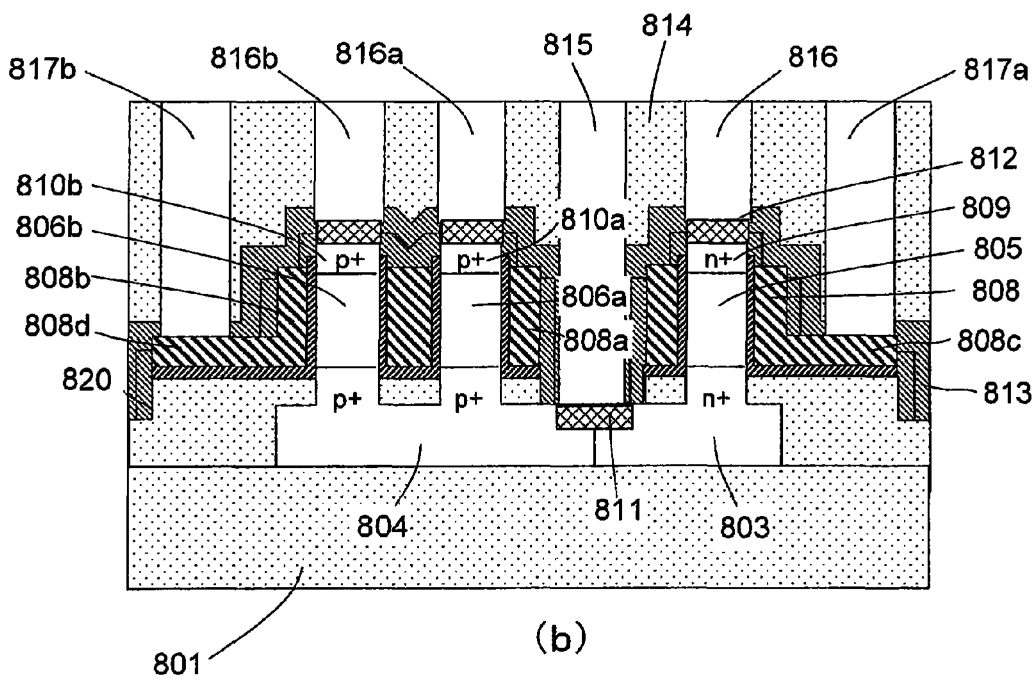

Then, as shown in FIGS. 90(*a*) and 90(*b*), after a silicon nitride liner film 813 is formed, a silicon oxide film 814 is formed, and flattened by CMP. Subsequently, a contact (815,

816, 816*a*, 816*b*, 817*a*, 817*b*) is formed on each of the drain diffusion layers on the planar silicon layer, the gates, and the source diffusion layer on the respective pillar-shaped silicon layers.

In the eighth embodiment, the additional dielectric film is inserted between the gate dielectric film and the drain diffusion layer, which provides an advantages of increasing a thickness of a dielectric film between the drain diffusion layer and each of the gate electrode and the gate line to reduce a parasitic capacitance between the gate and the drain diffusion layer, in addition to the advantages in the aforementioned embodiments. Particularly, in case where an additional dielectric film having a relatively low dielectric constant, such as a silicon oxide film, is inserted between the gate dielectric film and the drain diffusion layer, the parasitic capacitance can be largely reduced.

Ninth Embodiment

A ninth embodiment of the present invention shows one example of a technique of simultaneously achieving the technique in the seventh embodiment which is designed to simplify a gate formation process, and the SGT structure in the eighth embodiment which is designed to reduce a parasitic capacitance between a gate line and a drain diffusion layer underneath a pillar-shaped silicon layer.

Figure 91:
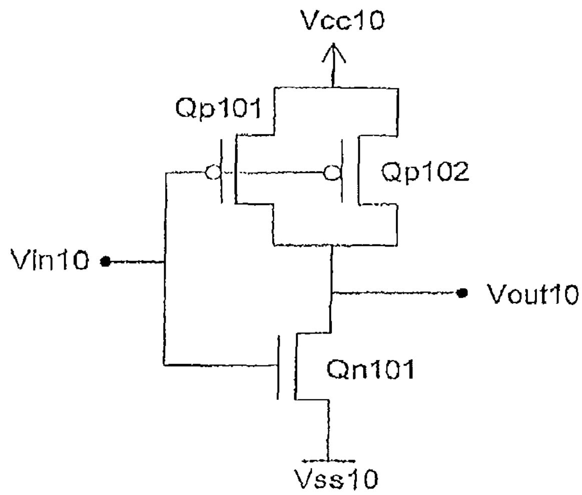
FIG. 91 is an equivalent circuit diagram of a CMOS inverter according to a ninth embodiment of the present invention.

FIG. 91 is an equivalent circuit diagram of a CMOS inverter according to the ninth embodiment. A circuit operation of the CMOS inverter is the same as that in the second embodiment, and its description will be omitted here.

Figure 92:
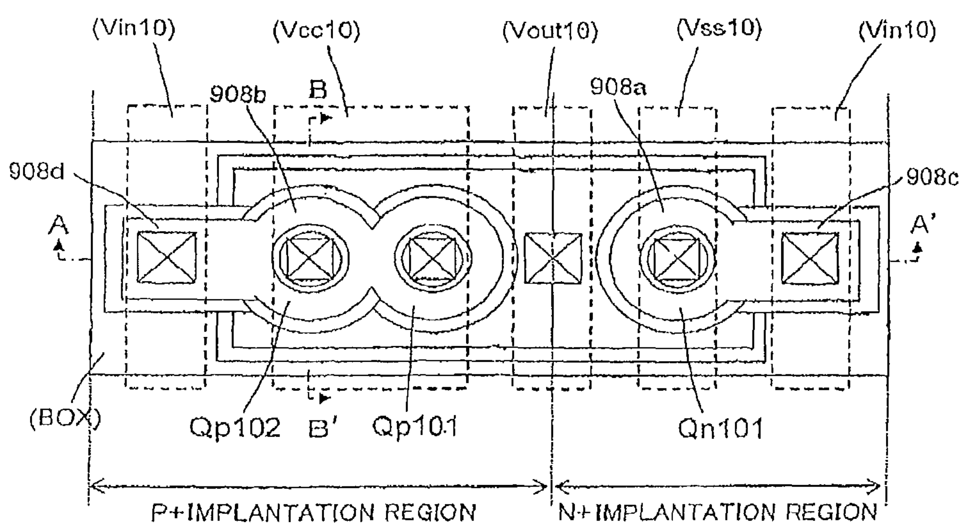
FIG. 92 is a top plan view of the CMOS inverter according to the ninth embodiment.
Figure 93:
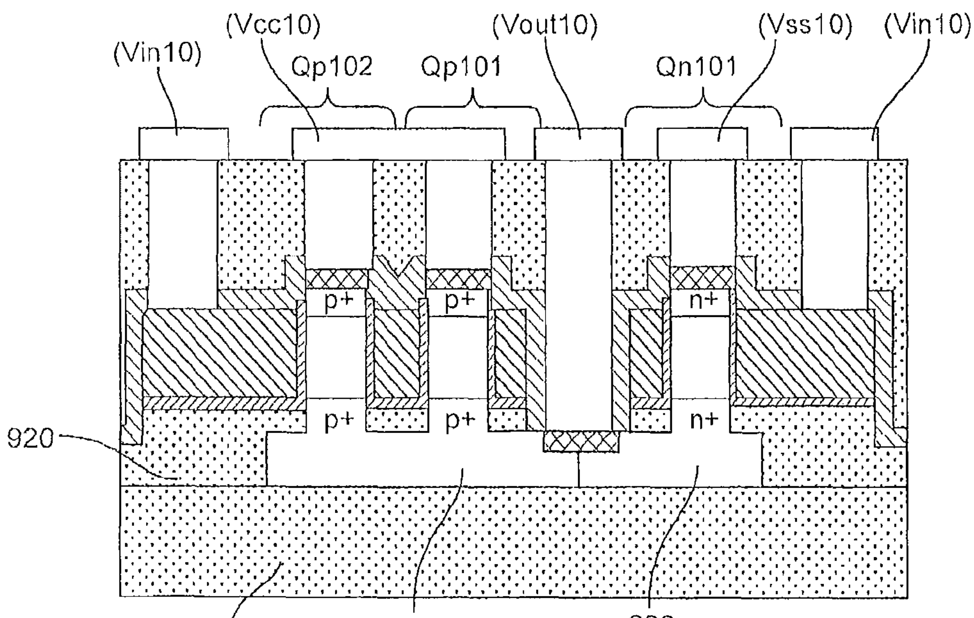
FIGS. 93(*a*) and 93(*b*) are sectional views of the CMOS inverter according to the ninth embodiment.
Figure 93:
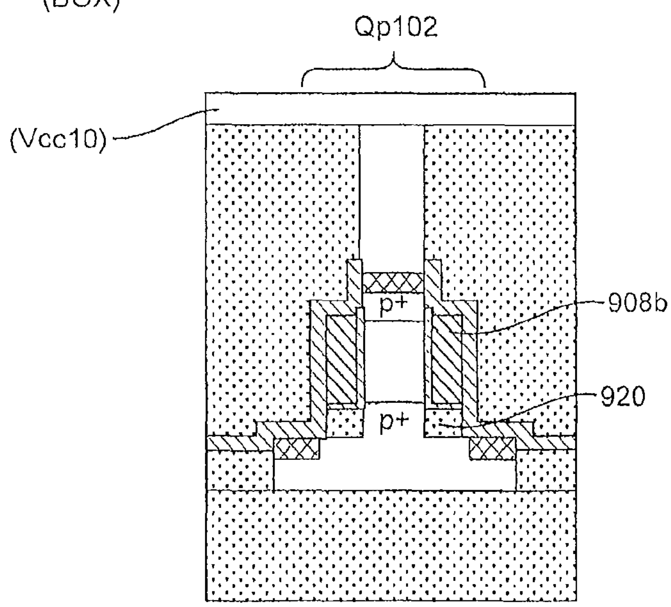

FIG. 92 is a top plan view of the CMOS inverter according to the ninth embodiment. FIGS. 93(*a*) and 93(*b*) are sectional views taken along the cutting-plane line A-A' and the cutting-plane line B-B' in FIG. 92, respectively. The ninth embodiment is characterized in that that a top surface of a gate electrode (908, 908*a*, 908*b*) surrounding a pillar-shaped silicon layer, and a top surface of a gate line (908*c*, 908*d*) extending from the gate electrode, have the same height, i.e., the gate electrode and the gate line are integrally formed in such a manner that the entire area of a top surface of the integrated combination of the gate electrode and the gate line becomes parallel to a substrate, and a third dielectric film 920 such as silicon oxide film exists between a drain diffusion layer (903, 904) and each of a gate electrode (908, 908*a*, 908*b*) and a gate line (908*c*, 908*d*).

The CMOS converter according to the ninth embodiment can be formed using the following production method.

As described in the production method (FIGS. 73(*a*) to 77(*b*)) in the eighth embodiment, after forming a pillar-shaped silicon layer, a third dielectric film, such as a silicon oxide film, is first formed to allow the pillar-shaped silicon layer to be buried therein, and then is flattened by CMP, whereafter the third dielectric film, such as a silicon oxide film, is etched back to leave a part of the third dielectric film, such as a silicon oxide film on a drain diffusion layer by a desired film thickness.

Subsequently, in the same manner as that described in the production method (FIGS. 56(*a*) to 69(*b*)) in the seventh embodiment, a gate conductive film is formed to allow the formed pillar-shaped silicon layer to be buried therein, and then flattened by CMP, whereafter the gate conductive film is etched back, and then a silicon nitride film for fixing a thickness of a gate electrode is formed and etched back to form a silicon nitride film-based sidewall for forming the gate electrode in a self-alignment manner. Subsequently, lithographic gate line patterning and etching are performed to obtain a gate electrode structure where a gate electrode and a gate line extending from the gate electrode are integrally formed in such a manner that the entire area of a top surface of the integrated combination of the gate electrode and the gate line becomes parallel to a substrate. Subsequently, a silicon nitride film is formed to protect a sidewall of the pillar-shaped silicon layer, and then a diffusion layer is formed in an upper portion of the pillar-shaped silicon layer, whereafter a silicide layer is formed on a top surface of a planar silicon layer and in the upper portion of the pillar-shaped silicon layer, and then a contact is formed thereon.

The production method in the ninth embodiment makes it possible to reduce the number of production processes for forming a gate, and facilitate forming a gate line during production. Further, in the ninth embodiment, an additional dielectric film is inserted between a gate dielectric film and a drain diffusion layer. Thus, a thickness of a dielectric film between the drain diffusion layer and each of a gate electrode and a gate line is increased, and therefore a parasitic capacitance between the gate and the drain diffusion layer is reduced. Particularly, in case where an additional dielectric film having a relatively low dielectric constant, such as a silicon oxide film, is inserted between the gate dielectric film and the drain diffusion layer, the parasitic capacitance can be largely reduced.

Tenth Embodiment

An SGT according to a tenth embodiment of the present invention is structurally different from that in the seventh embodiment, in that a gate has a layered structure comprising a thin metal film on the side of a gate dielectric film, and a polysilicon material on the side of a top surface of the gate, although the SGT is formed using the same gate formation process as that in the seventh embodiment.

In the above gate structure, depletion of a gate electrode is suppressed by the thin metal film on the side of the gate insulation film. In addition, respective top surfaces of the gate electrode and a gate line are defined by the polysilicon material. Thus, the SGT according to the tenth embodiment can be produced in the same production line as that for a transistor having a conventional polysilicon gate.

Figure 94:
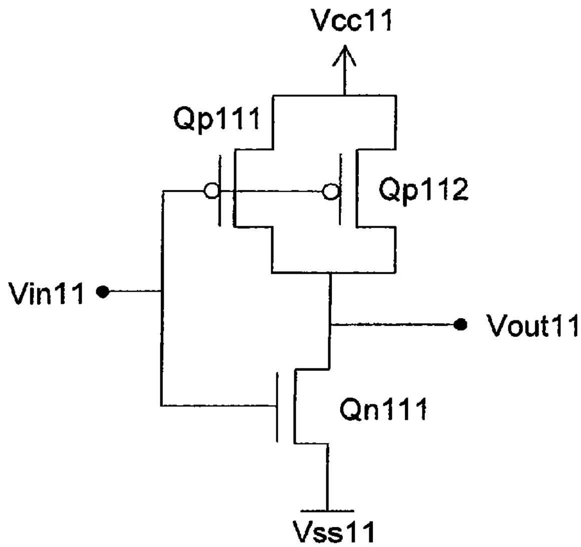
FIG. 94 is an equivalent circuit diagram of a CMOS inverter according to a tenth embodiment of the present invention.

FIG. 94 is an equivalent circuit diagram of a CMOS inverter according to the tenth embodiment. A circuit operation of the CMOS inverter is the same as that in the second embodiment, and its description will be omitted here.

Figure 95:
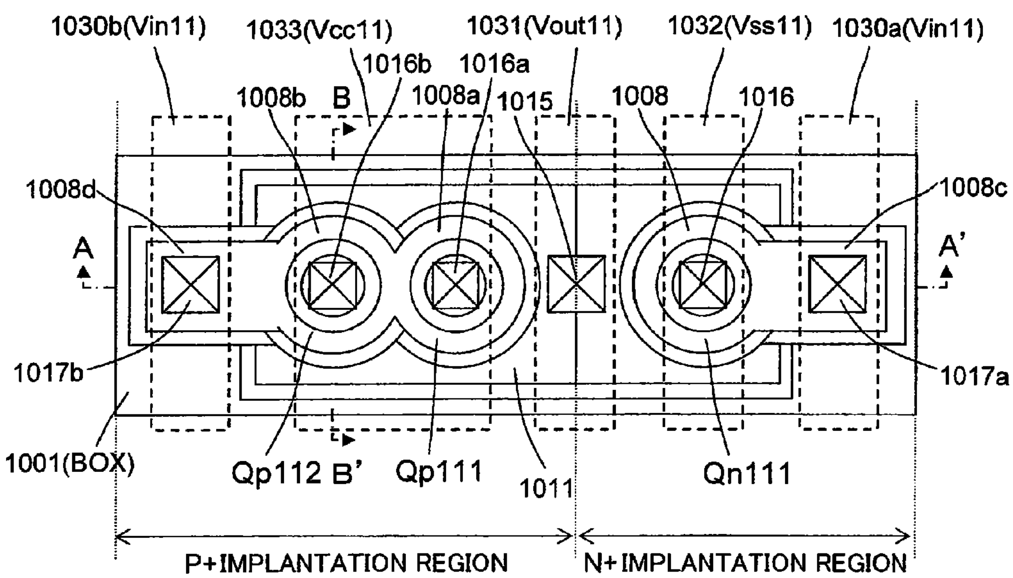
FIG. 95 is a top plan view of the CMOS inverter according to the tenth embodiment.
Figure 96:
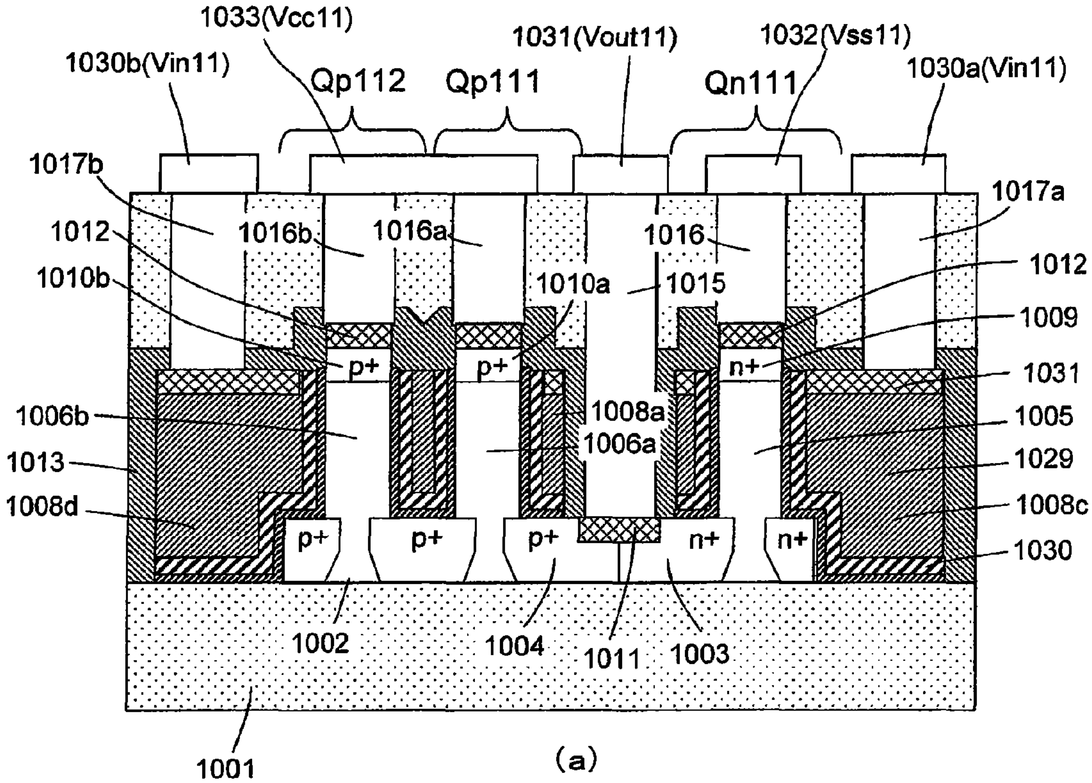
FIGS. 96(*a*) and 96(*b*) are sectional views of the CMOS inverter according to the tenth embodiment.
Figure 96:
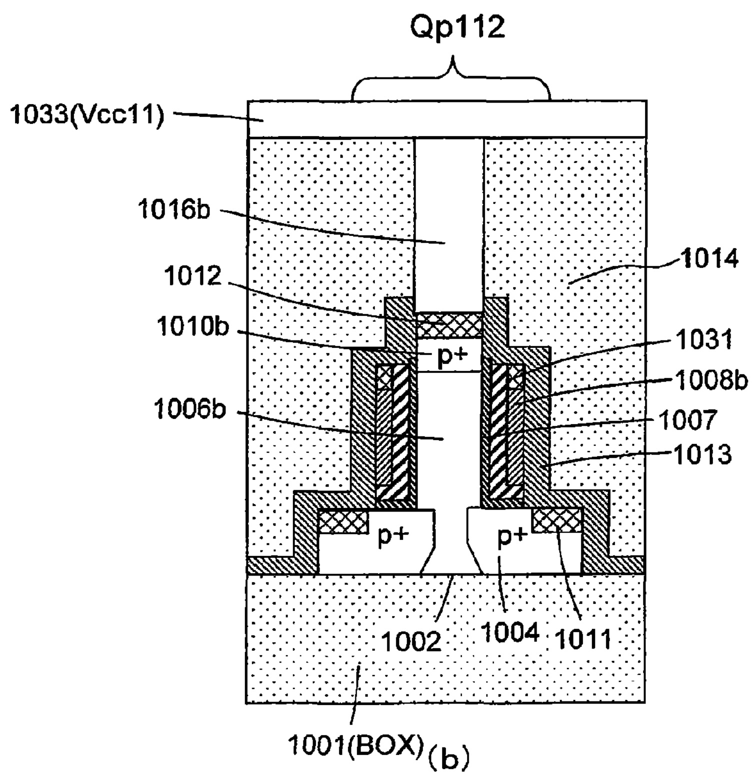

FIG. 95 is a top plan view of the CMOS inverter according to the tenth embodiment. FIGS. 96(*a*) and 96(*b*) are sectional views taken along the cutting-plane line A-A' and the cutting-plane line B-B' in FIG. 95, respectively. The tenth embodiment is characterized in that a top surface of a gate electrode (1008, 1008*a*, 1008*b*) surrounding a pillar-shaped silicon layer, and a top surface of a gate line (1008*c*, 1008*d*) extending from the gate electrode, have the same height, i.e., the gate electrode and the gate line are integrally formed in such a manner that the entire area of a top surface of the integrated combination of the gate electrode and the gate line becomes parallel to a substrate, and the gate has a layered structure comprising a thin metal film and a polysilicon material. With reference to FIGS. 95, 96(*a*) and 96(*b*), a structure of the CMOS inverter according to the tenth embodiment will be described.

A planar silicon layer 1002 is formed on a buried oxide film layer 1001. The planar silicon layer 1002 comprises an $N^+$ drain diffusion layer 1003 and a $P^+$ drain diffusion layer 1004. With a view to reducing a resistance of the drain diffusion layers, a silicide layer 1011 is formed in surfaces of the $N^+$ drain diffusion layer 1003 and the $P^+$ drain diffusion layer 1004, in such a manner that the $N^+$ drain diffusion layer 1003 and the $P^+$ drain diffusion layer 1004 are directly connected to each other through the silicide layer 1011. This eliminates a need for a contact for connecting the $N^+$ drain diffusion layer 1003 and the $P^+$ drain diffusion layer 1004 and element isolation therebetween, so that an inverter occupancy area can be reduced. In addition, element isolation can be achieved simply by isolating the planar silicon layer 1002 as element, so that the element isolation can be achieved while reducing the number of processes and minimizing a processing size. An NMOS transistor Qn 111 is formed based on a pillar-shaped silicon layer 1005 formed on the $N^+$ drain diffusion layer 1003, and each of two PMOS transistors Qp 111, Qp 112, is formed based on a pillar-shaped silicon layer (1006$a$, 1006$b$) formed on the $P^+$ drain diffusion layer 1004. A first dielectric film 1007, such as a high-k film, such as a $HfO_2$ film, is formed to surround the pillar-shaped silicon layer (1005, 1006$a$, 1006$b$), and a gate electrode (1008, 1008$a$, 1008$b$) consisting of a layered structure comprising a thin metal film 1030, such as a TaN film or a TiN film, and a polysilicon material 1029 is formed to surround the gate dielectric film 1007. An $N^+$ source diffusion layer 1009 is formed in an upper portion of the NMOS-forming pillar-shaped silicon layer 1005, and a $P^+$ source diffusion layer (1010$a$, 1010$b$) is formed in an upper portion of the PMOS-forming pillar-shaped silicon layer (1006$a$, 1006$b$), wherein a silicide film 1012 is formed in an upper portion of the source diffusion layer (1009, 1010$a$, 1010$b$). A silicon nitride film 1013 is formed to cover the above elements so as to serve as a contact stopper. Further, an interlayer silicon oxide film 1014 is formed on the silicon nitride film 1013, and a contact (1015, 1016, 1016$a$, 1016$b$, 1017$a$, 1017$b$) is formed to penetrate through the silicon oxide film 1014 having a flattened surface.

The contact 1015 formed on a boundary between the $N^+$ drain diffusion layer 1003 and the $P^+$ drain diffusion layer 1004 is connected to an output terminal Vout 11 via a line layer 1031, and the contact 1016 formed on the NMOS (Qn 111)-forming pillar-shaped silicon layer 1005 is connected to a ground potential Vss 11 via a line layer 1032. Further, the contact (1016$a$, 1016$b$) formed on the PMOS (Qp 111, Qp 112)-forming pillar-shaped silicon layer (1006$a$, 1006$b$) is connected to a power supply potential Vcc 11 via a line layer 1033, and each of the contact 1017$a$ formed on a gate line 1008$c$ extending from the gate electrode surrounding the NMOS-forming pillar-shaped silicon layer 1005, and the contact 1017$b$ formed on a gate line 1008$d$ extending from the gate electrode surrounding the PMOS-forming pillar-shaped silicon layer (1006$a$, 1006$b$), is connected to an input terminal Vin 11 via a line layer (1030$a$, 1030$b$). In this manner, the inverter is formed.

Figure 97:
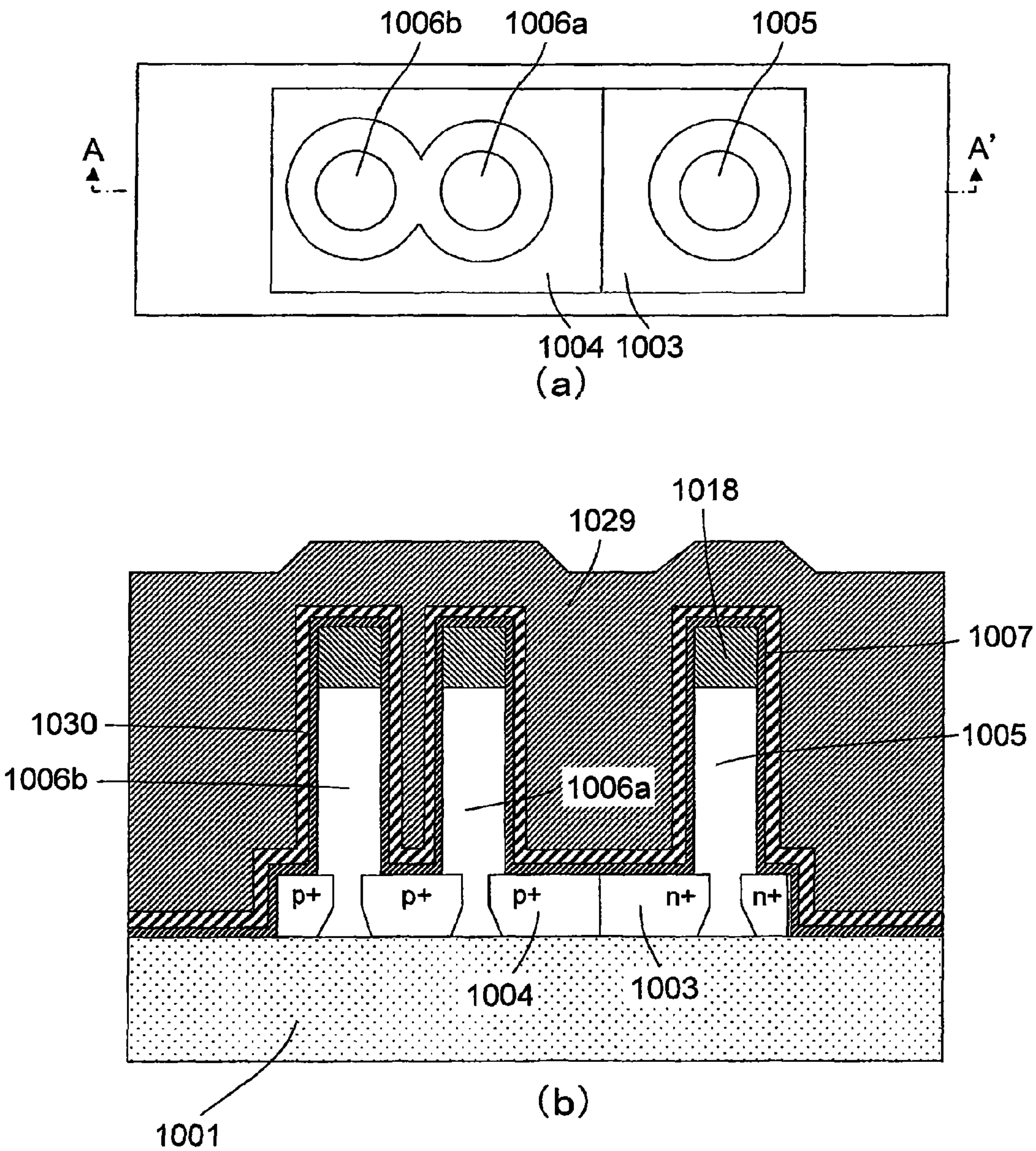
FIGS. 97(*a*) and 97(*b*) illustrate a part of production processes in the tenth embodiment.

With reference to FIGS. 97($a$) to 110($b$), a method of forming the CMOS converter according the tenth embodiment, as one example of a semiconductor device production method of the present invention will be described below. In FIGS. 97($a$) to 110($b$), the figure suffixed with (a) is a top plan view, and the figure suffixed with (b) is a sectional view taken along the line A-A'.

Any production process before a process of forming a gate conductive film, in the tenth embodiment, is the same as that in the second embodiment. Thus, the following description will start from the process of forming a gate conductive film.

A shown in FIGS. 97($a$) and 97($b$), after a first dielectric film 1007, such as a high-k film, such as a $HfO_2$ film, serving as a gate dielectric film, is formed to a thickness of about 1 to 5 nm by CVD or ALD. Subsequently, a thin metal film 1030, such as a TiN film or a TaN film, serving as a gate conductive film, is formed to a thickness of about 1 to 10 nm, and then a polysilicon material 1029 is formed to allow the pillar-shaped silicon layer to be buried therein.

Figure 98:
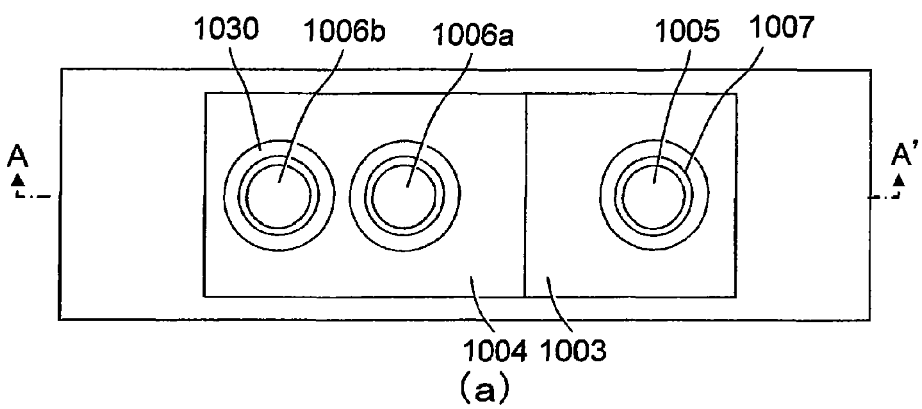
FIGS. 98(*a*) and 98(*b*) illustrate a part of production processes in the tenth embodiment.
Figure 98:
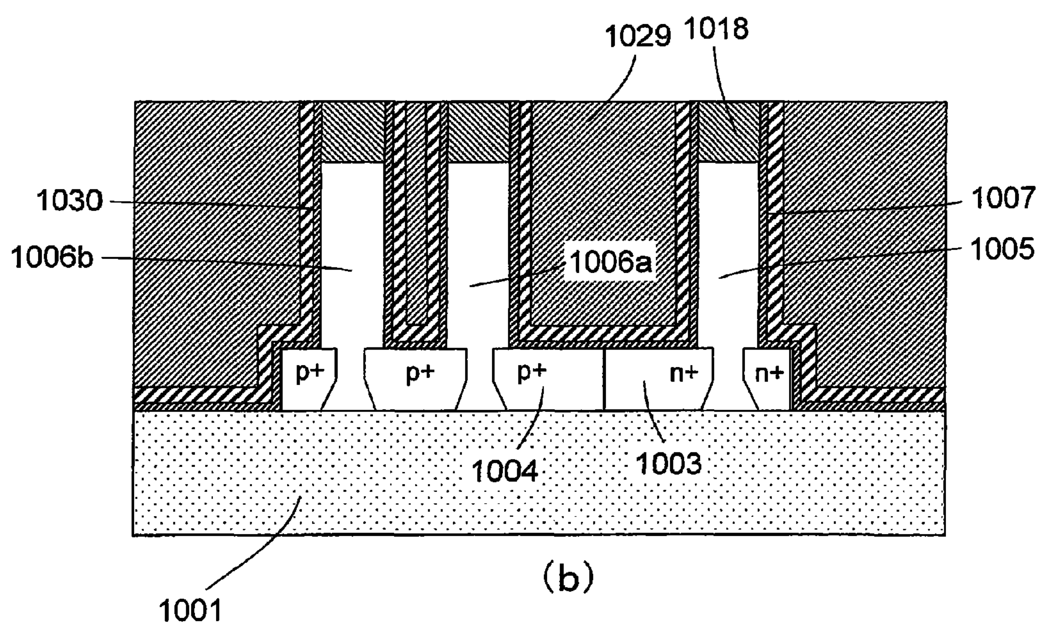

Then, as shown in FIGS. 98($a$) and 98($b$), the polysilicon material 1029 and the thin metal film 1030 are flattened by CMP. The flattening of a top surface of the gate by CMP makes it possible to achieve an adequate gate configuration and suppress a variation in gate length. Further, the CMP is stopped by a silicon nitride film 1018 on a top of the pillar-shaped silicon layer. The use of the silicon nitride film 1018 as a CMP stopper makes it possible to control an amount of CMP with high repeatability. In place of the silicon nitride film, the film to be used as a CMP stopper may be any other suitable film capable of functioning as the CMP stopper film.

Figure 99:
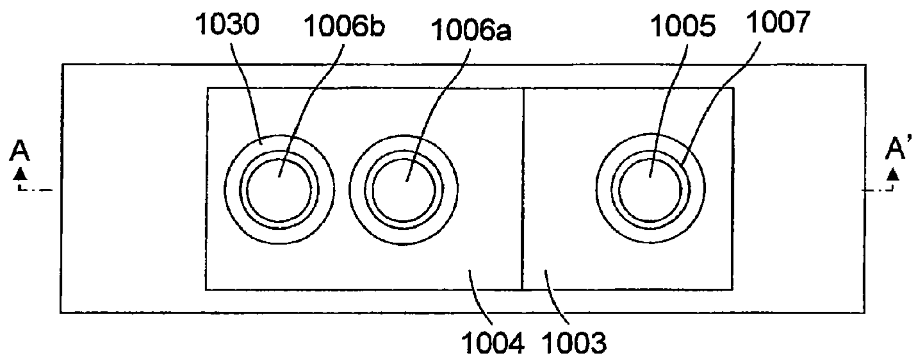
FIGS. 99(*a*) and 99(*b*) illustrate a part of production processes in the tenth embodiment.
Figure 99:
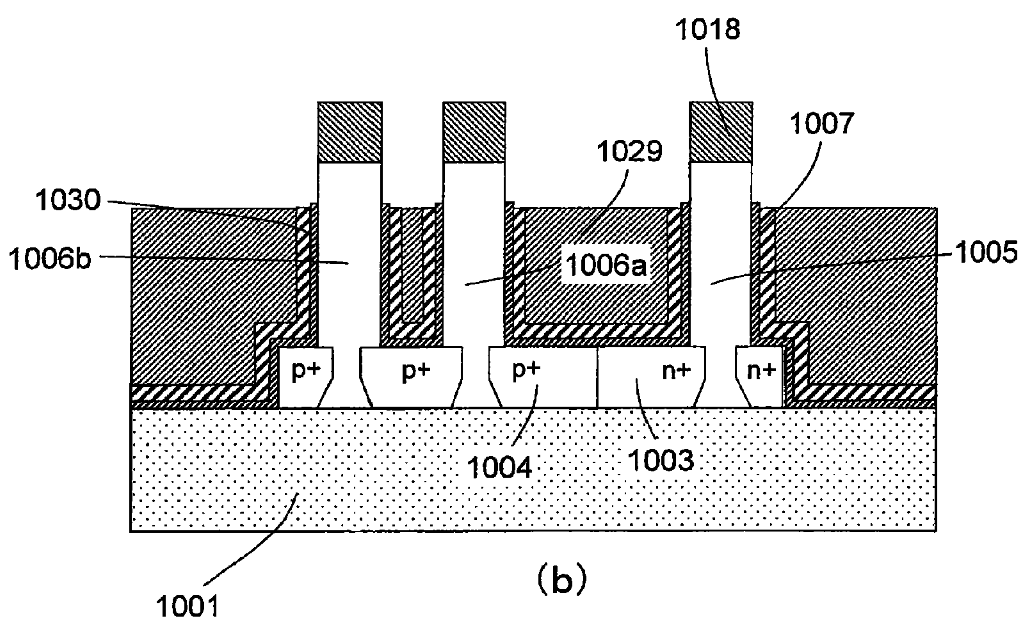

Then, as shown in FIGS. 99($a$) and 99($b$), the polysilicon material 1029 and the thin metal film 1030 are etched back. Through this process, a gate length is fixed.

Figure 100:
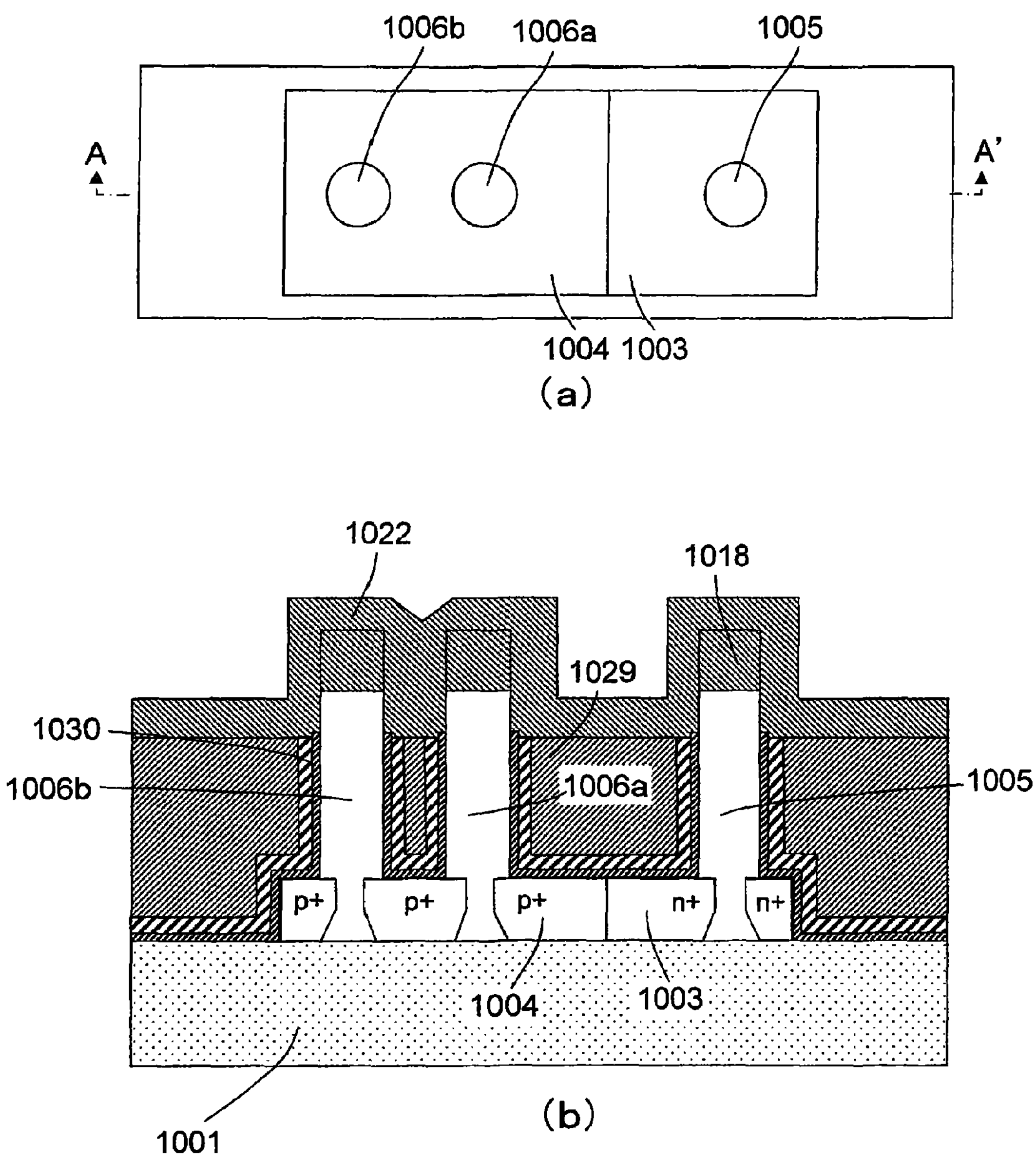
FIGS. 100(*a*) and 100(*b*) illustrate a part of production processes in the tenth embodiment.

Then, as shown in FIGS. 100($a$) and 100($b$), a silicon nitride film 1022 is formed.

Figure 101:
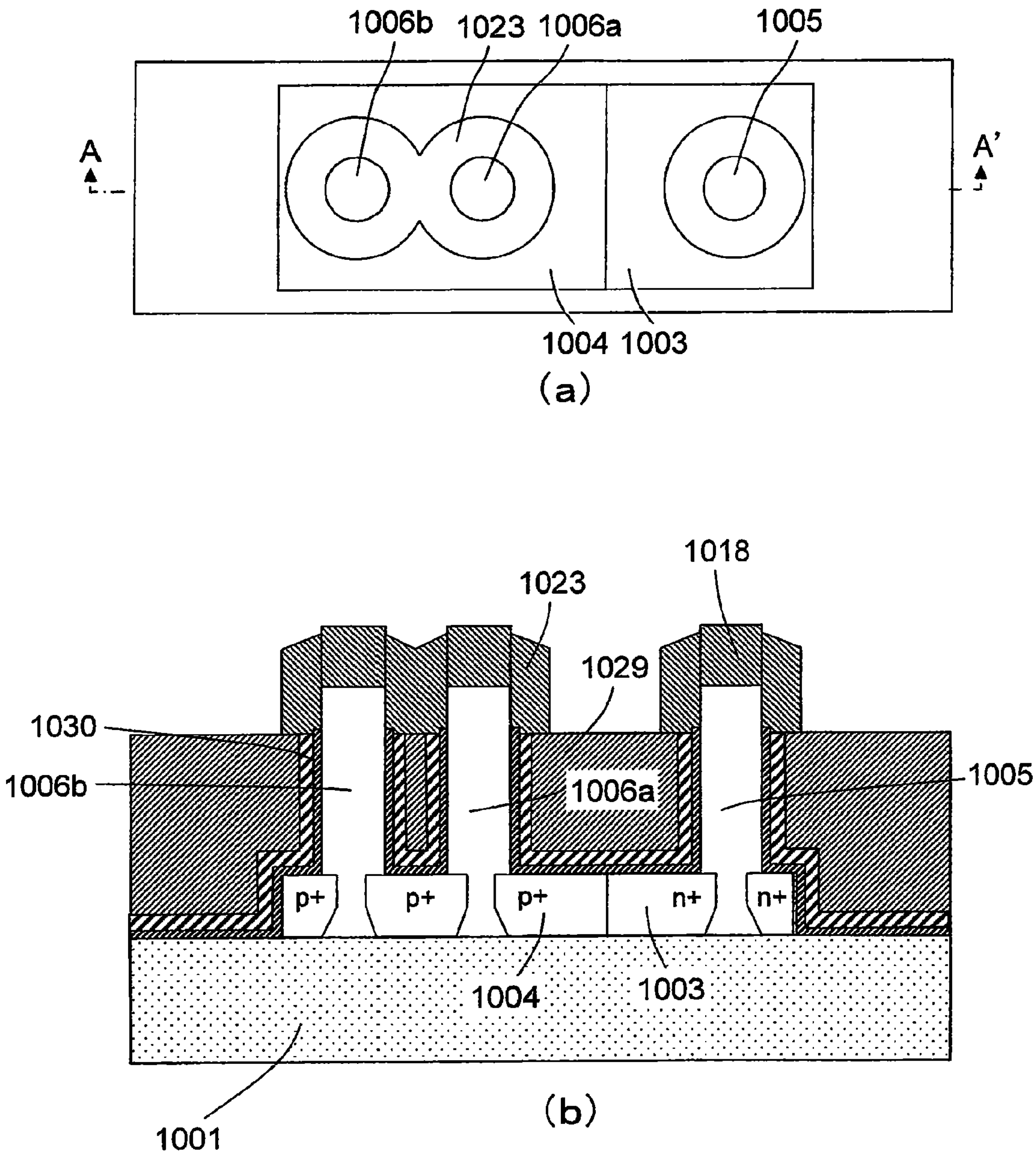
FIGS. 101(*a*) and 101(*b*) illustrate a part of production processes in the tenth embodiment.

Then, as shown in FIGS. 101($a$) and 101($b$), the silicon nitride film 1022 is etched back to form a silicon nitride film-based sidewall 1023 on a top of the metal gate. This silicon nitride film-based sidewall allows a gate electrode to be formed around the pillar-shaped silicon layer by a film thickness corresponding to that of the silicon nitride film-based sidewall remaining on the gate, in a self-alignment manner. Thus, a film thickness and an amount of etche back of the silicon nitride film 1023 may be set to allow the gate electrode to have a desired film thickness. In the tenth embodiment, the silicon nitride film is used as a sidewall protective film. Alternatively, any other suitable film capable of functioning as the sidewall protective film, such as a silicon oxide film, may be also used.

Figure 102:
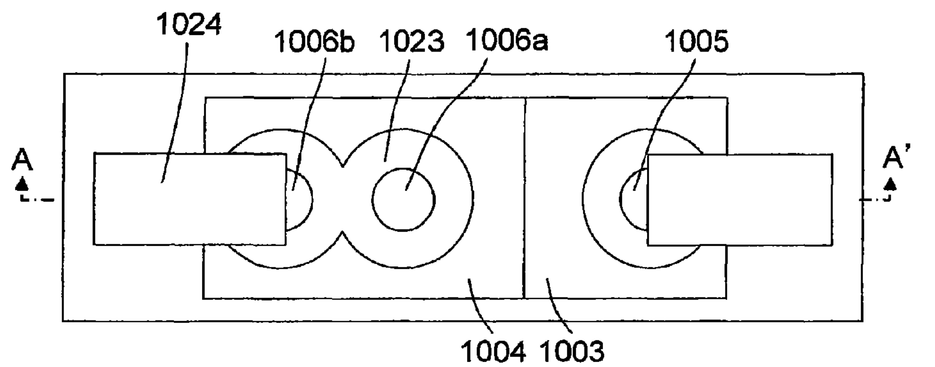
FIGS. 102(*a*) and 102(*b*) illustrate a part of production processes in the tenth embodiment.
Figure 102:
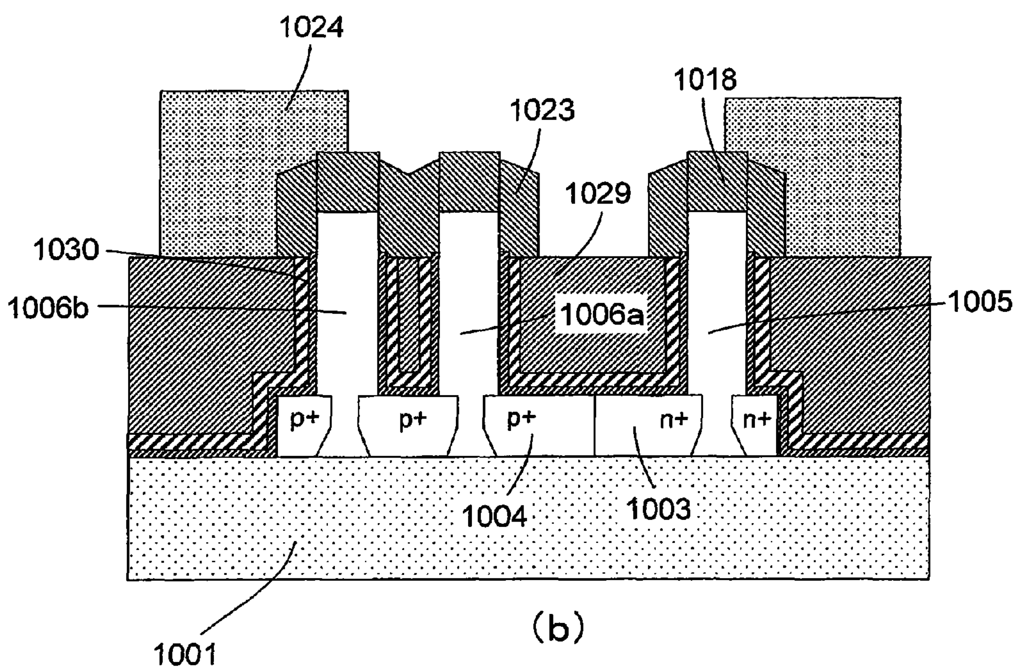

Then, as shown in FIGS. 102($a$) and 102($b$), a resist or a multilayer resist is applied, and a gate line pattern is formed by lithography, using the resist 1024.

Figure 103:
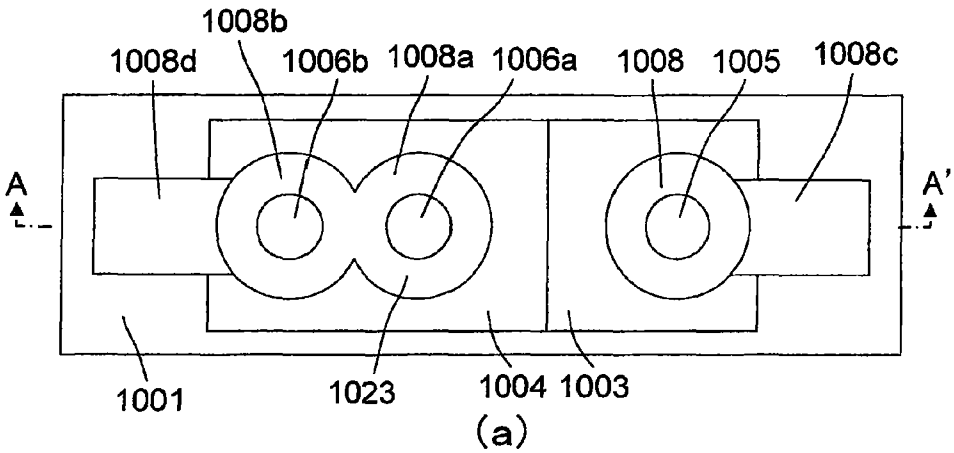
FIGS. 103(*a*) and 103(*b*) illustrate a part of production processes in the tenth embodiment.
Figure 103:
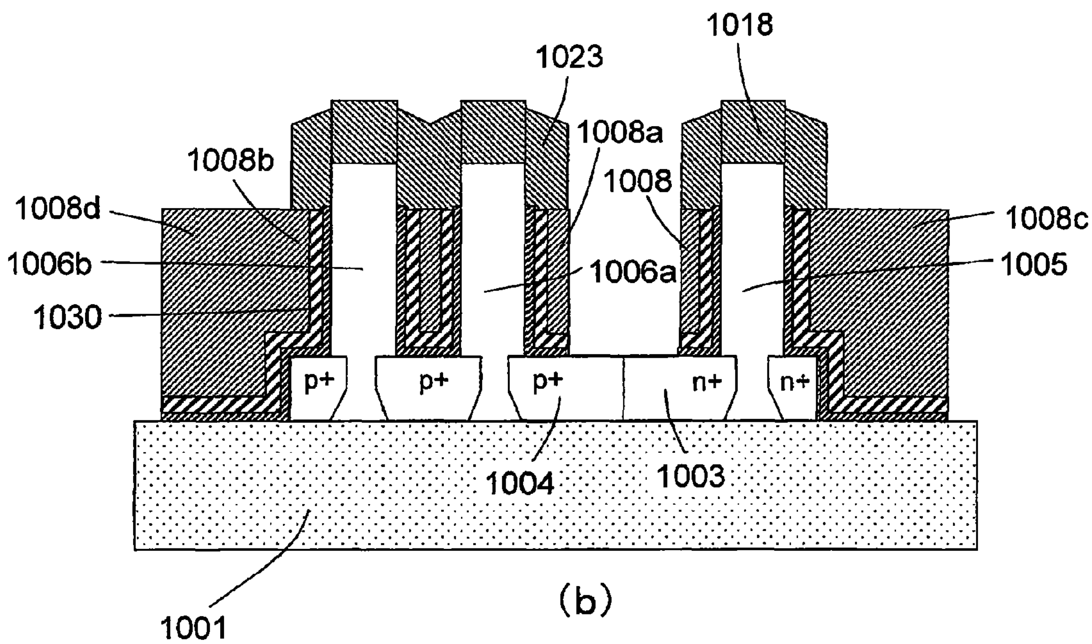

Then, as shown in FIGS. 103($a$) and 103($b$), a bottom portion of the gate and a portion of the first dielectric film, such as a high-k film, beneath the gate are partially etched by reactive ion etching, using a resist mask. Through this process, a gate electrode (1008, 1008$a$, 1008$b$) and a gate line (1008$c$, 1008$d$) are formed.

Figure 104:
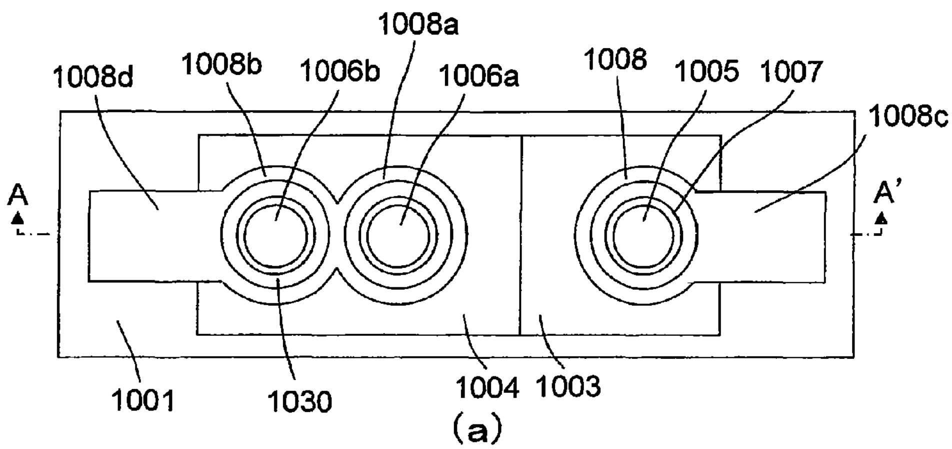
FIGS. 104(*a*) and 104(*b*) illustrate a part of production processes in the tenth embodiment.
Figure 104:
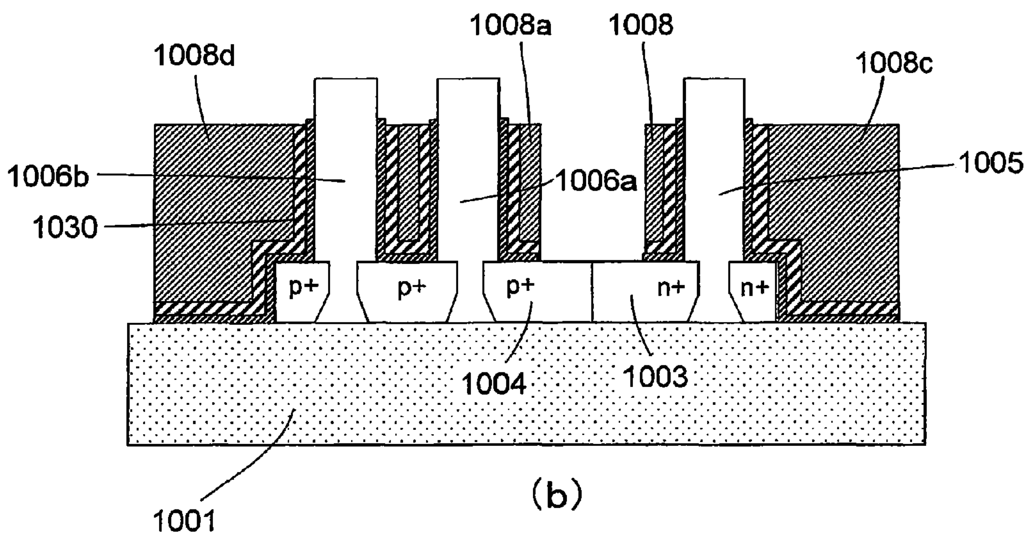

Then, as shown in FIGS. 104($a$) and 104($b$), the silicon nitride film 1018 on the top of the pillar-shaped silicon layer, and the silicon nitride film-based sidewall 1023, are removed by wet etching.

Figure 105:
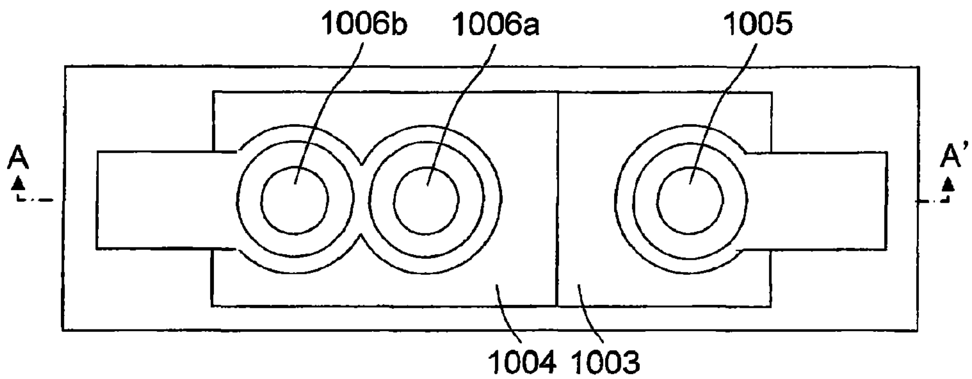
FIGS. 105(*a*) and 105(*b*) illustrate a part of production processes in the tenth embodiment.
Figure 105:
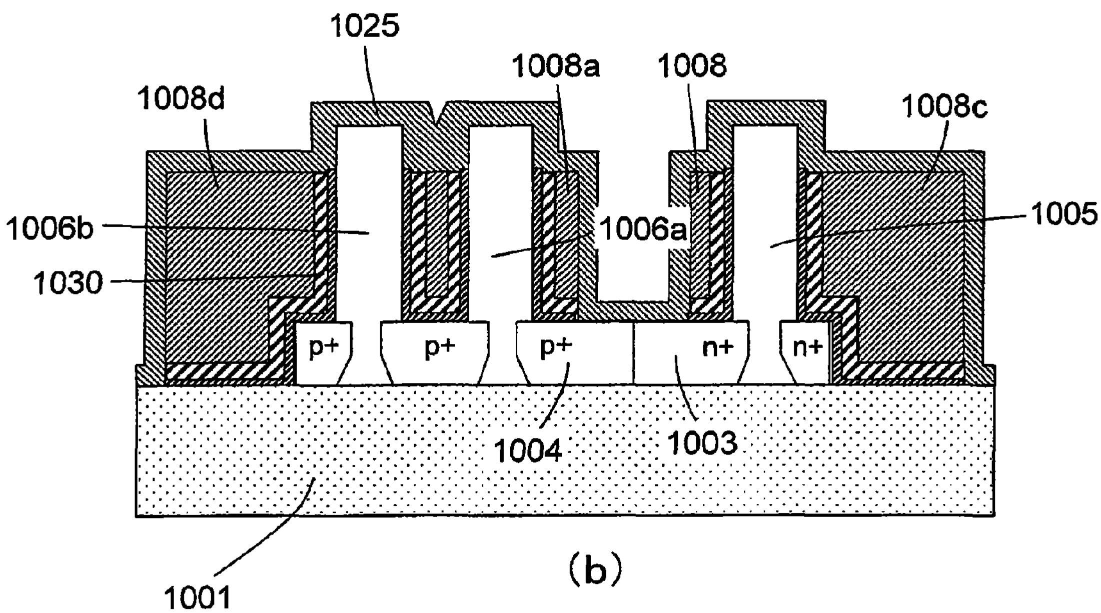

Then, as shown in FIGS. 105($a$) and 105($b$), a silicon nitride film 1025 is formed to a film thickness of about 10 to 50 nm on the surface.

Figure 106:
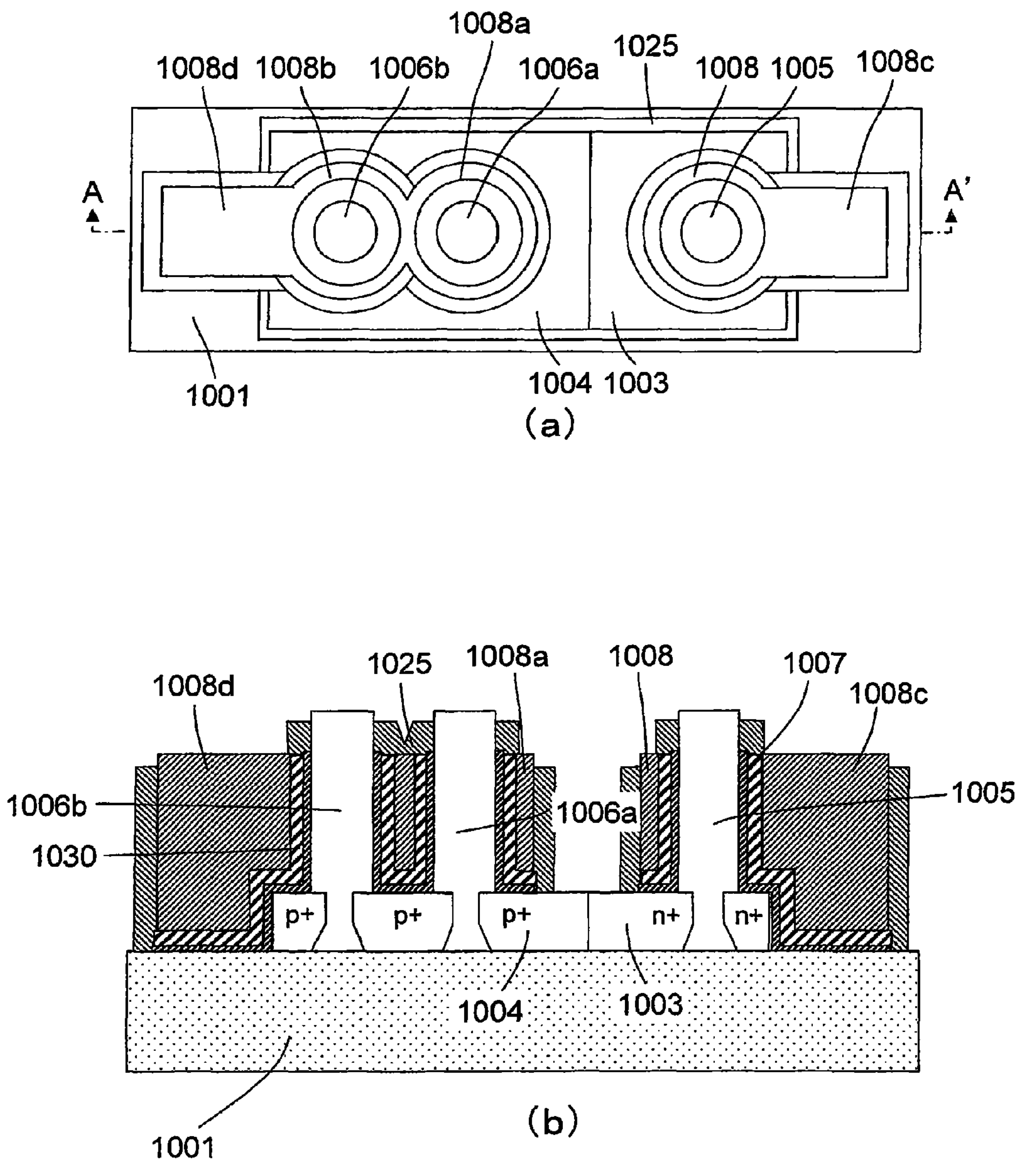
FIGS. 106(*a*) and 106(*b*) illustrate a part of production processes in the tenth embodiment.

Then, as shown in FIGS. 106($a$) and 106($b$), the silicon nitride film 1025 is etched back to form a structure where a sidewall of an upper portion of the pillar-shaped silicon layer and a sidewall of the gate are covered by the silicon nitride film 1025 while exposing a top surface of the pillar-shaped silicon layer, and a top surface of the planar silicon layer. This structure provides the following advantages.

Firstly, the silicon nitride film 1025 is disposed to isolate between the gate electrode (1008, 1008$a$, 1008$b$) and the upper portion of the pillar-shaped silicon layer and between the gate electrode (1008, 1008$a$, 1008$b$) and the drain diffusion layer (1003, 1004). This makes it possible to prevent short-circuiting between the gate electrode and the upper portion of the pillar-shaped silicon layer, and short-circuiting between the gate electrode and the drain diffusion layer, which would otherwise be caused by excessive formation of silicide. Secondly, the silicon nitride film is disposed to cover the sidewall of the upper portion of the pillar-shaped silicon layer. This makes it possible to prevent the pillar-shaped silicon layer from being excessively silicided through the sidewall of the pillar-shaped silicon layer, during a silicidation process in FIGS. 108(*a*) and 108(*b*). If a silicide layer is excessively formed in the upper portion of the pillar-shaped silicon layer to get closer to a junction of the source diffusion layer, it causes an increase in junction leak. Thus, it is necessary to control the silicide layer to keep from being excessively formed. Thirdly, the silicon nitride film 1025 is disposed to cover the first dielectric film 1007, such as a high-k film. This makes it possible to prevent the first dielectric film, such as a high-k film, from being damaged during ion implantation in a next process and during wet treatment and ion implantation in subsequent processes. Fourthly, the silicon nitride film 1025 is disposed to cover the thin metal film 1030 as a part of the gate electrode so as to keep the thin metal film from being exposed to the top surface of the gate. This makes it possible to produce the CMOS inverter in the same production line for a transistor having a conventional polysilicon gate.

If a silicon oxide film is used in place of the silicon nitride film, it will be undesirably wet-etched by hydrofluoric acid used in a cleaning/releasing process and a silicidation pretreatment. Thus, it is preferable to use a film insoluble in hydrofluoric acid, such as the silicon nitride film. Further, an excessively small film thickness of the silicon nitride film makes it impossible to fully protect the high-k film, and an excessively large film thickness of the silicon nitride film causes an increase in occupancy area by just the film thickness of the high-k film formed on the sidewall of the gate. In the tenth embodiment, the silicon nitride film is used as a protective film. Alternatively, any other suitable film capable of functioning as the protective film, such as a film having a layered structure comprising a silicon nitride film and a silicon oxide film, may also be used.

Figure 107:
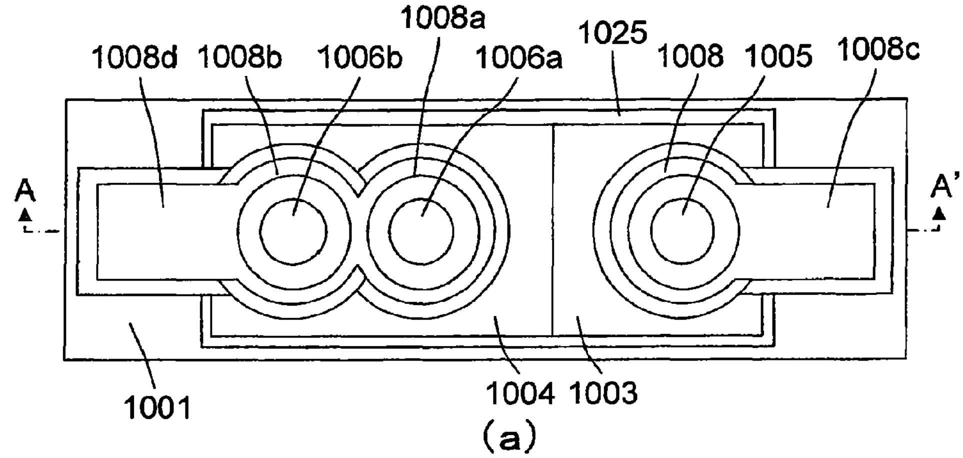
FIGS. 107(*a*) and 107(*b*) illustrate a part of production processes in the tenth embodiment.
Figure 107:
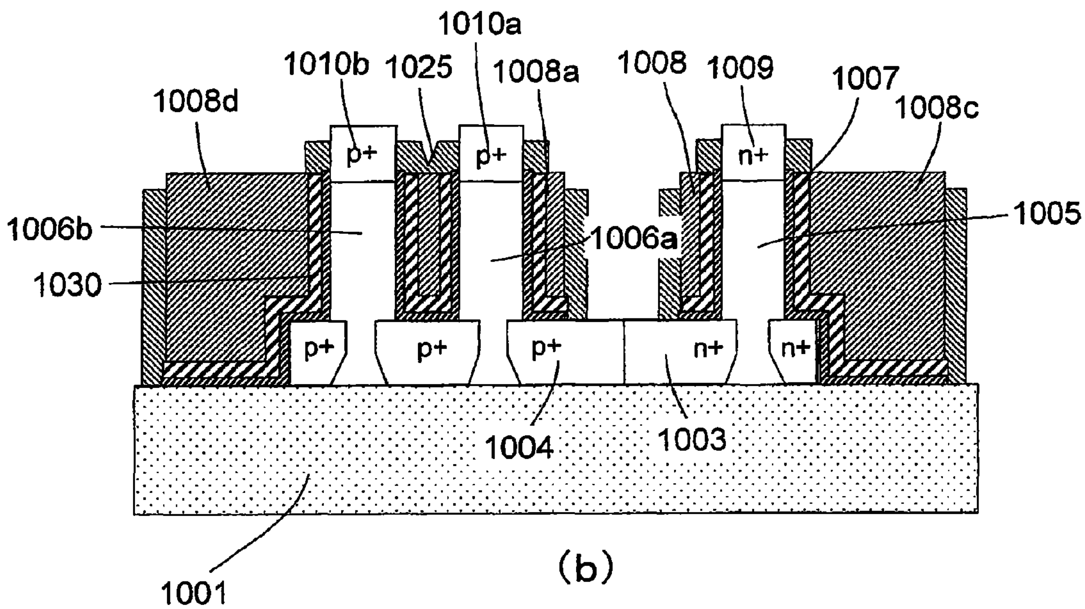

Then, as shown in FIGS. 107(*a*) and 107(*b*), an $N^+$ source diffusion layer 1009 is formed in an upper portion of the pillar-shaped silicon layer 1005 by ion implantation or other injection technique. In the same manner, a $P^+$ source diffusion layer (1010*a*, 1010*b*) is formed in an upper portion of the pillar-shaped silicon layer (1006*a*, 1006*b*).

Figure 108:
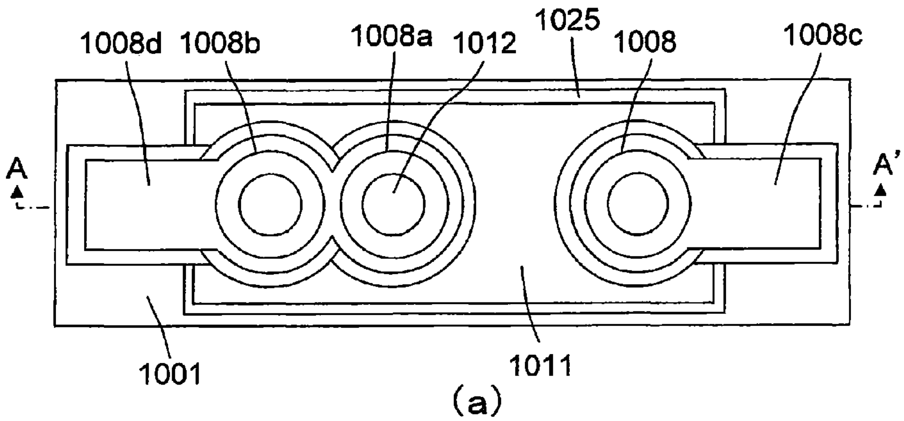
FIGS. 108(*a*) and 108(*b*) illustrate a part of production processes in the tenth embodiment.
Figure 108:
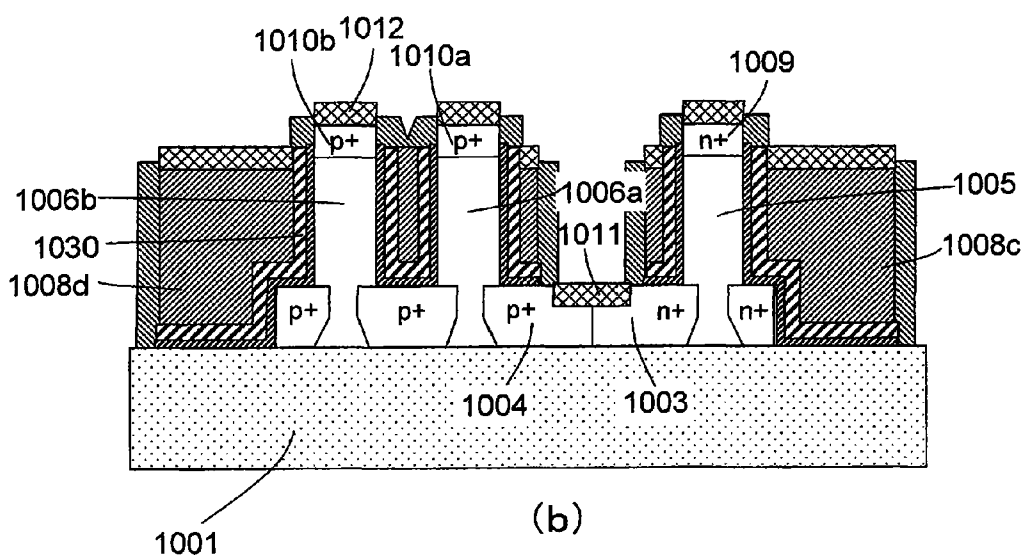

Then, as shown in FIGS. 108(*a*) and 108(*b*), a metal, such as Ni or Co, is sputtered onto each of the surfaces of the source and drain diffusion layers to form a metal film therein, and the metal film is silicided through a heat treatment, whereafter an unreacted portion of the metal film is removed to form a silicide layer 1011 on the drain diffusion layer (1003, 1004), a silicide layer 1012 on the source diffusion layer (1009, 1010*a*, 1010*b*) and a silicide layer 1041 on the gate electrode.

Figure 109:
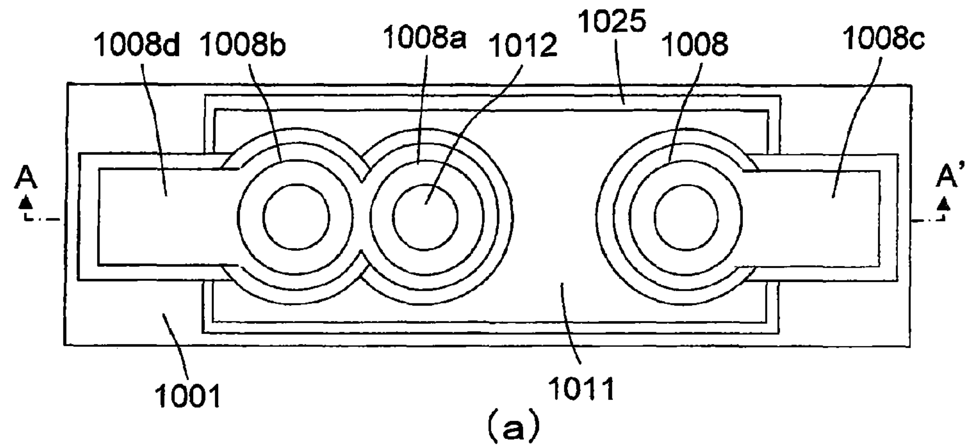
FIGS. 109(*a*) and 109(*b*) illustrate a part of production processes in the tenth embodiment.
Figure 109:
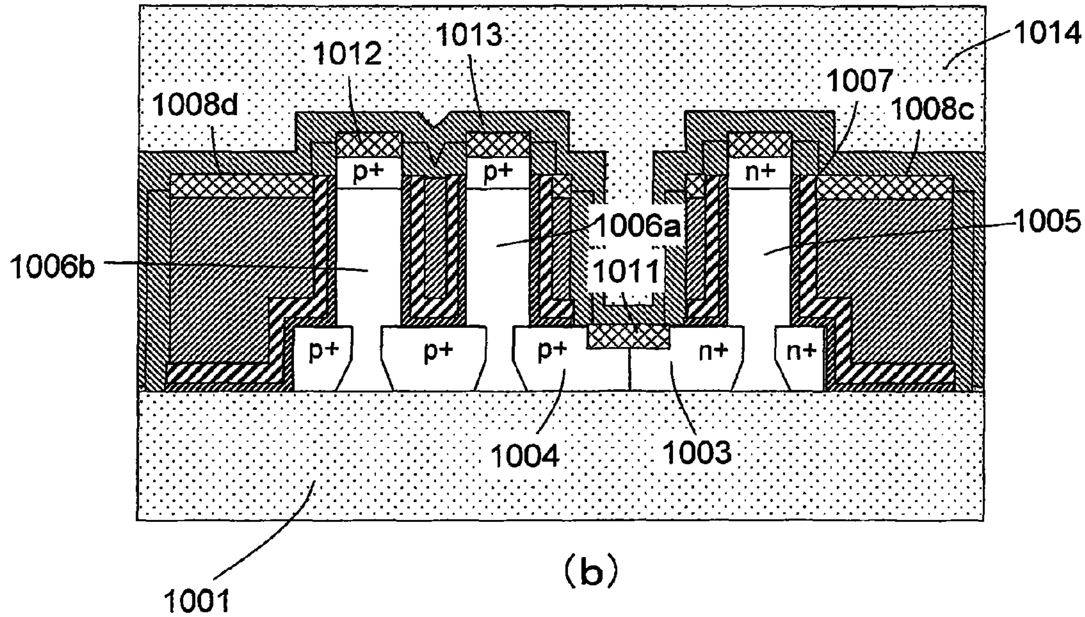

Then, as shown in FIGS. 109(*a*) and 109(*b*), after a silicon nitride liner film 1013 is formed, a silicon oxide film 1014 is formed, and flattened by CMP. The silicon nitride liner film is used as an etching stopper during contact formation.

Figure 110:
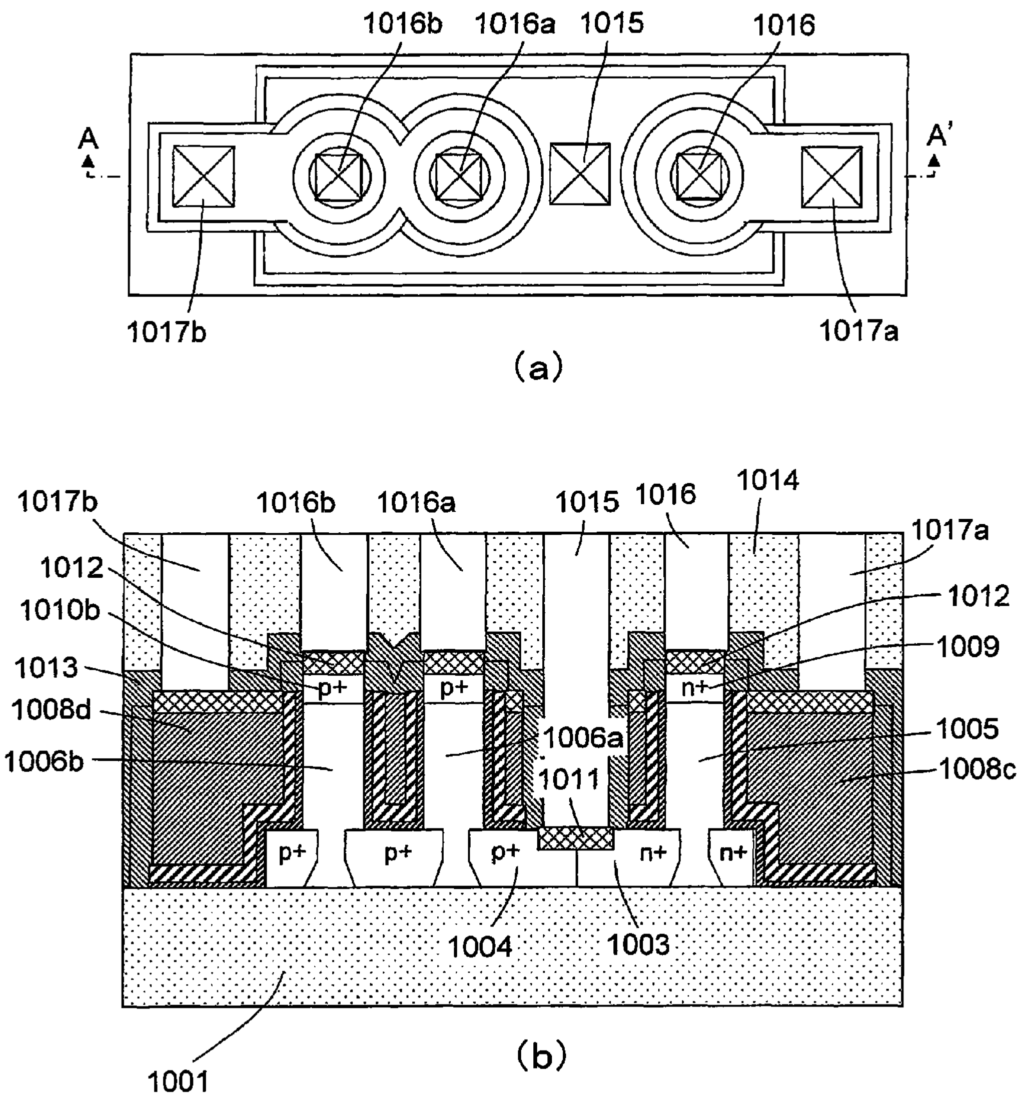
FIGS. 110(*a*) and 110(*b*) illustrate a part of production processes in the tenth embodiment.

Then, as shown in FIGS. 110(*a*) and 110(*b*), a contact (1015, 1016, 1016*a*, 1016*b*, 1017*a*, 1017*b*) is formed on each of the drain diffusion layers on the planar silicon layer, the gates, and the source diffusion layer on the respective pillar-shaped silicon layers.

As above, in the tenth embodiment, the gate structure comprises the thin metal film on the side of the gate dielectric film, and the polysilicon material on the side of the top surface of the gate, wherein the thin metal film on the side of the gate dielectric film functions to suppress depletion of the gate electrode, and the polysilicon material defines the top surfaces of the gate electrode and the gate line. This makes it possible to produce the SGT in the same production line as that for a transistor having a conventional polysilicon gate.

Eleventh Embodiment

An eleventh embodiment of the present invention shows one example of an SGT which comprises a gate electrode formed in a layered structure comprising a thin metal film and a polysilicon material, as in the tenth embodiment, and has a capability to reduce a parasitic capacitance between a gate line and a drain diffusion layer underneath a pillar-shaped silicon layer.

Figure 111:
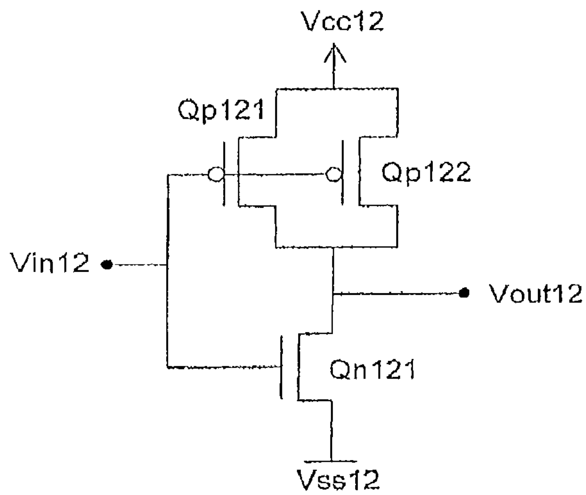
FIG. 111 is an equivalent circuit diagram of a CMOS inverter according to an eleventh embodiment of the present invention.

FIG. 111 is an equivalent circuit diagram of a CMOS inverter according to the eleventh embodiment. A circuit operation of the CMOS inverter is the same as that in the second embodiment, and its description will be omitted here.

Figure 112:
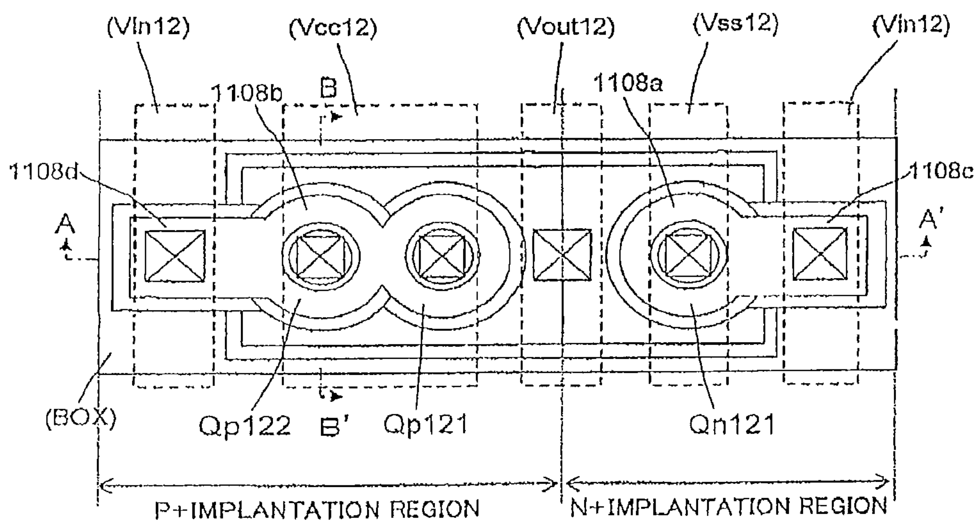
FIG. 112 is a top plan view of the CMOS inverter according to the eleventh embodiment.
Figure 113:
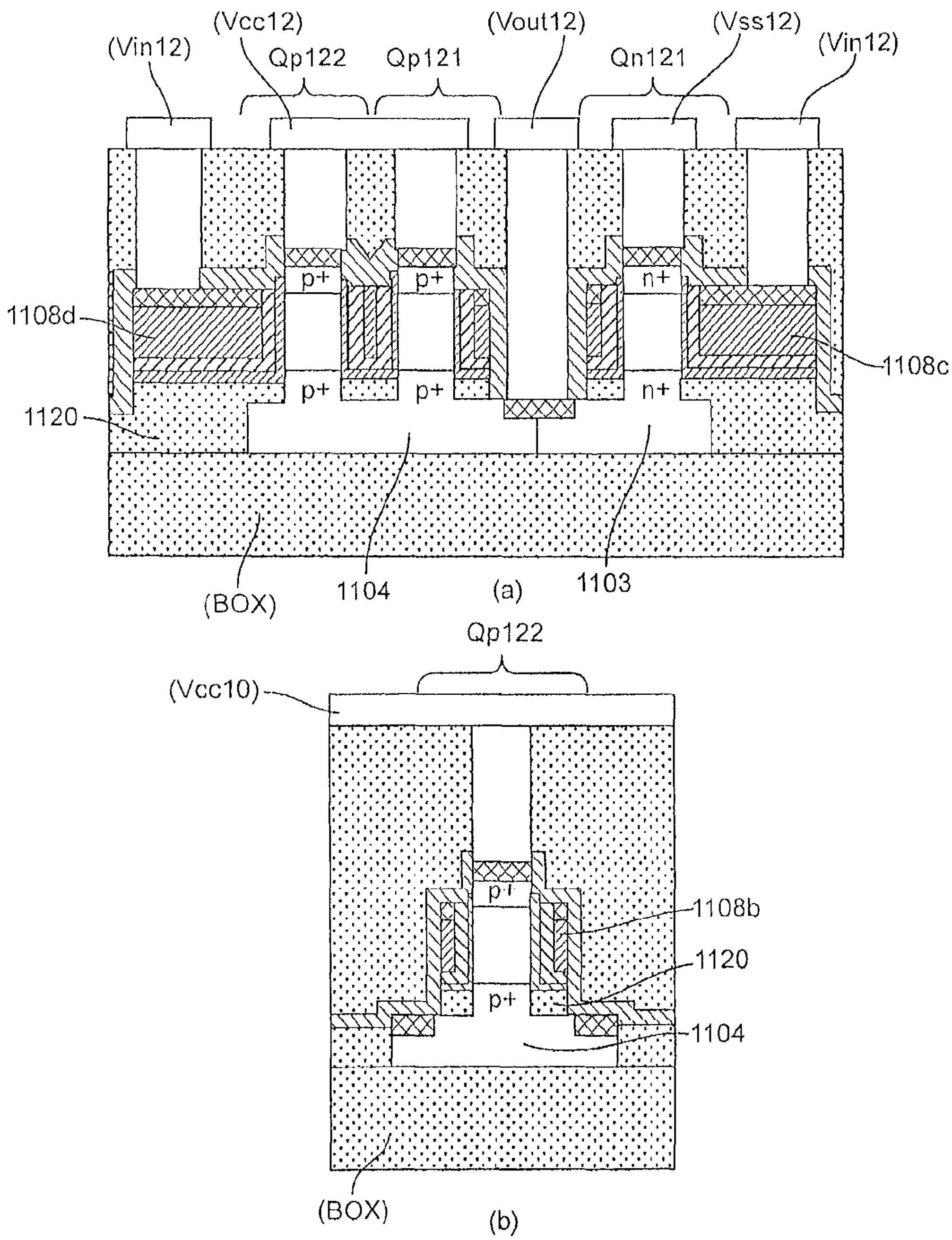
FIGS. 113(*a*) and 113(*b*) are sectional views of the CMOS inverter according to the eleventh embodiment.

FIG. 112 is a top plan view of the CMOS inverter according to the eleventh embodiment. FIGS. 113(*a*) and 113(*b*) are sectional views taken along the cutting-plane line A-A' and the cutting-plane line B-B' in FIG. 112, respectively. The eleventh embodiment is characterized in that a top surface of a gate electrode (1108, 1108*a*, 1108*b*) surrounding a pillar-shaped silicon layer, and a top surface of a gate line (1108*c*, 1108*d*) extending from the gate electrode, have the same height, i.e., the gate electrode and the gate line are integrally formed in such a manner that the entire area of a top surface of the integrated combination of the gate electrode and the gate line becomes parallel to a substrate. The eleventh embodiment is also characterized in that the gate has a layered structure comprising a thin metal film and a polysilicon material, and a third dielectric film 1120, such as a silicon oxide film, exists between a drain diffusion layer (1103, 1104) and each of a gate electrode (1108, 1108*a*, 1108*b*) and a gate line (1108*c*, 1108*d*).

The CMOS inverter according to the eleventh embodiment can be formed using the following production method.

As described in the production method (FIGS. 73(*a*) to 77(*b*)) in the eighth embodiment, after forming a pillar-shaped silicon layer, a third dielectric film, such as a silicon oxide film, is first formed to allow the pillar-shaped silicon layer to be buried therein, and then is flattened by CMP, whereafter the third dielectric film, such as a silicon oxide film, is etched back to leave a part of the third dielectric film, such as a silicon oxide film, on a drain diffusion layer by a desired film thickness, so as to form an inverter structure for reducing a parasitic capacitance between a gate electrode and a drain diffusion layer.

Subsequently, in the same manner as that described in the production method (FIGS. 97(*a*) to 110(*b*)) in the tenth embodiment, a gate conductive film comprising a thin metal film and a polysilicon material is formed to allow the formed pillar-shaped silicon layer to be buried therein, and then flattened by CMP, whereafter the gate conductive film is etched back, and then a silicon nitride film for fixing a thickness of a gate electrode is formed and etched back to form a silicon nitride film-based sidewall for forming the gate electrode in a self-alignment manner. Subsequently, lithographic gate line patterning and etching are performed to obtain a gate electrode structure where a gate electrode and a gate line extending from the gate electrode are integrally formed in such a manner that the entire area of a top surface of the integrated combination of the gate electrode and the gate line becomes parallel to a substrate. Subsequently, a silicon nitride film is formed to protect a sidewall of the pillar-shaped silicon layer, and then a diffusion layer is formed in an upper portion of the pillar-shaped silicon layer, whereafter a silicide layer is formed on a top surface of a planar silicon layer and in the upper portion of the pillar-shaped silicon layer, and then a contact is formed thereon.

In the eleventh embodiment, the gate structure comprises a thin metal film 1140 on the side of the gate dielectric film, and a polysilicon material 1129 on the side of the top surface of the gate, wherein the thin metal film on the side of the gate dielectric film functions to suppress depletion of the gate electrode, and the polysilicon material defines the top surfaces of the gate electrode and the gate line. This makes it possible to produce the SGT in the same production line as that for a transistor having a conventional polysilicon gate. Further, the additional dielectric film is inserted between the gate dielectric film and the drain diffusion layer, which provides an advantages of increasing a thickness of a dielectric film between the drain diffusion layer and each of the gate electrode and the gate line to reduce a parasitic capacitance between the gate and the drain diffusion layer. Particularly, in case where an additional dielectric film having a relatively low dielectric constant, such as a silicon oxide film, is inserted between the gate dielectric film and the drain diffusion layer, the parasitic capacitance can be largely reduced.

Twelfth Embodiment

In an SGT, considering a need for improving channel controllability of a gate to sufficiently suppress short-channel effects, it is necessary to allow a pillar-shaped semiconductor layer to be formed in a sufficiently small size relative to a gate length. A pillar-shaped semiconductor layer can be relatively easily formed in such a small size by use of a technique of shrinking a size of a pillar-shaped semiconductor layer during dry etching, or a technique of forming a pillar-shaped semiconductor layer and then subjecting it to sacrificial oxidation. Thus, it is not so difficult to form a pillar-shaped semiconductor layer having a size less than a minimum processing size. Therefore, in an actual SGT, it is often the case that a pillar-shaped semiconductor layer is formed in a size less than the minimum processing size.

In the above pillar-shaped semiconductor layer having a small diameter, particularly, a pillar-shaped semiconductor layer having a diameter of 50 nm or less, an area of an interface between a silicide layer and a diffusion layer formed in an upper portion of the pillar-shaped semiconductor layer, and a silicide layer formed on the diffusion layer, is reduced to cause an increase in interface resistance. Particularly, a small interface area between the silicide layer and the diffusion layer formed in the upper portion of the pillar-shaped semiconductor layer becomes a major factor of a source-drain parasitic resistance causing deterioration in transistor characteristics.

Moreover, in cases where a pillar-shaped semiconductor layer is formed in a size less than that of a contact formed in the minimum processing size, a contact resistance is increased, because a contact area between the contact formed on the pillar-shaped semiconductor layer and a top surface of the pillar-shaped semiconductor layer is determined by an area of the top surface of the pillar-shaped semiconductor layer which is less than an area of an bottom surface of the contact.

Furthermore, in a process of forming an SGT, it is desirable to simultaneously form contacts on respective diffusion layers in an upper portion of and beneath a pillar-shaped semiconductor layer, in view of a reduction in the number of production processes. In this case, as compared with a region for the contact to be formed beneath the pillar-shaped semiconductor layer, a region for the contact to be formed on a top of the pillar-shaped semiconductor layer will be subjected to extra overetch by a height of the pillar-shaped semiconductor layer or more. Thus, during contact etching, the region for the contact to be formed on the top of the pillar-shaped semiconductor layer is subjected to excessive overetch, resulting in a structure which is likely to cause short-circuiting between a gate and the contact.

The twelfth embodiment provides a structure and a production method of an SGT capable of solving the above problem with the SGT structure where a pillar-shaped semiconductor layer has a small diameter, particularly, of 50 nm or less, or a pillar-shaped semiconductor layer has a diameter less than a minimum processing size.

Figure 114:
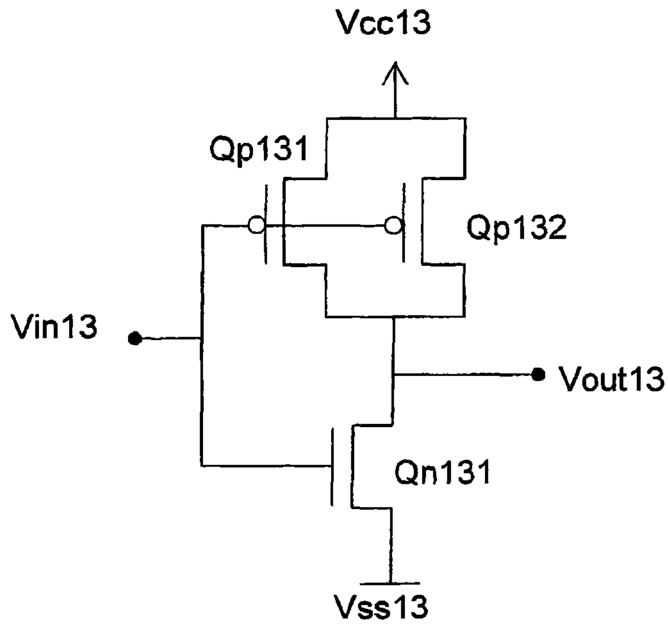
FIG. 114 is an equivalent circuit diagram of a CMOS inverter according to a twelfth embodiment of the present invention.

FIG. 114 is an equivalent circuit diagram of the CMOS inverter according to the twelfth embodiment. A circuit operation of the CMOS inverter will be described below. An input signal Vin 13 is applied to a gate of an NMOS Qn 131 and respective gates of two PMOSs Qp 131, Qp 132. When the Vin 13 is "1", the NMOS Qn 131 is placed in an ON state, and each of the PMOSs Qp 131, Qp 132 is placed in an OFF state, so that an output signal Vout 13 becomes "0". Reversely, when the Vin 13 is "0", the NMOS Qn 131 is placed in an OFF state, and each of the PMOSs Qp 131, Qp 132 is placed in an ON state, so that the Vout 13 becomes "1". As above, the CMOS inverter is operable to allow the output signal Vout 13 to have a value opposite to that of the input signal Vin 13.

Figure 115:
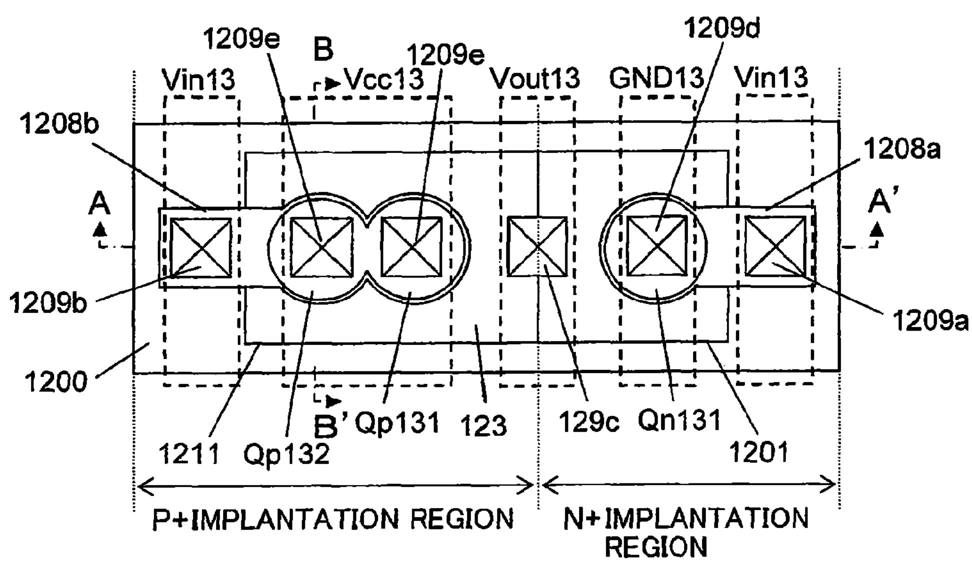
FIG. 115 is a top plan view of the CMOS inverter according to the twelfth embodiment.

FIG. 115 is a top plan view of the CMOS inverter according to the twelfth embodiment. The CMOS inverter will be briefly described based on the top plan view of FIG. 115. A planar silicon layer is formed on a buried oxide film layer 1200. The planar silicon layer comprises a lower $N^+$ diffusion layer 1201 formed in an $N^+$ injection region, and a lower $P^+$ diffusion layer 1211 formed in a $P^+$ injection region. With a view to reducing a parasitic resistance of the source/drain, a lower silicide layer 1203 is formed on a top surface of the planar silicon layer, in such a manner that the lower $N^+$ diffusion layer 1201 and the lower $P^+$ diffusion layer 1211 are connected to each other through the lower silicide layer 1203. The NMOS transistor Qn 132 is formed on the lower $N^+$ diffusion layer 1201, and the PMOS transistor (Qp 131, Qp 132) is formed on the lower $P^+$ diffusion layer 1201. A contact (1209*a*, 1209*b*) formed on a gate line (1208*a*, 1208*b*) extending from a gate electrode in each of the transistors is connected to the input line Vin 13, and a contact 1209*c* formed on the lower silicide layer 1203 is connected to the output line Vout 13. A contact 1209*d* formed on an upper diffusion layer of a pillar-shaped silicon layer forming the NMOS transistor Qn 131 is connected to a ground potential Vss 13. Further, a contact 1209*e* formed on an upper diffusion layer of a pillar-shaped silicon layer forming each of the PMOS transistors Qp 131, Qp 132 is connected to a power supply potential Vcc 13. In this manner, the inverter is formed.

Figure 116:
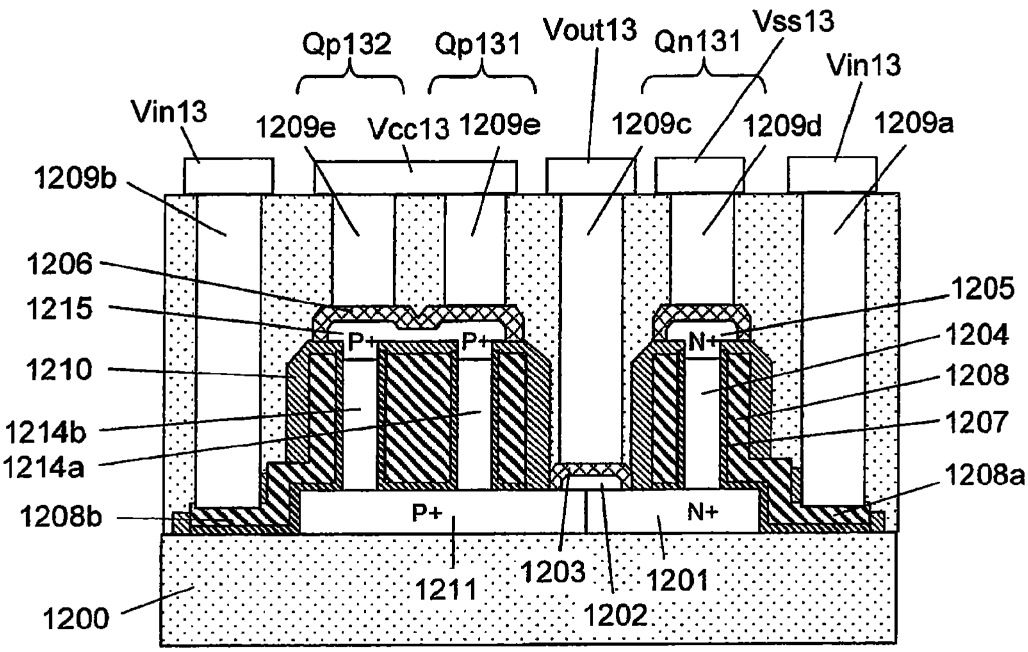
FIGS. 116(*a*) and 116(*b*) are sectional views of the CMOS inverter according to the twelfth embodiment.
Figure 116:
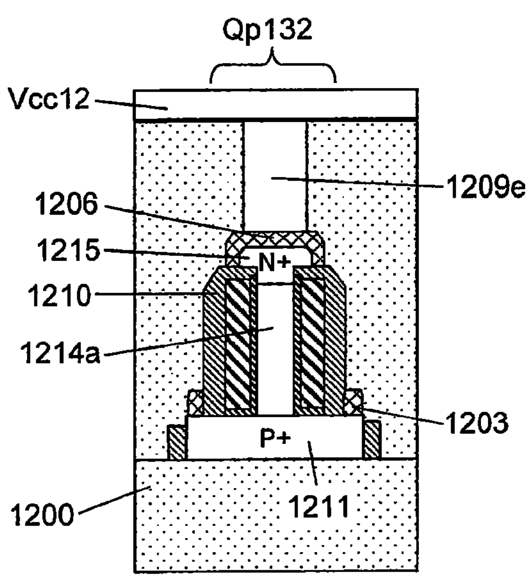

FIGS. 116(*a*) and 116(*b*) are sectional views taken along the cutting-plane line A-A' and the cutting-plane line B-B' in FIG. 115, respectively. With reference to FIGS. 115, 116(*a*) and 116(*b*), a structure of the CMOS inverter will be more specifically described below.

A planar silicon layer is formed on a buried oxide film layer 1200. The planar silicon layer comprises a lower $N^+$ diffusion layer 1201 and a lower $P^+$ diffusion layer 1211. A lower epitaxial silicon layer 1202 is formed on respective surfaces of the lower $N^+$ diffusion layer 1201 and the lower $P^+$ diffusion layer 1211, and a lower silicide layer 1203 is formed on surface of the lower epitaxial silicon layer 1202, in such a manner that the lower $N^+$ diffusion layer 1201 and the lower $P^+$ diffusion layer 1211 are directly connected to each other through the lower silicide layer 1203. The NMOS transistor Qn 131 is formed based on a pillar-shaped silicon layer 1204 formed on the lower $N^+$ diffusion layer 1201, and the PMOS transistor (Qp 131, Qp 132) is formed based on a pillar-shaped silicon layer (1214*a*, 1214*b*) formed on the lower $P^+$ diffusion layer 1211. A first dielectric film 1207 is formed to surround the pillar-shaped silicon layer (1204, 1214*a*, 1214*b*), and a gate electrode 1208 is formed to surround the gate dielectric film 1207. An upper epitaxial silicon layer (1205, 1215) is formed on a top of each of the pillar-shaped silicon layers, and insulated from the gate electrode 1208 through a fourth dielectric film 1210. In the pillar-shaped silicon layers 1214*a*, 1214*b* located in adjacent spaced-apart relation to each other by a given distance or less, the upper epitaxial silicon layers formed on respective tops of the pillar-shaped silicon layers 1214*a*, 1214*b* are integrally connected together. The upper epitaxial silicon layer 1205 on the NMOS (Qn 131)-forming pillar-shaped silicon layer is formed as an upper $N^+$ diffusion layer, and the upper epitaxial silicon layer 1215 on the PMOS (Qp 131, Qp 132)-forming pillar-shaped silicon layers is formed as an upper $P^+$ diffusion layer. With a view to reducing a parasitic resistance of a source/drain region, an upper silicide film 1206 is formed on each of the upper epitaxial silicon layers. In case where the pillar-shaped silicon layer has a small diameter, it is desirable to maximize an area of an interface between the silicide layer and the diffusion layer, because a resistance of the interface becomes a major factor of a source-drain parasitic resistance. As a result of forming the upper silicide layer 1206 in the surface of the upper epitaxial silicon layer, the area of the interface between the silicide layer and the diffusion layer is increased, and therefore the interface resistance is reduced. A contact (1209*d*, 1209*e*) to be formed on the upper epitaxial silicon layer (1205, 1215) on the top of the pillar-shaped silicon layer is fully formed on the upper epitaxial silicon layer (1205, 1215). In contact etching, etching conditions are set to allow a selectivity ratio of a silicon oxide film to the epitaxial silicon layer and the silicide layer formed in the surface of the epitaxial silicon layer, to become larger. Thus, even if overetch is performed during contact formation, the epitaxial silicon layer and the silicide layer are almost not etched, and therefore a short-circuiting between the contact and the gate will never occur.

Figure 117:
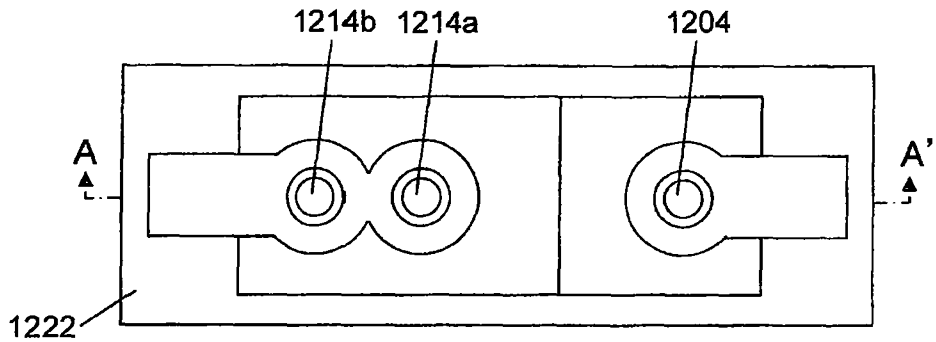
FIGS. 117(*a*) and 117(*b*) illustrate a part of production processes in the twelfth embodiment.
Figure 117:
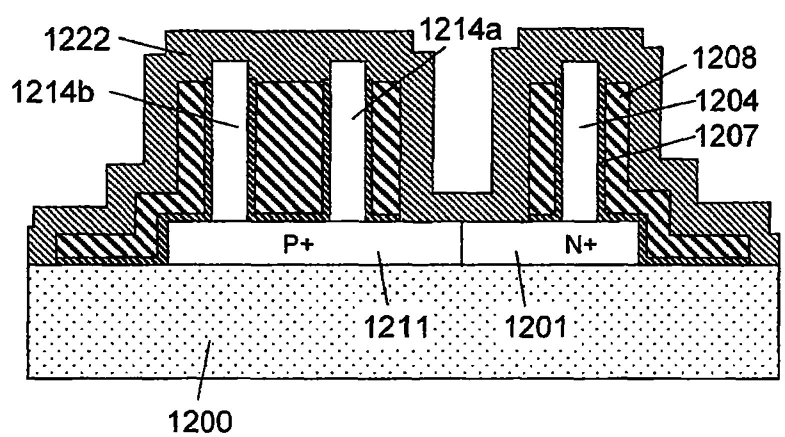

With reference to FIGS. 117(*a*) to 122(*b*), a method of forming the CMOS converter according the twelfth embodiment, as one example of a semiconductor device production method of the present invention will be described below. In FIGS. 117(*a*) to 122(*b*), the figure suffixed with (a) is a top plan view, and the figure suffixed with (b) is a sectional view taken along the line A-A'.

Any production process before a process of etching back a silicon nitride film after gate formation, in the twelfth embodiment, is the same as that in the second embodiment. Thus, the following description will start from a silicon nitride film-forming process identical to the process illustrated in FIG. 35.

As shown in FIGS. 117(*a*) and 117(*b*), after gate formation, a silicon nitride film 1222 is formed.

Figure 118:
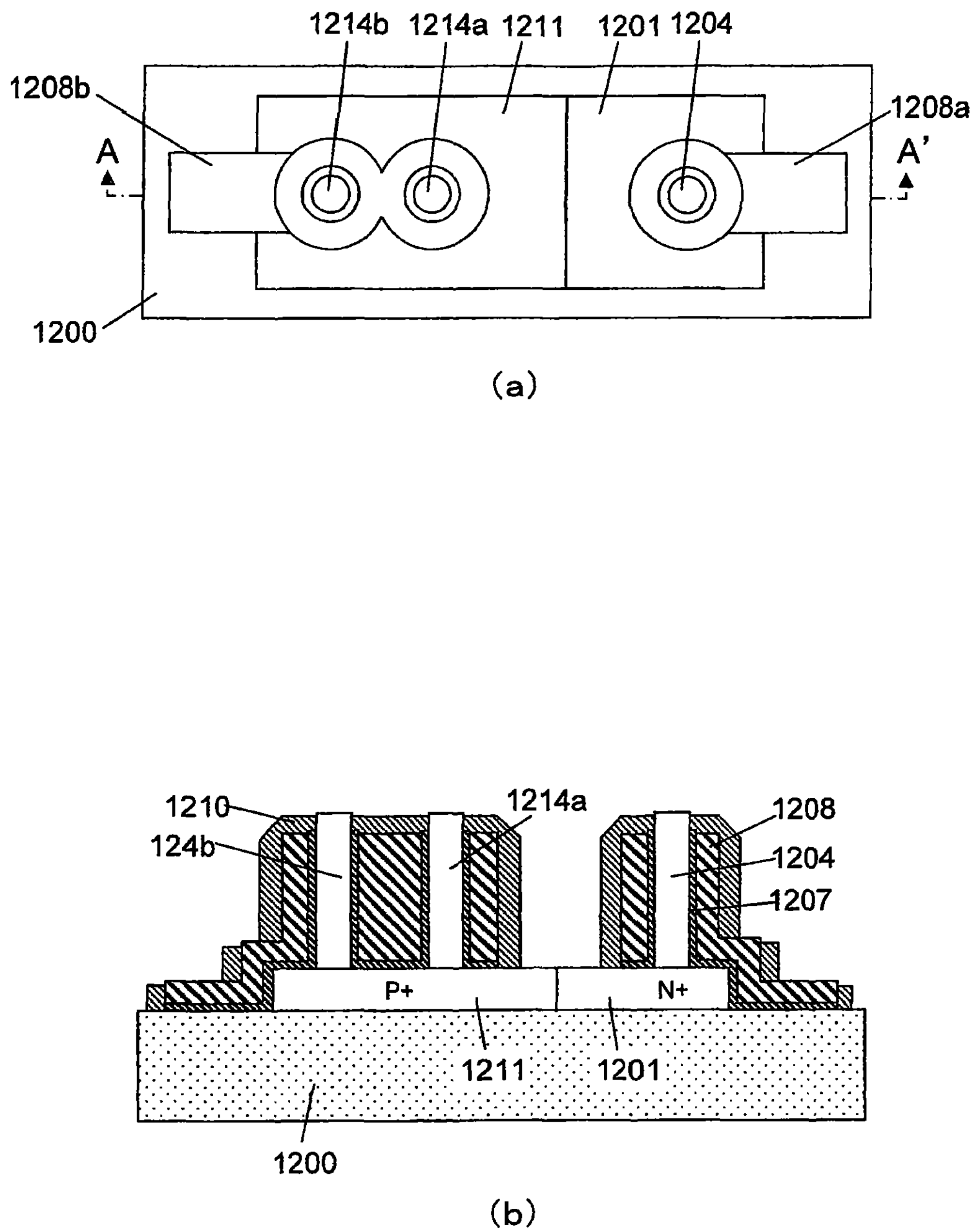
FIGS. 118(*a*) and 118(*b*) illustrate a part of production processes in the twelfth embodiment.

Then, as shown in FIGS. 118(*a*) and 118(*b*), the silicon nitride film 1222 is etched back to expose upper diffusion layers of the pillar-shaped silicon layers, and the lower diffusion layers. If a fourth dielectric film 1210, such as a silicon nitride film, does not exist on a top surface of the gate electrode, the top surface of the gate electrode will come into contact with an epitaxial silicon layer to be formed in a next process. In order to allow the fourth dielectric film 1210, such as a silicon nitride film, to be left on the top surface of the gate electrode, a film thickness of the silicon nitride film 1222 formed in the process illustrated in FIG. 117 is greater than that of the gate electrode. In this manner, the silicon nitride film can be left on the top surface of the gate electrode even after the etching back.

Figure 119:
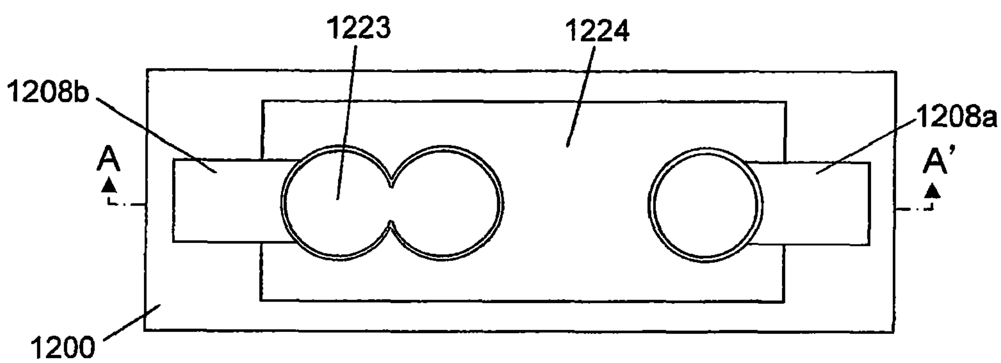
FIGS. 119(*a*) and 119(*b*) illustrate a part of production processes in the twelfth embodiment.
Figure 119:
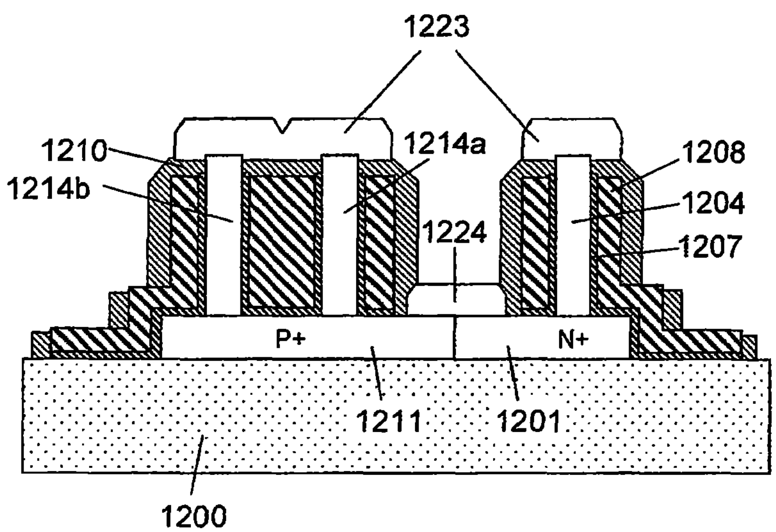

Then, as shown in FIGS. 119(*a*) and 119(*b*), silicon is selectively epitaxially grown on each of the pillar-shaped silicon layers and the lower diffusion layers to form an epitaxial silicon layer (1223, 1224) thereon, in such a manner that the epitaxial silicon layers formed on respective diffusion layers on respective tops of the pillar-shaped silicon layers located in adjacent spaced-apart relation to each other by a given distance or less are integrally connected together. In this process, each of the epitaxial silicon layers is formed to have a diameter greater than that of a contact to be formed thereon in a subsequent process, so that a structure free of short-circuiting between the contact and the gate can be obtained. In addition, the epitaxial silicon layer 1223 is shared by the adjacent pillar-shaped silicon layers (1214*a*, 1214*b*), so that a parasitic resistance of an after-mentioned upper diffusion layer of the adjacent pillar-shaped silicon layers can be further reduced.

Then, as shown in FIGS. 120(*a*) and 120(*b*), in order to form upper diffusion layers of the respective pillar-shaped silicon layers, an impurity is injected by ion implantation or other injection technique. Specifically, an imparity, such as As or P, is injected to form the upper $N^+$ diffusion layer 1205, and an imparity, such as B or BE), is injected to form the upper $P^+$ diffusion layer 1215.

Then, as shown in FIGS. 121(*a*) and 121(*b*), the source and drain diffusion layers are selectively silicided to form a lower silicide layer 1203 and an upper silicide layer 1206, through sputtering of a metal, such as Ni or Co, and a heat treatment. In this process, only a part of the epitaxial silicon layer is silicided, instead of siliciding the entire epitaxial silicon layer, so that an area of an interface between the upper silicide layer 1206 and the upper diffusion layer becomes greater than that of a top surface of the original pillar-shaped silicon layer (i.e., pillar-shaped silicon layer before the epitaxial growth). This makes it possible to reduce an interface resistance and consequently reduce a source-drain parasitic resistance. Further, in case where one upper epitaxial silicon layer is shared by two or more pillar-shaped silicon layers, the area of the interface between the upper diffusion layer and the upper silicide layer in each of the pillar-shaped silicon layers is further increased, so that a reduction in interface resistance is accelerated, and therefore the parasitic resistance is further reduced.

Then, as shown in FIGS. 122(*a*) and 122(*b*), after forming a silicon oxide film as an interlayer film, a contact (1209*a* to 1209*e*) is formed. In this process, the contact (1209*d*, 1209*e*) to be formed on the top of the pillar-shaped silicon layer is fully formed on the upper epitaxial silicon layer, so that a structure free of the occurrence of a short-circuiting between the contact and the gate can be obtained even if overetch is performed during contact formation.

The twelfth embodiment shows one example where an epitaxial silicon layer is formed in each of the NMOS and the PMOS. Alternatively, for example, an epitaxial silicon layer and an epitaxial silicon-germanium layer may be formed in respective ones of the NMOS and the PMOS to apply a stress to a channel region in the PMOS so as to improve carrier mobility.

As above, the present invention employed in the SGT comprising a pillar-shaped silicon layer having a relatively small diameter provides the following advantage.

In regard to a resistance of an interface between the upper silicide layer and the upper diffusion layer, if there is no epitaxial silicon layer (1205, 1215), a contact area between the upper silicide layer 1206 and the upper diffusion layer is no more than an area of the top surface of the pillar-shaped silicon layer. Differently, in FIGS. 116(*a*) and 116(*b*), a contact area between the upper silicide layer 1206 and the epitaxial silicon layer-based upper diffusion layer (1205, 1215) is determined by an area of the epitaxial silicon layer greater than the top surface of the original pillar-shaped silicon layer, and therefore a contact resistance is reduced. Furthermore, in the case where epitaxial silicon layers of two or more pillar-shaped silicon layers are integrally connected together as in the PMOS illustrated in FIGS. 116(*a*) and 116(*b*), the resistance of the interface between the upper silicide layer and the upper diffusion layer per pillar-shaped silicon layer is further reduced. Thus, the formation of the epitaxial silicon layer makes it possible to significantly reduce the contact resistance between upper silicide layer and the upper diffusion layer as a major factor causing a source-drain parasitic resistance, so as to improve SGT performance.

Further, when the pillar-shaped silicon layer has a diameter less than a minimum processing size, the following advantage is obtained, on an assumption that a bottom of a contact is formed in the minimum processing size.

Firstly, in regard to a contact resistance in a top of a pillar-shaped silicon layer, in a pillar-shaped silicon layer devoid of the epitaxial silicon layer (1205, 1215), a contact area of a contact is determined by an area of a top of the pillar-shaped silicon layer, which is less than that of a bottom surface of the contact. Specifically, as in the SGT structure illustrated in FIGS. 116(*a*) and 116(*b*), when an area of a top of a pillar-shaped silicon layer is less than that of a bottom surface of a contact, a contact area of the contact is determined by the area of the top of the pillar-shaped silicon layer. Thus, in a pillar-shaped silicon layer having a diameter less than that of a contact, an epitaxial silicon layer is formed thereon to increase a size of the top of the pillar-shaped silicon layer so as to reduce a contact resistance of the contact formed on the top of the pillar-shaped silicon layer.

In regard to contact formation in an SGT, it is desirable to simultaneously form contacts onto the upper diffusion layer of the pillar-shaped diffusion layer, and the lower diffusion layer, in view of a reduction in the number of production processes. In this case, a region for the contact to be formed on the upper diffusion layer will be subjected to extra overetch by a height of the pillar-shaped semiconductor layer or more. Thus, in a pillar-shaped silicon layer devoid of the epitaxial silicon layer (1205, 1215), a structure which is likely to cause short-circuiting between the gate and the contact, will be formed due to the excessive overetch in the region for the contact to be formed on the upper diffusion layer of the pillar-shaped silicon layer. Although a liner nitride film for a contact stopper (not shown) may be formed to suppress the short-circuiting, it cannot be an ultimate solution. Differently, in FIGS. 116(*a*) and 116(*b*), the contact is fully formed on the epitaxial silicon layer, and etching conditions during contact etching are set to allow a selectivity ratio of a silicon oxide film to the epitaxial silicon layer and the silicide layer formed in the surface of the epitaxial silicon layer, to become larger. Thus, a short-circuiting between the contact and the gate will never occur.

As above, the use of the twelfth embodiment makes it possible to achieve a reduction in contact resistance and source-drain parasitic resistance, and suppression in short-circuiting between the contact and the gate.

The twelfth embodiment shows one example where upper diffusion layers of the adjacent PMOS-forming pillar-shaped silicon layers are integrally connected together. Such an integral upper diffusion layer can be formed only in pillar-shaped silicon layers located in adjacent spaced-apart relation to each other by a given distance or less, in a self-alignment manner, by adjusting film formation conditions and a film thickness of the epitaxial silicon layer. This structure makes it possible to increase an area of an interface between silicon and silicide in the upper diffusion layer so as to reduce a resistance of the interface. In addition, this structure eliminates a need for forming a contact on each of all the pillar-shaped silicon layers, to facilitate contact layout.

Although the above embodiments have been described by taking, for the sake of simplicity, a structure and a production method for a semiconductor device comprising an inverter circuit with a simple configuration where drains are connected to each other, as an example of a structure and a production method for a semiconductor device comprising a transistor-based circuit, it would be apparent to those skilled in the art that the present invention can be applied to a structure and a production method for a semiconductor device comprising any other type of transistor-based circuit.

Further, although the above embodiments have been described by taking a SOT substrate as an example of a substrate forming a transistor, it would be apparent to those skilled in the art that the present invention can be implemented using any other suitable substrate, wherein a dielectric film is formed on the substrate, and a planar semiconductor layer is formed on the dielectric film.

What is claimed is:

1. A semiconductor device comprising a circuit which has a connection between one of a drain region and a source region of a first MOS transistor and one of a drain region and a source region of a second MOS transistor, the semiconductor device, comprising:

a substrate;

a dielectric film on the substrate;

a planar semiconductor layer formed on the on-substrate dielectric film, wherein:

the first MOS transistor includes a first drain or source region formed in the planar semiconductor layer, a first pillar-shaped semiconductor layer formed on the planar semiconductor layer, a second source or drain region formed in an upper portion of the first pillar-shaped semiconductor layer, and a first gate electrode formed in such a manner that the first gate electrode surrounds a sidewall of the first pillar-shaped semiconductor layer through a first dielectric film; and the second MOS transistor includes a third drain or source region formed in the planar semiconductor layer, a second pillar-shaped semiconductor layer formed on the planar semiconductor layer, a fourth source or drain region formed in an upper portion of the second pillar-shaped semiconductor layer, and a second gate electrode formed in such a manner that the second gate electrode surrounds a sidewall of the second pillar-shaped semiconductor layer through a second dielectric film, and wherein a first silicide layer is formed to connect at least a part of a surface of the first drain or source region and at least a part of a surface of the third drain or source region and the first silicide layer is also formed in the first drain or source region and the third drain or source region, and in an area on which the first gate electrode, the second gate electrode and the gate line extending from the first gate electrode and second gate electrode are absent.

2. The semiconductor device as defined in claim 1, wherein the first gate electrode and the second gate electrode are connected through a gate line extending from the first gate electrode and the second gate electrode, wherein a contact formed on the gate line is formed in an area between the first pillar-shaped semiconductor layer and the second pillar-shaped semiconductor layer.

3. The semiconductor device as defined in claim 1, further comprising a first gate line, integrally formed with the first gate electrode in such a manner that top surfaces of the first gate electrode and the first gate line have a same height and an entire area of the top surface of the integrated combination of the gate electrode and the gate line becomes parallel to the substrate, wherein a contact for the gate electrode is provided in such a manner as to be in contact with the top surface formed parallel to the substrate.

4. The semiconductor device as defined in claim 1, further comprising a third dielectric film interposed between the first dielectric film and the planar semiconductor layer including the first drain or source region, wherein the first dielectric film is formed beneath the first gate electrode and a gate line extending from the first gate electrode, and the third dielectric film has a thickness larger than that of the first dielectric film.

5. The semiconductor device as defined in claim 1, wherein one or each of the first and second MOS transistors comprises a plurality of the pillar-shaped semiconductor layers, wherein a single common contact is formed commonly on source or drain regions formed in the upper portion of at least two said pillar-shaped semiconductor layers, the source or drain regions being connected to each other through the single common contact.

6. The semiconductor device as defined in claim 1, wherein the second source or drain region and the first gate electrode are connected through a single common contact.

7. The semiconductor device as defined in claim 1, wherein the first drain or source region and the gate line extending from the first gate electrode are connected through a single common contact.

8. The semiconductor device as defined in claim 3, wherein the first and the second gate electrodes are formed in a layered structure which comprises a thin metal film and a polysilicon layer, wherein the thin metal film is interposed between the polysilicon layer and the first dielectric film, wherein the first dielectric film is formed on each of the pillar-shaped semiconductor layers, the first and third drain or source regions, and the on substrate dielectric film.

9. The semiconductor device as defined in claim 8, further comprising a silicide layer formed on a top surface of the polysilicon layer of the integrated combination of the gate electrode and the gate line.

* * * * *